US012727375B2

(12) United States Patent
Tsuji et al.

(10) Patent No.: US 12,727,375 B2
(45) Date of Patent: Sep. 1, 2026

(54) POLYMER, A COMPOSITION, AND AN ELECTROLUMINESCENT DEVICE

(71) Applicant: SAMSUNG ELECTRONICS CO., LTD., Suwon-si (KR)

(72) Inventors: Masashi Tsuji, Hwaseong-si (KR); Norihito Ishii, Kanagawa-ken (JP); Takahiro Fujiyama, Yokohama (JP); Naotoshi Suganuma, Kanagawa-ken (JP); Yusaku Konishi, Yokohama (JP); Fumiaki Kato, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1037 days.

(21) Appl. No.: 17/899,771

(22) Filed: Aug. 31, 2022

(65) Prior Publication Data

US 2023/0126748 A1 Apr. 27, 2023

(30) Foreign Application Priority Data

Aug. 31, 2021 (JP) ................................ 2021-141633
Jul. 29, 2022 (JP) ................................ 2022-122163
Aug. 29, 2022 (KR) ........................ 10-2022-0108733

(51) Int. Cl.

| | |
|---|---|
| ***H01L 51/54*** | (2006.01) |
| ***C08G 61/12*** | (2006.01) |
| ***H10K 50/11*** | (2023.01) |
| ***H10K 85/10*** | (2023.01) |
| *H10K 50/115* | (2023.01) |
| *H10K 101/40* | (2023.01) |

(52) U.S. Cl.

CPC ............ *H10K 85/111* (2023.02); *C08G 61/12* (2013.01); *H10K 50/11* (2023.02); *H10K 85/115* (2023.02); *H10K 85/151* (2023.02); *C08G 2261/143* (2013.01); *C08G 2261/148* (2013.01); *C08G 2261/3142* (2013.01); *C08G 2261/3162* (2013.01); *H10K 50/115* (2023.02); *H10K 2101/40* (2023.02)

(58) Field of Classification Search

None

See application file for complete search history.

(56) References Cited

U.S. PATENT DOCUMENTS

| | | | | |
|---|---|---|---|---|
| 8,330,142 | B2 | 12/2012 | Cho et al. | |
| 8,580,393 | B2 | 11/2013 | Mizuki et al. | |
| 8,581,241 | B2 | 11/2013 | Iida et al. | |
| 8,692,234 | B2 | 4/2014 | Iida et al. | |
| 9,954,174 | B2 | 4/2018 | Radu et al. | |
| 10,439,140 | B2 | 10/2019 | Radu et al. | |
| 10,749,111 | B2 | 8/2020 | Radu et al. | |
| 10,879,467 | B2 | 12/2020 | Radu et al. | |
| 2005/0238917 | A1 | 10/2005 | Yasuda et al. | |
| 2007/0154734 | A1 * | 7/2007 | Wei ...................... | H10K 85/115 257/E51.032 |
| 2021/0021069 | A1 | 1/2021 | Komoto et al. | |
| 2021/0253785 | A1 * | 8/2021 | Togashi ............... | H10K 85/115 |

FOREIGN PATENT DOCUMENTS

| | | | |
|---|---|---|---|
| CN | 108559066 | B | 4/2020 |
| EP | 3512307 | A1 | 7/2019 |
| EP | 3766918 | A1 | 1/2021 |
| JP | 2002080595 | A | 3/2002 |
| JP | 2009263665 | A | 11/2009 |
| JP | 2010199067 | A | 9/2010 |
| KR | 20060047315 | A | 5/2006 |
| KR | 20210019132 | A | 2/2021 |
| KR | 20210027250 | A | 3/2021 |
| WO | 2009110360 | A1 | 9/2009 |
| WO | 2017107117 | A1 | 6/2017 |
| WO | 2019177175 | A1 | 9/2019 |

OTHER PUBLICATIONS

Extended European Search Report dated Jan. 23, 2023 corresponding to European Application No. 22192781.7, 8 pp.
Office Action dated Apr. 16, 2024, issued in EP 22 192 781.7, 6 pp.
Office Action dated Nov. 11, 2025, of the corresponding Japanese Patent Application No. 2022-122163, 3 pp.

* cited by examiner

*Primary Examiner* — Andrew K Bohaty
(74) *Attorney, Agent, or Firm* — CANTOR COLBURN LLP

(57) ABSTRACT

As a means for providing an electroluminescent device capable of achieving high luminance, high efficiency, and at the same time excellent device life-span, a polymer having an overlap index of greater than or equal to about 0.00001 and less than or equal to about 1.8, and a polymer including a structural unit represented by Chemical Formula (1) are provided:

(1)

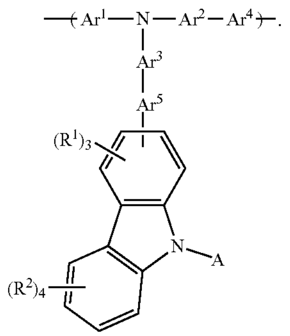

16 Claims, 11 Drawing Sheets

| | TFB | |
|---|---|---|
| Serial number (k) of atoms in a structural unit |  Serial number (k) of carbon atom or heteroatom |  Serial number (k) of hydrogen atom |
| dkHOMO of Dispersity Density of HOMO and dkLUMO of Dispersity Density of LUMO at each atom having a serial number k, obtained by simulation |  | |

| | Polymer A-7 |
| --- | --- |
| Serial number (k) of atoms in a structural unit |  Serial number (k) of carbon atom or heteroatom  Serial number (k) of hydrogen atom |
| dkHOMO of Dispersity Density of HOMO and dkLUMO of Dispersity Density of LUMO at each atom having a serial number k, obtained by simulation |  |

| | Polymer A-7 | |
|---|---|---|
| Multiplication of dkHOMO of Dispersity Density of HOMO and dkLUMO of Dispersity Density of LUMO at each atom having a serial number k |  | |
| Schematic Molecular Orbitals |  |  |

Serial number (k) of atoms in a structural unit
Polymer A-1
Serial number (k) of carbon atom or heteroatom
Serial number (k) of hydrogen atom
dkHOMO of Dispersity of HOMO Density of HOMO and dkLUMO of Dispersity of LUMO Density of LUMO at each atom having a serial number k, obtained by simulation Polymer A-1
Multiplication of dkHOMO of Dispersity Density of HOMO and dkLUMO of Dispersity Density of LUMO at each atom having a serial number k
k (-)
Schematic Molecular Orbitals
HOMO
LUMO

| | Polymer A-2 |
|---|---|
| Serial number (k) of atoms in a structural unit |  Serial number (k) of carbon atom or heteroatom  Serial number (k) of hydrogen atom |
| dkHOMO of Dispersity Density of HOMO and dkLUMO of Dispersity Density of LUMO at each atom having a serial number k, obtained by simulation |   |

| | Polymer A-2 | |
|---|---|---|
| Multiplication of dkHOMO of Dispersity Density of HOMO and dkLUMO of Dispersity Density of LUMO at each atom having a serial number k |  | |
| Schematic Molecular Orbitals |  HOMO |  LUMO |

| | Polymer A-3 |
| --- | --- |
| Serial number (k) of atoms in a structural unit |  Serial number (k) of carbon atom or heteroatom  Serial number (k) of hydrogen atom |
| dkHOMO of Dispersity Density of HOMO and dkLUMO of Dispersity Density of LUMO at each atom having a serial number k, obtained by simulation |  |

POLYMER, A COMPOSITION, AND AN ELECTROLUMINESCENT DEVICE

CROSS-REFERENCE TO RELATED APPLICATION

This application claims priority to and the benefit of Japanese Patent Application Nos. 2021-141633 and 2022-122163, filed in the Japanese Patent Office on Aug. 31, 2021, and Jul. 29, 2022, respectively, and Korean Patent Application No. 10-2022-0108733 filed in the Korean Intellectual Property Office on Aug. 29, 2022, the entire contents of which are incorporated herein by reference.

BACKGROUND OF THE INVENTION

(a) Field of the Invention

An embodiment relates to a polymer having a specific overlap index, a polymer having a specific structure, a composition, and an electroluminescent device.

(b) Description of the Related Art

Research and development for electroluminescent devices (EL devices) is being actively conducted.

In particular, the EL device is promising for use as an inexpensive large-area full-color display device of a solid-state light-emitting type or a recording light source array.

The EL device is a light emitting device having a thin film of several nanometers to several hundreds of nanometers between an anode and a cathode.

In addition, the EL device usually has a hole transport layer, a light emitting layer, an electron transport layer, and the like.

From the viewpoint of realization of an EL device having a long life-span and excellent color purity, a light emitting device using an inorganic light emitting material "quantum dots" as a light emitting material is being studied (Japanese Patent Laid-Open No. 2010-199067).

Quantum dots (QD) are semiconductor materials having a crystal structure of several nanometers in size, and is composed of hundreds to thousands of atoms.

Quantum dots exhibit a quantum confinement effect and the like because their sizes are particle diameters corresponding to the de Broglie wavelength of an atom.

Due to this quantum confinement effect, quantum dots may control an emission wavelength only by adjusting their sizes, and have characteristics such as excellent color purity and high PL (photoluminescence) luminous efficiency, and thus, are attracting much attention.

A quantum dot electroluminescent device (QD LED, or QLED) is known as a basic device having a three-layer structure including a hole transport layer and an electron transport layer on both ends with a quantum dot light emitting layer interposed therebetween.

On the other hand, as an example of the charge transport material, polymers containing a nitrogen atom forming a triarylamine structure in the main chain such as poly[(9,9-dioctyl fluorenyl-2,7-diyl)-co-(4,4'-(N-(4-sec-butylphenyl)) diphenylamine)](TFB) are known (see, e.g., Chinese Patent Publication No. 108559066; International Publication No. 2020/009069; Japanese Patent Laid-Open No. 2009-263665; Japanese Patent Laid-Open No. 2005-306998; International Publication No. 2009/110360; and International Publication No. 2019/177175).

In an organic electroluminescent device (organic EL device), it is known that excellent device properties can be obtained by using a substance having a specific structure among these polymers as a hole transport material included in the hole transport layer (see, e.g., Chinese Patent Publication No. 108559066; International Publication No. 2020/009069; Japanese Patent Laid-Open No. 2009-263665; Japanese Patent Laid-Open No. 2005-306998; International Publication No. 2009/110360; and International Publication No. 2019/177175).

SUMMARY OF THE INVENTION

However, in the electroluminescent device using the hole transport material described in Japanese Patent Laid-Open No. 2010-199067, sufficient device life-span could not be achieved.

Sufficient device life-span may not be achieved in the conventional electroluminescent devices using TFB or the high molecular weight compound described in the previously-referenced patent documents as a hole transport material.

Accordingly, the present inventors discovered that high luminance, high efficiency, and at the same time excellent device life-span could be achieved in an electroluminescent device using a polymer having an overlap index within a specific range as further described below.

The polymers of the present disclosure have an overlap index of greater than or equal to about 0.00001 and less than or equal to about 1.8 represented by the following equation:

$$\text{overlap index} = \left(\sum_{k=1}^{n}\left(d^{k}_{HOMO} \times d^{k}_{LUMO}\right)\right) \times 100$$

In the equation, k is a serial number assigned to an atom in the chemical formula of a structural unit constituting the polymer, $d^{k}_{HOMO}$ denotes a distribution density of HOMO in the atom of serial number k, and $d^{k}_{LUMO}$ denotes a distribution density of LUMO in the atom of serial number k. The $d^{k}_{HOMO}$ and $d^{k}_{LUMO}$ are values calculated as functional B3LYP and basis function 6-31G (d, p) using quantum chemical calculation software by density functional theory (DFT), respectively. As quantum chemical calculation software, Gaussian 16 (Gaussian Inc.) may be used. The polymers of the present disclosure may include a structural unit represented by Chemical Formula (1):

(1)

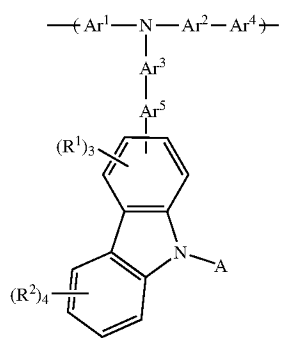

wherein, in Chemical Formula (1), $Ar^1$ and $Ar^2$ are each independently a substituted or unsubstituted divalent aromatic hydrocarbon group having 6 to 60 carbon atoms, $Ar^3$ is a substituted or unsubstituted divalent aromatic hydrocarbon group having 6 to 120 carbon atoms, $Ar^4$ is a substituted or unsubstituted divalent aromatic hydrocarbon group having 6 to 60 carbon atoms or a substituted or unsubstituted divalent aromatic heterocyclic ring group having 3 to 60 ring atoms, $Ar^5$ is a single bond or a substituted or unsubstituted divalent aromatic heterocyclic ring group having 3 to 60 ring atoms, each $R^1$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, or a cyano group, each $R^2$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthio group, an alkoxycarbonyl group, an alkylthiocarbonyl group, a thiocarboxyl group, a dithiocarboxyl group, an alkylthioalkyl group, a hydroxyl group, a carboxyl group, a thiol group, a cyano group, and A is a structure represented by Chemical Formula (2) or Chemical Formula (3):

(2)

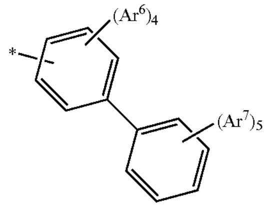

(3)

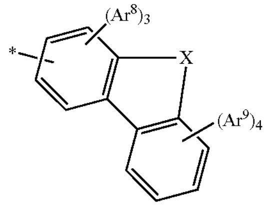

wherein, in Chemical Formula (2), each $Ar^6$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^F$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, two or more $Ar^7$s may form a condensed ring with the benzene ring to which two or more $Ar^7$s are bonded, and

* indicates a bonding position with an adjacent atom, wherein, in Chemical Formula (3), each $Ar^8$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^9$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, X is S, O, or C substituted with two substituted or unsubstituted linear or branched hydrocarbon groups having 1 to 16 carbon atoms, two or more $Ar^9$s may form a condensed ring with the benzene ring to which two or more $Ar^9$s are bonded, and

* indicates a bonding position with an adjacent atom.

According to the present disclosure, in an electroluminescent device, the means which can achieve high luminance, high efficiency, and excellent device lifespan at the same time may be provided.

DETAILED DESCRIPTION OF THE EMBODIMENTS

Figure 1:
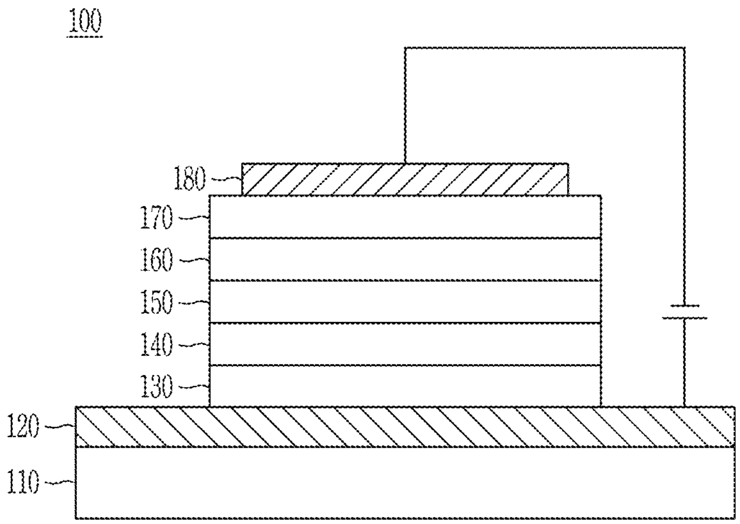
FIG. 1 is a schematic view showing an electroluminescent device according to an exemplary embodiment.

Hereinafter, embodiments of the present disclosure will be described.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded Thus, the regions illustrated in the figures are schematic in nature and their shapes are not intended to illustrate the precise shape of a region and are not intended to limit the scope of the present claims.

In addition, the present disclosure is not limited only to the following embodiment.

In addition, unless otherwise noted, operation and measurement of physical properties are measured at room temperature (20° C. or higher and 25° C. or lower)/relative humidity 40% RH or higher and 50% RH or lower.

In this specification, "X and Y are each independently" means that X and Y may be the same or different.

As used herein, the term "ring-derived group" refers to a group formed by separating a hydrogen atom directly bonded to a ring constituent element from a ring structure.

As used herein, the term "ring set" refers to two or more rings bonded through a single bond.

In addition, "ring set group" and "a group derived from ring set" represent a group formed by separating a hydrogen atom directly bonded to a ring constituent element from a ring set structure.

<Polymer>

An embodiment relates to a polymer having an overlap index of greater than or equal to about 0.00001 and less than or equal to about 1.8 represented by the following equation:

$$\text{overlap index} = \left(\sum_{k=1}^{n}\left(d^k_{HOMO} \times d^k_{LUMO}\right)\right) \times 100$$

In the equation, k is a serial number assigned to an atom in the chemical formula of a structural unit constituting the polymer, $d^k_{HOMO}$ denotes a distribution density of HOMO in the atom of serial number k, and $d^k_{LUMO}$ denotes a distribution density of LUMO in the atom of serial number k.

The $d^k_{HOMO}$ and $d^k_{LUMO}$ are values calculated as functional B3LYP and basis function 6-31 G (d, p) using quantum chemical calculation software by density functional theory (DFT), respectively. As quantum chemical calculation software, Gaussian 16 (Gaussian Inc.) may be used.

The polymer may be a homopolymer or a copolymer.

Without being bound by a specific theory, the present inventors estimate a mechanism by which the purpose is solved by the structure as follows.

The overlap index, which will be described in detail later, is a parameter indicating a degree of overlap between HOMO (Highest Occupied Molecular Orbital) and LUMO (Lowest Unoccupied Molecular Orbital) in a molecular structure of interest. The overlap between the HOMO and the LUMO in the molecular structure of interest increases as the value of the overlap index increases. In addition, the smaller the value of the overlap index, that is, the closer to 0, the smaller the overlap between the HOMO and the LUMO in the molecular structure of interest.

In molecules of materials having charge transport properties, a moiety mainly responsible for charge transport is present. In addition, a moiety mainly responsible for hole transport in the molecule of the hole transport material is present. The moiety mainly responsible for hole transport is a moiety corresponding to the HOMO in the molecule of the hole transport material. The moiety mainly responsible for hole transport is weak to electrons, and by injecting electrons into the moiety, an irreversible change occurs in the corresponding moiety, and deterioration of the compound occurs.

In addition, when electrons are injected into the hole transport material, the moiety into which the electrons are injected is a moiety corresponding to the LUMO in the molecule of the hole transport material. Here, a case where the moiety mainly responsible for hole transport in the hole transport material is overlapped with the moiety where electrons are injected, that is, the moiety corresponding to the HOMO is overlapped with the moiety corresponding to the LUMO in the hole transport material may be considered.

At this time, the greater the overlap between the moiety corresponding to the HOMO and the moiety corresponding to the LUMO is, the higher the possibility that electrons are injected into the overlapping moiety thereof. And, the greater the overlap between the moiety corresponding to the HOMO and the moiety corresponding to the LUMO, the higher the possibility that an irreversible change occurs in the hole transport material due to the overlap moiety by electron injection. Therefore, the greater the overlap between the moiety corresponding to HOMO and the moiety corresponding to LUMO, the higher the possibility that the hole transport material will deteriorate.

As such, the device life-span of the electroluminescent device using the charge transport material may be shortened due to deterioration of the charge transport material.

However, the polymer according to an embodiment has an overlap index of a value less than or equal to a certain value, and the overlap between HOMO and LUMO in the molecular structure of interest is extremely small.

In this regard, as the overlap between the moiety corresponding to HOMO and the moiety corresponding to LUMO is small, the possibility of irreversible change in the polymer due to the moiety where they overlap by injection of electrons decreases.

Accordingly, the smaller the overlap between the moiety corresponding to the HOMO and the moiety corresponding to the LUMO, the lower the possibility that deterioration of the polymer occurs.

Accordingly, the device life-span of the electroluminescent device using the polymer according to an embodiment may be significantly improved.

On the other hand, the above mechanism is based on guesswork, and the correctness thereof does not affect the technical scope of the present invention In addition, the correctness thereof does not affect the technical scope of this invention similarly also about speculation outside this specification.

The overlap index may be small from the viewpoint of improving the device life-span of the electroluminescent device.

For example, the overlap index may be less than or equal to about 1.8, for example, less than or equal to about 1.2, and for example, less than or equal to about 1.0, for example, less than or equal to about 0.6.

Also, the overlap index may be greater than or equal to about 0.00001, for example, greater than or equal to about 0.00005, and for example, greater than or equal to about 0.0001.

For example, the overlap index may be greater than or equal to about 0.00001 and less than or equal to about 1.8, greater than or equal to about 0.00001 and less than or equal to about 1.2, greater than or equal to about 0.00005 and less than or equal to about 1.0, and greater than or equal to about 0.0001 and less than or equal to about 0.6, but is not limited thereto.

Within this range, in particular, an effect of improving the device life-span in the quantum dot electroluminescent device may become large.

The overlap index can be calculated as follows.

First, in the structural unit (or repeating unit) constituting the polymer, Gaussian 16 (Gaussian Inc.) is used as the calculation software for HOMO, LUMO, and their distribution densities by density functional theory (DFT) and computed with the functional B3LYP and the basis function 6-31G (d, p).

Then, using the distribution density of HOMO and the distribution density of LUMO on each atom of the structural unit constituting the polymer, which are calculated by the above calculation equation, the overlap index is calculated as the overlap of HOMO and LUMO according to the equation for calculating the overlap index.

Calculation of the overlap index is performed for the ground state of the structural unit of the polymer, and the highest orbital in which electrons are distributed is called HOMO, and the lowest orbital in which electrons are not distributed is called LUMO.

When the polymer has one type of structural unit (or repeating unit) alone, the overlap index becomes a value calculated with the above structural unit.

In addition, when the polymer has two or more structural units (or repeating units), the overlap indexes of each structural unit are calculated respectively, the values obtained by multiplying the overlap index of each structural unit by the content ratio of each structural unit (the ratio of the number of each structural unit to the total number of structural units constituting the polymer) are calculated respectively, and the sum of the obtained values is taken as the overlap index of the polymer.

Detailed description is given in the examples.

The polymer according to an embodiment may be a polymer including a structural unit represented by Chemical Formula (1):

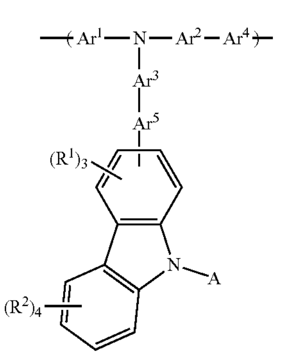

(1)

wherein, in Chemical Formula (1), $Ar^1$ and $Ar^2$ are each independently a substituted or unsubstituted divalent aromatic hydrocarbon group having 6 to 60 carbon atoms, $Ar^3$ is a substituted or unsubstituted divalent aromatic hydrocarbon group having 6 to 120 carbon atoms, $Ar^4$ is a substituted or unsubstituted divalent aromatic hydrocarbon group having 6 to 60 carbon atoms or a substituted or unsubstituted divalent aromatic heterocyclic ring group having 3 to 60 ring atoms, $Ar^5$ is a single bond or a substituted or unsubstituted divalent aromatic heterocyclic ring group having 3 to 60 ring atoms, each $R^1$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, or a cyano group, each $R^2$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, and A is a structure represented by Chemical Formula (2) or Chemical Formula (3):

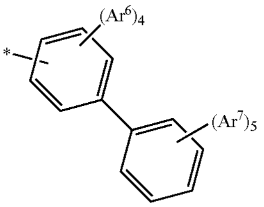

(2)

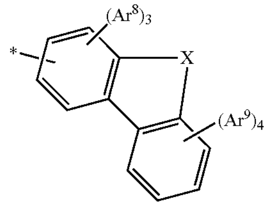

(3)

wherein, in Chemical Formula (2), each $Ar^6$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^7$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, two or more $Ar^7$s may form a condensed ring with the benzene ring to which two or more $Ar^7$s are bonded, and

* indicates a bonding position with an adjacent atom, wherein, in Chemical Formula (3), each $Ar^8$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^9$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, X is S, O, or C substituted with two substituted or unsubstituted linear or branched hydrocarbon groups having 1 to 16 carbon atoms, two or more $Ar^9$s may form a condensed ring with the benzene ring to which two or more $Ar^9$s are bonded, and

* indicates a bonding position with an adjacent atom.

Without intending to be bound by a particular theory, the inventors of the present application propose a mechanism by which the problem is solved by the polymer including the structural unit represented by Chemical Formula (1) as follows.

In molecules of materials having charge transport properties, a moiety mainly responsible for charge transport is present. For example, a moiety mainly responsible for hole transport in the molecule of the hole transport material is present. The moiety mainly responsible for hole transport is a moiety corresponding to the HOMO in the molecule of the hole transport material.

The moiety mainly responsible for hole transport is weak to electrons, and by injecting electrons into the moiety, an irreversible change may occur in the corresponding moiety, and deterioration of the compound may occur.

In addition, when electrons are injected into the hole transport material, the moiety into which the electrons are injected is a moiety corresponding to the LUMO in the molecule of the hole transport material.

Here, the case in which, in the hole transport material, when the moiety mainly responsible for hole transport is overlapped with the moiety where electrons are injected, that is, the moiety corresponding to the HOMO is overlapped with the moiety corresponding to the LUMO in the hole transport material is considered.

At this time, the greater the overlap between the moiety corresponding to the HOMO and the moiety corresponding to the LUMO, the higher the possibility that electrons are injected into the overlapped moiety thereof.

And, the greater the overlap between the moiety corresponding to the HOMO and the moiety corresponding to the LUMO, the higher the possibility that an irreversible change occurs in the hole transport material due to the moiety where they overlap by injection of electrons. Accordingly, the greater the overlap between the moiety corresponding to the HOMO and the moiety corresponding to the LUMO, the higher the possibility that the hole transport material will deteriorate. As such, the device life-span of the electroluminescent device using the charge transport material may be shortened due to deterioration of the charge transport material.

However, in the polymer including the structural unit represented by Chemical Formula (1), the moiety corresponding to the HOMO in these structural units is located around the triarylamine structure including the nitrogen atom constituting the main chain. In addition, the moiety corresponding to LUMO is located on the periphery of an aromatic hydrocarbon group, an aromatic heterocyclic ring group, or a ring set group having a structure in which one or more aromatic hydrocarbon rings and one or more aromatic heterocyclic rings are bonded through a single bond, which is bonded to the nitrogen atom of the carbazole ring in the side chain. Therefore, the overlap between HOMO and LUMO in such a structural unit may be extremely small.

In this regard, as the overlap between the moiety corresponding to HOMO and the moiety corresponding to LUMO is small, the possibility of irreversible change in these overlapping portions due to electron injection may be lowered. Accordingly, as the overlap between the moiety corresponding to HOMO and the moiety corresponding to LUMO is small, the possibility of deterioration of the compound is also reduced.

Accordingly, the device life-span of an electroluminescent device using a polymer including such a structural unit can be significantly improved.

On the other hand, the above mechanism is hypothetical, and the correctness thereof does not affect the technical scope of the present invention. In addition, the correctness thereof does not affect the technical scope of this invention similarly also about speculation outside this specification.

Rather, an embodiment may also be said to include the polymer including the structural unit represented by Chemical Formula (1).

In Chemical Formula (1), $Ar^1$ and $Ar^2$ may each independently be a substituted or unsubstituted divalent aromatic hydrocarbon group having 6 to 60 carbon atoms.

In Chemical Formula (1), $Ar^3$ may be a substituted or unsubstituted divalent aromatic hydrocarbon group having 6 to 120 carbon atoms.

$Ar^1$ to $Ar^3$ may be the same as or different from each other.

From the viewpoint of improving the device life-span, $Ar^1$ to $Ar^3$ may all be the same.

In Chemical Formula (1), $Ar^4$ may be a substituted or unsubstituted divalent aromatic hydrocarbon group having 6 to 60 carbon atoms, or a substituted or unsubstituted divalent aromatic heterocyclic ring group having 3 to 60 ring atoms.

In Chemical Formula (1), $Ar^5$ is a single bond or a substituted or unsubstituted divalent aromatic heterocyclic ring group having 3 to 60 ring atoms.

The divalent aromatic hydrocarbon group having 6 to 60 carbon atoms, which may constitute $Ar^1$, $Ar^2$, and $Ar^4$, respectively, is not particularly limited.

The divalent aromatic hydrocarbon group having 6 to 120 carbon atoms (for example, a divalent aromatic hydrocarbon group having 6 to 60 carbon atoms) which may constitute $Ar^3$ is not particularly limited.

Examples of the aromatic hydrocarbon group which may each constitute $Ar^1$ to $Ar^4$ may include a divalent group derived from an aromatic hydrocarbon ring such as benzene (phenylene group), indene, naphthalene, anthracene, azylene, heptalene, acenaphthene, phenalene, fluorene, phenanthrene, pyrene, and the like, a divalent group derived from a ring set group of two or more aromatic hydrocarbon rings bonded through a single bond, such as biphenyl (biphenylene group), terphenyl (terphenylene group), quarterphenyl (quaterphenylene group), quinkphenyl (quinkphenylene group), sexyphenyl (sexyphenylene group), and the like.

Meanwhile, in the present specification, for example, a hydrocarbon ring including an aromatic hydrocarbon ring moiety such as fluorene is also included as an aromatic heterocyclic ring.

The divalent aromatic heterocyclic ring group having 3 to 60 ring atoms, which may constitute $Ar^4$ and $Ar^5$, respectively, is not particularly limited.

Examples of the aromatic heterocyclic ring group which may each constitute $Ar^4$ and $Ar^5$ may include a divalent group derived from an aromatic heterocyclic ring such as acridine, phenazine, benzoquinoline, benzoisoquinoline, phenanthridine, phenanthroline, anthraquinone, fluorenone, dibenzofuran, dibenzothiophene, carbazole, imidazo phenanthridine, benzimidazophenanthroline, azadibenzofuran, azacarbazole, azadibenzothiophene, diazadibenzofuran, diazacarbazole, diazadibenzothiophene, xanthone, thioxanthone, pyridine, quinoline, and anthraquinone, and a divalent group derived from a ring set of two or more aromatic heterocyclic rings bonded through a single bond, such as bipyridine, bipyrimidine, and bipyrazine.

On the other hand, in this specification, for example, a heterocyclic ring containing an aromatic ring moiety, such as dibenzofuran, dibenzothiophene, and carbazole, may also be included as an aromatic heterocyclic ring.

In the present specification, the aromatic heterocyclic ring includes a ring including a structure in which a heteroatom is bonded to an atom directly forming a ring moiety through a double bond.

When $Ar^1$ to $Ar^5$ are each a group substituted with a substituent, the number of substituents is not particularly limited.

The number of introduced substituents in $Ar^1$ to $Ar^5$ is each independently, for example, 1 or more and 3 or less, for example, 1 or more and 2 or less, and may be, for example, 1.

When $Ar^1$ to $Ar^5$ are each a group substituted with a substituent, the type of the substituent is not particularly limited.

When $Ar^1$ to $Ar^5$ are each a group substituted with a substituent, the type of the substituent may be, for example, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a halogen group, and the like, but is not limited thereto.

When $Ar^1$ to $Ar^5$ are groups substituted with a substituent, the substituents may be the same as or different from each other.

When $Ar^1$ to $Ar^5$ are each substituted with a substituent and each has two or more substituents, in each of $Ar^1$ to $Ar^5$, two or more corresponding substituents may be the same as or different from each other.

As used herein "alkyl group" means saturated aliphatic hydrocarbon group and is not particularly limited. The number of carbon atoms in the alkyl group is not particularly limited, but may be 1 or more and 20 or less.

The alkyl group is not particularly limited, and may be linear, branched, or cyclic. For example, the alkyl groups may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a cyclopropyl group, a cyclobutyl group, a cyclopentyl group, a cyclohexyl group, and the like, but is not limited thereto.

As used herein "hydroxyalkyl group" means a saturated aliphatic hydrocarbon group substituted with at least one hydroxyl group. Although a hydroxyalkyl group is not particularly limited, it may be for example, the alkyl group substituted with 1 or more and 3 or less, for example, 1 or more and 2 or less, for example, one hydroxyl group, for example, a hydroxymethyl group, a hydroxyethyl group, and the like, but is not limited thereto.

As used herein "alkylthiol group" means a saturated aliphatic hydrocarbon group substituted with at least one thiol group. Although an alkylthiol group is not particularly limited, it may be for example, the alkyl group substituted with 1 or more and 3 or less, for example, 1 or more and 2 or less, for example, one thiol group, for example, a methyl thiol group, an ethyl thiol group, and the like, but is not limited thereto.

As used herein "alkoxy group" refers to a monovalent group represented by —$OA_{101}$ (wherein $A_{101}$ is an alkyl group). Although an alkoxy group is not particularly limited, it may be for example a methoxy group, an ethoxy group, a propoxy group, an isopropoxy group, a butoxy group, a pentyloxy group, a hexyloxy group, a heptyloxy group, an octyloxy group, a nonyloxy group, decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylphenyloxy group, a cyclopropyl group, a cyclobutyl group, a cyclopentyl group, a cyclohexyl group, and the like, but is not limited thereto.

As used herein "alkoxyalkyl group" refers to an alkyl group substituted with at least one alkoxy groups. Although an alkoxyalkyl group is not particularly limited, it may be for example, the alkyl group substituted by 1 or more and 3 or less, for example, 1 or more and 2 or less, for example, one alkoxy group.

As used herein "alkylthioalkyl group" refers to an alkyl group substituted with at least one thioalkyl groups. Although an alkylthioalkyl group is not particularly limited, it may be for example, an alkyl group substituted by 1 or more and 3 or less, for example, 1 or more and 2 or less, for example, one thioalkyl group.

As used herein "alkenyl group" refers to a hydrocarbon group formed by including at least one carbon-carbon double bond. Although an alkenyl group is not particularly limited, it may be for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, a 1,3-butadienyl group, and the like, but is not limited thereto.

As used herein "alkynyl group" refers to a hydrocarbon group formed by including at least one carbon-carbon triple bond. Although an alkynyl group is not particularly limited, it may be for example, an acetylenyl group (ethynyl group), a 1-propynyl group, a 2-propynyl group (propargyl group), a 1-butynyl group, a 2-butynyl group, a 3-butynyl group, a 1-pentynyl group, a 2-pentynyl group, a 3-pentynyl group, a 1-hexynyl group, a 2-hexynyl group, a 3-hexynyl group, a 1-heptynyl group, a 2-heptynyl group, a 5-heptynyl group, a 1-octynyl group, a 3-octynyl group, an 5-octynyl group, and the like, but is not limited thereto.

As used herein "alkylthio group" refers to a monovalent group represented by $—SA_{102}$ (wherein $A_{102}$ is an alkyl group). Although an alkylthio group is not particularly limited, it may be for example, a methylthio group, an ethylthio group, a propylthio group, a pentylthio group, a hexylthio group, an octylthio group, a dodecylthio group, a cyclopentylthio group, a cyclohexylthio group, and the like, but it is not limited thereto.

As used herein "alkoxycarbonyl group" refers to a monovalent group represented by $—OC(=O)A_{102}$ or $—C(=O)O-A_{102}$ (wherein $A_{102}$ is an alkyl group). Although an alkoxycarbonyl group is not particularly limited, it may be for example, a methoxycarbonyl group, an ethoxycarbonyl group, a butoxycarbonyl group, an octyloxycarbonyl group, a dodecyloxycarbonyl group, and the like, but it is not limited thereto.

As used herein "alkylthiocarbonyl group" refers to a monovalent group represented by $—SC(=O)A_{104}$ or $—C(=O)S\ A_{104}$ (wherein $A_{104}$ is an alkyl group). Although an alkylthiocarbonyl group is not particularly limited, it may be for example, a methylthiocarbonyl group, an ethylthiocarbonyl group, and the like, but it is not limited thereto.

As used herein "a carboxyl group" refers to a monovalent group represented by $—C(=O)OH$.

As used herein "a thiocarboxyl group" refers to a monovalent group represented by $—C(=S)OH$.

As used herein "a dithiocarboxyl group" refers to a monovalent group represented by $—C(=S)SH$.

Although a halogen is not particularly limited, it may be for example, a fluoro group, a chloro group, a bromo group, an iodine group, and the like, but it is not limited thereto.

When $Ar^1$ to $Ar^5$ are a group substituted with a substituent, the substituent may be, for example, an alkyl group, for example, a linear or branched alkyl group having 1 to 18 carbon atoms.

In addition, for example, it may be a linear alkyl group having 1 to 8 carbon atoms, for example, an n-octyl group.

Each of the groups that may constitute $Ar^1$ to $Ar^3$ may be a substituted or unsubstituted phenylene group, a substituted or unsubstituted naphthylene group, a divalent group derived from a substituted or unsubstituted anthracene (a divalent group derived from a substituted or unsubstituted anthracene ring), a divalent group derived from a substituted or unsubstituted fluorene (a divalent group derived from a substituted or unsubstituted fluorene ring), or a substituted or unsubstituted biphenylene group.

For example, a group that may constitute each of $Ar^1$ to $Ar^3$ may be a substituted or unsubstituted phenylene group, for example, a phenylene group, for example, a p-phenylene group.

The groups that may constitute $Ar^4$ may be a substituted or unsubstituted phenylene group, a substituted or unsubstituted naphthylene group, a divalent group derived from a substituted or unsubstituted anthracene (a divalent group derived from a substituted or unsubstituted anthracene ring), a divalent group derived from a substituted or unsubstituted fluorene (a divalent group derived from a substituted or unsubstituted fluorene ring), or a substituted or unsubstituted biphenylene group.

The group which may constitute $Ar^4$ may be, for example, a divalent group derived from substituted or unsubstituted fluorene, for example, a divalent group derived from fluorene substituted with two alkyl groups, for example, a divalent group derived from fluorene substituted with two n-hexyl groups, n-octyl groups, n-decyl groups, or n-dodecyl groups.

In an embodiment, $Ar^5$ may be a single bond.

In the polymer according to an embodiment, in Chemical Formula (1), $Ar^3$ may be a group selected from Group (I). In Chemical Formula (1), $Ar^3$ may be a group selected from Group (I), and $Ar_5$ may be a single bond. In Chemical Formula (1), $Ar^3$ may be I-1 or I-4, and $Ar^5$ may be a single bond. In Chemical Formula (1), $Ar^3$ may be a phenylene group, and $Ar^5$ may be a single bond. In Chemical Formula (1), $Ar^3$ may be a p-phenylene group, and $Ar^5$ may be a single bond. According to these structures, the effect of improving the device life-span in an electroluminescent device using a polymer, particularly, a quantum dot electroluminescent device may be increased.

Group (1)

I-1

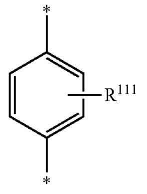

I-2

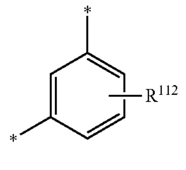

-continued

I-3

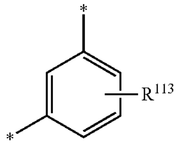

I-4

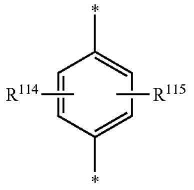

I-5

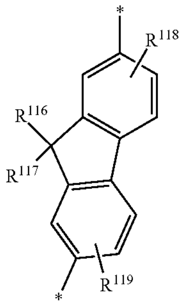

I-6

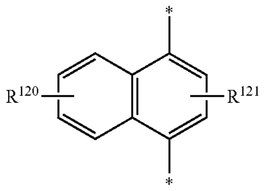

I-7

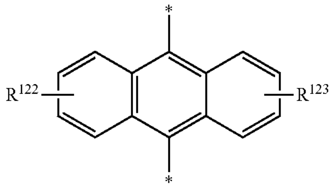

Here, $R^{111}$-$R^{123}$ are each independently a hydrogen atom or a linear or branched hydrocarbon group having 1 to 16 carbon atoms, and

* indicates a bonding position with an adjacent atom.

That is, in Group (1), * is a bonding position with an adjacent nitrogen atom and an adjacent $Ar^5$ atom.

On the other hand, when $Ar^5$ is a single bond, * is a bonding position with an adjacent nitrogen atom and a carbon atom of the benzene ring in the adjacent carbazole ring of Chemical Formula (1).

In the polymer according to an embodiment, in Chemical Formula (1), at least one selected from $Ar^1$, $Ar^2$, and $Ar^4$ may each independently be a group selected from Group (II).

For example, in Chemical Formula (1), $Ar^1$, $Ar^2$, and $Ar^4$ may each independently be a group selected from Group (II).

In Chemical Formula (1), $Ar^1$ and $Ar^2$ may each independently be II-1 or II-4, and $Ar^4$ may be II-5.

In Chemical Formula (1), $Ar^1$ and $Ar^2$ may each independently be a phenylene group, and $Ar^4$ may be II-5, in which $R^{216}$ and $R^{217}$ may each independently be an alkyl group having 1 to 20 carbon atoms, for example, an n-hexyl group, an n-octyl group, an n-decyl group, or an n-dodecyl group, and $R^{218}$ and $R^{219}$ may each be a hydrogen atom.

In Chemical Formula (1), $Ar^1$ and $Ar^2$ may each be a p-phenylene group, and $Ar^4$ may be II-5, in which $R^{216}$ and $R^{217}$ may each independently be an alkyl group having 1 to 20 carbon atoms, for example, an n-hexyl group, an n-octyl group, an n-decyl group, or an n-dodecyl group, and $R^{218}$ and $R^{219}$ may each be a hydrogen atom.

According to these structures, the effect of improving the device life-span in an electroluminescent device using a polymer, particularly, a quantum dot electroluminescent device may be increased.

Alternatively, in the polymer according to an embodiment, in Chemical Formula (1), $Ar^1$ and $Ar^2$ may each independently be II-6 or II-7, and $Ar^4$ may be II-5. In Chemical Formula (1), $Ar^1$ and $Ar^2$ may each independently be a biphenylene group, and $Ar^4$ may be II-5, in which $R^{216}$ and $R^{217}$ may each independently be an alkyl group having 1 to 20 carbon atoms, for example, an n-hexyl group, an n-octyl group, an n-decyl group, or an n-dodecyl group, and $R^{218}$ and $R^{219}$ may each be a hydrogen atom.

In Chemical Formula (1), $Ar^1$ and $Ar^2$ may each be a p-biphenylene group, and $Ar^4$ may be II-5, in which $R^{216}$ and $R^{217}$ may each independently be an alkyl group having 1 to 20 carbon atoms, for example, an n-hexyl group, an n-octyl group, an n-decyl group, or an n-dodecyl group, and $R^{218}$ and $R^{219}$ are each a hydrogen atom.

According to these structures, the effect of improving the device life-span in an electroluminescent device using a polymer, particularly, a quantum dot electroluminescent device may be increased.

Alternatively, in the polymer according to an embodiment, in Chemical Formula (1), $Ar^1$ and $Ar^2$ may each independently be II-6 or II-7, and $Ar^4$ may be II-4. In Chemical Formula (1), $Ar^1$ and $Ar^2$ may each independently be a biphenylene group, and $Ar^4$ may be II-4, in which $R^{214}$ and $R^{215}$ may each independently be an alkyl group having 1 to 20 carbon atoms, for example, an n-hexyl group, an n-octyl group, an n-decyl group, or an n-dodecyl group, and $R^{218}$ and $R^{219}$ may each be a hydrogen atom.

In Chemical Formula (1), $Ar^1$ and $Ar^2$ may each a p-biphenylene group, and $Ar^4$ may be II-4, in which $R^{214}$ and $R^{215}$ may each independently be an alkyl group having 1 to 20 carbon atoms, for example, an n-hexyl group, an n-octyl group, an n-decyl group, or an n-dodecyl group. According to these structures, the effect of improving the device life-span in an electroluminescent device using a polymer, particularly, a quantum dot electroluminescent device may be increased.

Group (II)

II-1

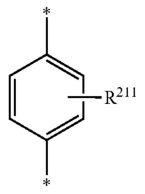

II-2

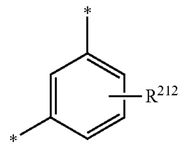

-continued

II-3

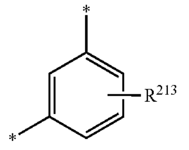

II-4

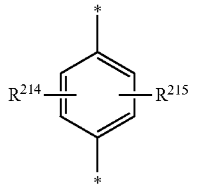

II-5

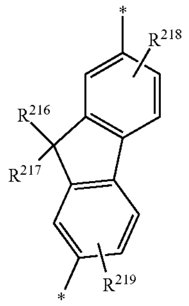

II-6

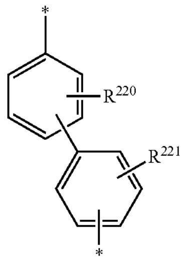

II-7

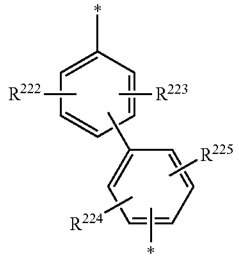

Here, $R^{211}$ to $R^{225}$ may each independently be a hydrogen atom or a linear or branched hydrocarbon group having 1 to 16 carbon atoms, and

* indicates a bonding position with an adjacent atom.

In Chemical Formula (1), "$(R^1)_3$" indicates that three $R^1$s are present.

Each $R^1$ may independently be a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, or a cyano group.

Each $R^1$ may be the same as or different from each other.

In Chemical Formula (1), "$(R^2)_4$" indicates that four $R^2$s are present.

Each $R^2$ may each independently be a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, or a cyano group.

Each $R^2$ may be the same as or different from each other.

Each of $R^1$ and $R^2$ may be the same as or different from each other.

Each of the above groups which may each constitute $R^1$ and $R^2$ is not particularly limited, and the substituents in the case where $Ar^1$ to $Ar^5$ are groups substituted with substituents may be exemplified.

In Chemical Formula (2), "$(Ar^6)_4$" indicates that four $Ar^6$s are present.

Each $Ar^6$ may independently be a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond.

Each $Ar^6$ may be the same as or different from each other.

In Chemical Formula (2), "$(Ar^7)_5$" indicates that five $Ar^7$s are present.

Each $Ar^7$ may independently be a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond.

Each $Ar^7$ may be the same as or different from each other.

Two or more $Ar^7$s may form a condensed ring with the benzene ring to which two or more $Ar^7$s are bonded, and In Chemical Formula (3), "$(Ar^8)_3$" indicates that three $Ar^8$s are present.

Each $Ar^8$ may be independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond.

Each $Ar^8$ may be the same as or different from each other.

In Chemical Formula (3), "$(Ar^9)_4$" indicates that four $Ar^9$s are present.

Each $Ar^9$ may independently be a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond.

Each $Ar^8$ may be the same as or different from each other.

Two or more $Ar^9$s may form a condensed ring with the benzene ring to which two or more $Ar^9$s are bonded.

Each $Ar^6$ and each $Ar^F$ may be the same as or different from each other.

Each $Ar^8$ and each $Ar^9$ may be the same as or different from each other.

The alkyl group, hydroxyalkyl group, alkoxy group, alkoxyalkyl group, alkenyl group, alkynyl group, alkylthio group, and alkoxycarbonyl group which may each constitute $Ar^6$, $Ar^7$, $Ar^8$, and $Ar^9$ are not particularly limited.

Although these groups are not particularly limited, for example, when $Ar^1$ to $Ar^5$ are substituted with a substituent, the groups as an example of the substituent may be exemplified.

The monovalent aromatic hydrocarbon group having 6 to 60 carbon atoms, which may constitute $Ar^6$, $Ar^7$, $Ar^8$, and $Ar^9$, respectively, is not particularly limited.

Examples of the aromatic hydrocarbon group constituting $Ar^6$, $Ar^7$, $Ar^8$, and $Ar^9$ include a monovalent group derived from an aromatic hydrocarbon ring such as benzene (phenylene group), indene, naphthalene, anthracene, azylene, heptalene, acenaphthene, phenalene, fluorene, phenanthrene, pyrene, and the like, a monovalent group derived from a ring set of two or more aromatic hydrocarbon rings bonded through a single bond such as biphenyl (biphenylene group), terphenyl (terphenylene group), quarterphenyl (quaterphenylene group), quinkphenyl (quinkphenylene group), sexyphenyl (sexyphenylene group), and the like.

The monovalent aromatic heterocyclic ring group having 3 to 60 ring atoms, which may constitute $Ar^6$, $Ar^7$, $Ar^8$, and $Ar^9$, respectively, is not particularly limited.

Examples of the aromatic heterocyclic ring group which can each constitute $Ar^6$, $Ar^7$, $Ar^8$, and $Ar^9$ may include a monovalent group derived from an aromatic heterocyclic ring such as acridine, phenazine, benzoquinoline, benzoisoquinoline, phenanthridine, phenanthroline, anthraquinone, Fluorenone, dibenzofuran, dibenzothiophene, carbazole, imidazo phenanthridine, benzimidazo phenanthridine, azadibenzofuran, azacarbazole, azadibenzothiophene, diazadibenzofuran, diazacarbazole, diazadibenzothiophene, xanthone, thioxanthone, pyridine, quinoline, and anthraquinone, and a monovalent group derived from a ring set of two or more aromatic heterocyclic rings bonded through a single bond, such as bipyridine, bipyrimidine, bipyrazine, and the like.

The substituted or unsubstituted monovalent ring set group which may each constitute $Ar^6$, $Ar^7$, $Ar^8$, and $Ar^9$, and including a structure in which one or more aromatic hydrocarbon ring having 1 to 60 carbon atoms and one or more aromatic heterocyclic rings having 3 to 60 ring atoms are bonded through a single bond, is not particularly limited.

In the monovalent ring set group which can constitute $Ar^6$, $Ar^7$, $Ar^8$, and $Ar^9$, respectively, the aromatic hydrocarbon ring having 6 to 60 carbon atoms may be, for example, a ring exemplified as the aromatic hydrocarbon ring which constitutes the monovalent aromatic hydrocarbon group having 6 to 60 carbon atoms.

In the monovalent ring set group which can constitute $Ar^6$, $Ar^7$, $Ar^8$, and $Ar^9$, respectively, the aromatic heterocyclic ring having 3 to 60 ring atoms may be, for example, a ring exemplified as the aromatic heterocyclic ring which constitutes the monovalent aromatic heterocyclic ring group having 3 to 60 ring atoms.

The number of aromatic hydrocarbon rings having 6 to 60 carbon atoms in the monovalent ring set group which may each constitute $Ar^6$, $Ar^7$, $Ar^8$, and $Ar^9$ is not particularly limited as long as it is 1 or more, but, for example, it may be 1 or more and 5 or less, for example, 1 or more and 3 or less, for example, 1 or more and 2 or less, or for example 1.

In the ring set group, the number of aromatic heterocyclic rings having 3 to 60 ring atoms is not particularly limited as long as it is 1 or more, but may be, for example, 1 or more and 5 or less, for example, 1 or more and 3 or less, for example, 1 or more and 2 or less, or for example 1.

When $Ar^6$, $Ar^7$, $Ar^8$, and $Ar^9$ are groups substituted with a substituent, the number of substituents is not particularly limited. The number of substituents in $Ar^6$, $Ar^7$, $Ar^8$, and $Ar^9$ may each independently be, for example, 1 or more and 3 or less, for example, 1 or more and 2 or less, or for example 2.

When $Ar^6$, $Ar^7$, $Ar^8$, and $Ar^9$ are groups substituted with a substituent, the type of the substituent is not particularly limited.

When $Ar^6$, $Ar^7$, $Ar^8$, and $Ar^9$ are groups substituted with a substituent, the type of the substituent may be, for example, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, an alkylthioalkyl group, a hydroxyl group, a carboxyl group, a thiol group, a cyano group, a halogen group, and the like, but is not limited thereto.

When $Ar^6$, $Ar^7$, $Ar^8$, and $Ar^9$ are groups substituted with a substituent, each of the alkyl group, hydroxyalkyl group, alkoxy group, alkoxyalkyl group, alkenyl group, alkynyl group, alkylthio group, an alkoxycarbonyl group, and halogen group as the substituents are not particularly limited.

Examples of these groups include those exemplified as examples of the substituent in the case where $Ar^1$ to $Ar^5$ are groups substituted with a substituent.

When $Ar^6$ and $Ar^F$ are groups substituted with a substituent, the substituents may be the same as or different from each other.

When two or more each of $Ar^6$s and $Ar^7$s are present, and at the same time, when two or more $Ar^6$s and two or more $Ar^7$s are groups substituted with a substituent, the substituents of each $Ar^6$ and $Ar^F$ may be the same as or different from each other.

When each of $Ar^6$s and $Ar^7$s is a substituted group and has two or more corresponding substituents, the two or more corresponding substituents in each of $Ar^6$ and $Ar^F$ may be the same as or different from each other.

When $Ar^8$ and $Ar^9$ are groups substituted with a substituent, the substituents may be the same as or different from each other.

When two or more of each of $Ar^8$s and $Ar^9$s are present, and at the same time, when two or more $Ar^8$s and two or more $Ar^9$s are substituted groups, the substituents of each $Ar^8$s and $Ar^9$s may be the same as or different from each other.

When $Ar^8$ and $Ar^9$ are each substituted with a substituent and each has two or more corresponding substituents, in each of $Ar^8$ and $Ar^9$, two or more corresponding substituents may be the same as or different from each other.

The group which may each constitute $Ar^6$, $Ar^7$, $Ar^8$, and $Ar^9$ may be a hydrogen atom, a substituted or unsubstituted monovalent aromatic hydrocarbon group having 6 to 60 carbon atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond.

In an embodiment, the groups each constituting $Ar^6$, $Ar^7$, $Ar^8$, and $Ar^9$ may be a hydrogen atom or a substituted or unsubstituted monovalent aromatic hydrocarbon group having 6 to 60 carbon atoms.

For example, the groups each constituting $Ar^6$, $Ar^7$, $Ar^8$, and $Ar^9$ may be a hydrogen atom or a substituted or unsubstituted aromatic hydrocarbon group having 6 to 12 carbon atoms.

For example, the groups each constituting $Ar^6$, $Ar^7$, $Ar^8$, and $Ar^9$ may be a hydrogen atom, a substituted or unsubstituted phenyl group, a substituted or unsubstituted fluorenyl group, or a substituted or unsubstituted biphenyl group.

For example, the groups each constituting $Ar^6$, $Ar^7$, $Ar^8$, and $Ar^9$ may be a hydrogen atom, a phenyl group, a fluorenyl group, or a biphenyl group.

3 or 4 of the 4 $Ar^6$s may be hydrogen atoms.

3, 4, or 5 of the 5 $Ar^7$s may be hydrogen atoms.

3 of the 3 $Ar^8$s may be hydrogen atoms.

4 of the 4 $Ar^9$s may be hydrogen atoms.

When two or more $Ar^7$s form a condensed ring with the benzene ring to which they are bonded, and when two or more $Ar^9$s form a condensed ring with the benzene ring to which they are bonded, the condensed ring is not particularly limited as long as it is a condensed ring including a benzene ring.

The condensed ring including a benzene ring may be an aromatic hydrocarbon ring or an aromatic heterocyclic ring, but may be, for example, an aromatic hydrocarbon ring, for example, an aromatic hydrocarbon ring having 9 to 60 carbon atoms, for example, an aromatic hydrocarbon ring having 10 to 22 carbon atoms.

The aromatic hydrocarbon ring having 9 to 60 carbon atoms is not particularly limited, and examples thereof may include indene, naphthalene, anthracene, acenaphthene, phenalene, fluorene, phenanthrene, and pyrene. In an embodiment, the aromatic hydrocarbon ring having 9 to 60 carbon atoms may be naphthalene.

In Chemical Formula (2), X may be S, O, or C substituted with two substituted or unsubstituted linear or branched hydrocarbon groups having 1 to 16 carbon atoms.

Here, "C substituted with two substituted or unsubstituted linear or branched hydrocarbon groups" means that C is substituted with two linear or branched hydrocarbon groups having 1 to 16 carbon atoms, and at the same time, the hydrocarbon groups are each substituted or may be unsubstituted.

In C substituted with two linear or branched hydrocarbon groups having 1 to 16 carbon atoms that may constitute X, the two linear or branched hydrocarbon groups having 1 to 16 carbon atoms may be the same as or different from each other, from the viewpoint of improving the device life-span, they may be the same as each other.

In C substituted with two linear or branched hydrocarbon groups having 1 to 16 carbon atoms that may constitute X, the linear or branched hydrocarbon group having 1 to 16 carbon atoms is not particularly limited.

The linear or branched hydrocarbon group having 1 to 16 carbon atoms may be any one of an alkyl group, an alkenyl group, or an alkynyl group.

The linear or branched alkyl group having 1 to 16 carbon atoms is not particularly limited but may be, for example, a linear alkyl group such as a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, and the like, a branched alkyl group such as an isopropyl group, an isobutyl group, a sec-butyl group, a tert-butyl group, an isopentyl group, a tert-pentyl group, a neopentyl group, a 1,2-dimethyl propyl group, an isohexyl group, a 1,3-dimethylbutyl group, a 1-isopropyl propyl group, a 1,2-dimethylbutyl group, a 1,4-dimethyl pentyl group, a 3-ethyl pentyl group, a 2-methyl-1-isopropyl propyl group, a 1-ethyl-3-methyl butyl group, a 2-ethylhexyl group, a 3-methyl-1-isopropyl butyl group, a 2-methyl-1-isopropyl group, a 1-tert-butyl-2-methyl propyl group, a 3,5,5-trimethyl hexyl group, isodecyl group, a 1-methyldecyl group, a vinyl group, an allyl group, an 1-propenyl group, a 2-butenyl group, a 1,3-butadienyl group, a 2-pentenyl group, and the like.

The linear or branched alkenyl group having 1 to 16 carbon atoms is not particularly limited but may be, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, a 1,3-butadienyl group, and the like.

The linear or branched alkynyl group having 1 to 16 carbon atoms is not particularly limited but may be, for example, an acetylenyl group (ethynyl group), a 1-propynyl group, a 2-propynyl group (propargyl group), a 1-butynyl group, a 2-butynyl group, a 3-butynyl group, a 1-pentynyl group, a 2-pentynyl group, a 3-pentynyl group, a 1-hexynyl group, a 2-hexynyl group, a 3-hexynyl group, a 1-heptynyl group, a 2-heptyl group a 5-heptynyl group, a 1-octynyl group, a 3-octynyl group, a 5-octynyl group, and the like.

The linear or branched hydrocarbon group having 1 to 16 carbon atoms may be a group substituted with a substituent and the number of substituents is not particularly limited.

The linear or branched hydrocarbon group having 1 to 16 carbon atoms may be a group substituted with a substituent, the type of the substituent is not particularly limited.

In the case of the linear or branched hydrocarbon group having 1 to 16 carbon atoms substituted with a substituent, the type of the substituent may be, for example, a hydroxyl group, a carboxyl group, a thiol group, a cyano group, a halogen group, and the like, but it is not limited thereto.

Although the halogen is not particularly limited, and the substituents in the case where $Ar^1$ to $Ar^5$ are groups substituted with substituents may be exemplified.

In the two linear or branched hydrocarbon groups having 1 to 16 carbon atoms, the substituents substituting them may be the same as or different from each other.

When the linear or branched hydrocarbon group having 1 to 16 carbon atoms is substituted with a substituent, and each has two or more corresponding substituents, the two or more corresponding substituents may be the same as or different from each other.

In C substituted with two substituted or unsubstituted linear or branched hydrocarbon groups having 1 to 16 carbon atoms, which may constitute X, the two substituted or unsubstituted linear or branched hydrocarbon groups having 1 to 16 carbon atoms are not particularly limited. The two substituted or unsubstituted linear or branched hydrocarbon groups having 1 to 16 carbon atoms may be an alkyl group, for example, a linear or branched alkyl group having 1 to 18 carbon atoms. For example, it may be a linear alkyl group having 1 to 8 carbon atoms, for example, a methyl group.

In Chemical Formulas (2) and (3), * represents a bonding position with an adjacent atom, that is, * is a bonding position with a nitrogen atom of an adjacent carbazole ring of Chemical Formula (1).

In the polymer according to an embodiment, the structural unit represented by Chemical Formula (1) may satisfy the following conditions.

That is, in Chemical Formula (1), each $R^1$ all represents a hydrogen atom, each $R^2$ all represents a hydrogen atom, each $Ar^6$ is each independently a hydrogen atom, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^F$ is each independently a hydrogen atom, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, two or more $Ar^7$s may form a condensed ring with the benzene ring to which two or more $Ar^7$s are bonded, each $Ar^8$ is independently a hydrogen atom, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^9$ is independently a hydrogen atom, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, X is S, O, or C substituted with two unsubstituted linear or branched hydrocarbon groups having 1 to 16 carbon atoms, and two or more $Ar^9$s may form a condensed ring with the benzene ring to which two or more $Ar^9$s are bonded.

According to the above structure, the effect of improving the device life-span in an electroluminescent device using a polymer, particularly, a quantum dot electroluminescent device may be increased.

The polymer according to an embodiment may include at least one structural unit selected from Group (A). In an embodiment, the structural unit represented by Chemical Formula (1) included in the polymer may be at least one structural unit selected from Group (A).

Group (A)

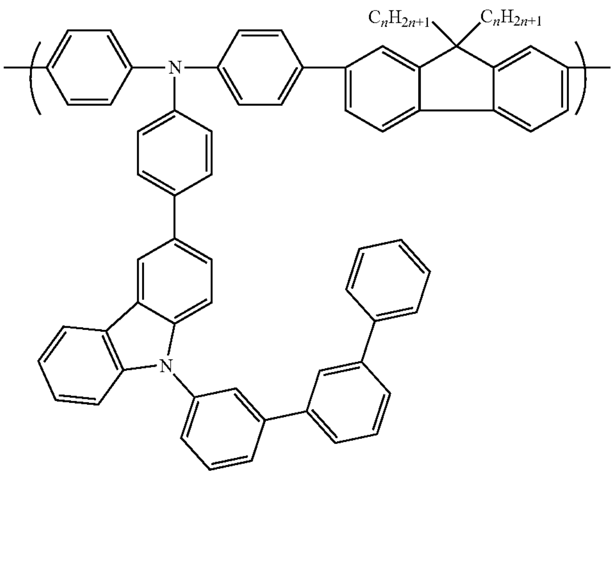

-continued
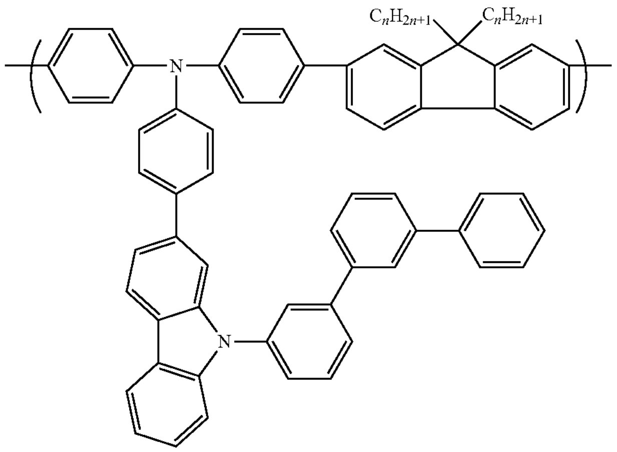
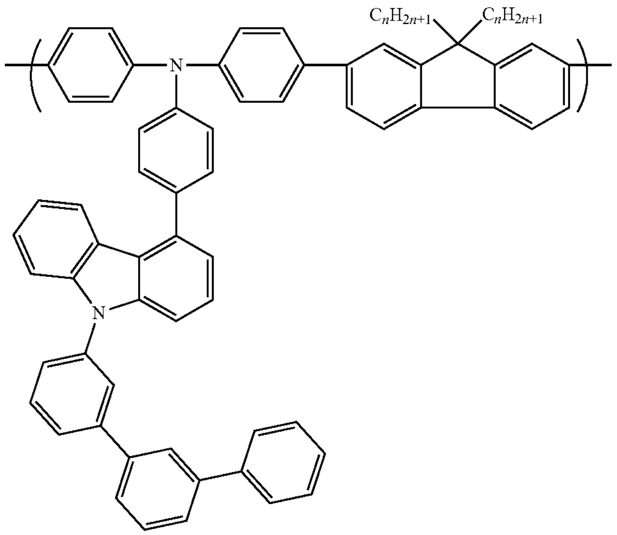
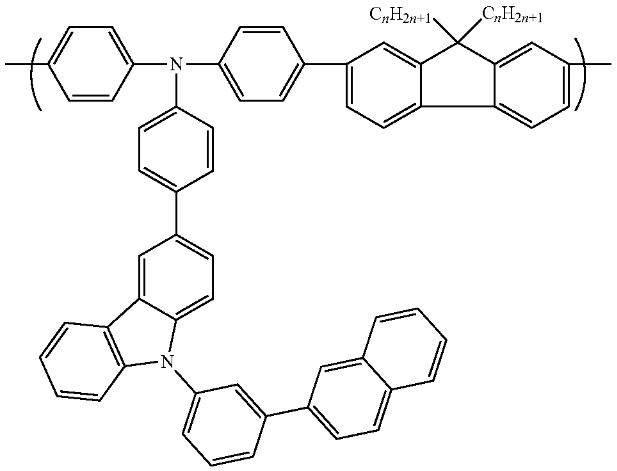

-continued
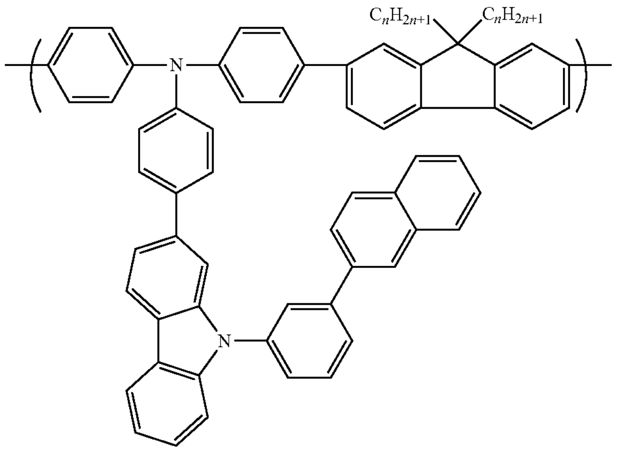
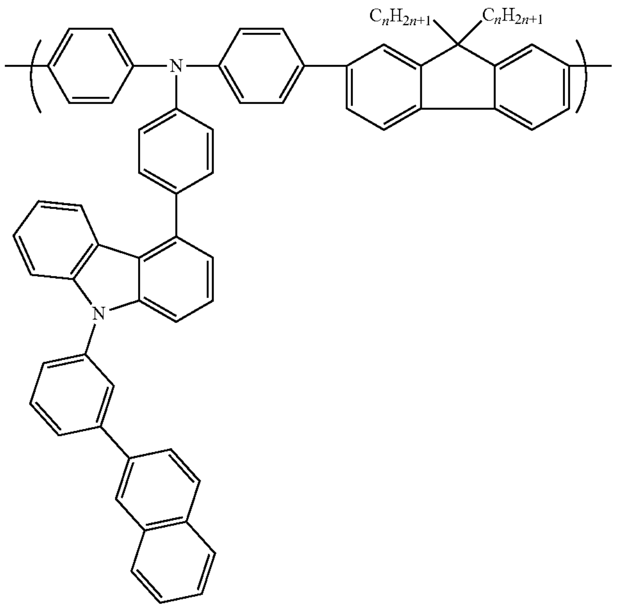
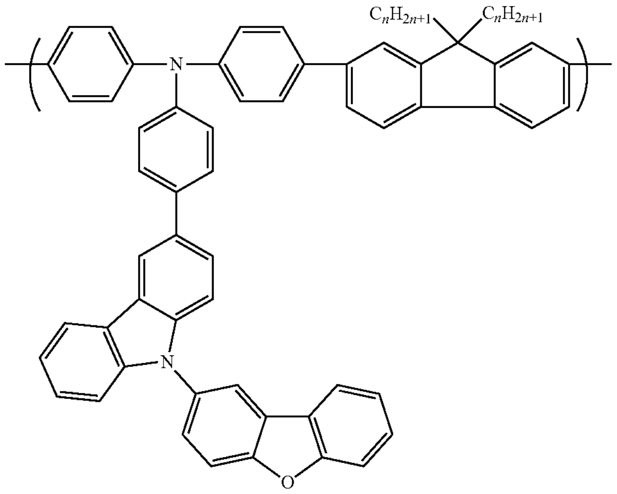

-continued
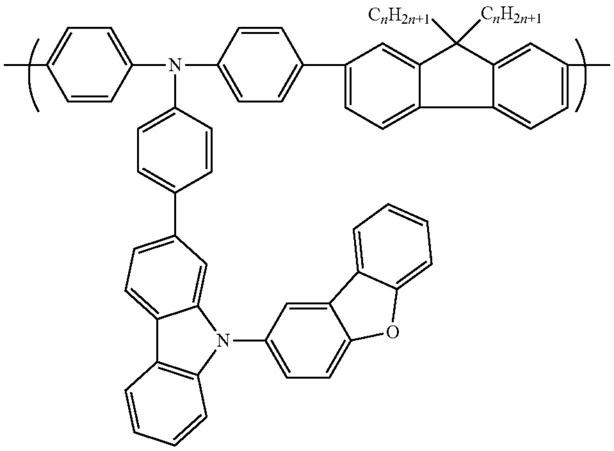
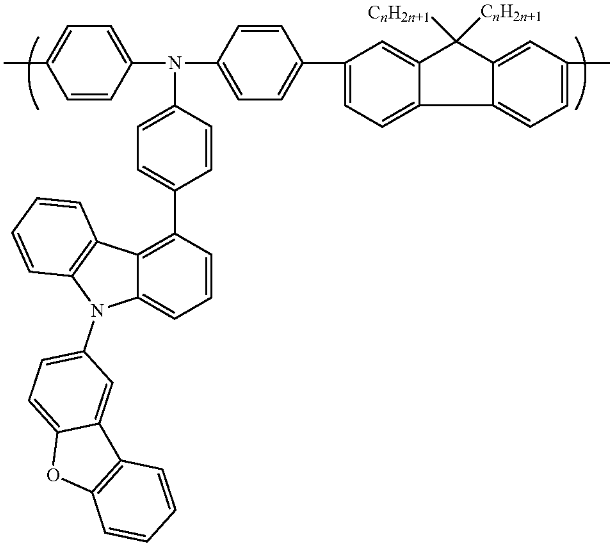
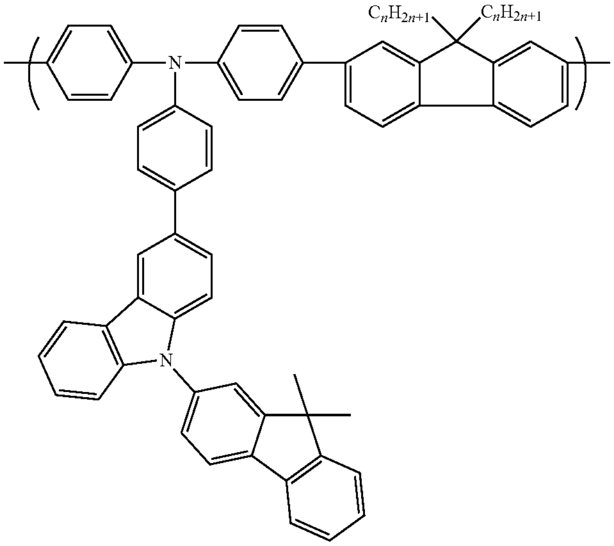

-continued
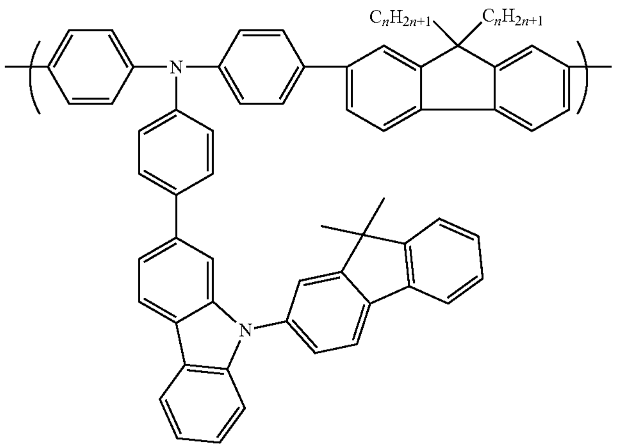
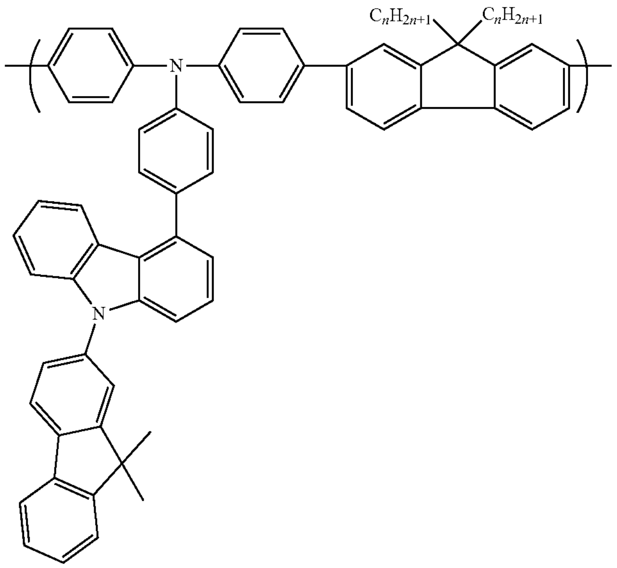
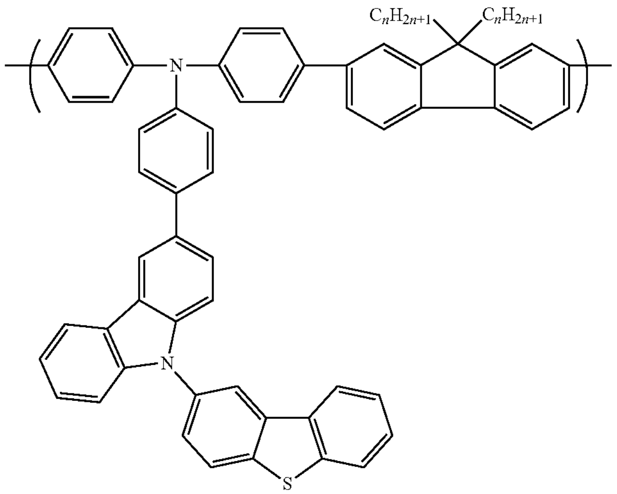

-continued
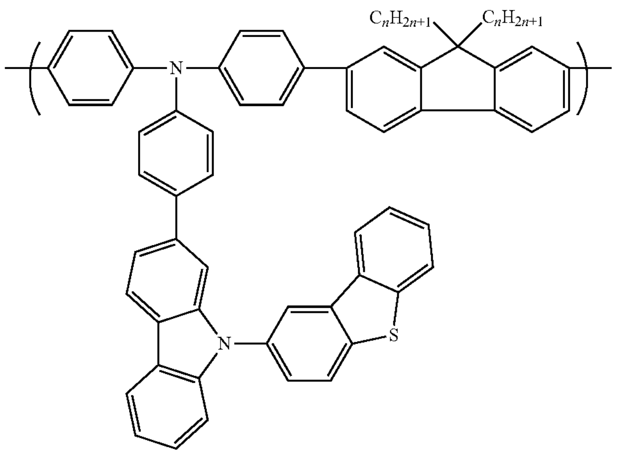
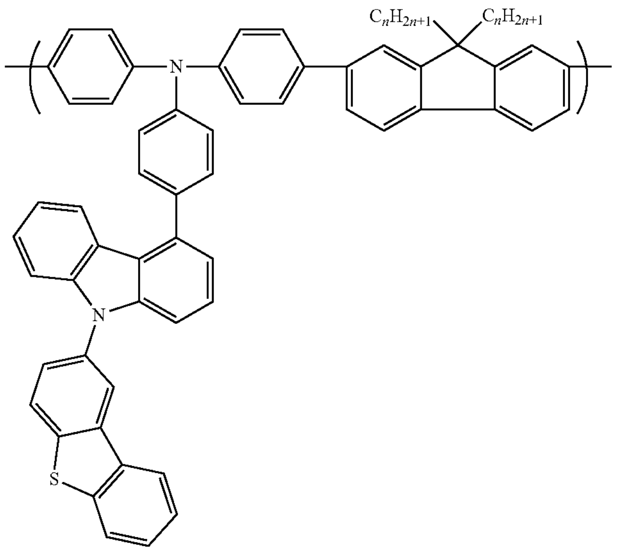
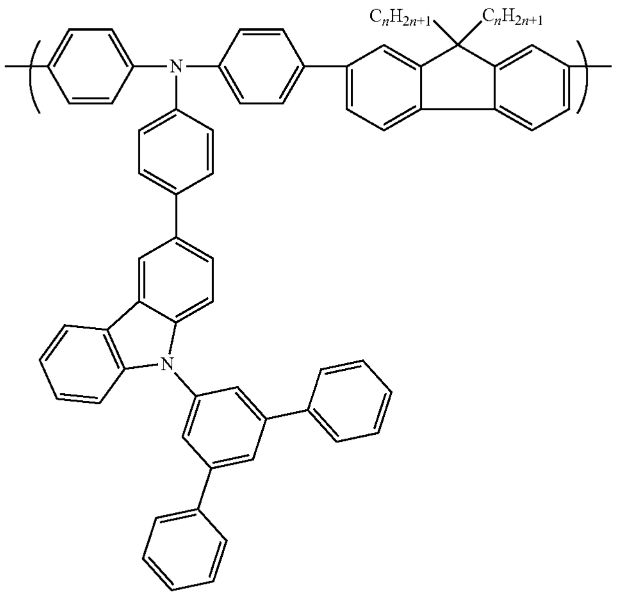

-continued
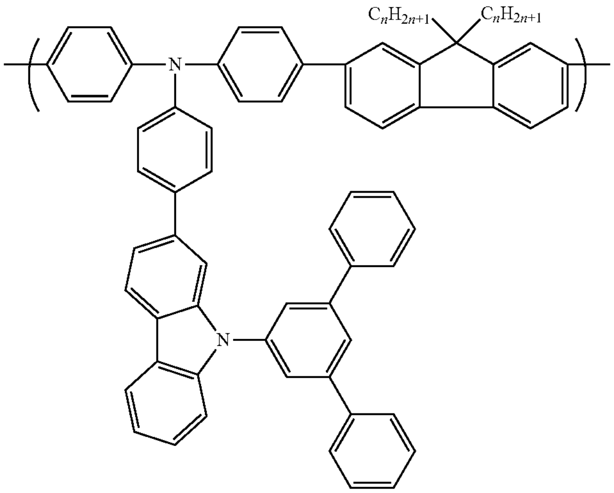
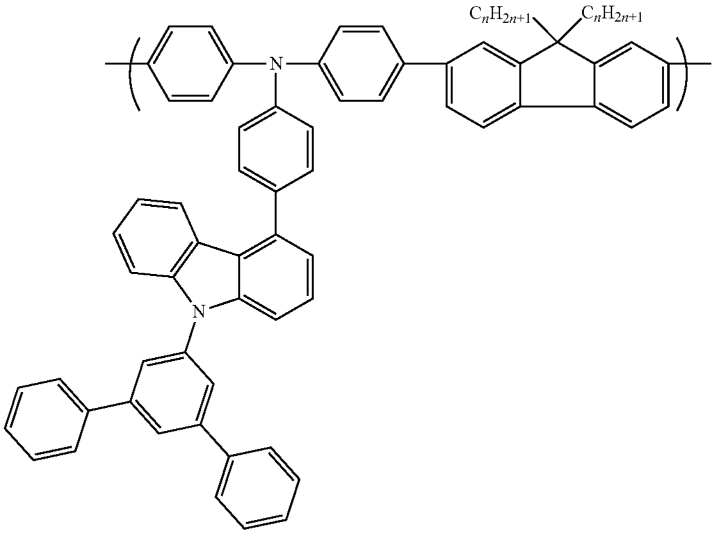
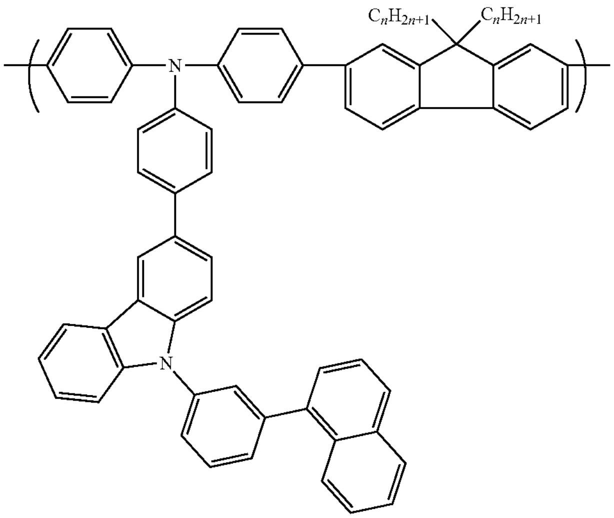

-continued
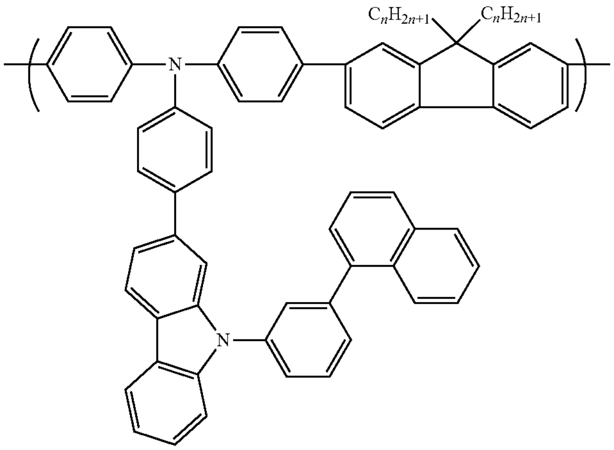
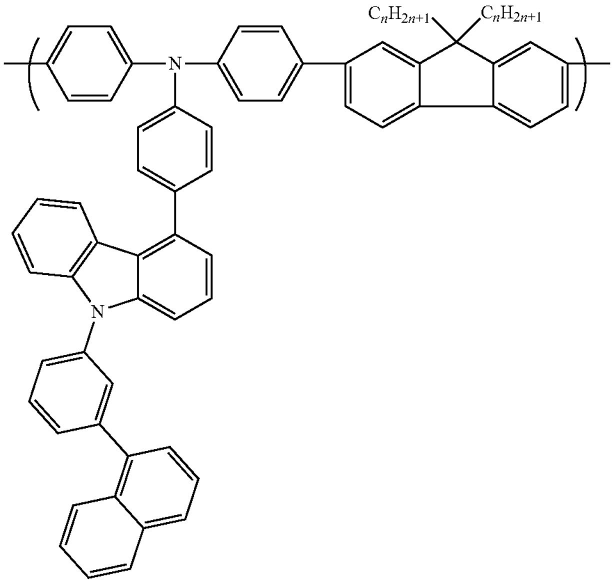
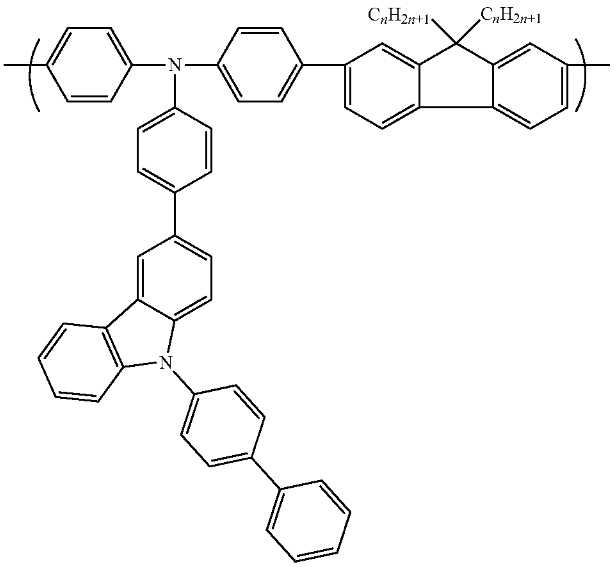

-continued
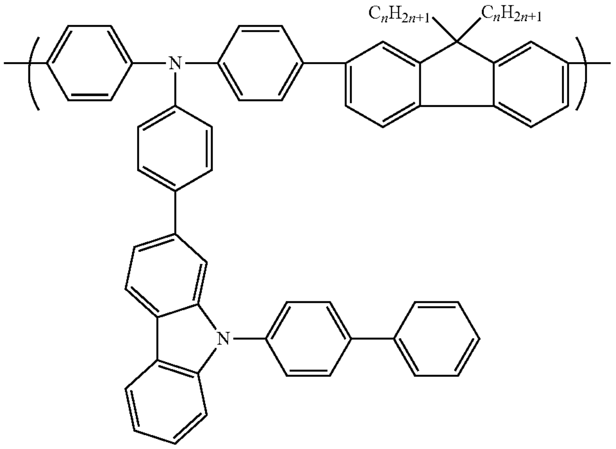
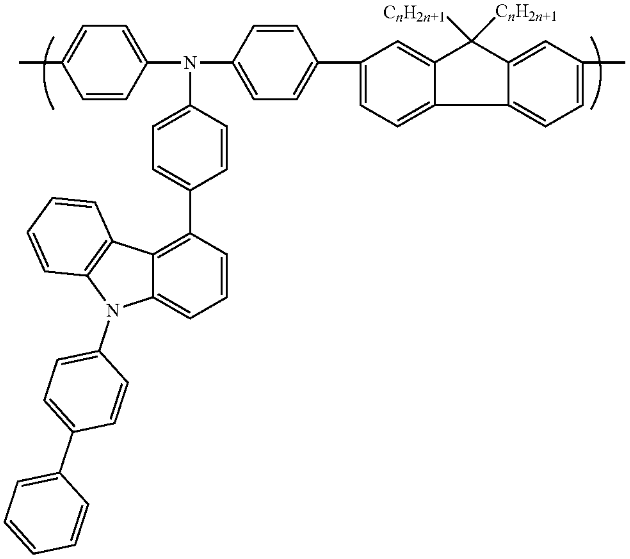
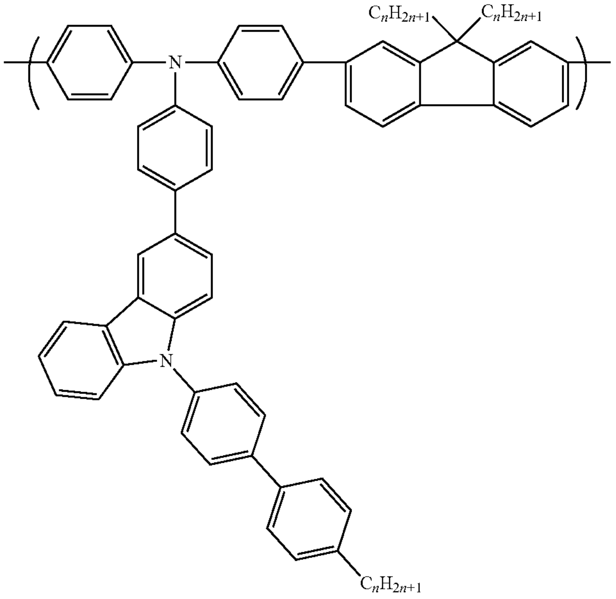

-continued
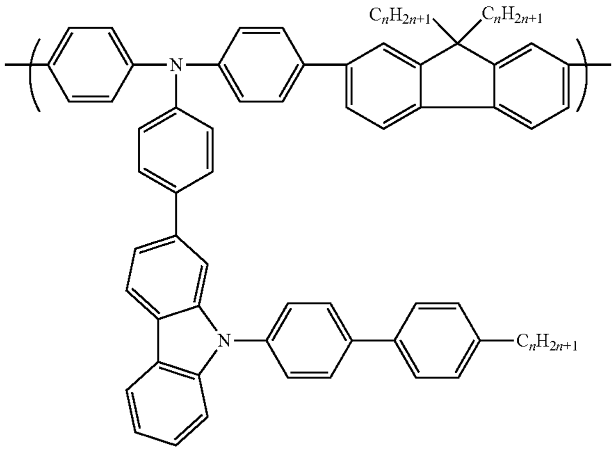
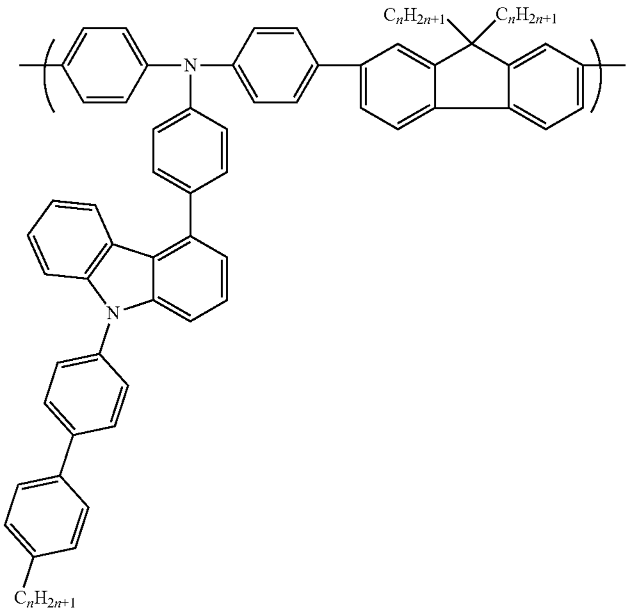
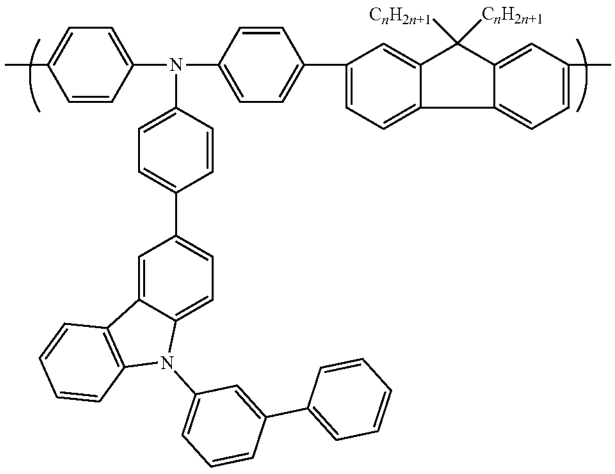

-continued
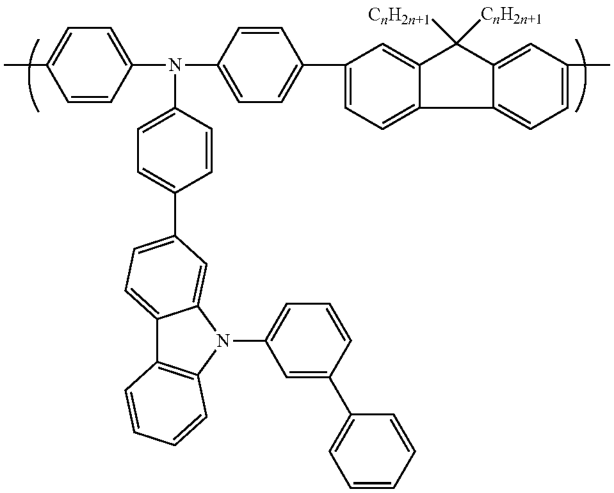
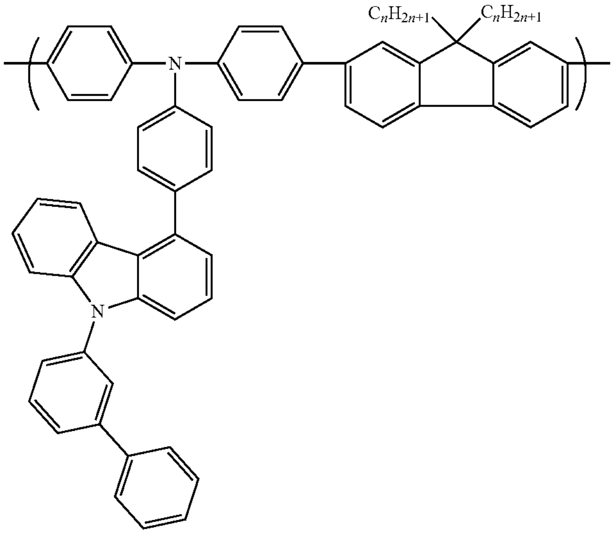
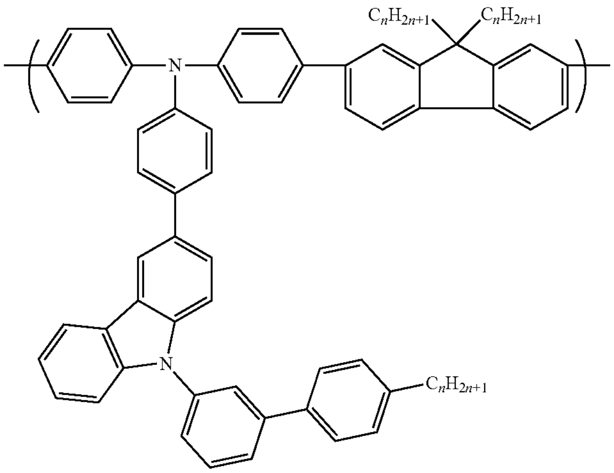

-continued
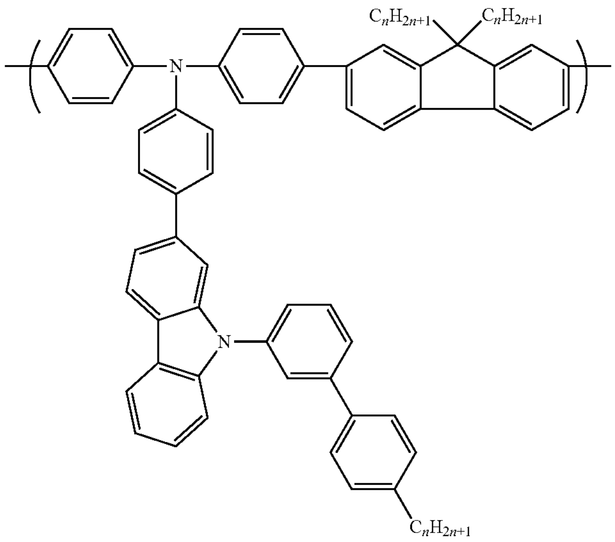
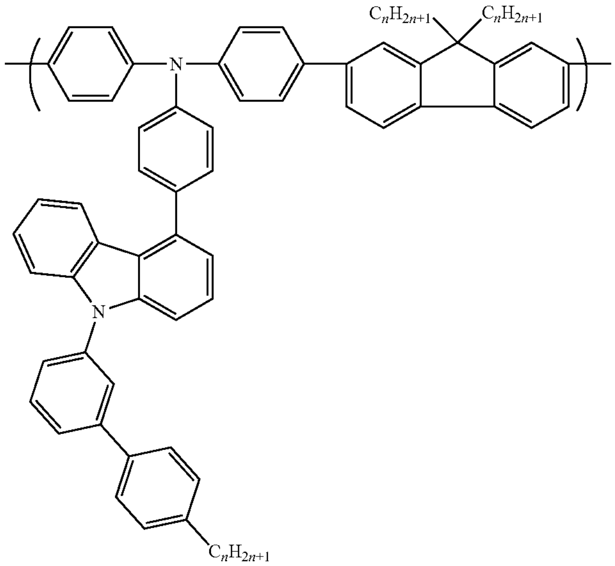

-continued
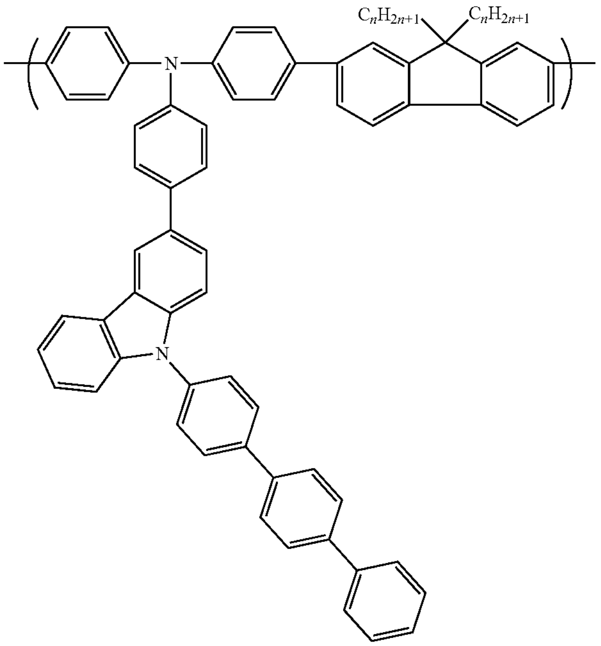
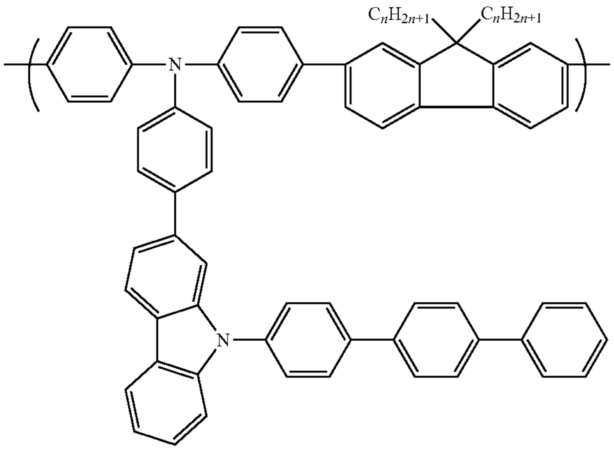

-continued
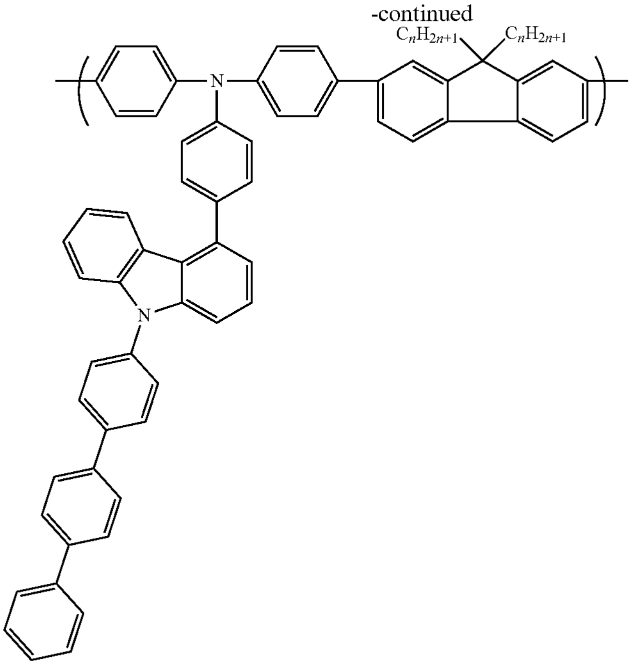
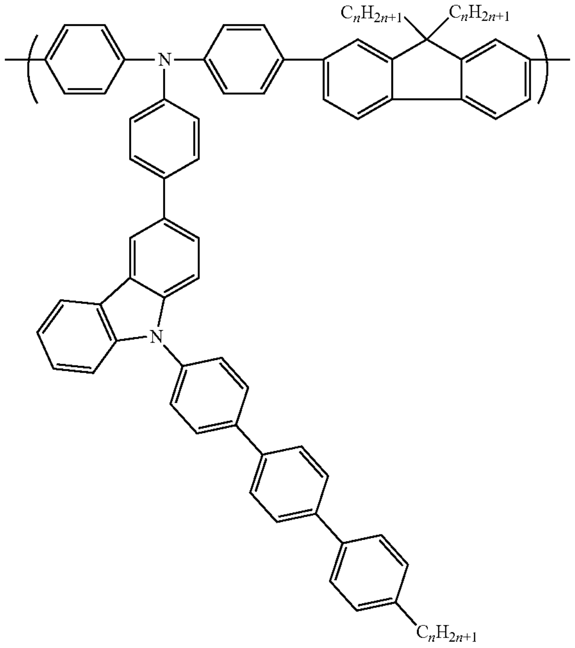

-continued
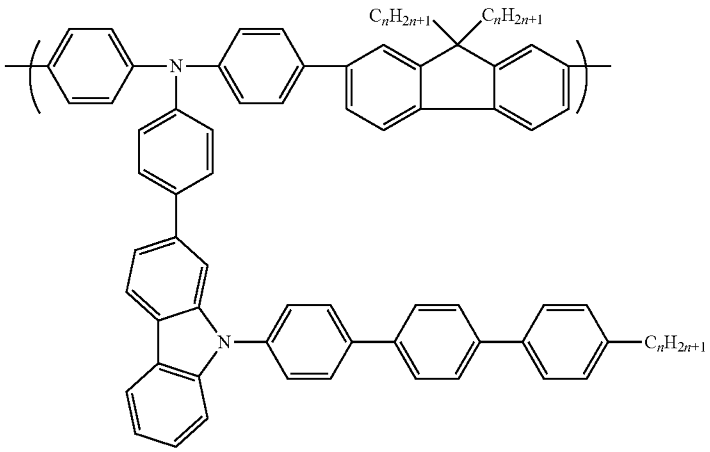
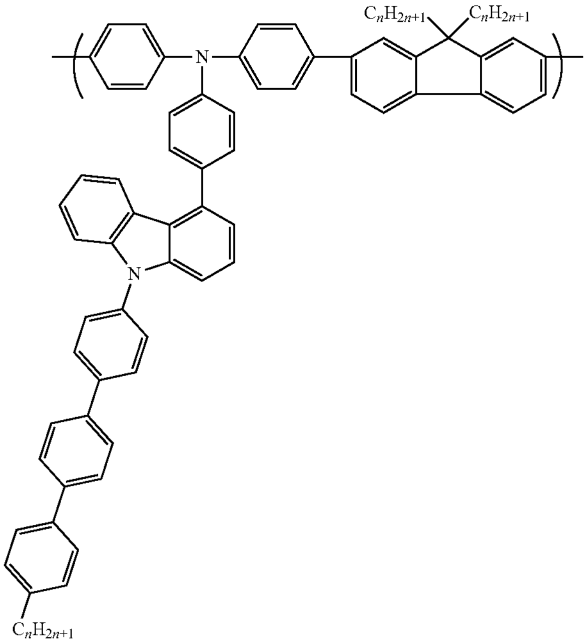
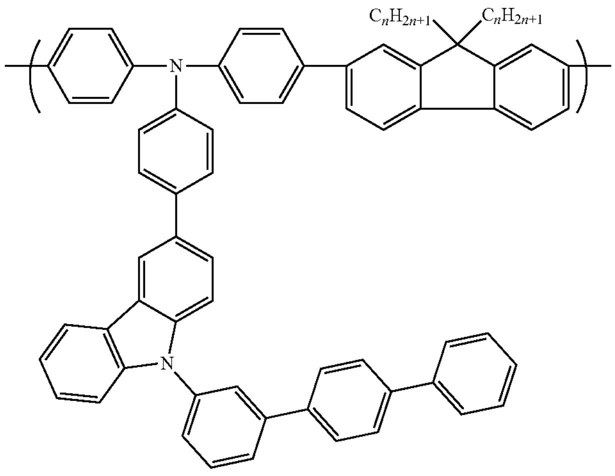

-continued
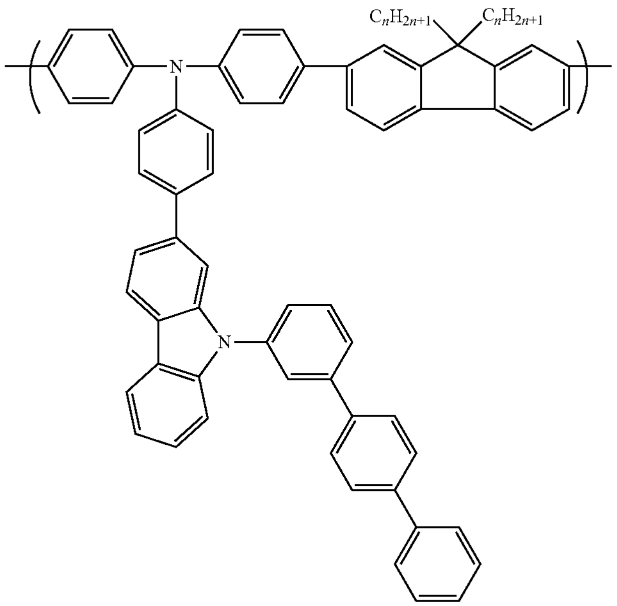
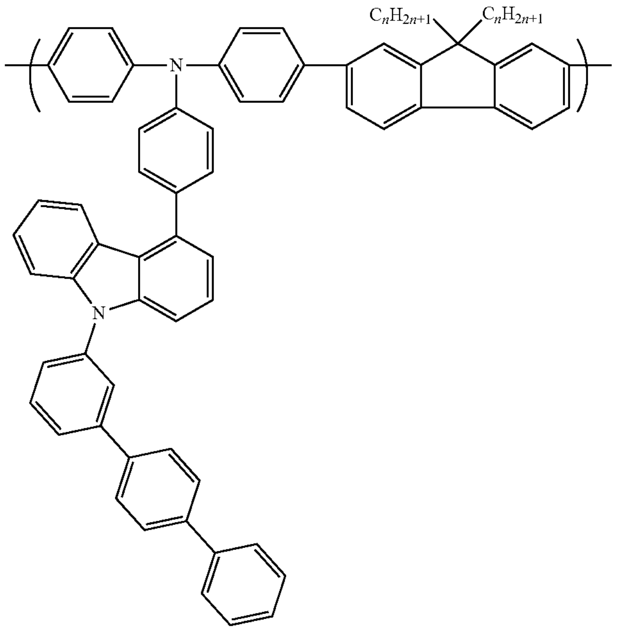
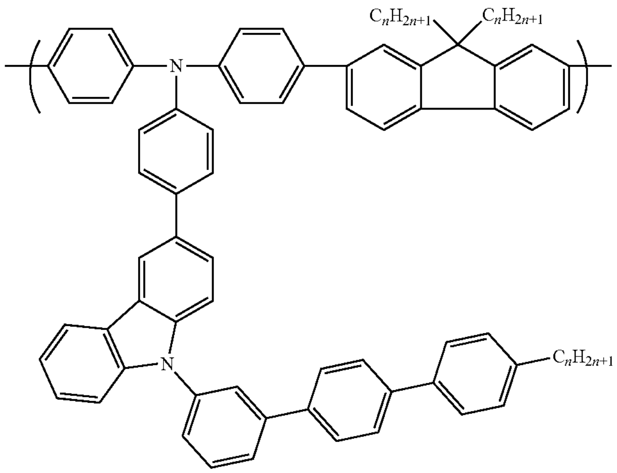

-continued
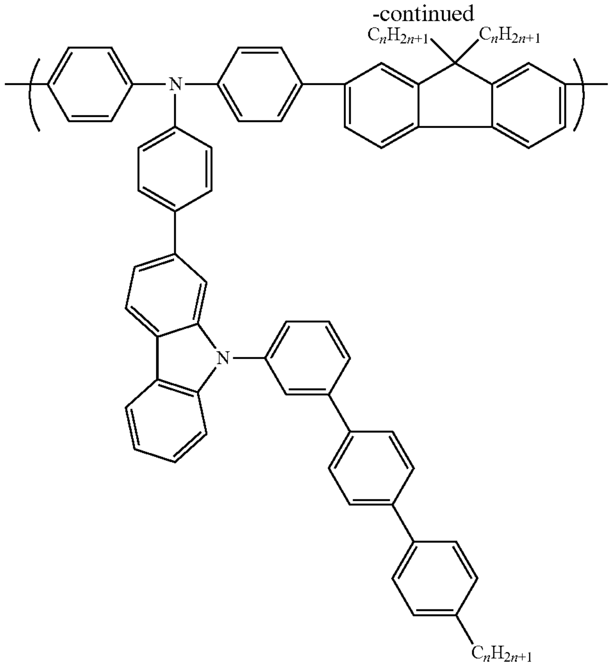
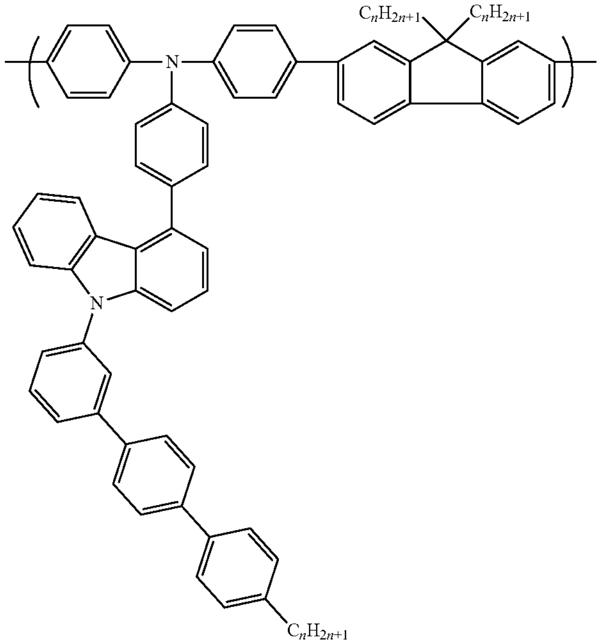

-continued
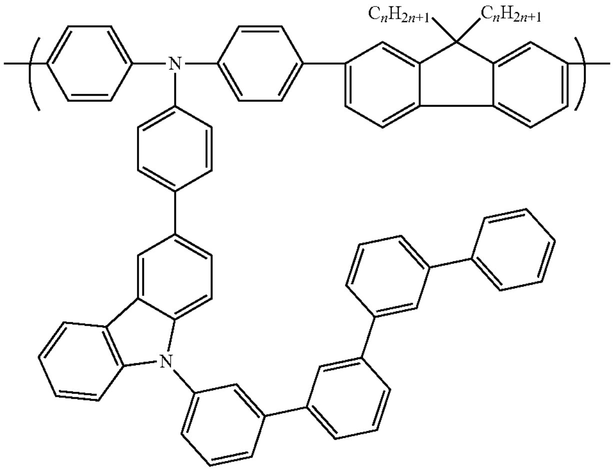
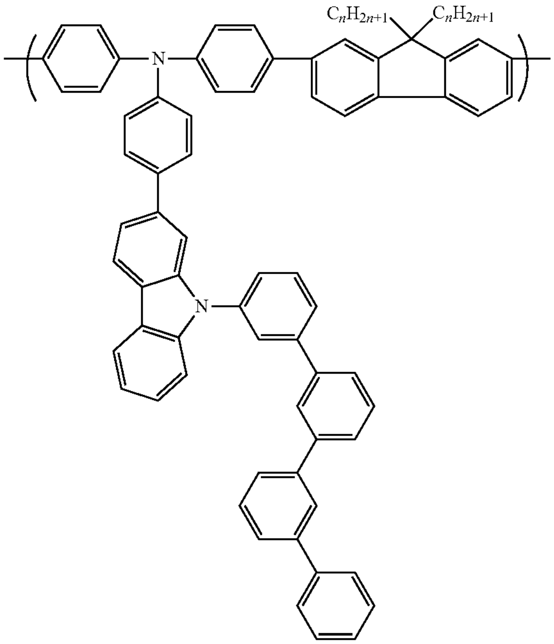
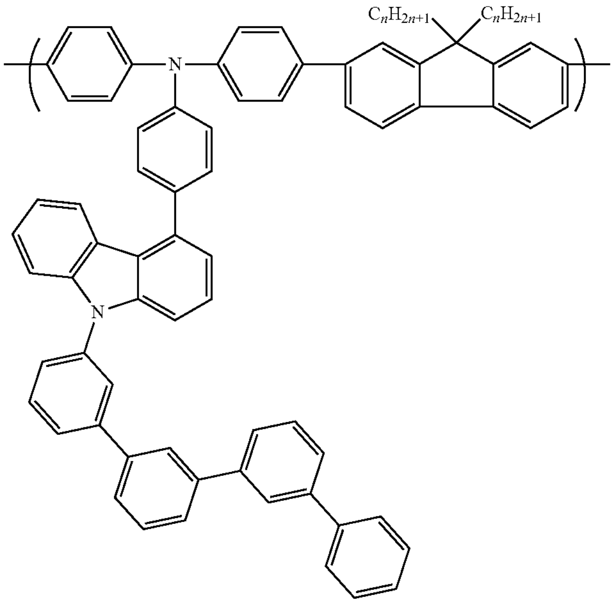

-continued
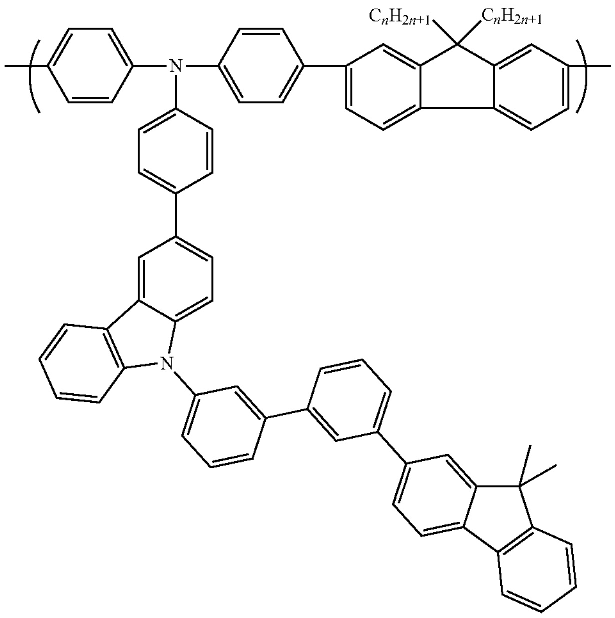
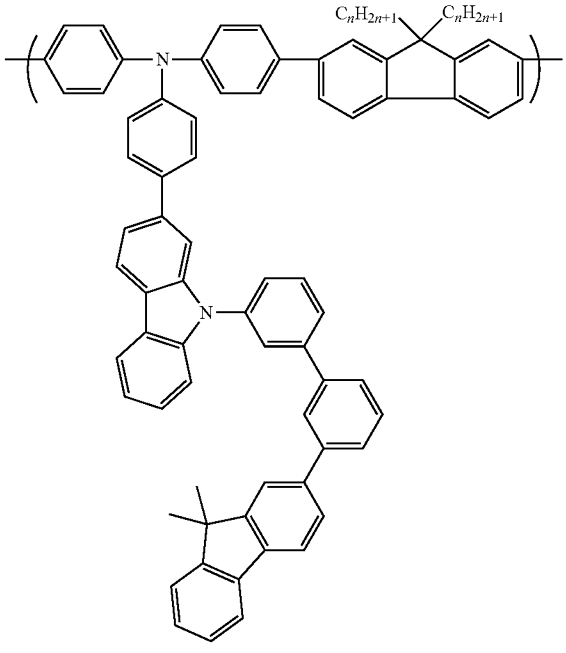

-continued
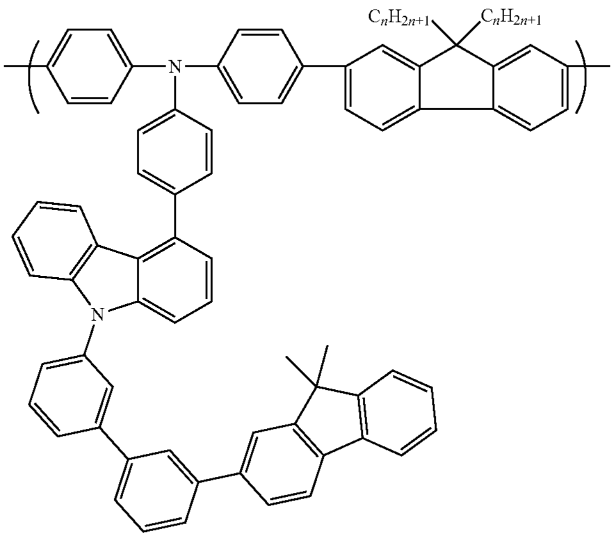
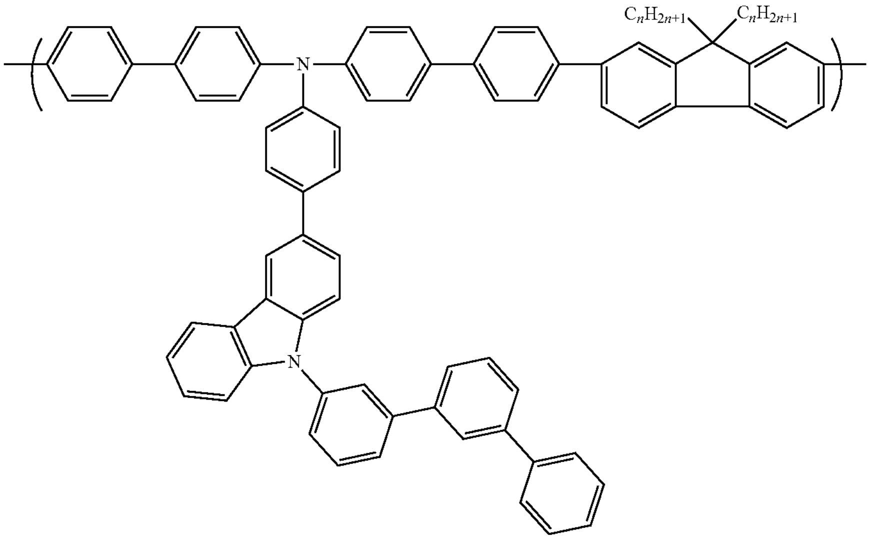
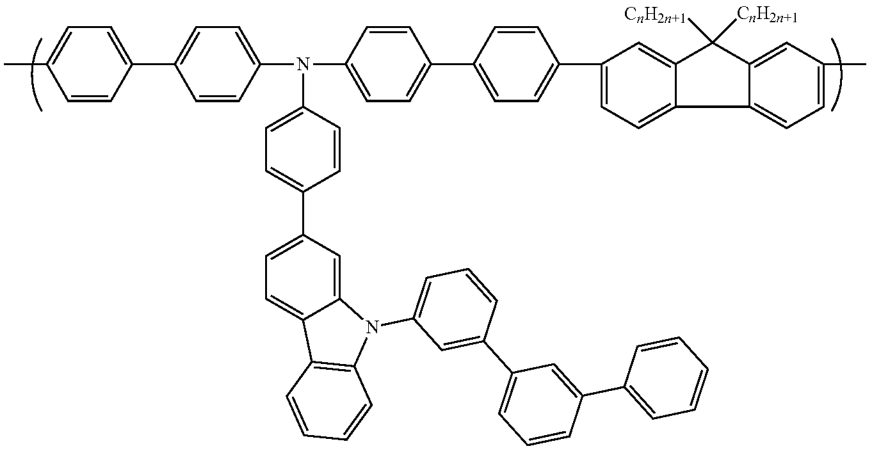

-continued
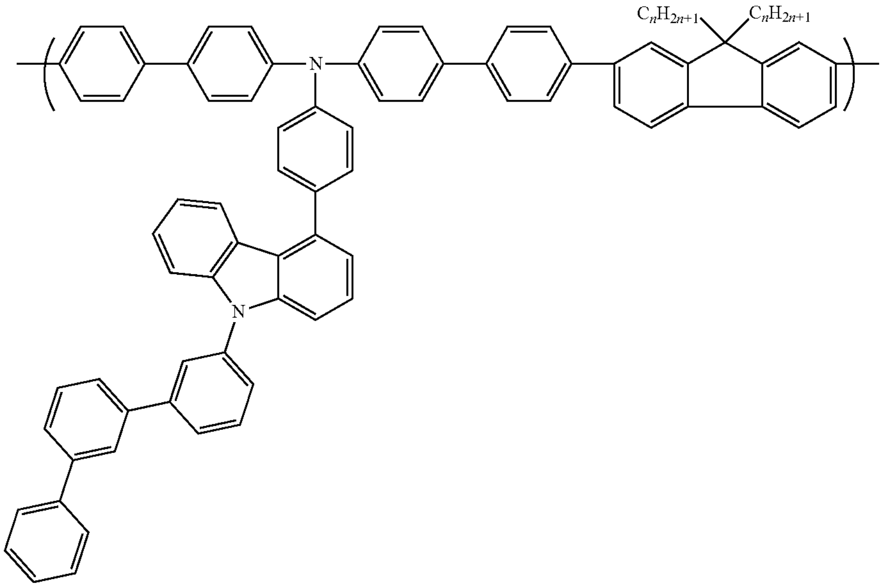
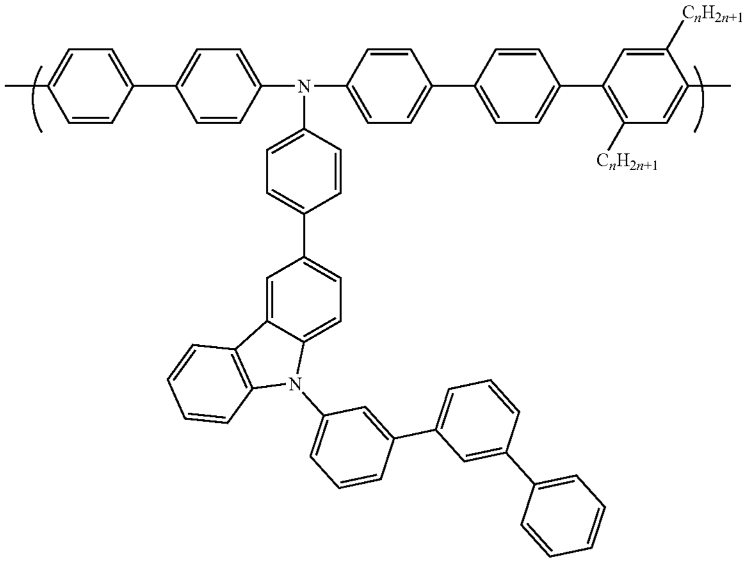
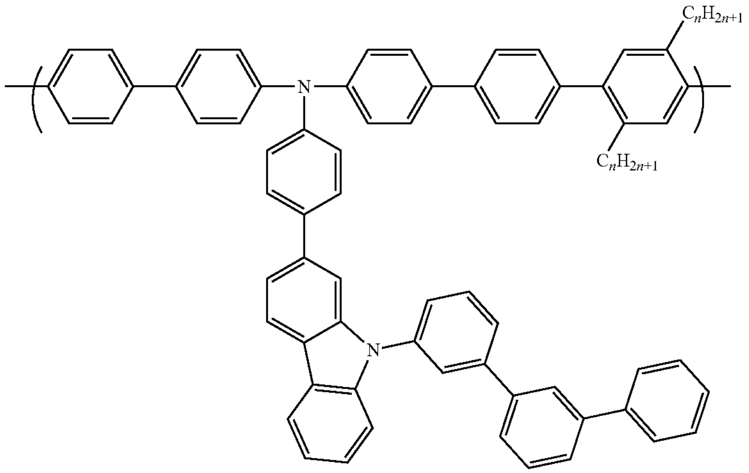

-continued

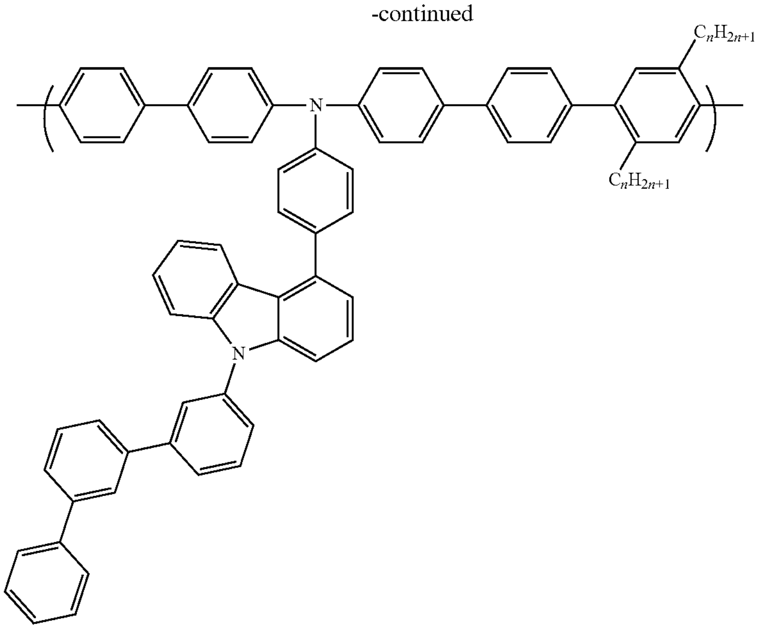

In the above chemical formulas, n may be an integer, and each independently may be an integer of 1 or more and 20 or less, an integer of 6 or more and 12 or less, and an integer of 6, 8, 10, or 12. When the compound represented by the above chemical formulas has two or more groups represented by "$C_nH_{2n+1}$—", wherein n in "$C_nH_{2n+1}$—" may be the same as or different from each other. When the compounds represented by the above chemical formulas have two or more groups represented by "$C_nH_{2n+1}$—", each group represented by "$C_nH_{2n+1}$—" may be the same as or different from each other. The group represented by "$C_nH_{2n+1}$—" may be linear or branched, and for example, may be a linear group.

The polymer according to an embodiment may include at least one structural unit selected from Group (B). In an embodiment, the structural unit represented by Chemical Formula (1) included in the polymer may be at least one structural unit selected from Group (B). Among these, Polymers A-1 to A-21 used in examples to be described later may be included. For example, it may include Polymers A-1 to A-6 and A-8 to A-21, and may include Polymers A-1 to A-3 and A-8 to A-17. It may also include Polymers A-1, A-2, A-3, A-15 and A-17, and may include Polymers A-3, A-15, and A-17, for example, Polymer A-17. According to these structures, the effect of improving the device life-span in an electroluminescent device using a polymer, particularly, a quantum dot electroluminescent device may be increased.

Group (B)

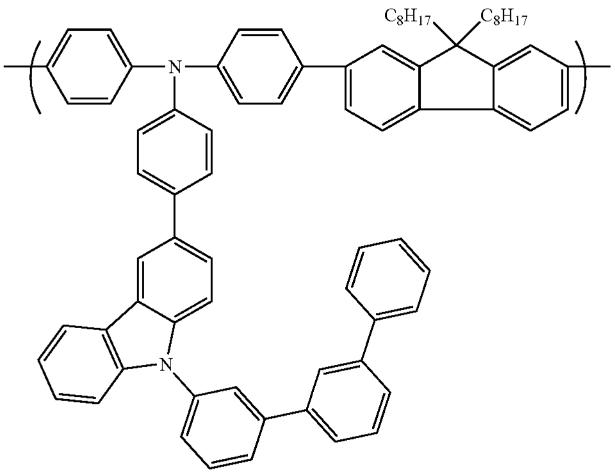

-continued
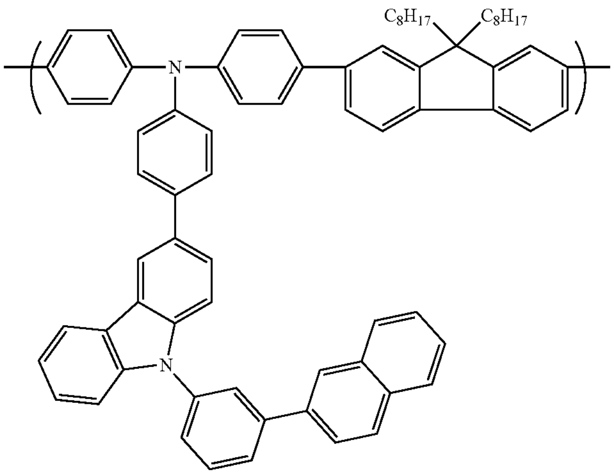
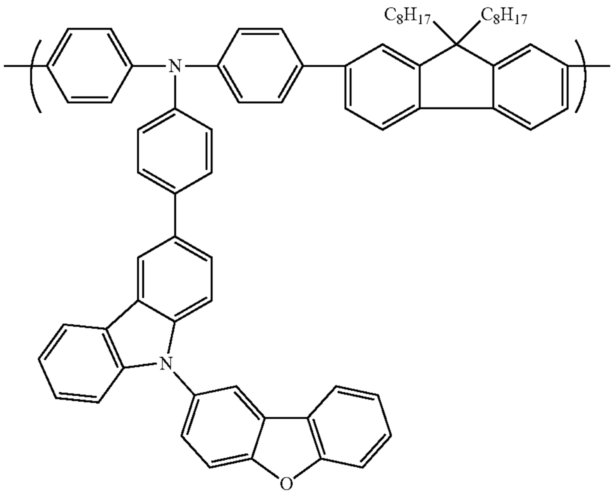
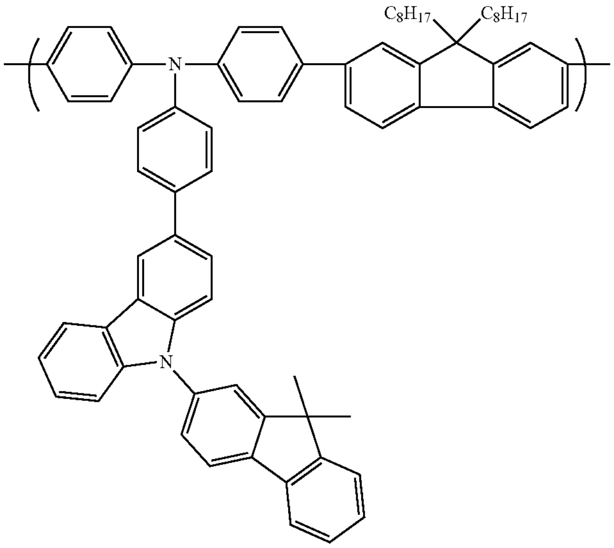

-continued
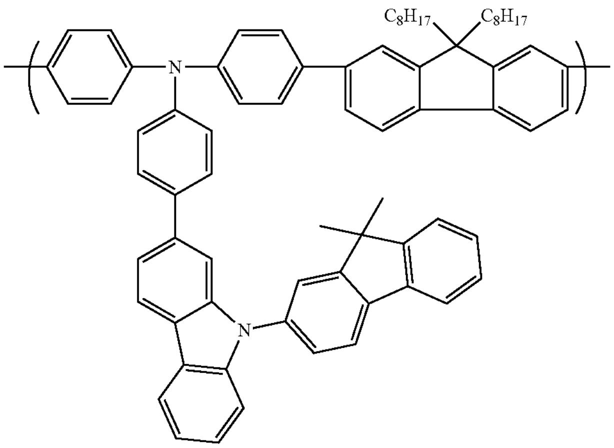
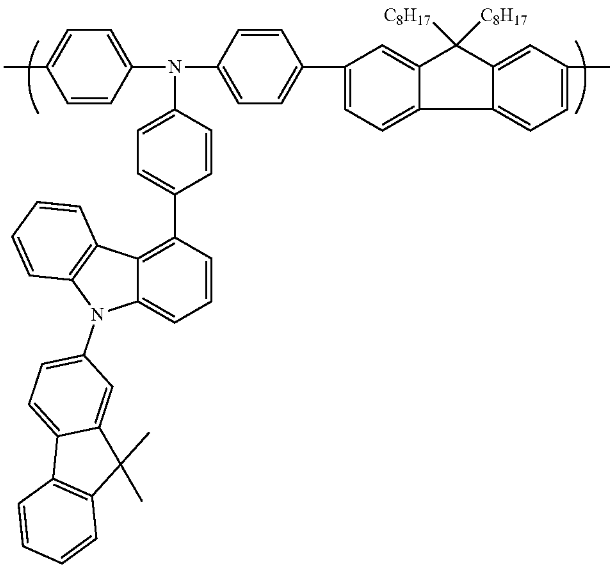
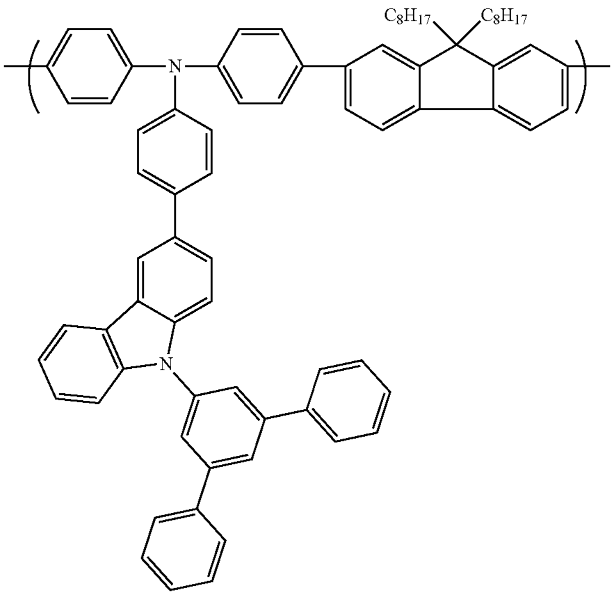

-continued
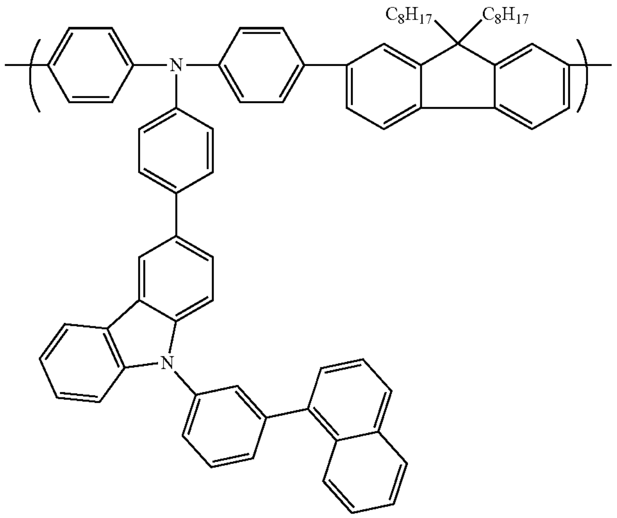
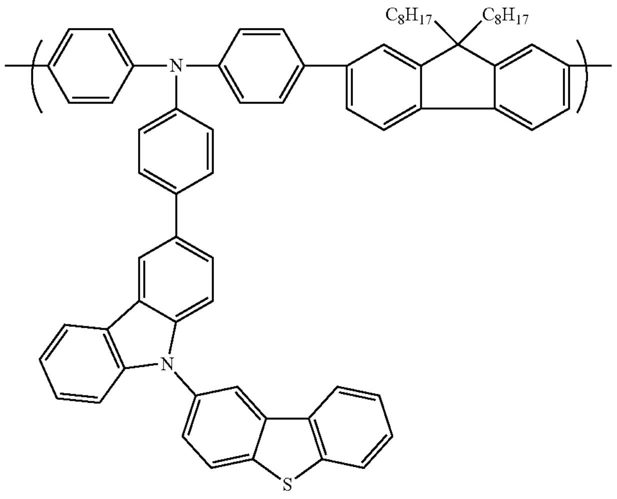
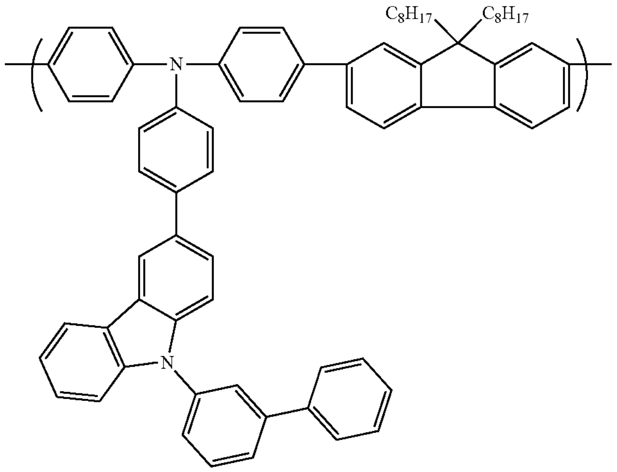

-continued
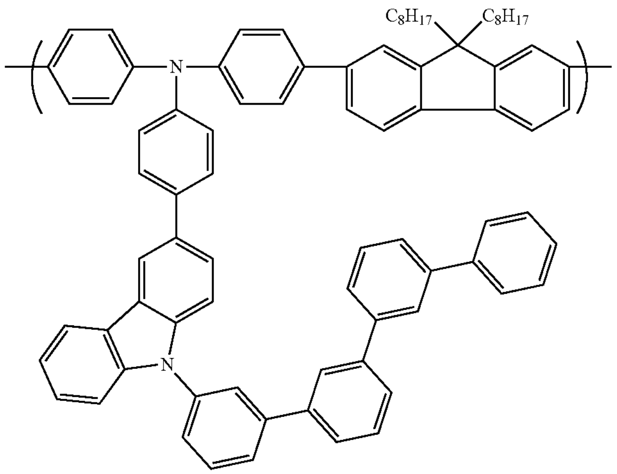
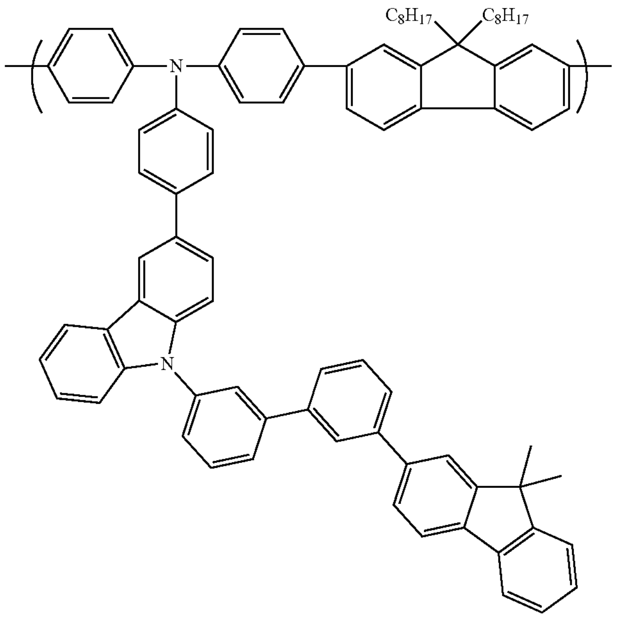
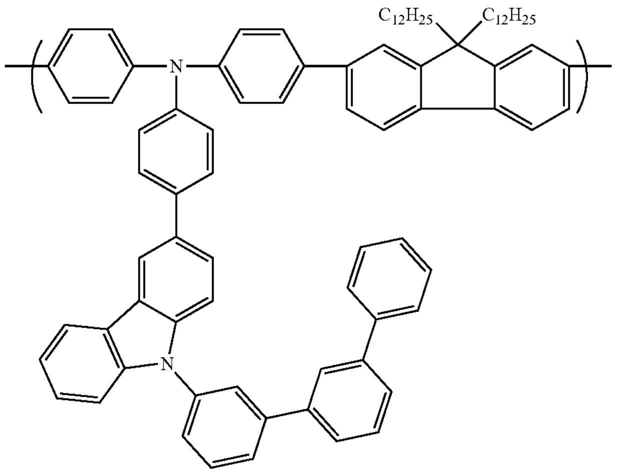

-continued
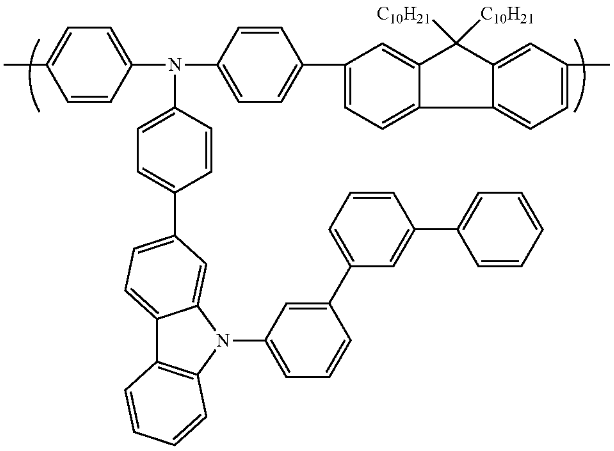
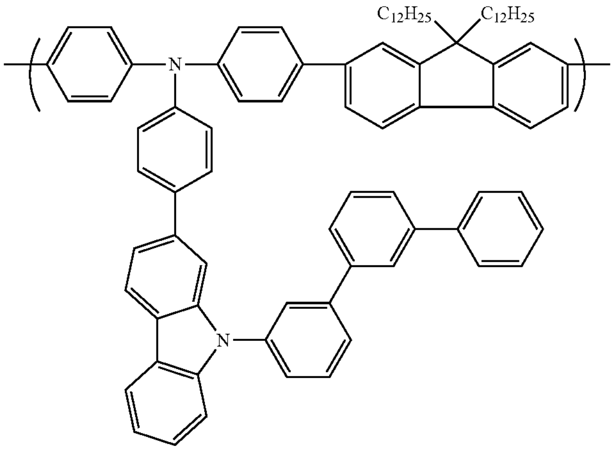
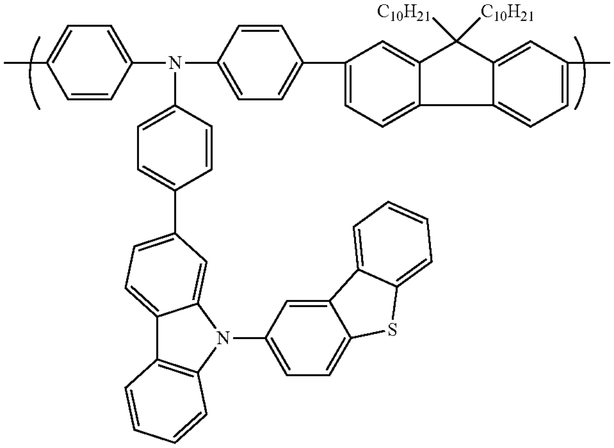

-continued
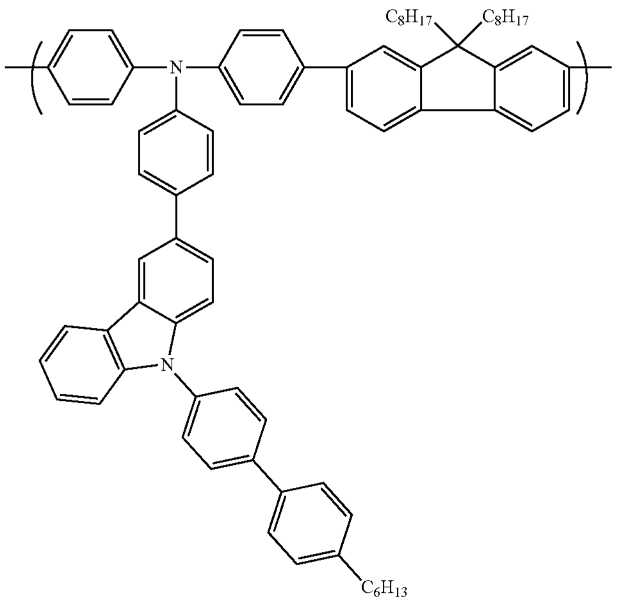
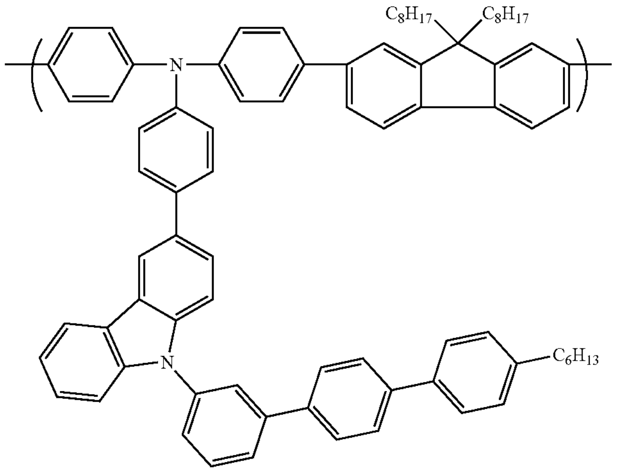
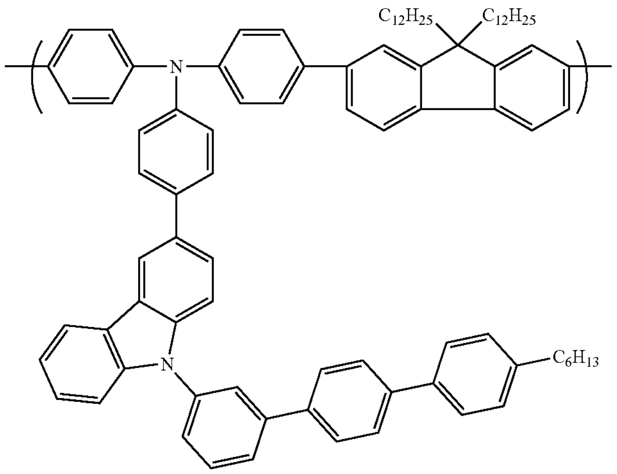

-continued
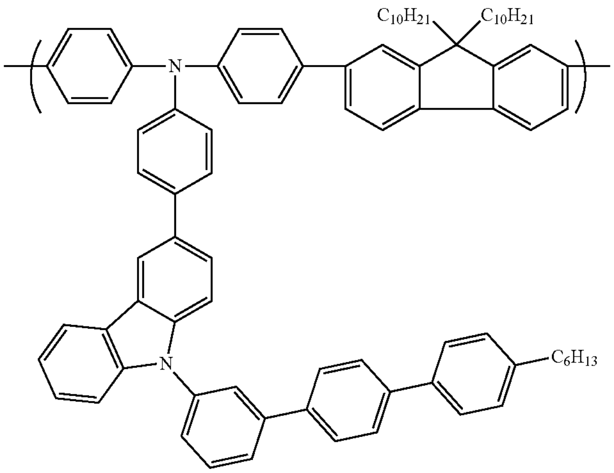
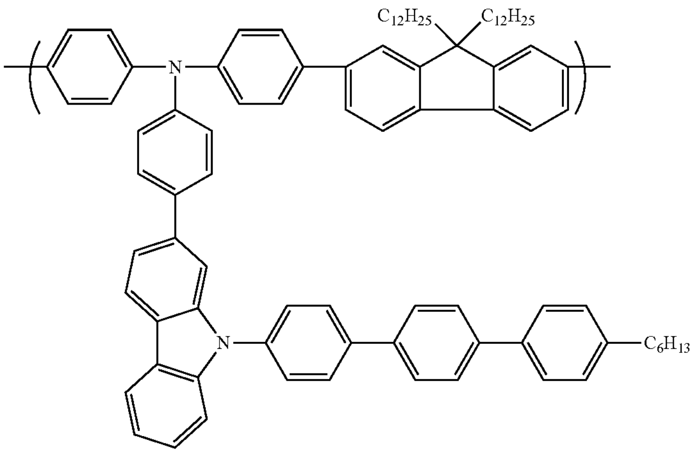
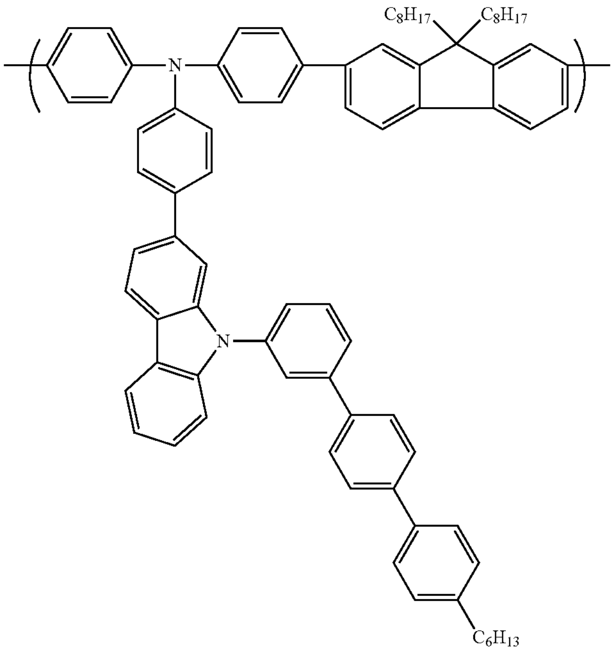

-continued

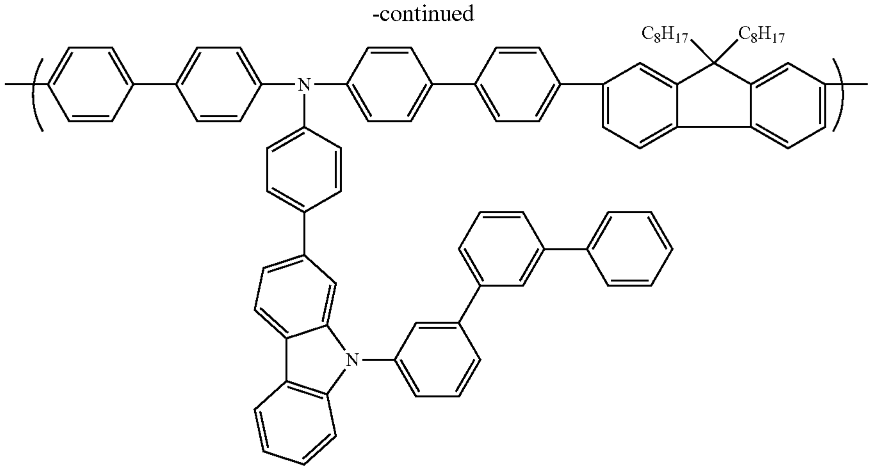

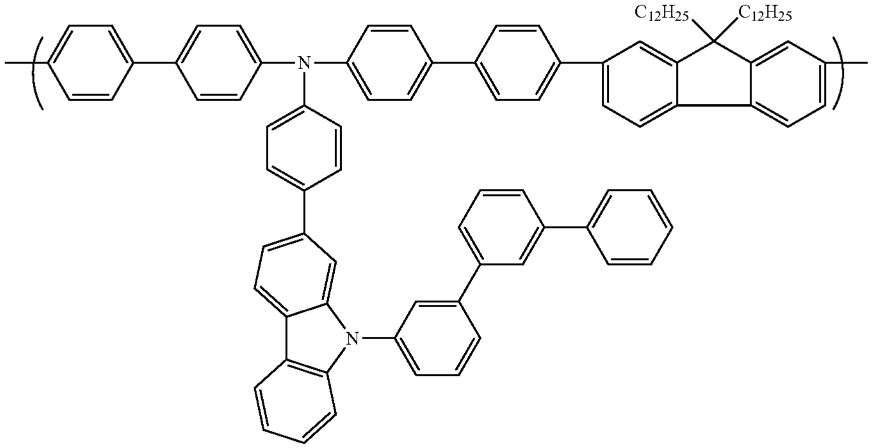

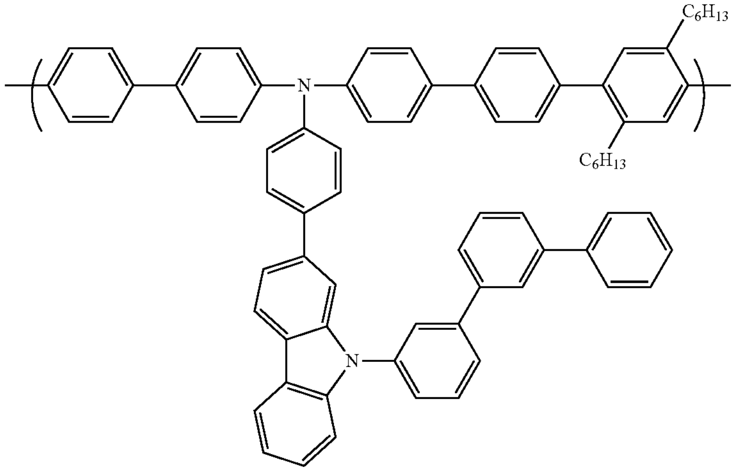

In the above chemical formula, the group represented by "$C_{12}H_{25}$—" may represent an n-dodecyl group. In the above chemical formula, the group represented by "$C_{10}H_{21}$—" may represent an n-decyl group. In the above chemical formula, the group represented by "$C_8H_{17}$—" may represent an n-octyl group. In the above chemical formula, the group represented by "$C_6H_{13}$—" may represent an n-hexyl group.

The polymer according to an embodiment is not particularly limited, and for example, a polymer including at least one structural unit selected from Group (B').

In an embodiment, the structural unit represented by Chemical Formula (1) included in the polymer may be, for example, at least one structural unit selected from Group (B'). Among Group (B'), Polymers A-1 to A-7 used in examples to be described later may be used.

For example, the polymer may be Polymers A-1 to A-6 used in examples, for example, Polymers A-1 to A-3, for example, Polymer A-1 or A-3, for example Polymer A-3.

According to these structures, the effect of improving the device life-span in an electroluminescent device using a polymer, particularly, a quantum dot electroluminescent device may be increased.

Group (B′)
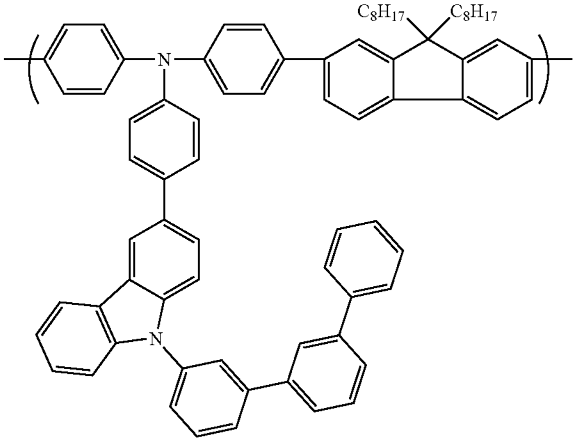
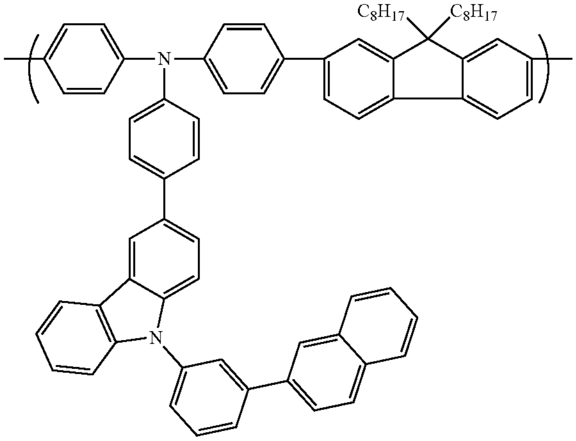
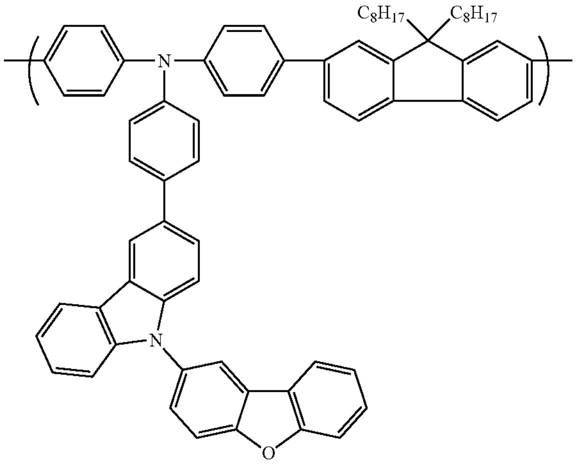
-continued
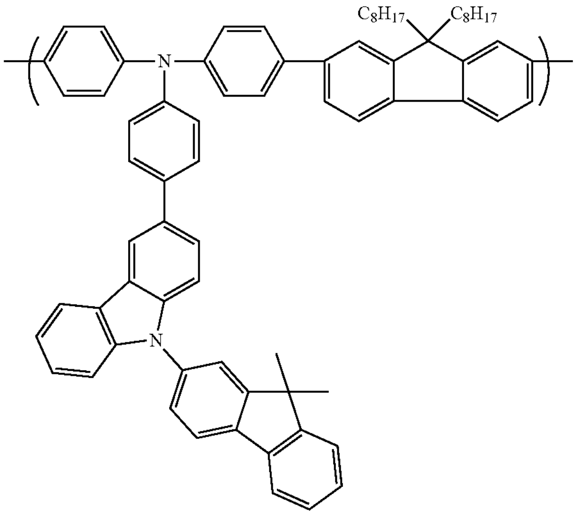
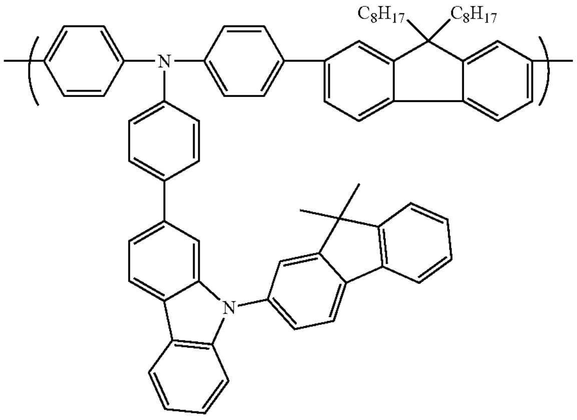
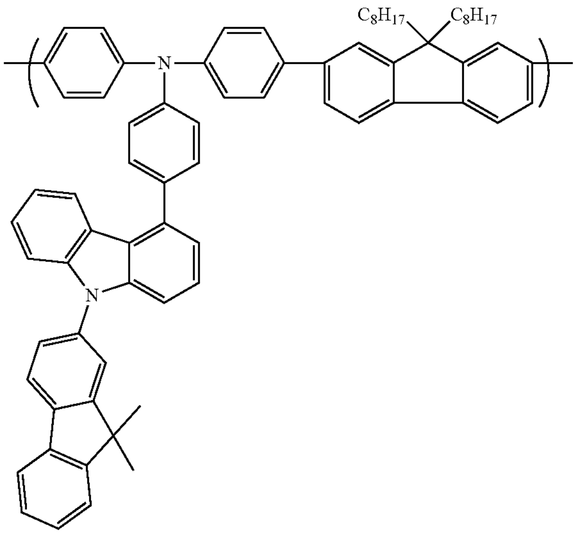

-continued

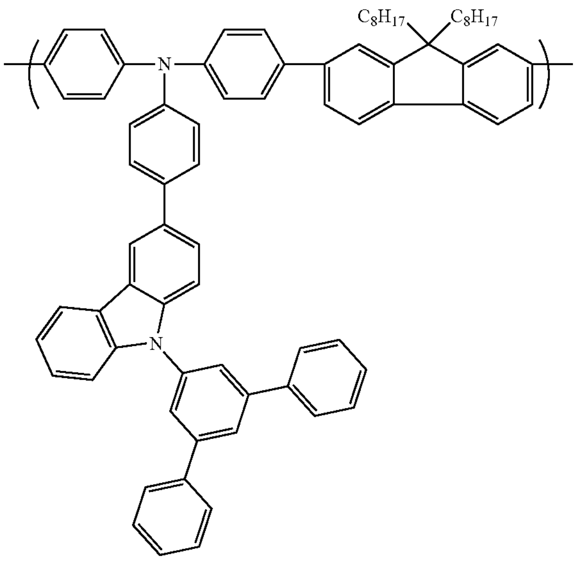

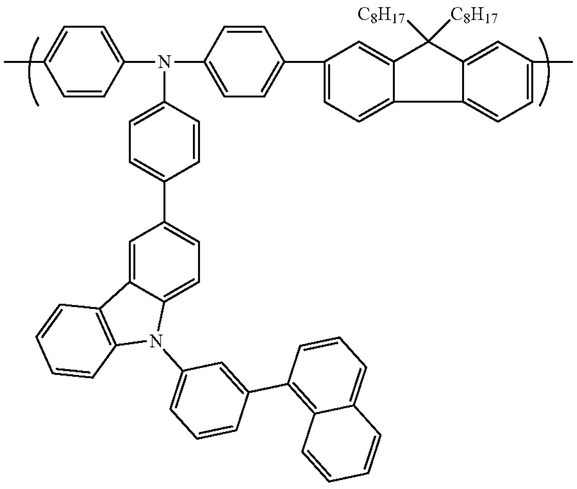

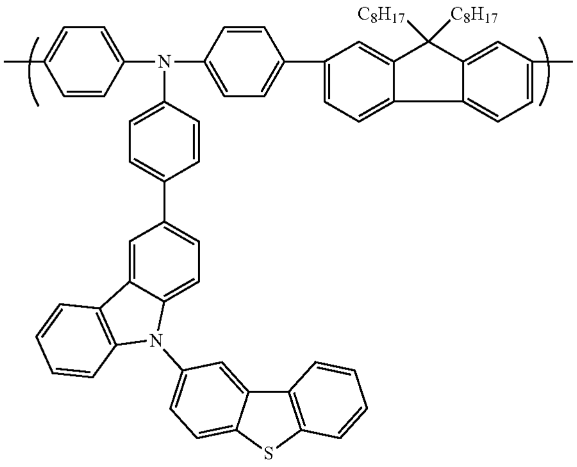

-continued

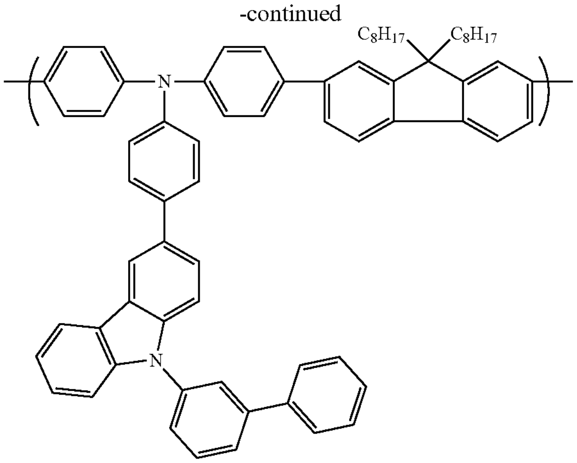

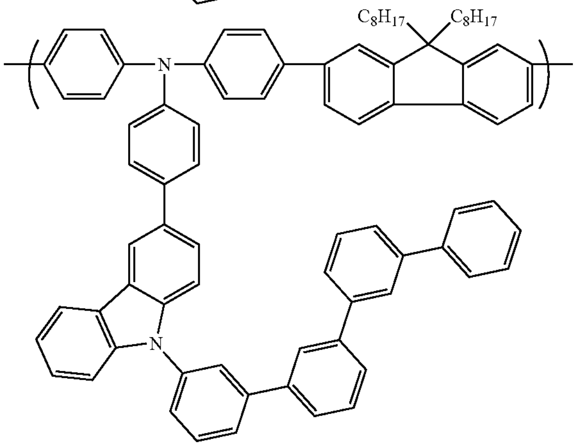

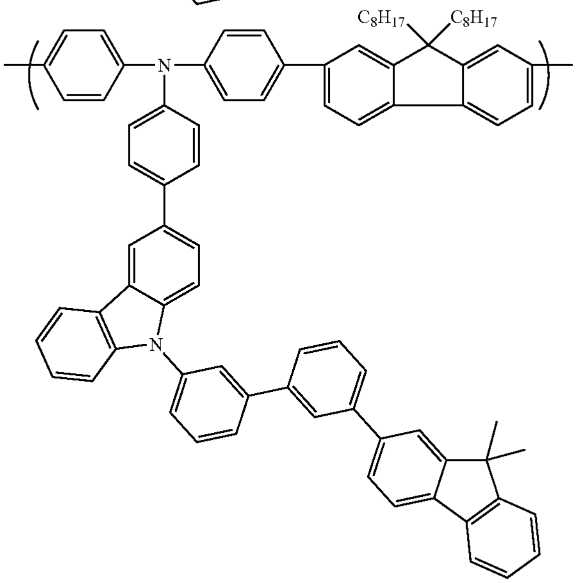

In the above chemical formula, the group represented by “$C_8H_{17}$—” represents an n-octyl group.

In the polymer according to an embodiment, a proportion of the structural unit represented by Chemical Formula (1) is not particularly limited.

Considering the new effect of improving the device life-span or hole transport ability of an electroluminescent device using a polymer, the polymer according to an embodiment may include the structural unit represented by Chemical Formula (1) in an amount of greater than or equal to about 10 mol % and less than or equal to about 100 mol % based on the number of moles of the total structural units constituting the polymer.

The polymer according to an embodiment may include the structural unit represented by Chemical Formula (1) in an amount of greater than about 50 mol % and less than or equal to about 100 mol % based on the number of moles of the total structural units constituting the polymer.

In other words, the polymer according to an embodiment may be composed of the structural unit represented by Chemical Formula (1) and a terminal end group.

On the other hand, when the polymer includes two or more types of the structural units represented by Chemical Formula (1), the proportion means a ratio of a sum amount of the structural units represented by Chemical Formula (1).

As described above, the polymer according to an embodiment may include the structural unit represented by Chemical Formula (1) alone as a structural unit.

The polymer according to an embodiment may further include, as a structural unit, other structural units than the structural unit represented by Chemical Formula (1), in addition to the structural units represented by Chemical Formula (1).

When other structural units are included, the other structural units are not particularly limited as long as the effects of the present disclosure are not impaired.

For example, when $Ar^1$, $Ar^2$, and $Ar^4$ constituting the main chain of Chemical Formula (1) do not include a group selected from Group (III), other structural units may be, for example, at least one structural unit selected from Group (III).

Group (III)

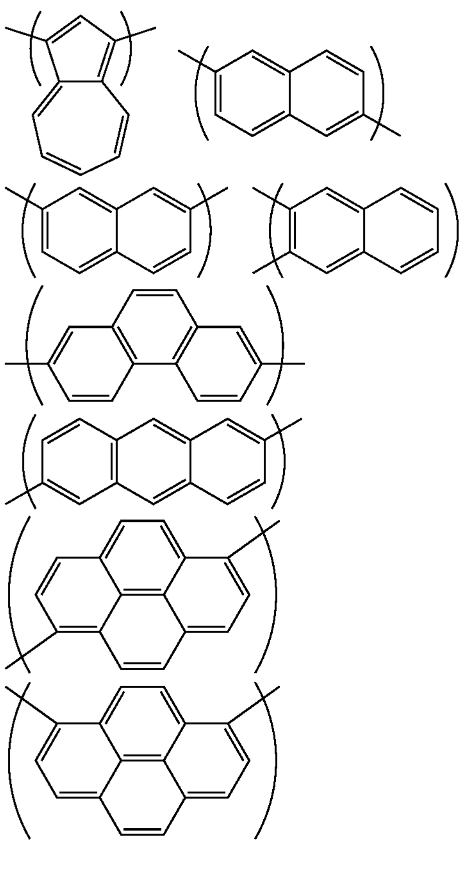

-continued

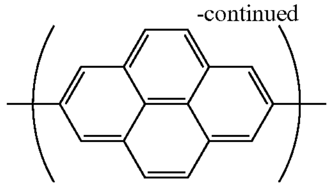

In the polymer according to an embodiment, a proportion of the structural units selected from Group (III) is not particularly limited.

Considering the effect of improving film-forming easiness, film strength, and the like by the composition including the polymer, the polymer according to an embodiment may include a structural unit selected from Group (III) in an amount of greater than or equal to about 1 mol % and less than or equal to about 10 mol % or less based on the number of moles of the total structural units constituting the polymer.

On the other hand, when the polymer includes two or more types of structural units selected from Group (III), the above proportions means a ratio of a sum amount of the structural units selected from Group (III).

The terminal end (terminal end group) of the main chain of the polymer according to an embodiment is not particularly limited and is appropriately defined by the type of raw material used, but may be, for example, a hydrogen atom.

The weight average molecular weight (Mw) of the polymer according to an embodiment is not particularly limited as long as the desired effect of the present disclosure is obtained.

The weight average molecular weight (Mw) may be, for example, greater than or equal to about 12,000 g/mol and less than or equal to about 1,000,000 g/mol, for example, greater than or equal to about 50,000 g/mol and less than or equal to about 500,000 g/mol.

Within these weight average molecular weight ranges, a viscosity of the coating solution for forming a layer, for example, a hole injection layer, a hole transport layer, and the like using the polymer may be appropriately adjusted, and a layer with a uniform film thickness may be formed.

The number average molecular weight (Mn) of the polymer according to an embodiment is not particularly limited as long as the desired effect of the present disclosure is obtained.

The number average molecular weight (Mn) may be, for example, greater than or equal to about 10,000 g/mol and less than or equal to about 250,000 g/mol, for example, greater than or equal to about 30,000 g/mol and less than or equal to about 100,000 g/mol.

Within these number average molecular weight ranges, a viscosity of the coating solution for forming a layer, for example, a hole injection layer, a hole transport layer, and the like using the polymer may be appropriately adjusted, and a layer with a uniform film thickness may be formed.

The polydispersity (weight average molecular weight/number average molecular weight) of the polymer according to an embodiment may be, for example, greater than or equal to about 1.2 and less than or equal to about 4.0, for example, greater than or equal to about 1.5 and less than or equal to about 3.5.

The measurement of the number average molecular weight (Mn) and the weight average molecular weight (Mw) is not particularly limited, and they may be obtained by using a known method or by appropriately modifying the known method.

In the present specification, the number average molecular weight (Mn) and the weight average molecular weight (Mw) may be values measured by the following method.

Meanwhile, the polydispersity (Mw/Mn) is calculated by dividing the weight average molecular weight (Mw) by the number average molecular weight (Mn) measured by the following method.

(Measurement of Number Average Molecular Weight (Mn) and Weight Average Molecular Weight (Mw))

The number average molecular weight (Mn) and weight average molecular weight (Mw) of the polymer according to an embodiment are measured under the following conditions by SEC (Size Exclusion Chromatography) using polystyrene as a standard material.

(SEC Measurement Conditions)

Analysis equipment (SEC): Shimadzu Corporation, Prominence HPLC

Column: Polymer Laboratories, PLgel MIXED-B

Column temperature: 40° C.

Flow rate: 1.0 mL/min

Injection amount of sample solution: 20 μL (concentration: about 0.05 mass %)

Solvating solvent: tetrahydrofuran (THF)

Detector (UV-VIS detector): Shimadzu Corporation, SPD-10AV

Standard sample: polystyrene

The glass transition temperature (Tg) of the polymer according to an embodiment is not particularly limited, but may be greater than or equal to about 70° C., for example, greater than or equal to about 80° C., for example, greater than or equal to about 100° C.

The glass transition temperature (Tg) of the polymer according to an embodiment is not particularly limited, but may be, for example, 200° C. or less, for example, less than or equal to about 180° C., for example, less than or equal to about 150° C.

Within these ranges, a device suitable for element fabrication and having improved characteristics may be obtained.

The glass transition temperature may be measured using a differential scanning calorimeter (DSC) (manufactured by Seiko Stru Company, trade name: DSC6000).

The details of the measurement method are described in examples to be described later.

The HOMO level of the polymer according to an embodiment is not particularly limited, but may be greater than or equal to about −5.75 eV, for example, greater than or equal to about −5.7 eV, for example, greater than or equal to about −5.65 eV.

The HOMO level of the polymer according to an embodiment is not particularly limited, but may be −4.5 eV or less, for example, less than or equal to about −5.0 eV, for example less than or equal to about −5.3 eV.

Within these ranges, hole injection efficiency into the light emitting layer is further improved, and a device with more improved characteristics may be obtained.

The HOMO level may be measured using a photoelectron spectrometer (Riken Keiki, Inc., AC-3) in the air.

The details of the measurement method are described in examples to be described later.

The LUMO level of the polymer according to an embodiment is not particularly limited, but may be greater than or equal to about −3.0 eV, for example, greater than or equal to about −2.8 eV, for example, greater than or equal to about −2.7 eV.

The LUMO level of the polymer according to an embodiment is not particularly limited, but may be less than or equal to about −2.0 eV, for example, less than or equal to about −2.2 eV, for example, less than or equal to about −2.4 eV.

Within these ranges, electrons are efficiently trapped in the light emitting layer, and a device with more improved characteristics may be obtained.

The LUMO level may be calculated by photoluminescence (PL) spectral measurement.

The details of the measurement method are described in examples to be described later.

The polymer according to an embodiment may have high solvent resistance. In the present specification, a ratio of an intensity at the reference wavelength of the absorption spectrum after dipping in a solvent to an intensity at the reference wavelength of the absorption spectrum before dipping in a solvent ("intensity at the reference wavelength of the absorption spectrum after dipping in a solvent/intensity at the reference wavelength of the absorption spectrum before dipping in a solvent"×100(%)) is defined as a "solvent resistance value (%)", and the solvent resistance may be evaluated from this value. The details of the method for determining the reference wavelength and the method for evaluating the solvent tolerance are described in examples. The solvent resistance value of the polymer according to an embodiment is not particularly limited, but may be greater than or equal to about 75%, for example, greater than or equal to about 90%. By using a polymer satisfying these ranges, film mixing of the layer including the polymer with the other layer may be further suppressed even when another layer is formed by a wet method. For example, when an electroluminescent device to be described later is manufactured using a wet method, for example, an inkjet method, by using a polymer satisfying these ranges, mixing a layer including the polymer with another layer may be more suppressed.

The polymer according to an embodiment may be synthesized using a known organic synthesis method.

A specific method for synthesizing a polymer according to an embodiment can be easily understood by those skilled in the art with reference to Examples to be described later.

For example, the polymer according to an embodiment may be prepared by, for example, a polymerization reaction using one or more monomers represented by Chemical Formula (1)', or may be produced by a copolymerization reaction using one or more monomers represented by Chemical Formula (1)' and a monomer other than those corresponding to the above other structural units.

(1')

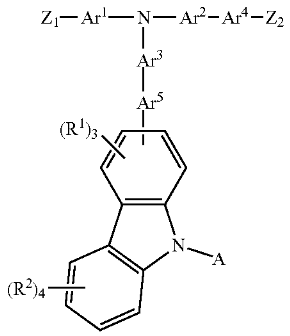

Alternatively, the polymer according to an embodiment may be prepared by, for example, a copolymerization reaction using one or more monomers represented by Chemical Formula (1-1) and one or more monomers represented by Chemical Formula (1-2') or a copolymerization reaction using at least one monomer represented by Chemical Formula (1-1), one or more monomers represented by the Chemical Formula (1-2'), and a monomer other than those corresponding to the other structural units.

(1-1')

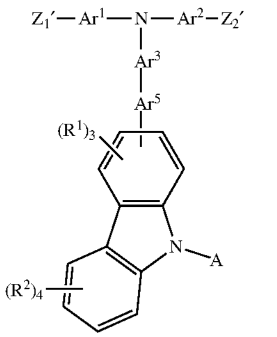

$$Z_1'' - Ar^4 - Z_2'' \quad (1\text{-}2')$$

A, $Ar^1$, $Ar^2$, $Ar^3$, $Ar^4$, $Ar^5$, $R^1$, and $R^2$ in Chemical Formula (1)', Chemical Formula (1-1'), and Chemical Formula (1-2') are, respectively, the same as defined in in Chemical Formula (1).

$Z_1$, $Z_2$, $Z_1'$, $Z_2'$, $Z_1''$, and $Z_2''$ may each independently be a halogen atom, for example, a fluorine atom, a chlorine atom, a bromine atom, an iodine atom, for example, a bromine atom, or may be a group having a structure represented by Chemical Formula (Z-1).

Meanwhile, in the structure represented by Chemical Formula (Z-1), $R_A$ to $R_D$ may each independently be an alkyl group having 1 to 3 carbon atoms, for example, $R_A$ to $R_D$ may each be a methyl group.

Meanwhile, $Z_1$ and $Z_2$ in Chemical Formula (1') may be the same as or different from each other.

Similarly, in Chemical Formula (1-1'), $Z_1'$ and $Z_2'$ may be the same as or different from each other.

In Chemical Formula (1-2'), $Z_1''$ and $Z_2''$ may be the same as or different from each other.

In an embodiment, $Z_1$ and $Z_2$ in Chemical Formula (1') may be different from each other.

In an embodiment, $Z_1'$ and $Z_2'$ in Chemical Formula (1-1') are the same as each other; $Z_1''$ and $Z_2''$ in Chemical Formula (1-2') are the same as each other; and $Z_1'$ and $Z_2'$ in Chemical Formula (1-1) may be different from $Z_1''$ and $Z_2''$ in Chemical Formula (1-2').

(Z-1)

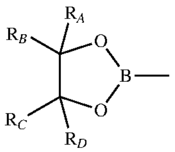

A monomer represented by Chemical Formula (1'), a monomer represented by Chemical Formula (1-1), and a monomer represented by Chemical Formula (1-2') which are used for polymerization of the polymer according to an embodiment may be synthesized by appropriately combining known synthetic reactions, respectively, and the structures may also be confirmed by a known method, for example, NMR or LC-MS.

In addition, other monomers corresponding to structural units other than the above which are used for polymerization of the polymer according to an embodiment may also be synthesized by appropriately combining known synthesis reactions, and the structure thereof may also be confirmed by a known method, for example, NMR, LC-MS, or the like.

<Electroluminescent Device Materials>

As described above, the polymer according to an embodiment may be advantageously used in an electroluminescent device. according to an embodiment. The electroluminescent device may have an excellent device life-span. Accordingly, another embodiment may relate to an electroluminescent device material (EL device material) including the polymer according to an embodiment. Alternatively, it may relate to a use of the polymer according to an embodiment as an EL device material. In particular, in the case of the polymer including the structural unit represented by Chemical Formula (1), the main chain has appropriate flexibility. For this reason, the polymer according to the above embodiment exhibits high solubility in solvents and high heat resistance. Therefore, a film (thin film) may be easily formed by the wet (coating) method.

<Composition>

A composition includes the above-described polymer(s). In addition, the compositions may be included as a material for an EL device according to an embodiment. The polymer according to an embodiment may be used alone or as a mixture of 2 or more types of polymers. In addition to the polymer according to an embodiment, the compositions may further include other compounds.

The other compounds are not particularly limited, but may include, for example, a hole transport material, an electron transport material, a light emitting material, or a combination thereof. Here, the light emitting material included in the composition is not particularly limited, and examples thereof may include organometallic complexes (luminescent organometallic complex compounds) or semiconductor nanoparticles, for example, semiconductor inorganic nanoparticles.

As described above, the polymers according to an embodiment may be advantageously used in an electroluminescent device. An electroluminescent device may have an excellent device life-span.

<Electroluminescent Device>

As described above, the polymers may be advantageously used in an electroluminescent device. The polymers may be used alone or as a mixture of two or more. Such an electroluminescent device may realize excellent device life-span.

Rather, another embodiment provides an electroluminescent device including a pair of electrodes and at least one organic layer including the polymer according to an embodiment, disposed between the pair of electrodes.

One embodiment provides an electroluminescent device including a pair of electrodes and at least one organic layer including the EL device material according to an embodiment, which is disposed between the pair of electrodes.

One embodiment provides an electroluminescent device including a pair of electrodes and at least one organic layer including the composition according to an embodiment, which is disposed between the pair of electrodes.

The electroluminescent device according to the present embodiment may further include a layer including quantum dots.

The electroluminescent device according to an embodiment may further include a layer including quantum dots in addition to at least one organic layer including the polymer according to an embodiment. Here, the polymer according to an embodiment may be used alone or as a mixture of two or more polymers.

In an embodiment, the polymer according to an embodiment may be included as an EL device material in the organic layer of the EL device according to an embodiment, or may be included as a composition according to an embodiment.

The layer including quantum dots in the electroluminescent device according to an embodiment is not particularly limited, but for example, descriptions for a light emitting layer including quantum dots of an electroluminescent device to be described later may be applicable.

The layer including quantum dots may include a material other than quantum dots. As another material, an organic compound may be, for example included.

Although a layer other than the layer including quantum dots is not limited, the descriptions for one example of the electroluminescent device to be described later may be respectively applicable.

A method of manufacturing an electroluminescent device is not particularly limited, and a well-known method may be used.

The method for forming an organic film including the polymer according to an embodiment and the method for forming the organic film including the composition according to an embodiment are not particularly limited, and for example, a coating method may be used.

Accordingly, another embodiment provides a method of manufacturing an electroluminescent device including an organic film including a polymer according to an embodiment, wherein at least one organic film of the organic films including the polymer may be formed by a coating method. Further, an embodiment provides a method for manufacturing an electroluminescent device including an organic film including an EL device material according to an embodiment, wherein at least one organic film of the organic films including the EL device material is formed by a coating method.

An embodiment provides a method of manufacturing an electroluminescent device including an organic film including the composition according to an embodiment, wherein at least one organic film of the organic films including the composition is formed by a coating method.

The polymer according to an embodiment has excellent solubility in organic solvents. Accordingly, the polymer according to an embodiment, the EL device material according to an embodiment, and the composition according to an embodiment may be advantageously used for manufacturing a device such as a thin film by a coating method, that is, a wet process. Accordingly, another embodiment may relate to a liquid composition including any one of the polymer according to an embodiment, the EL device material according to an embodiment, and the composition according to an embodiment, and a solvent or dispersion medium.

The liquid composition according to another embodiment may further include the polymer according to an embodiment, a solvent or a dispersion medium, and other compounds in addition thereto.

The other compound is not particularly limited, and may be, for example, a material constituting each layer of an electroluminescent device to be described later. In addition, another embodiment may relate to a thin film including any one of the polymer according to an embodiment, the EL device material according to an embodiment, and the composition according to an embodiment.

The polymer according to an embodiment has excellent hole injection properties and hole mobility. For this reason, the polymer according to an embodiment, the EL device material according to an embodiment, and the composition according to an embodiment are suitable for the formation of any organic film among a hole injection material, a hole transport material, or a light emitting material (host). In an embodiment, from the viewpoint of hole transport properties, they may be advantageously used as a hole injection material or a hole transport material, and may be, for example, particularly advantageously used as a hole transport material.

[Embodiment of Electroluminescent Device]

Hereinafter, an electroluminescent device according to an embodiment will be described in detail with reference to FIG. 1.

FIG. 1 is a schematic view showing an electroluminescent device according to an exemplary embodiment.

In addition, in this specification, an "electroluminescent device" may be abbreviated as "EL device."

In addition, in description of drawings, the same reference numerals are given to the same elements in the description of the drawings, and redundant descriptions are omitted.

In addition, the dimension ratios in the drawings are exaggerated for convenience of description and may be different from the actual ratios.

As shown in FIG. 1, an EL device 100 according to an embodiment includes a substrate 110, a first electrode 120 on the substrate 110, a hole injection layer 130 on the first electrode 120, a hole transport layer 140 on the hole injection layer 130, a light emitting layer 150 on the hole transport layer 140, an electron transport layer 160 on the light emitting layer 150, an electron injection layer 170 on the electron transport layer 160, and a second electrode 180 on the electron injection layer 170.

Here, the polymer according to an embodiment may be included in, for example, any one organic film (organic layer) disposed between the first electrode 120 and the second electrode 180.

In addition, in this specification, the film including an organic compound is called an organic film (organic layer), and the organic film (organic layer) may further include an inorganic compound.

For example, the polymer according to an embodiment may be included in the hole injection layer 130 as a hole injection material, may be included in the hole transport layer 140 as a hole transport material, or may be included in at least one layer of the light emitting layer 150 as a light emitting material (host). In an embodiment, the polymer according to an embodiment may be included in the hole injection layer 130 as a hole injection material or the hole transport layer 140 as a hole transport material. In an embodiment, the polymer may be included in the hole transport layer 140 as a hole transport material.

In other words, in an embodiment, the organic film including the polymer according to an embodiment may be a hole transport layer, a hole injection layer, or a light emitting layer. For example, the organic film including the polymer according to an embodiment may be a hole transport layer or a hole injection layer. For example, the organic layer including the polymer according to an embodiment may be a hole transport layer.

In these embodiments, the polymer according to an embodiment may be included in the organic film as an EL device material according to an embodiment, or as a composition according to an embodiment.

In addition, methods of forming the organic film including the polymer according to an embodiment, the organic film including the EL device material according to an embodiment, and the organic film including the composition according to an embodiment are not particularly limited.

However, for example, these organic films may be formed by a coating method (solution coating method).

For example, the organic film may be formed by using a solution coating method such as a spin coating method, a casting/casting method, a micro gravure coating method, a gravure coating method, a bar coating method, a roll coating method, a wire bar coating method, a dip coating method, a spray coating method, a screen printing method, a flexographic printing method, an offset printing method, or an ink jet printing method.

Meanwhile, the solvent used in the solution coating method is not particularly limited as long as it can dissolve the polymer according to an embodiment, the EL device material according to an embodiment, and the composition according to an embodiment.

The solvent used for the solution coating method may be suitably selected according to the type of these solutes.

For example, it may be toluene, xylene, ethyl benzene, diethylbenzene, mesitylene, propyl benzene, cyclohexyl benzene, dimethoxy benzene, anisole, ethoxy toluene, phenoxy toluene, isopropyl biphenyl, dimethyl anisole, phenyl acetate, phenyl propionate, methyl benzoate, ethyl benzoate, cyclohexane, and the like.

The solvent may be a single solvent, or a mixture of 2 or more solvents.

In addition, the amount of the solvent used is not particularly limited, but considering the ease of application and the like, a concentration of the polymer according to an embodiment may be, for example, greater than or equal to about 0.1 mass % and less than or equal to about 10 mass %, for example, greater than or equal to about 0.5 mass % and less than or equal to about 5 mass %.

On the other hand, a film forming method of layers other than the organic film including the organic film including the polymer according to an embodiment, the organic film including the EL device material according to an embodiment, and the organic film including the composition according to an embodiment, is not particularly limited.

Layers other than the organic film including the organic film including the polymer according to an embodiment, the organic film including the EL device material according to an embodiment, and the organic film including the composition according to an embodiment may be formed into a film by, for example, a vacuum deposition method or may be formed into a film by the solution coating method.

The substrate 110 may be a substrate used in a general EL device. For example, the substrate 110 may be a semiconductor substrate such as a glass substrate, a silicon substrate, and the like, or a transparent plastic substrate.

The first electrode 120 is formed on the substrate 110.

The first electrode 120 is specifically an anode, and is formed by a material having a large work function among a metal, an alloy, or a conductive compound.

For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity.

The first electrode 120 may be formed as a reflective electrode by laminating magnesium (Mg), aluminum (Al), or the like on the transparent conductive layer.

After forming the first electrode 120 on the substrate 110, washing and UV-ozone treatment may be performed as necessary.

On the first electrode 120, a hole injection layer 130 is formed.

The hole injection layer 130 is a layer that facilitates injection of holes from the first electrode 120, and may be formed to have a thickness (dry film thickness; the same below) of specifically greater than or equal to about 10 nm and less than or equal to about 1000 nm, or greater than or equal to about 20 nm and less than or equal to about 50 nm.

The hole injection layer 130 may be formed of a known hole injection material.

The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino) triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), and polyaniline/10-camphorsulfonic acid, and the like.

The hole injection material may be a single hole injection material, or a mixture of 2 or more hole injection material.

A hole transport layer 140 is formed on the hole injection layer 130.

The hole transport layer 140 is a layer having a function of transporting holes, and may be formed with a thickness of, for example, greater than or equal to about 10 nm and less than or equal to about 150 nm, and for example greater than or equal to about 20 nm and less than or equal to about 50 nm.

In an embodiment, the hole transport layer 140 may be formed by a solution coating method using the polymer according to an embodiment.

In an embodiment, the polymer according to an embodiment may be used as an EL device material according to an embodiment or as a composition according to an embodiment.

The polymer according to an embodiment may be used alone or as a mixture of two or more.

According to these methods, the device life-span of the EL device 100, in particular, the device life-span of the quantum dot electroluminescent device may be extended.

In addition, since the hole transport layer may be formed by the solution coating method, a large area may be formed efficiently.

In an embodiment, the hole transport layer 140 may include the polymer according to an embodiment and other low molecular weight materials.

(Low Molecular Weight Material)

The hole transport layer may include the polymer and the low molecular weight material according to an embodiment. The low molecular weight material is present in the hole transport layer to fill a so-called gap between the high molecular material, for example, the polymer according to an embodiment. For this reason, a dense hole transport layer may be formed, and the hole transport ability of the hole transport layer is improved. The quantum dot electroluminescent device having such a hole transport layer may have excellent luminous efficiency and luminous life-span.

The low molecular weight material may be a hole transport material or a widegap material. That is, the hole transport material may have a widegap, and the widegap material may have hole transport properties. In addition, the low molecular weight material may include a single low molecular weight material or a plurality of low molecular weight materials in the hole transport layer.

Here, the widegap material refers to a material having a HOMO-LUMO energy gap of greater than or equal to about 3.3 eV. The widegap material may have a HOMO-LUMO energy gap greater than the HOMO-LUMO energy gap of at least one of the above embodiments in combination. In addition, the HOMO-LUMO energy gap is not particularly limited, but may be less than or equal to about 4 eV. Within the above range, the luminous efficiency and the luminous life-span of the quantum dot electroluminescent device may be further improved.

The molecular weight of the low molecular weight material may be greater than or equal to about 100 g/mol and less than or equal to about 500 g/mol. Within this range, the film may be solidified, and since sublimation and purification are straight-forward, a high-purity film may be easily obtained. In addition, since it has an appropriate molecular size, an effect of filling the gap of a polymer material, for example, the polymer according to an embodiment, may be further improved. A molecular weight of the low molecular weight material may be greater than or equal to about 500 g/mol and less than or equal to about 1,500 g/mol, and greater than or equal to about 600 g/mol and less than or equal to about 1,300 g/mol. On the other hand, the molecular weight of a low molecular weight material is the sum total of the atomic weights of each atom.

The low molecular weight material may satisfy the following condition (a), and may also satisfy the following condition (b), the following condition (c), or both. That is, as suitable low molecular weight materials, compounds satisfying the following conditions (a) and (b), compounds satisfying the following conditions (a) and (c), and compounds satisfying the following condition (a), the following condition (b), and the following condition (c):

(a) a band gap of the low molecular weight material is larger than the polymer according to an embodiment to be mixed, (b) a LUMO of the low molecular weight material is shallower than the polymer according to an embodiment to be mixed, and (c) a HOMO of the low molecular weight material is deeper than the polymer according to an embodiment to be mixed.

The hole transport layer, together with the polymer according to an embodiment, satisfies the above condition (a), and also contains a low molecular weight material that satisfies the above condition (b), the above condition (c) or a combination thereof, and thereby, in an electroluminescent device, promotion of charge injection, improvement of electron resistance, or a combination thereof may be realized.

The condition (a) indicates that the value calculated as "LUMO (eV)−HOMO (eV)" of the low molecular weight material is larger compared with the value calculated as "LUMO (eV)−HOMO (eV)" of the polymer according to the above embodiment to be mixed.

The condition (b) indicates that the "LUMO (eV)" value of the low molecular weight material is larger than the "LUMO (eV)" value of the polymer according to an embodiment to be mixed.

The condition (c) indicates that the "HOMO (eV)" value of the low molecular weight material is smaller than the "HOMO (eV)" value of the polymer according to an embodiment to be mixed.

In addition, the HOMO level and LUMO level of a low molecular weight material are negative integers normally.

In addition to the above condition (a), by satisfying the above condition (b), an improvement in the electron resistance to the light emitting layer may be realized. Further, in addition to the above condition (a), by satisfying the above condition (c), injection of holes may be accelerated.

Hereinafter, low molecular weight compounds 1 to 6 which are embodiments of low molecular weight materials will be described.

The low molecular weight compounds 1 to 6 may be synthesized using a known organic synthesis method. A specific method for synthesizing the low molecular weight material of the present embodiment may be easily understood by those skilled in the art. The structure of a low molecular weight material may also be confirmed by a well-known method, for example, NMR, LC-MS, and the like.

(Low Molecular Weight Compounds 1 and 2)

The low molecular weight material according to an embodiment may include, for example, a low molecular weight compound represented by Chemical Formula (L1) (hereinafter also referred to as "low molecular weight compound 1"), and a low molecular weight compound represented by Chemical Formula (L2) (hereinafter, also referred to as "low molecular weight compound 2"). Not wishing to be bound by theory, the low molecular weight compounds 1 and 2 are hole transport materials, and when used in combination with the polymer according to an embodiment, the low molecular weight compounds 1 and 2 enter the gap between the polymer according to an embodiment and exist therein. Therefore, a denser hole transport layer is provided, and the hole transport ability of the hole transport layer is improved. In addition, since the hole transporting ability of the low molecular weight compounds 1 and 2 itself, which is a hole transport material to be added, is imparted to the hole transport layer, an effect that the hole transport properties may be further improved. For example, the low molecular weight material includes the low molecular weight compound 1, the low molecular weight compound 2, or a combination thereof.

Hereinafter, the low molecular weight compound 1 and the low molecular weight compound 2 are described.

(Low Molecular Weight Compound 1)

The low molecular weight compound 1 is a compound represented by Chemical Formula (L1)

(L1)

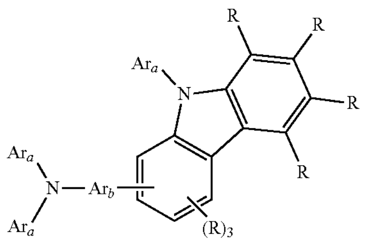

wherein, in Chemical Formula (L1), each R is independently a hydrogen atom, a deuterium atom, or a monovalent organic group. In Chemical Formula (L1), a plurality of Rs may form a ring. A plurality of $Ar_a$s in Chemical Formula (L1) may form a ring. One or a plurality of $Ar_a$s in Chemical Formula (L1) and $Ar_b$ may form a ring. In Chemical Formula (L1), one or more $Ar_a$ and one or a plurality of Rs may form a ring. In Chemical Formula (L1), one or a plurality of Rs and $Ar_b$ may form a ring. From the viewpoint of further enhancing the advantageous effect by the addition of the low molecular weight material, R in Chemical Formula (L1) may be a hydrogen atom.

Specific examples of the monovalent organic group may include an alkyl group, a cycloalkyl group, an alkenyl group, an alkynyl group, an aryl group, a heteroaryl group, an acyl group, an alkoxycarbonyl group, an amino group, an alkoxy group, a cycloalkyloxy group, an aryloxy group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a silyl group, a sulfonyl group, a sulfinyl group, an ureido group, a phosphoric acid amide group, a halo hydroxyl group, a mercapto group, a cyano group, a sulfo group, a carboxyl group, a nitro group, a hydroxamic acid group, a sulfino group, a hydrazino group, an imino group, and the like.

In Chemical Formula (L1), when a plurality of Rs form a ring, the plurality of Rs may be combined with each other to form a ring. In Chemical Formula (L1), when a plurality of $Ar_a$s form a ring, the plurality of $Ar_a$s forming the ring may be combined with each other to form a ring. In Chemical Formula (L1), when one or a plurality of $Ar_a$s and $Ar_b$ form a ring, one or a plurality of $Ar_a$s and $Ar_b$ forming a ring may be bonded to each other to form a ring. In Chemical Formula (L1), when one or a plurality of $Ar_a$s and one or a plurality of Rs form a ring, one or a plurality of $Ar_a$s and one or a plurality of Rs forming a ring may be bonded to each other to form a ring. In Chemical Formula (L1), when one or a plurality of Rs and $Ar_b$ form a ring, a plurality of Rs and $Ar_b$ forming the ring may be bonded to each other to form a ring.

In Chemical Formula (L1), when a plurality of Rs form a ring, a plurality of Rs forming the ring may share one aryl group or a heteroaryl group to form a ring. In Chemical Formula (L1), when a plurality of $Ar_a$s forms a ring, a plurality of $Ar_a$s forming the ring may share one aryl group or a heteroaryl group to form a ring. In Chemical Formula (L1), when one or a plurality of $Ar_a$s and $Ar_b$ form a ring, one or a plurality of $Ar_a$s and $Ar_b$ forming the ring may share an aryl group or a heteroaryl group to form a ring. In Chemical Formula (L1), when one or a plurality of $Ar_a$s and one or a plurality of Rs form a ring, one or a plurality of $Ar_a$s and one or a plurality of Rs forming a ring may share an aryl group or a heteroaryl group to form a ring. In Chemical Formula (L1), when one or a plurality of Rs and $Ar_b$ form a ring, a plurality of Rs and $Ar_b$ forming a ring may share one aryl group or a heteroaryl group to form a ring.

The number of carbon atoms of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group. Due to an interaction of the ligand of the quantum dot and the alkyl group present in the hole transport layer, effects such as improving hole injection properties may be obtained.

In addition, when the solvent for dispersing the quantum dots is a long-chain hydrocarbon-based solvent, from the viewpoint of securing the solvent resistance of the hole transport layer, the number of carbon atoms of the alkyl group contained in the polymer according to an embodiment may be small.

Accordingly, the alkyl group may include a linear or branched alkyl group having 1 to 18 carbon atoms. These alkyl groups may be appropriately selected depending on the quantum dots used or the solvent for dispersing the quantum dots.

The carbon number of the alkoxy group may be as follows.

For example, when the ligand of the quantum dot is a long-chain alkyl-containing compound such as oleic acid, oleylamine, or trioctylphosphine, the compound included in the hole transport layer may also include a compound having a long-chain alkoxy group. Due to an interaction of the ligand of the quantum dot with the alkoxy group present in the hole transport layer, effects such as improving hole injection properties may be obtained.

In addition, when the solvent for dispersing the quantum dots is a long-chain hydrocarbon-based solvent, the number of carbon atoms of the alkoxy group contained in the polymer according to an embodiment may be small from the viewpoint of securing the solvent resistance of the hole transport layer.

Accordingly, the alkoxy group may include a linear or branched alkoxy group having 1 to 18 carbon atoms. These alkoxy groups may be appropriately selected depending on the quantum dots used or the solvent for dispersing the quantum dots.

$Ar_a$ in Chemical Formula (L1) is a group represented by Chemical Formula (L1-a). A plurality of $Ar_a$s in Chemical Formula (La1) may be the same as or different from each other, but for example, may be different from each other. A plurality of $Ar_a$s In Chemical Formula (L1) may be bonded to each other to form a ring.

(L1-a)

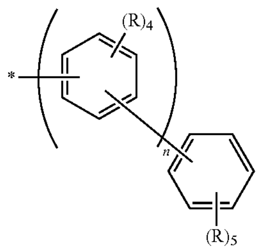

In Chemical Formula (L1-1), the Rs are each independently a hydrogen atom, a deuterium atom, or a monovalent organic group. In Chemical Formula (L1-1), a plurality of Rs may form a ring with each other. Here, although the monovalent organic group is not particularly, for example, it is a linear or branched alkyl group having 1 to 24 carbon atoms. Further, in Chemical Formula (L1-1), n is an integer of 0 or more and 3 or less, for example, an integer of 0 or more and 2 or less, for example, 0 or 1. In addition, in Chemical Formula (L1-a), * represents a bonding position with an adjacent atom.

When a plurality of Rs in Chemical Formula (L1-1) forms a ring, a plurality of Rs may be bonded to each other to form a ring.

When a plurality of Rs in Chemical Formula (L1-1) forms a ring, a plurality of Rs forming the ring may share one aryl group or a heteroaryl group to form a ring.

Specific examples of the linear or branched alkyl group having 1 to 24 carbon atoms may include a methyl group, an ethyl group, an n-propyl group, an isopropyl group, an n-butyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methyl-butyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, and the like.

The carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group. Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, the number of carbon atoms of the alkyl group contained in the polymer according to an embodiment may be small from the viewpoint of securing the remaining film ratio of the hole transport layer.

Accordingly, the alkyl group may include a linear or branched alkyl group having 1 to 18 carbon atoms. These alkyl groups may be appropriately selected depending on the quantum dots used or the solvent for dispersing the quantum dots.

From the viewpoint of further improving the advantageous effect by the addition of the low molecular weight material, $Ar_a$ may be a group selected from Group L1-A. Meanwhile, in Group L1-A, R is a linear or branched alkyl group having 1 to 24 carbon atoms, for example, a linear alkyl group having 1 to 16 carbon atoms. In addition, in Group L1-A, * represents a bonding position with an adjacent atom.

Group L1-A

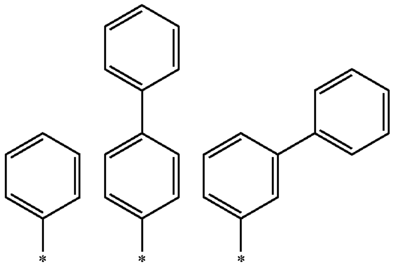

-continued

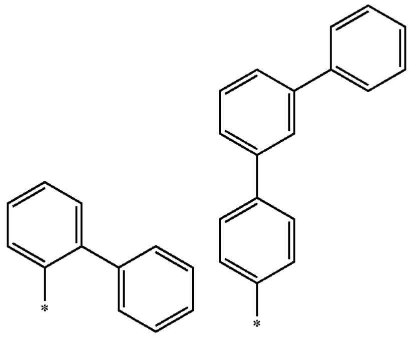

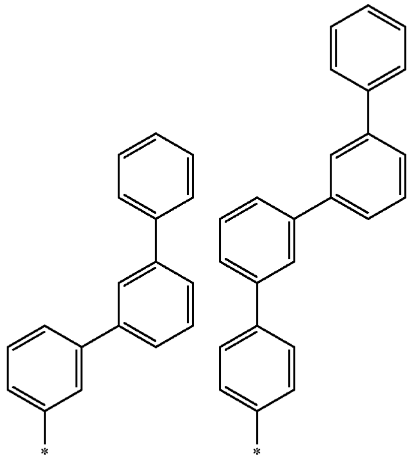

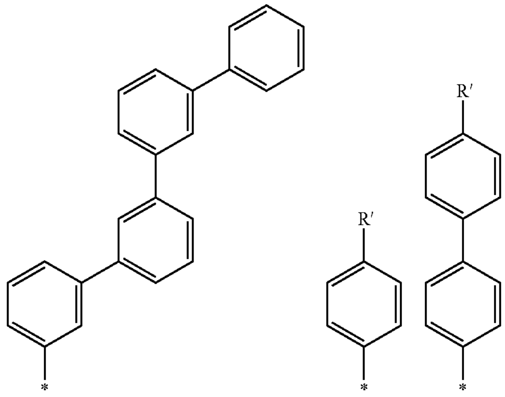

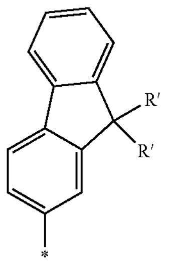

From the viewpoint of further improving the advantageous effect of the addition of the low molecular weight material, $Ar_a$ may be a group selected from Group L1-A'. On the other hand, dodecyl Group L1-A' represents an n-dodecyl group. * indicates a bonding position with an adjacent atom.

Group L1-A′

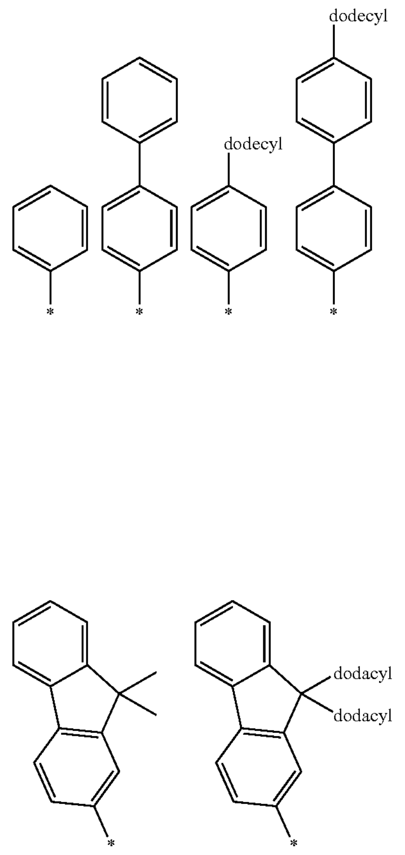

$Ar_b$ in Chemical Formula (L1) may be represented by Chemical Formula (L1-b).

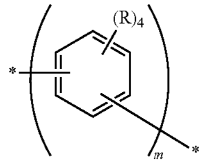

(L1-b)

Each occurrence of R in Chemical Formula (L1-b) is independently a hydrogen atom, a deuterium atom, or a monovalent organic group. In Chemical Formula (L1-b), a plurality of Rs may form a ring with each other. From the viewpoint of further improving the advantageous effect of the addition of the low molecular weight material, R in Chemical Formula (La-b) may be a hydrogen atom.

In Chemical Formula (L1-b), when a plurality of Rs form a ring, the plurality of Rs may combine with each other to form a ring.

In Chemical Formula (L1-b), when a plurality of Rs form a ring, a plurality of Rs forming the ring may share one aryl group or a heteroaryl group to form a ring.

In Chemical Formula (L1-b), m is an integer of 0 or more and 2 or less, for example, 1 or 2, for example, 1. In Chemical Formula (L1-b), * represents a bonding position with an adjacent atom.

$Ar_b$ in Chemical Formula (L1) may be selected from Group L1-B. On the other hand, R' in Groups L1-B is each independently a linear or branched alkyl group having 1 to 24 carbon atoms. A plurality of Rs of Group L1-B may be bonded to each other to form a ring. In addition, in Groups L1-B, * represents a bonding position with an adjacent atom. Among them, $Ar_b$ may be a para-phenylene group from the viewpoint of further improving the advantageous effect by the addition of the low molecular weight material.

The carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group. Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, from the viewpoint of securing the solvent resistance of the hole transport layer, the number of carbon atoms of the alkyl group contained in the polymer according to an embodiment may be small.

Accordingly, the alkyl group may include a linear or branched alkyl group having 1 to 18 carbon atoms. These alkyl groups may be appropriately selected depending on the quantum dots used or the solvent for dispersing the quantum dots.

Group L1-B

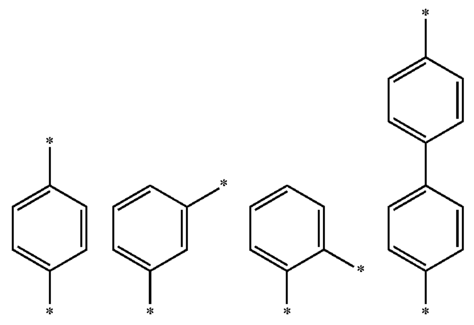

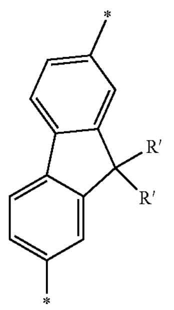

The low molecular weight compound 1 may be a compound represented by any one of Chemical Formulas (L1-1) to (L1-3):

(L1-1)

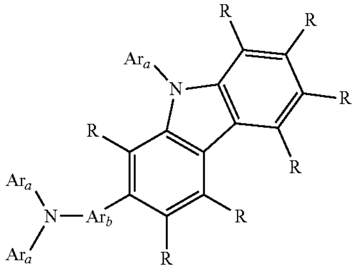

(L1-2)

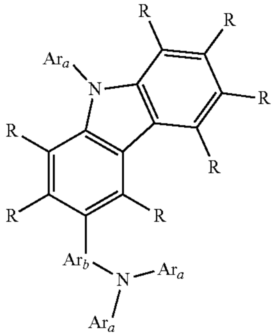

-continued (L1-3)

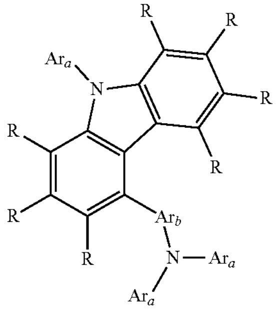

The definitions of R, $Ar_a$, and $Ar_b$ in Chemical Formula (L-1-1) to (L-1-3) are the same as those in Chemical Formula (L-1).

Specific examples of the low molecular weight compound 1 include compounds represented by the following chemical formulas. The low molecular weight compound 1 may include a single low molecular weight compound or a mixture of 2 or more low molecular weight compounds.

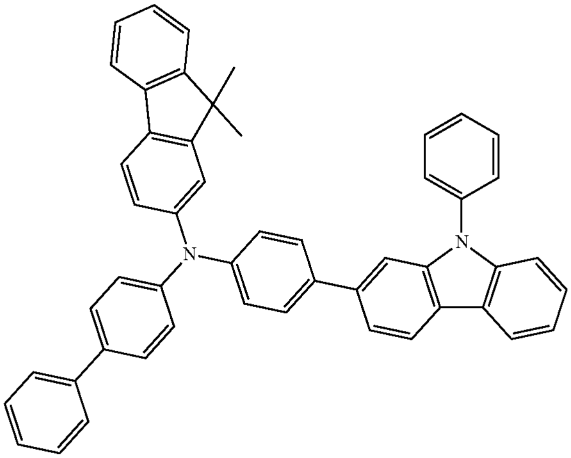

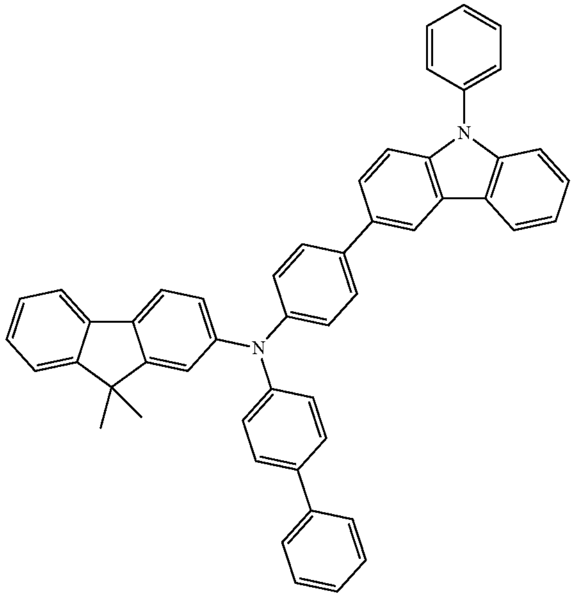

-continued
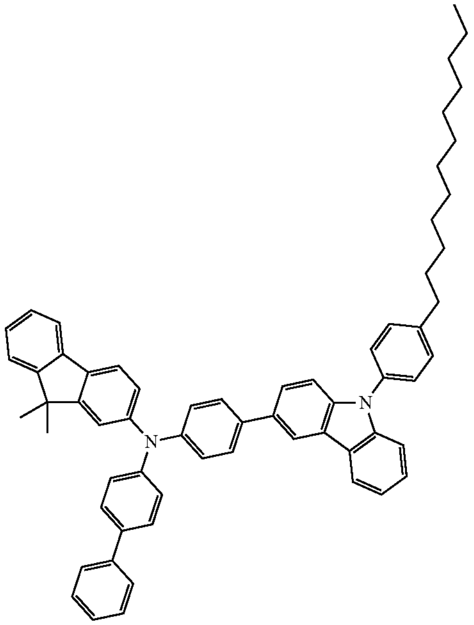
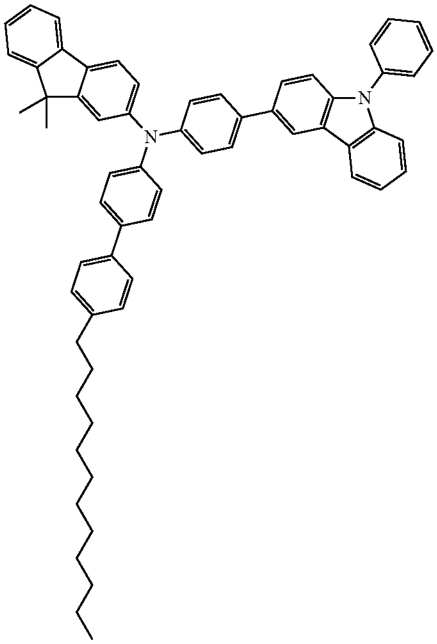
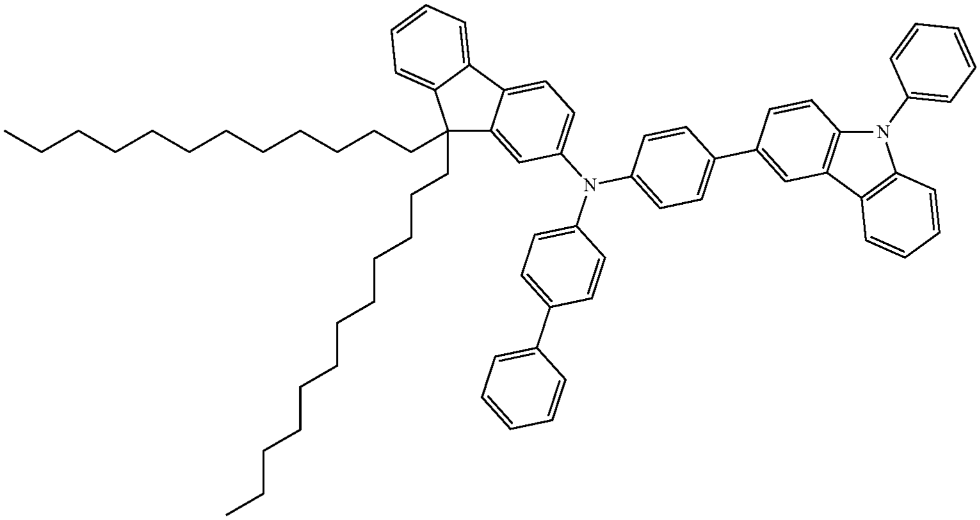
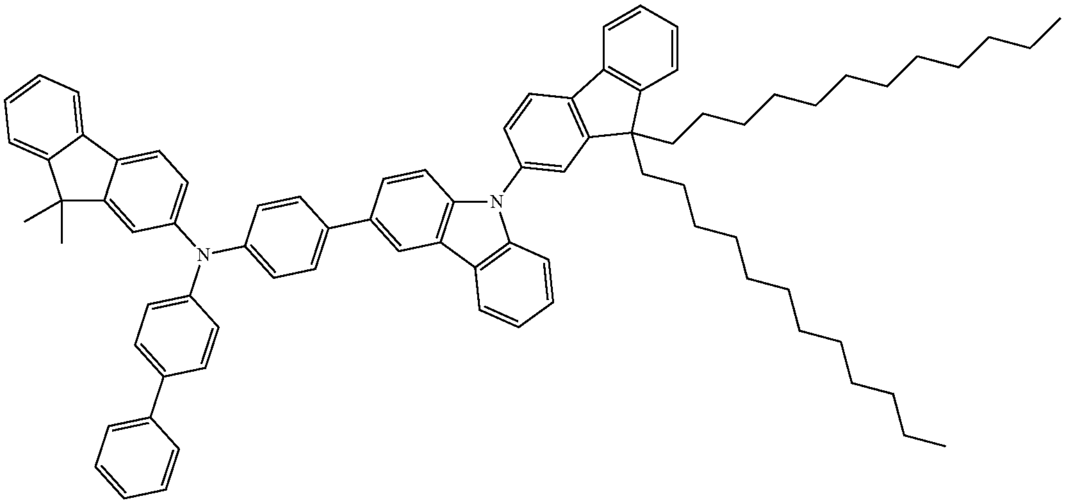

-continued

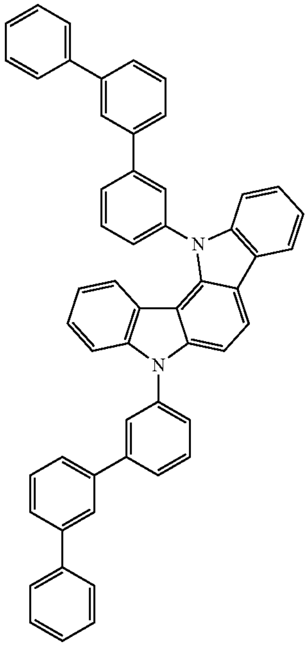

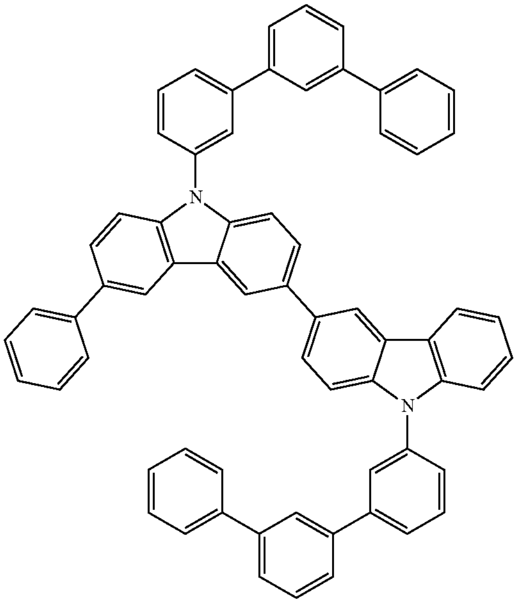

The low molecular weight compound 1 may be synthesized using a known organic synthesis method.

(Low Molecular Weight Compound 2)

The low molecular weight compound 2 is a compound represented by Chemical Formula (L2).

(L2)

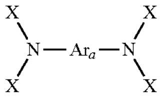

$Ar_a$ In Chemical Formula (L2) may be represented by Chemical Formula (L2-a).

(L2-a)

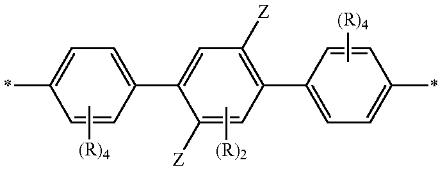

R in Chemical Formula (L2-a) is each independently a hydrogen atom, a deuterium atom, or a monovalent organic group. In Chemical Formula (L2-a), a plurality of Rs may form a ring with each other. In Chemical Formula (L2-a), Z is each independently a linear or branched alkyl group having 1 to 12 carbon atoms, for example, a linear alkyl group having 4 to 12 carbon atoms. In addition, * in Chemical Formula (L2-a) represents a bonding position with an adjacent atom.

From the viewpoint of further improving the advantageous effect of the addition of the low molecular weight material, $Ar_a$ in Chemical Formula (L2) may be represented by Chemical Formula (L2-a').

(L2-a')

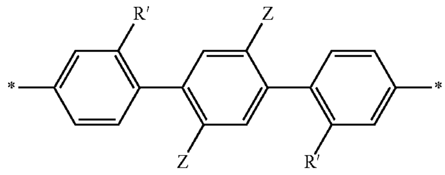

In Chemical Formula (L2-a'), Z is the same as defined in Chemical Formula (L2-a). In Chemical Formula (L2-a'), R' is a hydrogen atom or a methyl group. In Chemical Formula (L2-a'), * represents a bonding position with an adjacent atom.

From the viewpoint of further improving the effects, $Ar_a$ may be a group selected from Group L2-A. On the other hand, in Group L2-A, * represents a bonding position with an adjacent atom.

Group L2-A

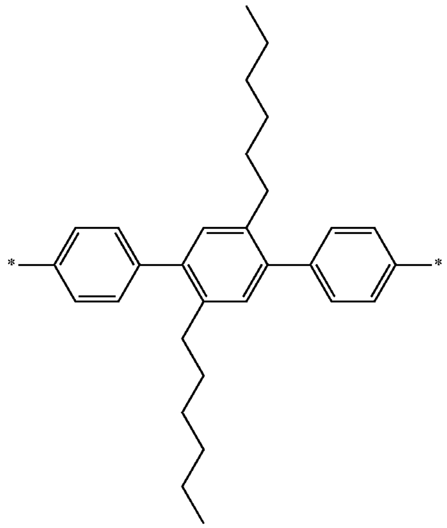

-continued

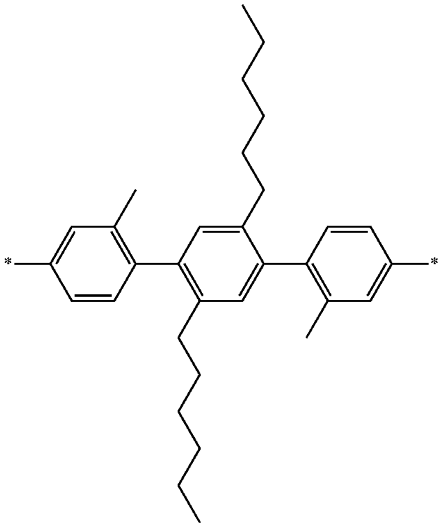

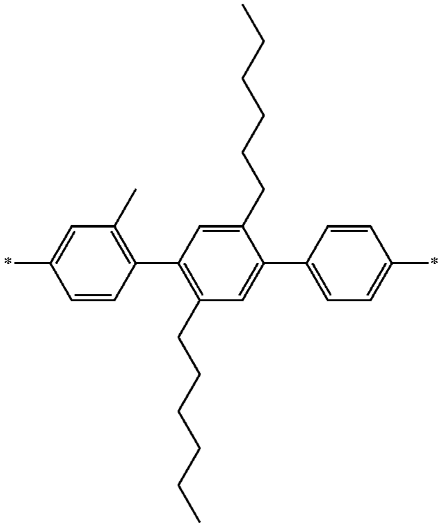

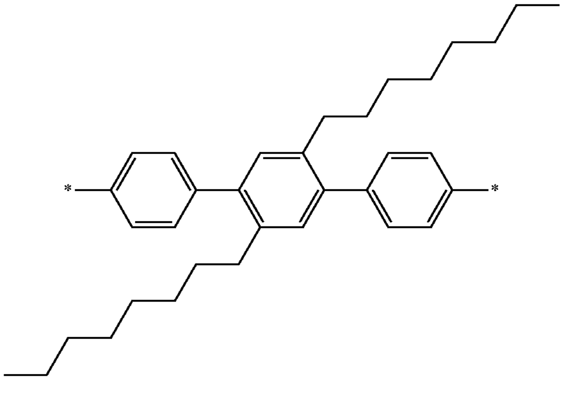

-continued

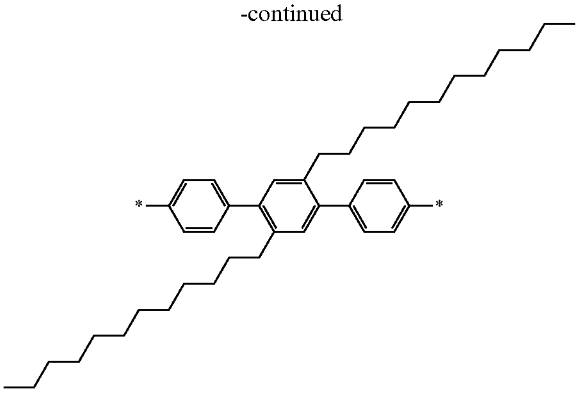

X in Chemical Formula (L2) is a group represented by Chemical Formula (L2-b). A plurality of Xs in Chemical Formula (L2) may be the same as or different from each other. A plurality of Xs in Chemical Formula (L2) may be bonded to each other to form a ring.

(L2-b)

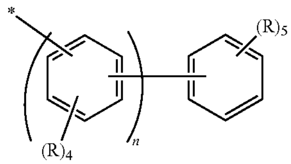

Each occurrence of R in Chemical Formula (L2-b) is independently a hydrogen atom, a deuterium atom, or a monovalent organic group. In Chemical Formula (L2-b), a plurality of Rs may be bonded to each other to form a ring. In addition, in Chemical Formula (L2-b), n is an integer of 0 or more and 3 or less, for example, an integer of 0 or more and 2 or less. In addition, * in Chemical Formula (L2-b) represents a bonding position bonding with an adjacent atom.

From the viewpoint of further improving the advantageous effect of the addition of the low molecular weight material, X may be a group selected from Group L2-B. On the other hand, each occurrence of R' in Group L2-B is independently a linear or branched alkyl group having 1 to 24 carbon atoms. A plurality of R' in Group L2-B may be bonded to each other to form a ring. In addition, in Group L2-B, * represents a bonding position with an adjacent atom.

The carbon number of the alkyl group may be as follows. For example, when the ligand of the quantum dot is a long-chain alkyl-containing compound such as oleic acid, oleylamine, or trioctylphosphine, the compound included in the hole transport layer may also include a compound having a long-chain alkyl group. Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, from the viewpoint of securing the solvent resistance of the hole transport layer, the number of carbon atoms of the alkyl group contained in the polymer according to an embodiment may be small.

Accordingly, the alkyl group may include a linear or branched alkyl group having 1 to 18 carbon atoms. These alkyl groups may be appropriately selected depending on the quantum dots used or the solvent for dispersing the quantum dots.

Group L2-B

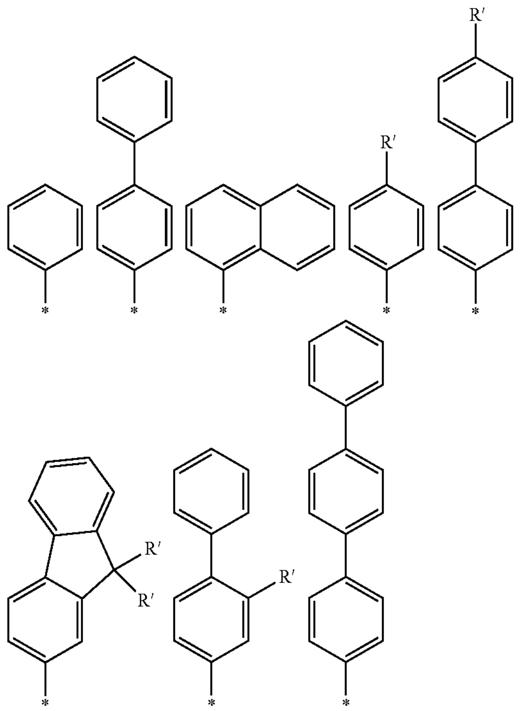

From the viewpoint of further improving the advantageous effect of the addition of the low molecular weight material, the group (—$NX_2$) bonded with $Ar_a$ in Chemical Formula (L2) may be a group selected from Group L2-B'. The groups (—$NX_2$) bonded with a plurality of $Ar_a$s in Chemical Formula (L2) may be the same or different from each other. On the other hand, * in Group L2-B' represents a bonding position with $Ar_a$ of Chemical Formula (L2).

Group L2-B'

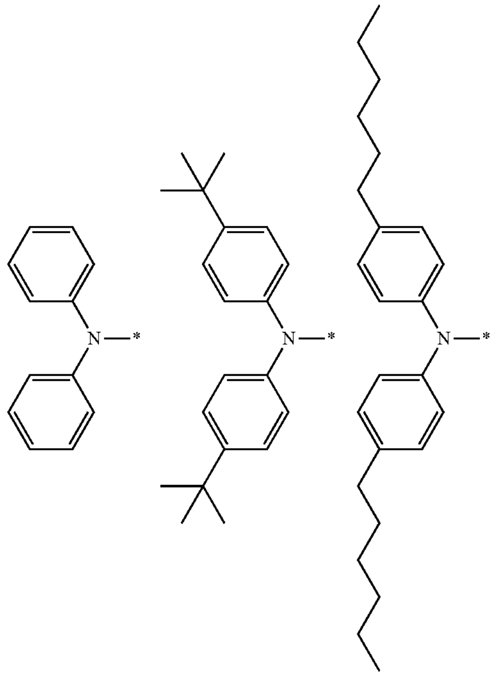

-continued

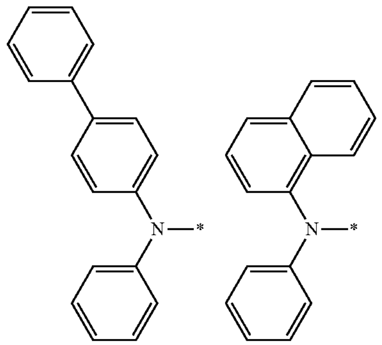

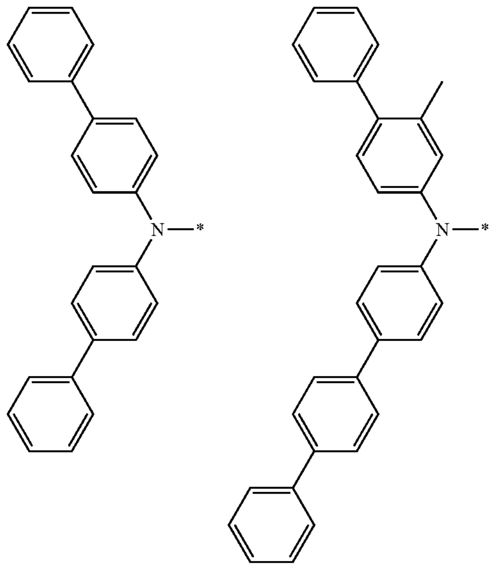

-continued
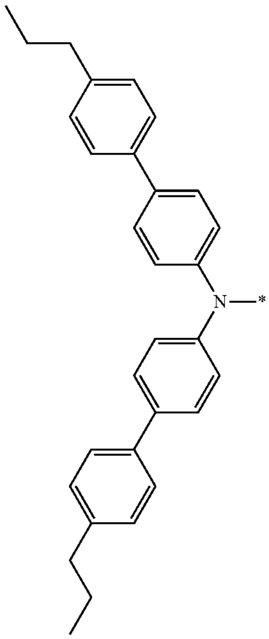
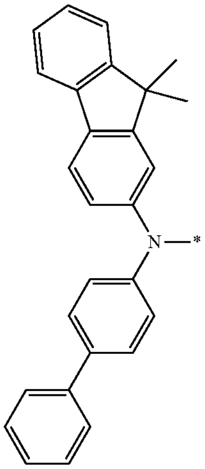
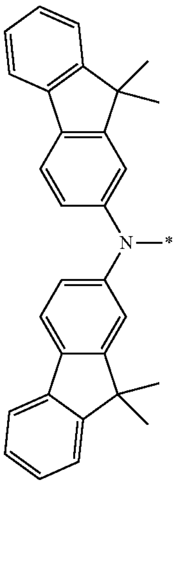
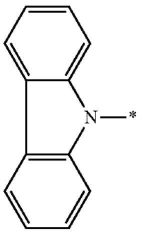
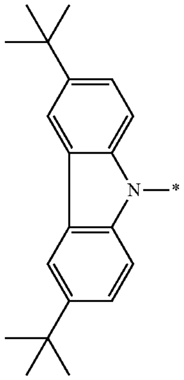
-continued
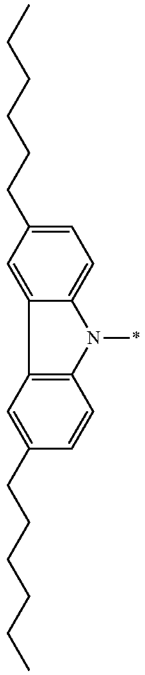
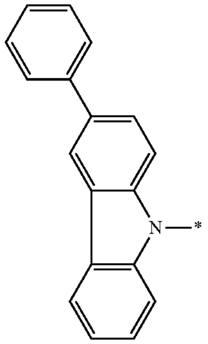
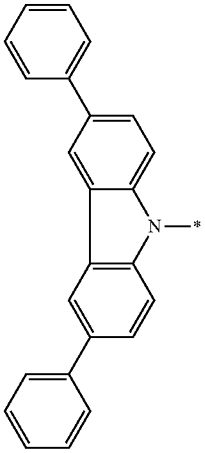 [SMILES: *n1c2ccc(-c3ccccc3)cc2c2cc(-c3ccccc3)ccc21]
Specific examples of the low molecular weight compound 2 include compounds represented by the following chemical formulas. The low molecular weight compound 2 may be used alone or as a mixture of 2 or more low molecular weight compound s.

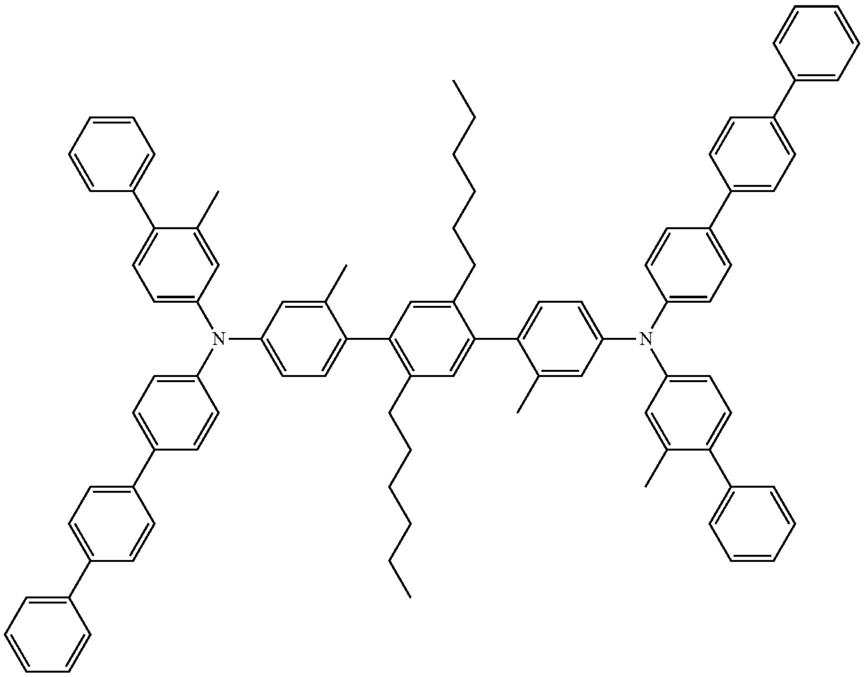
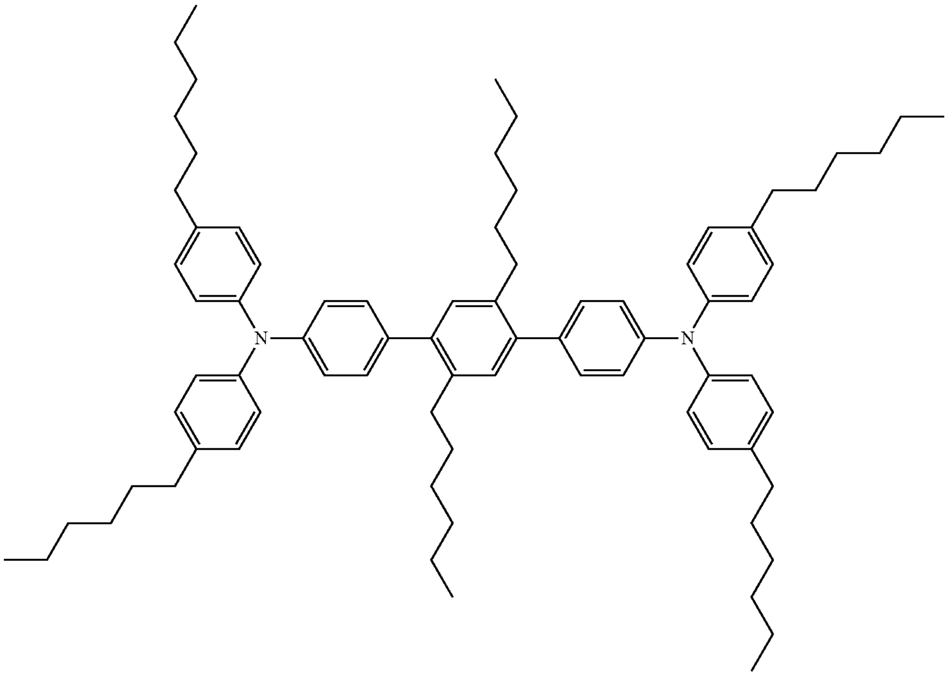

-continued
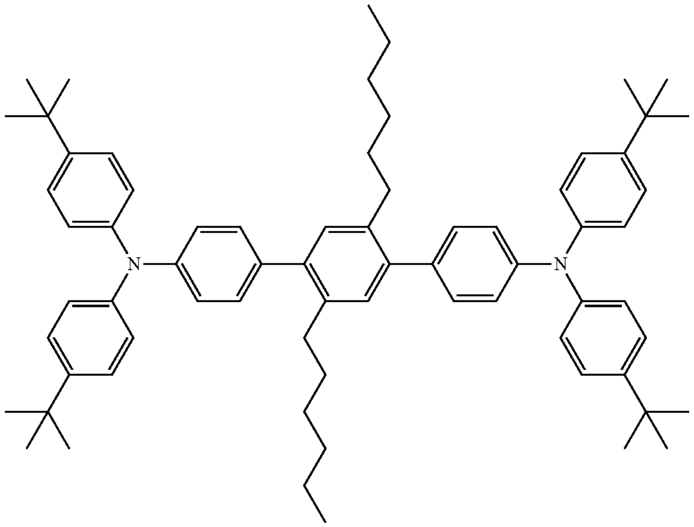
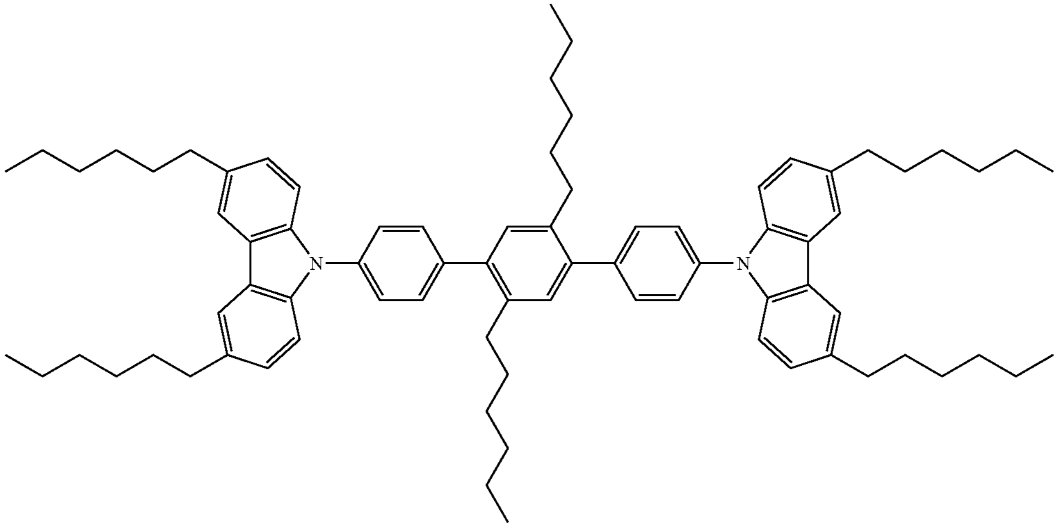
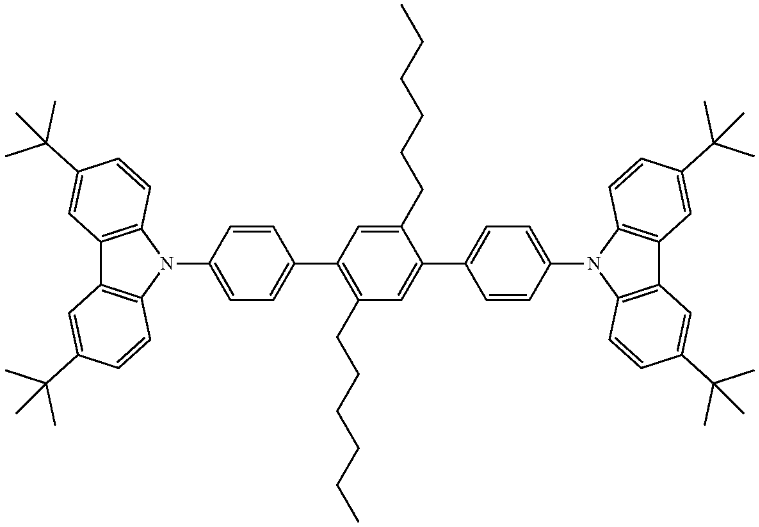

-continued

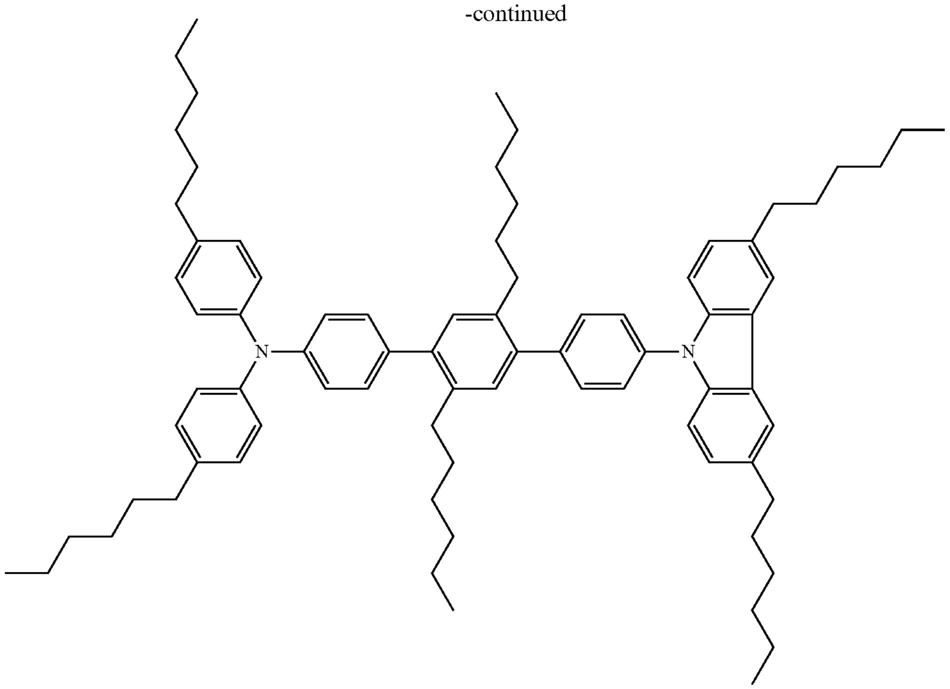

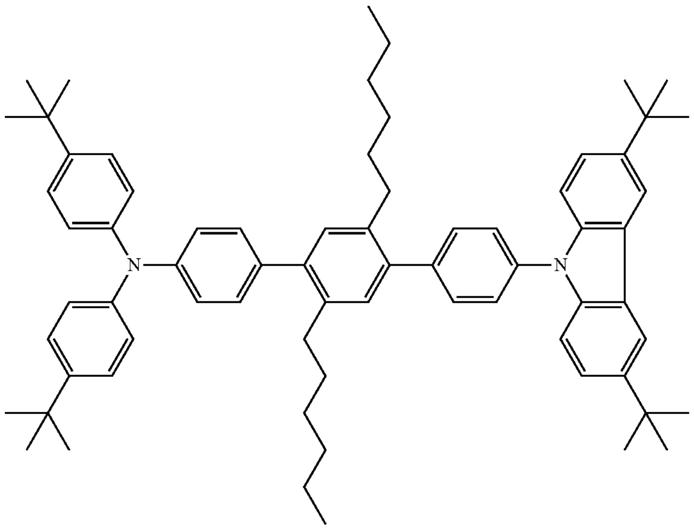

The low molecular weight compound 2 may be synthesized using a known organic synthesis method.

(Low Molecular Weight Compound 3)

Examples of the low molecular weight material according to an embodiment include a low molecular weight compound represented by Chemical Formula (L3) (hereinafter referred to as "low molecular weight compound 3"). The low molecular weight compound 3 is a hole transport material, and by using it together with the polymer according to an embodiment, the low molecular weight compound 3 is interposed in the gap between the polymers. Accordingly, it becomes a denser hole transport layer, and the hole transport ability of the hole transport layer may be improved. In addition, since the hole transport properties of the low molecular weight compound 3 itself, which is a hole transport material to be added, is imparted to the hole transport layer, the effect of further improving the hole transport properties may be obtained. In an embodiment, the low molecular weight material includes the low molecular weight compound 3.

Hereinafter, the low molecular weight compound 3 is described.

(Low Molecular Weight Compound 3)

The low molecular weight compound 3 is a compound represented by Chemical Formula (L3).

(L3)

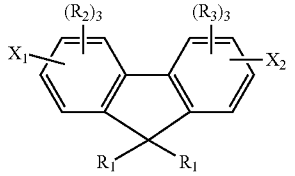

In Chemical Formula (L3), $R_1$ to $R_3$ are each independently a hydrogen atom, a monovalent hydrocarbon group, or a monovalent aromatic hydrocarbon group. In addition, $R_1$ to $R_3$ may be the same or different from each other. In addition, two $R_1$s in Chemical Formula (L3) may be bonded to each other to form a ring. Here, the monovalent hydrocarbon group is not particularly limited, and examples thereof may include a linear or branched alkyl group, alkenyl group, and alkynyl group, and a cyclic alkyl group (cycloalkyl group). The alkyl group is for example a linear or branched alkyl group having 1 to 20 carbon atoms. Examples of the alkyl group may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyl hexyl group, an n-tridecyl group, an n-tetradecyl group, an n-pentadecyl group, an n-hexadecyl group, an n-heptadecyl group, an n-octadecyl group, and the like, but are not limited thereto.

The carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group. Due to an interaction of the ligand of the quantum dot and the alkyl group present in the hole transport layer, effects such as improving hole injection properties may be obtained.

In addition, when the solvent for dispersing the quantum dots is a long-chain hydrocarbon-based solvent, from the viewpoint of securing the solvent resistance of the hole transport layer, the number of carbon atoms of the alkyl group contained in the polymer according to an embodiment may be small.

Accordingly, the alkyl group may include a linear or branched alkyl group having 1 to 18 carbon atoms. These alkyl groups may be appropriately selected depending on the quantum dots used or the solvent for dispersing the quantum dots.

The alkenyl group may include, for example, a linear or branched alkenyl group having 2 to 12 carbon atoms. Although the alkenyl group is not limited to the following, it may be, for example, a vinyl group, an allyl group, a 1-propenyl group, a 2-butenyl group, a 1,3-butadienyl group, a 2-pentenyl group, an isopropenyl group, and the like. The alkynyl group may include, for example, a linear or branched alkynyl group having 2 to 12 carbon atoms. Although the alkynyl group is not limited to the following, it may be, for example, an ethenyl group, a propargyl group, and the like. The cycloalkyl group may be, for example, a cycloalkyl group having 3 to 12 carbon atoms. Although the cycloalkyl group is not limited to the following, it may be, for example, a cyclopropyl group, a cyclobutyl group, a cyclopentyl group, cyclohexyl group, and the like. Moreover, although the monovalent aromatic hydrocarbon group is not particularly limited, an aromatic hydrocarbon group having 6 to 25 carbon atoms. Examples of the aromatic hydrocarbon group having 6 to 25 carbon atoms may include monovalent groups derived from aromatic hydrocarbons such as benzene (phenyl group), indene, naphthalene, anthracene, azulene, heptalene, acenaphthene, phenalene, fluorene, anthraquinone, phenanthrene, biphenyl, terphenyl, quaterphenyl, quinkphenyl, sexyphenyl, pyrene, 9,9-diphenylfluorene, and 9,9'-spirobi[fluorene], but are not limited thereto. Among these, from the viewpoint of further improving advantageous effects of the addition of the low molecular weight material, each occurrence of $R_1$ may independently be a hydrogen atom or a linear or branched alkyl group having 1 to 12 carbon atoms, a phenyl group, or a biphenyl group, for example, a linear or branched alkyl group having 3 to 10 carbon atoms, a phenyl group, or a biphenyl group, or for example, a linear alkyl group of 5 to 8 carbon atoms, or a phenyl group. In addition, from the viewpoint of further improving advantageous effects of the addition of the low molecular weight material, $R_2$ to $R_3$ may each independently be a hydrogen atom or a linear or branched alkyl group having 1 to 8 carbon atoms, for example, a hydrogen atom or a linear alkyl group having 1 to 3 carbon atoms, or for example, a hydrogen atom.

That is, from the viewpoint of further enhancing advantageous effects by the addition of the low molecular weight material, the structure of Chemical Formula (L3) excluding $X_1$ and $X_2$ (that is, the following chemical formula structure) may be selected from the following group:

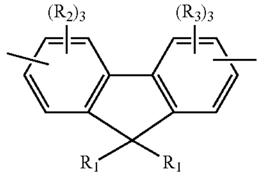

Hereinafter, “Alkyl” means “unsubstituted (i.e., Alkyl=hydrogen atom) or substituted with an alkyl group”. For example, “Alkyl” means “substituted with a linear or branched alkyl group having 1 to 12 carbon atoms”. For example, “Alkyl” means “substituted with a linear or branched alkyl group having 5 to 8 carbon atoms”. In addition, “Alkyl” may be the same alkyl groups and may be different alkyl groups. In the following structures, * represents a bonding position with an adjacent atom.

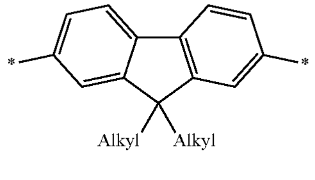

-continued

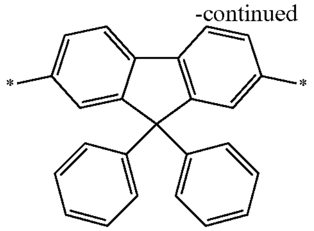

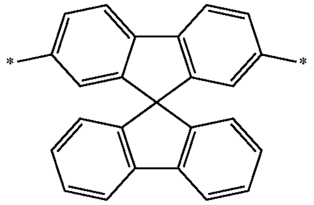

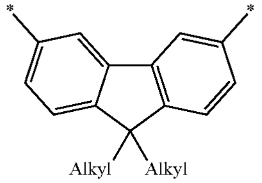

In Chemical Formula (L3), $X_1$ is a hydrogen atom or a group represented by Chemical Formula (L3-a). In addition, $X_2$ is group represented by Chemical Formula (L3-a). That is, the low molecular weight compound 3 includes one or two groups represented by Chemical Formula (L3-a). On the other hand, * in Chemical Formula (L3-a) represents a bonding position where $X_1$ or $X_2$ is bonded to the fluorene ring in Chemical Formula (L3).

(L3-a)

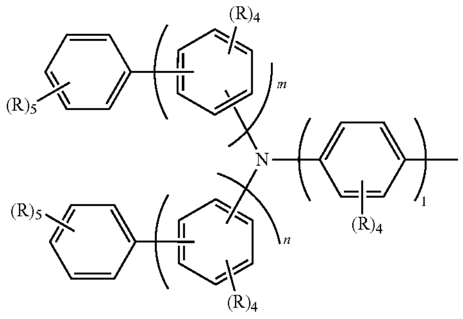

In Chemical Formula (L3-a), R is each independently a hydrogen atom or a monovalent organic group. Here, a plurality of Rs may be the same or different, respectively. Further, in Chemical Formula (L3-a), two or more R groups may be combined with each other to form a ring. Here, although the monovalent hydrocarbon group is not particularly limited, it is the same as the definition for $R_1$ to $R_3$ in Chemical Formula (L3). Among these, from the viewpoint of further enhancing advantageous effects of the addition of the low molecular weight material, R may each independently be a hydrogen atom or a linear or branched alkyl group having 1 to 12 carbon atoms, for example, a hydrogen atom or a linear or branched alkyl group having 3 to 10 carbon atoms.

In addition, in Chemical Formula (L3-a), 1, m, and n are each independently an integer of 0-3. From the viewpoint of further improving advantageous effects of the addition of the low molecular weight material, I may be an integer of 0 to 2, for example, 0 or 1. Further, from the viewpoint of further enhancing advantageous effects by the addition of the low molecular weight material, n and m may be integers of 0 to 2, for example, integers of 0 or 2.

In Chemical Formula (L3-a), as in the following low molecular weight compound (L3-2), two phenyl groups at the terminal ends may be combined to form a carbazole ring.

That is, from the viewpoint of further improving advantageous effects of the addition of the low molecular weight material, the group represented by Chemical Formula (L3-a) may have any structure selected from Group L3-A. In Group L3-A, * represents a bonding position with an adjacent atom.

Group L3-A

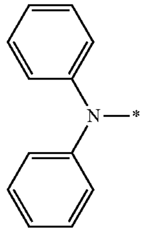

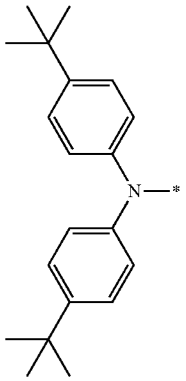

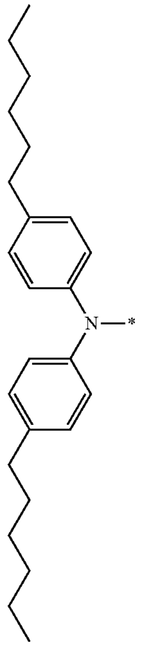

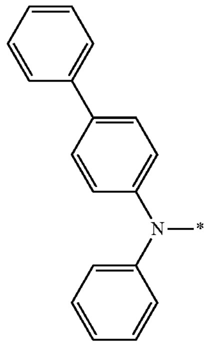

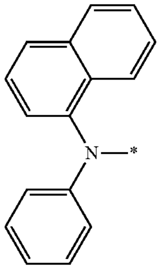

-continued
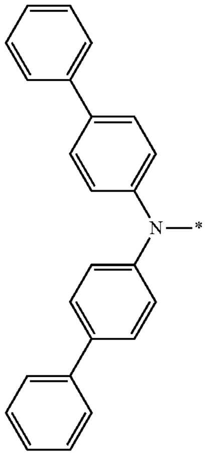
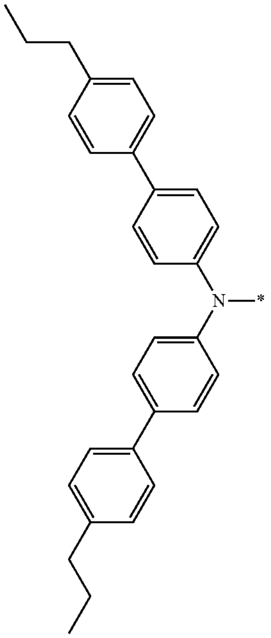
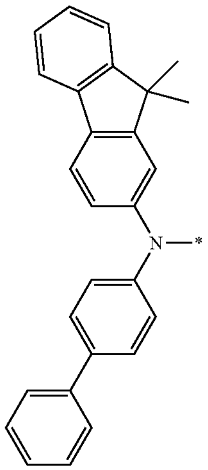
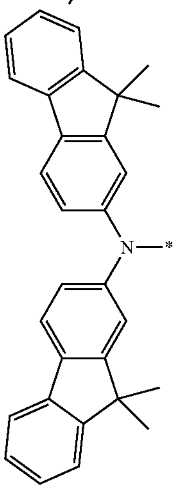
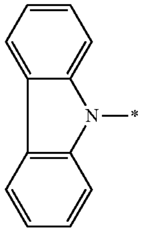
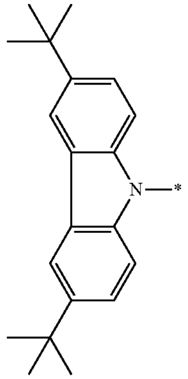
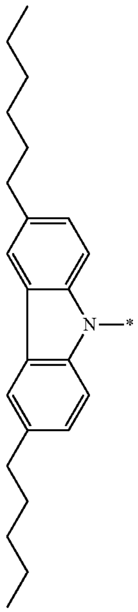
-continued
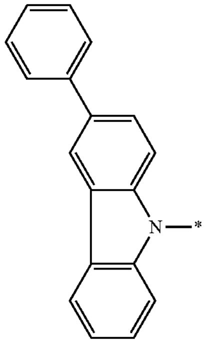
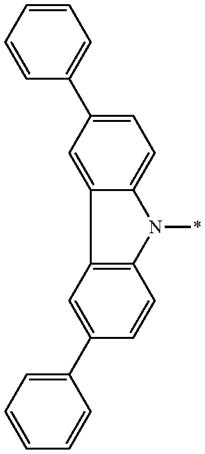
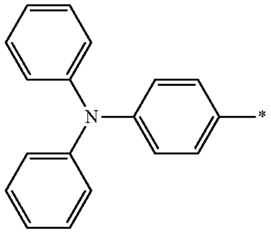
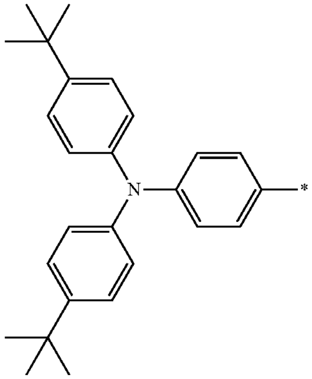
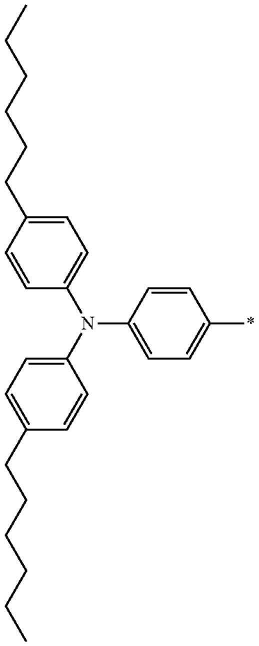

-continued
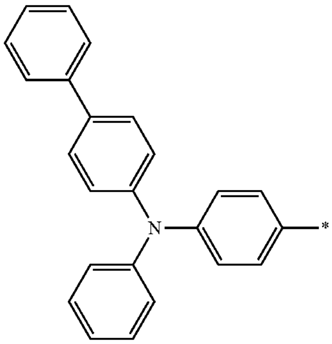
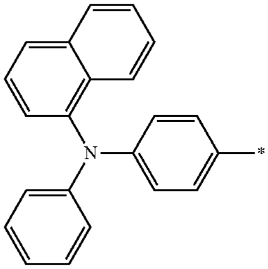
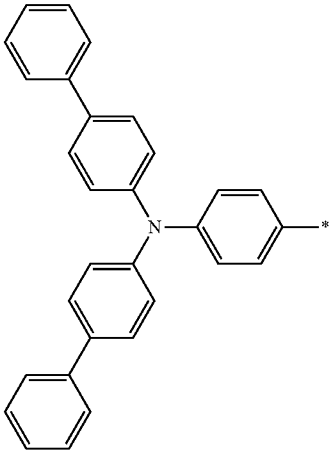
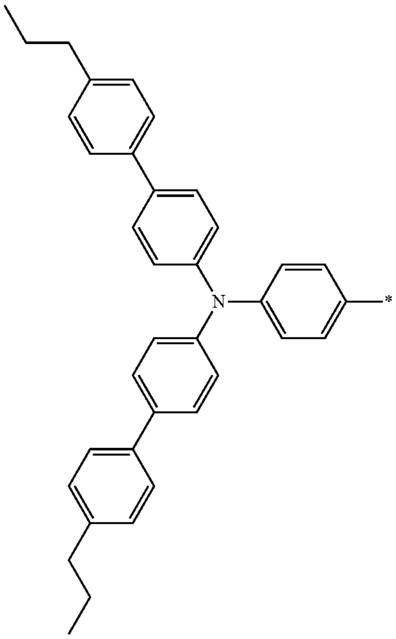
-continued
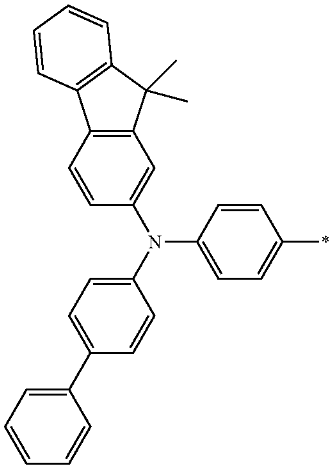
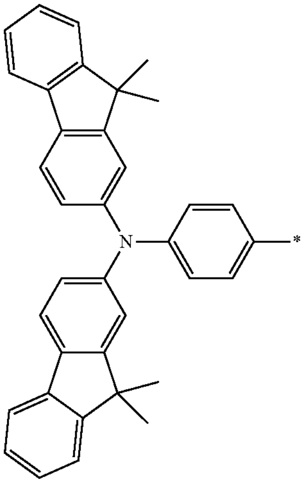
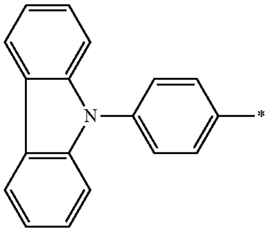
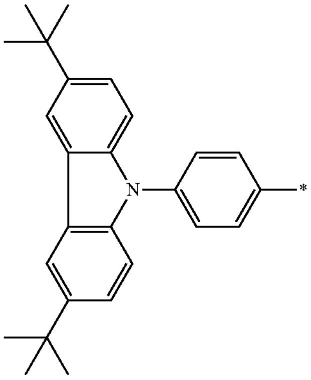

-continued
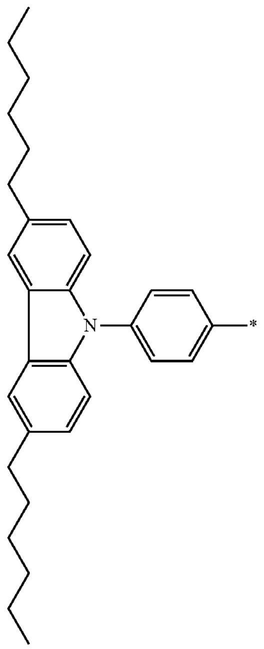
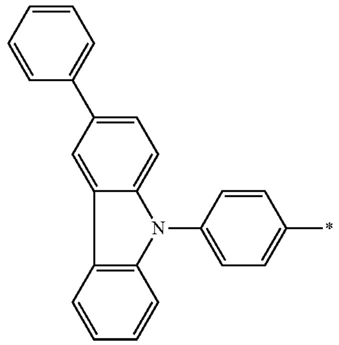
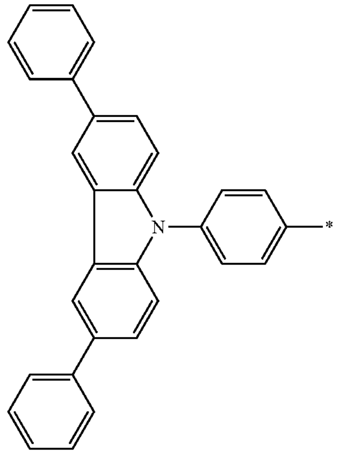
-continued
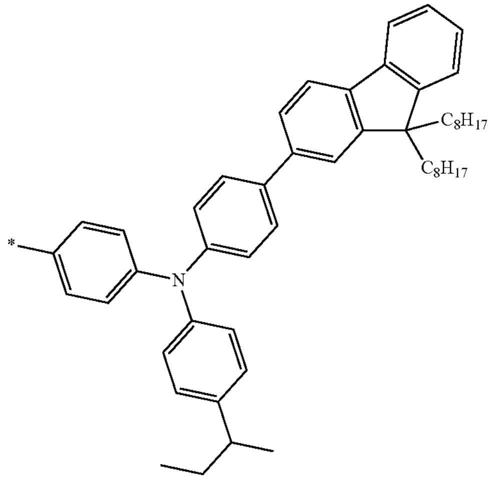
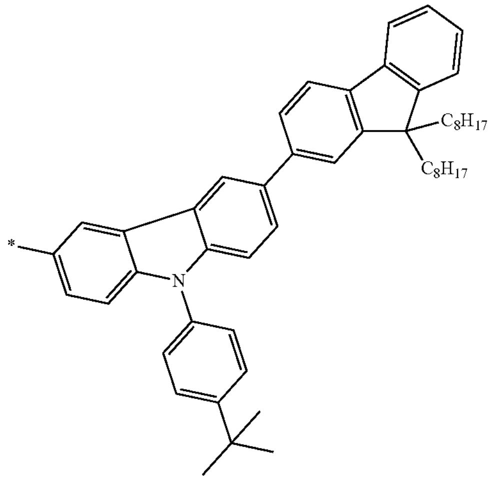
The low molecular weight compound 3 may be one or more of compounds represented by Chemical Formulas (L-3-1) to (L-3-10).

(L3-1)
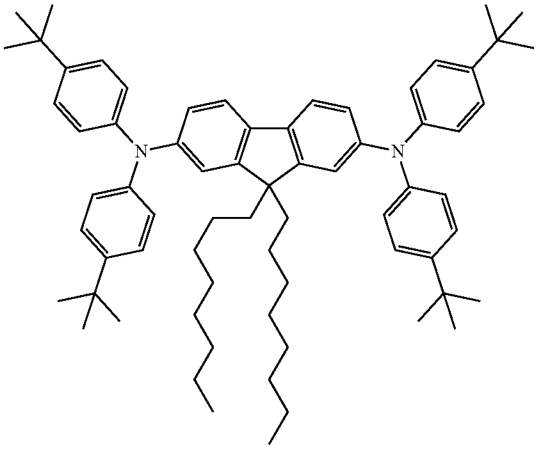
(L3-2)
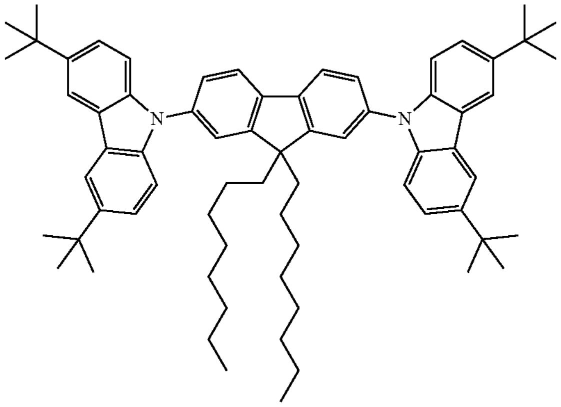
(L3-3)
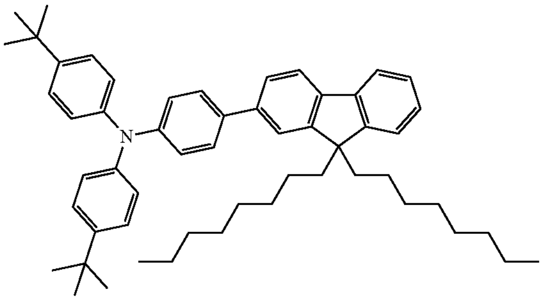
(L3-4)
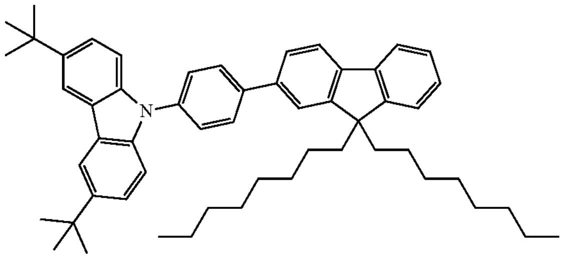
(L3-5)
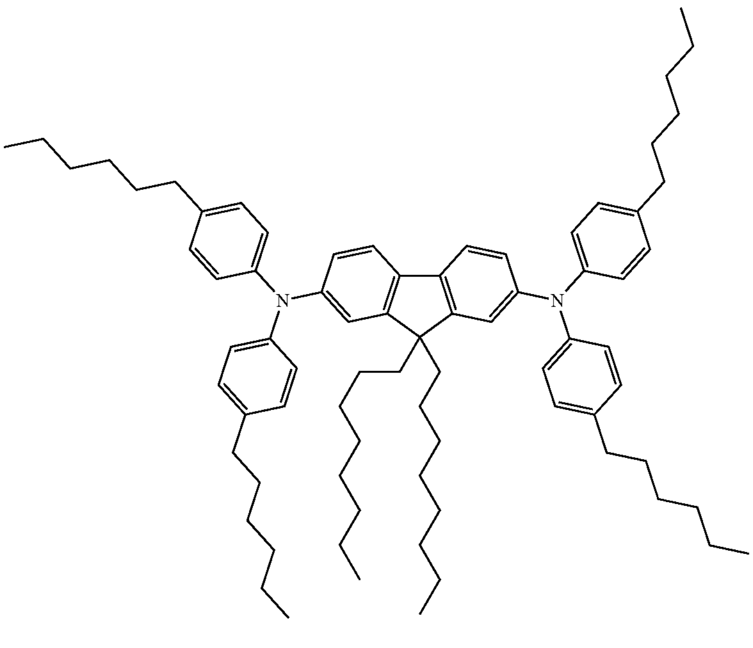

-continued
(L3-6)
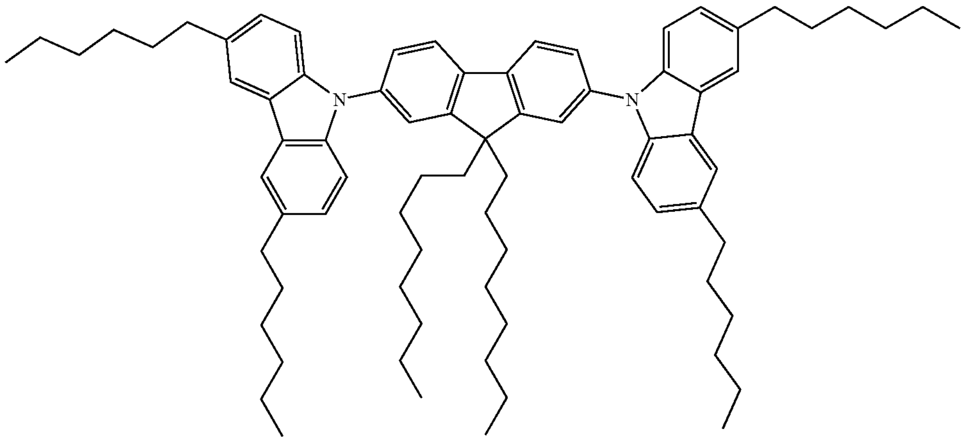
(L3-7)
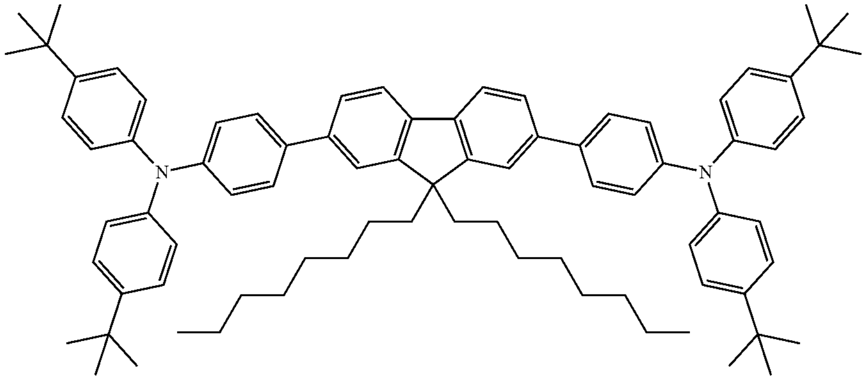
(L3-8)
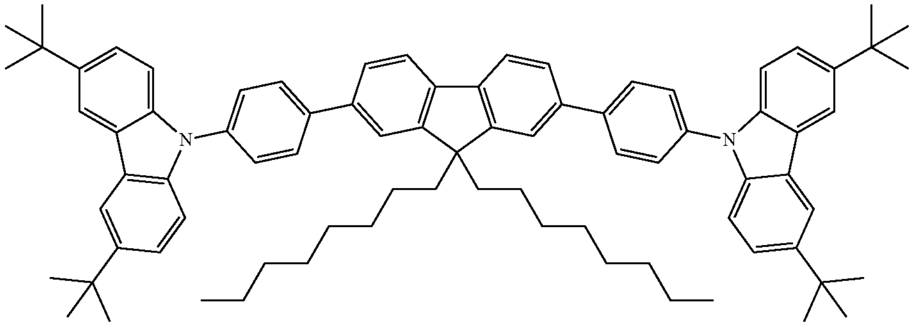

-continued (L3-9)

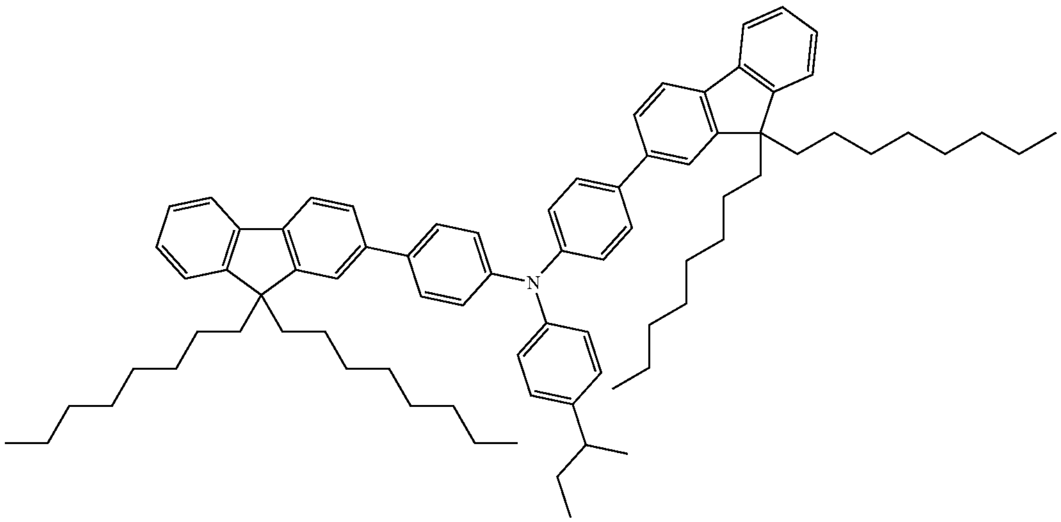

(L3-10)

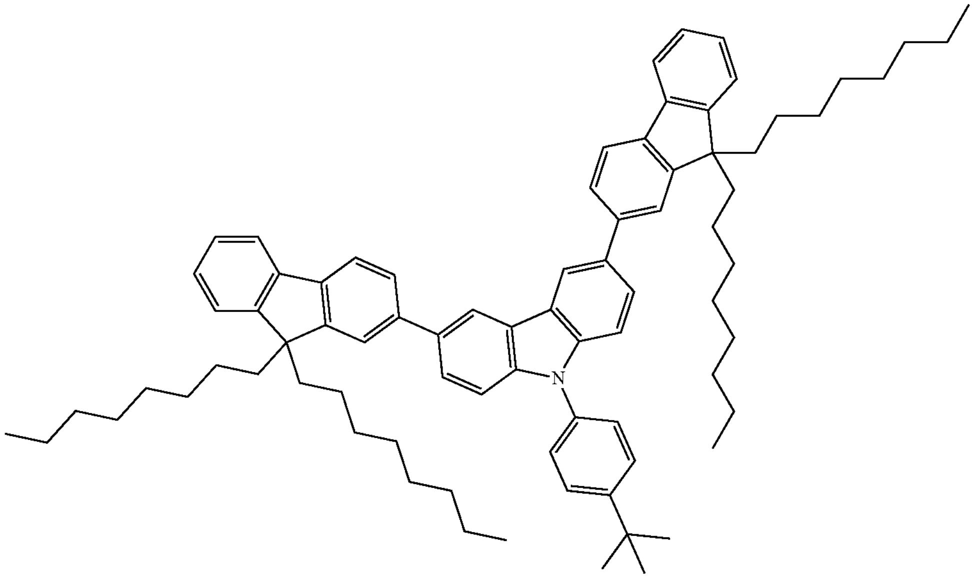

The low molecular weight compound 3 may be synthesized using a known organic synthesis method.

(Low Molecular Weight Compound 4)

Examples of the low molecular weight material according to an embodiment include a low molecular weight compound represented by Chemical Formula (L4) (hereinafter also referred to as "low molecular weight compound 4") and the like. Not wishing to be bound by theory, the low molecular weight compound 4 is used in combination with the polymer according to an embodiment, and the low molecular weight compound 4 penetrates into the gap between the polymer and exists therein. Accordingly, the hole transport ability of the hole transport layer may be improved due to a denser hole transport layer.

The low molecular weight material according to an embodiment includes the low molecular weight compound 4.

Hereinafter, the low molecular weight compound 4 is described.

The low molecular weight compound 4 is a compound represented by Chemical Formula (L4). When the low molecular weight material includes a widegap material, the widegap material may include at least one low molecular weight compound 4 represented by Chemical Formula (L4). The low molecular weight compound 4 may have hole transport properties.

$$X—Ar_a—X. \quad (L4)$$

In Chemical Formula (L4), $Ar_a$ is a group represented by Chemical Formula (L4-a).

(L4-a)

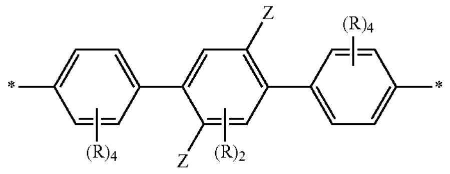

In Chemical Formula (L4-a), each occurrence of R is independently a hydrogen atom, a deuterium atom, or a monovalent organic group.

In Chemical Formula (L4-a), a plurality of Rs may be bonded to each other to form a ring.

In addition, in Chemical Formula (L4-a), Z may be a linear or branched alkyl group having 1 to 12 carbon atoms, and may be, for example, a linear alkyl group having 4 to 12 carbon atoms.

In addition, in Chemical Formula (L4-a), * represents the bonding position with the adjacent atom.

From the viewpoint of further improving advantageous effects of the addition of the low molecular weight material, $Ar_a$ in Chemical Formula (L4) may be a group represented by Chemical Formula (L4-a').

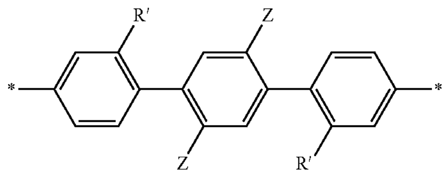

(L4-a')

Z in Chemical Formula (L4-a') has the same definition as in Chemical Formula (L4-a).

In Chemical Formula (L4-a'), R' is a hydrogen atom or a methyl group.

In Chemical Formula (L4-a'), * denotes a bonding position with an adjacent atom.

From the viewpoint of further improving the effects, $Ar_a$ may be a group selected from Group L4-A. On the other hand, in Group L4-A, * represents a bonding position with an adjacent atom.

Group L4-A

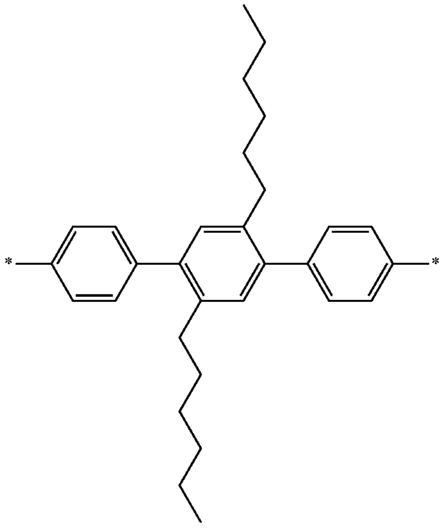

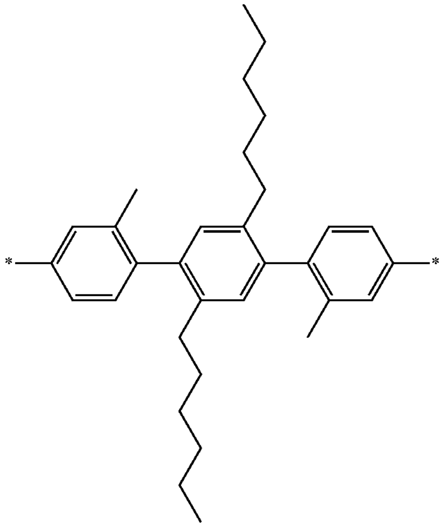

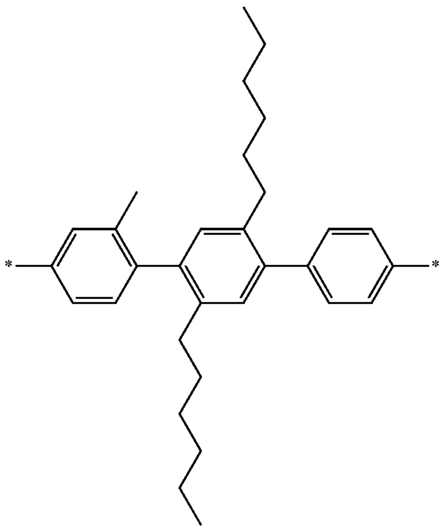

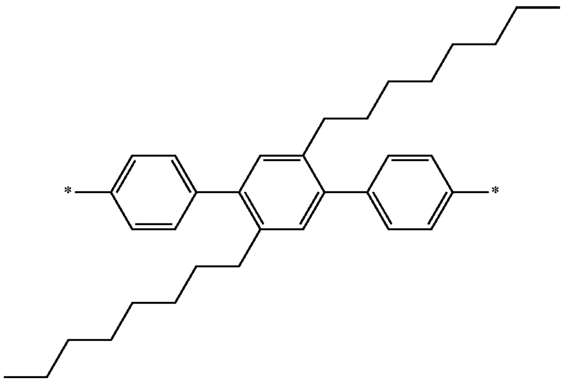

-continued

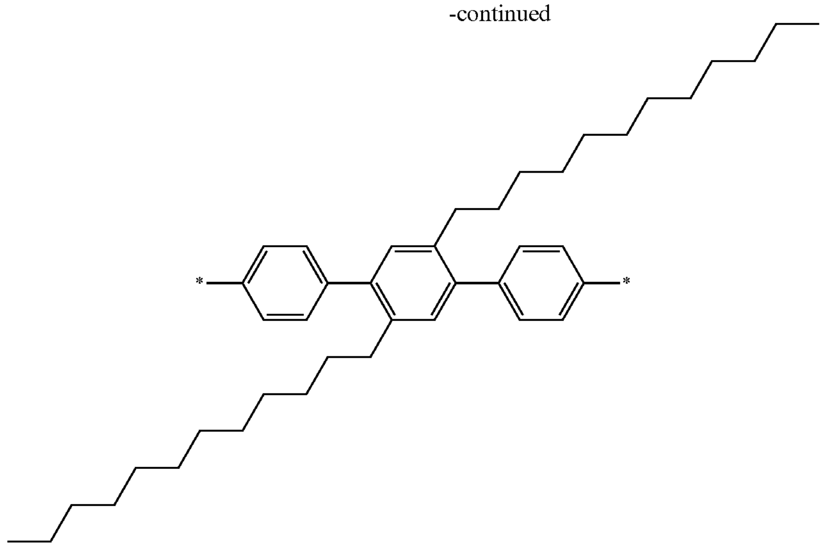

In Chemical Formula (L4), X is a group represented by Chemical Formula (L4-b).

In Chemical Formula (L4), a plurality of Xs may be the same or different.

In Chemical Formula (L4), a plurality of Xs may be bonded to each other to form a ring.

(L4-b)

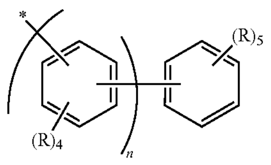

In Chemical Formula (L4-b), R is each independently a hydrogen atom, a deuterium atom, or a monovalent organic group.

In Chemical Formula (L4-b), a plurality of Rs may be bonded to each other to form a ring.

In addition, in Chemical Formula (L4-b), n may be an integer of 0 or more and 3 or less, for example, an integer of 0 or more and 2 or less.

In addition, in Chemical Formula (L4-b), * represents a bonding position with an adjacent atom.

From the viewpoint of further enhancing advantageous effects of the addition of the low molecular weight material, X may be a group selected from Group L4-B.

On the other hand, in Group L4-B, R' is each independently a linear or branched alkyl group having 1 to 24 carbon atoms.

In Group L4-B, a plurality of R' may be bonded to each other to form a ring.

In addition, in Group L4-B, * represents a bonding position with an adjacent atom.

The carbon number of the alkyl group may be as follows.

For example, when the ligand of the quantum dot is a compound containing a long-chain alkyl group such as oleic acid, oleylamine, or trioctylphosphine, the compound included in the hole transport layer may also include a compound having a long-chain alkyl group. Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, from the viewpoint of securing the solvent resistance of the hole transport layer, the number of carbon atoms of the alkyl group contained in the polymer according to an embodiment may be small.

Accordingly, the alkyl group may include a linear or branched alkyl group having 1 to 18 carbon atoms.

These alkyl groups may be appropriately selected depending on the quantum dots used or the solvent for dispersing the quantum dots.

Group L4-B

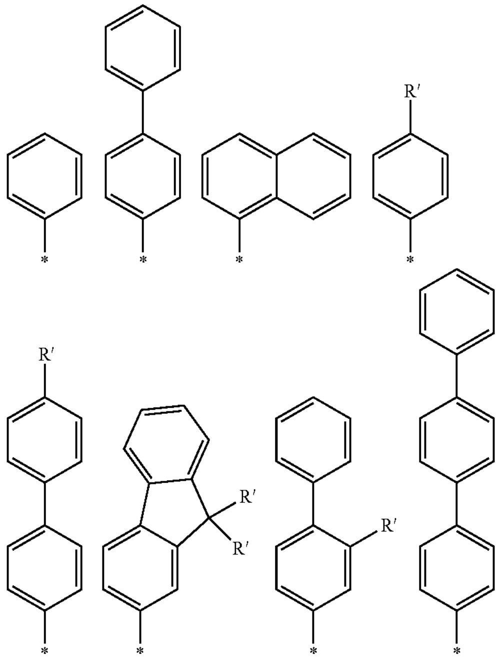

Specific examples of the low molecular weight compound 4 include compounds represented by the following chemical formula. The low molecular weight compound 4 may be used alone or as a mixture of 2 or more low molecular weight compounds.

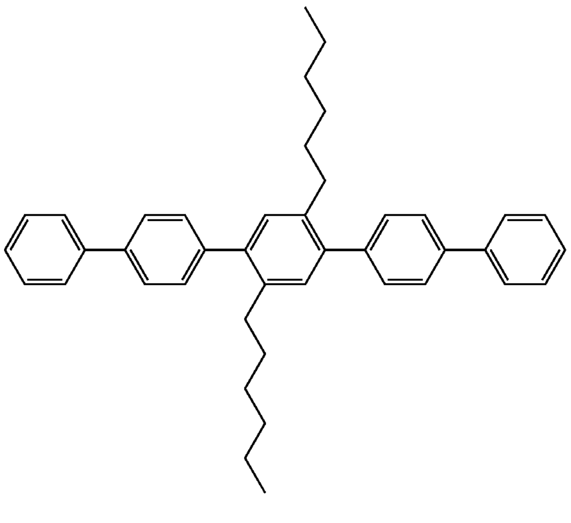

The low molecular weight compound 4 may be synthesized using a known organic synthesis method.

(Low Molecular Weight Compound 5 and Low Molecular Weight Compound 6)

The low molecular weight material according to an embodiment may include, for example, a low molecular weight compound represented by Chemical Formula (L5) (hereinafter also referred to as "low molecular weight compound 5"), and a low molecular weight compound represented by Chemical Formula (L6) (hereinafter, also referred to as "low molecular weight compound 6").

The low molecular weight compounds 5 and 6 are used in combination with the polymer according to an embodiment, and the low molecular weight compounds 5 and 6 penetrate into the gap between the polymers according to an embodiment and exist therein to form a denser hole transport layer, and to improve the hole transport ability of the hole transport layer.

In an embodiment, the low molecular weight material includes the low molecular weight compound 5, the low molecular weight compound 6, or a combination thereof.

Hereinafter, the low molecular weight compound 5 and the low molecular weight compound 6 are described.

(Low Molecular Weight Compound 5)

The low molecular weight compound 5 is a compound represented by Chemical Formula (L5).

When the low molecular weight material includes a widegap material, the widegap material may include at least one low molecular weight compound 5 represented by Chemical Formula (L5). The low molecular weight compound 5 may have hole transport properties.

(L5)

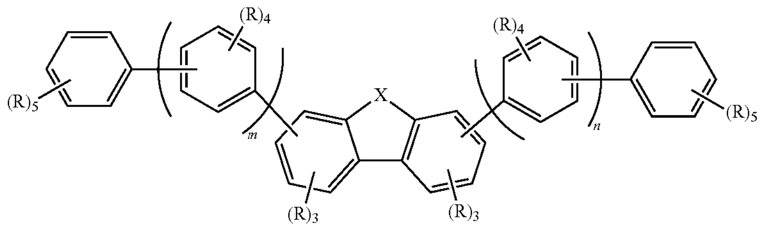

In Chemical Formula (L-5), m and n each independently represent an integer of 0 or more and 3 or less, R is each independently a hydrogen atom or a monovalent organic group, and two or more Rs may be condensed or bonded to form a ring, X is O, S, NR', $C(R'')_2$, or a divalent organic group other than NR' and $C(R'')_2$, and R' and R" are each independently a hydrogen atom or a monovalent organic group.

In Chemical Formula (L-5), the monovalent organic group that may constitute R is not particularly limited.

For example, R may be a hydrogen atom, a cyano group, a substituted or unsubstituted alkyl group having 1 to 30 carbon atoms, a substituted or unsubstituted alkoxy group having 1 to 30 carbon atoms, a substituted or unsubstituted aryloxy group having 6 to 30 carbon atoms, an alkylamino group having a substituted or unsubstituted alkyl group having 1 to 30 carbon atoms, a substituted or unsubstituted monovalent aromatic hydrocarbon ring group having 6 to 30 carbon atoms, or a substituted or unsubstituted monovalent aromatic heterocyclic ring group having 3 to 30 ring atoms.

The aromatic hydrocarbon ring group having 6 to 30 carbon atoms that constitutes R may be a group derived from a hydrocarbon (aromatic hydrocarbon) ring having a carbocyclic ring containing at least one aromatic ring having 6 to 30 carbon atoms. In addition, when an aromatic hydrocarbon ring group contains two or more rings, the two or more rings may mutually be condensed. In addition, one or more hydrogen atoms present in these aromatic hydrocarbon ring groups may be replaced by a substituent.

The aromatic hydrocarbon ring constituting the aromatic hydrocarbon ring group is not particularly limited, and may be specifically benzene, indene, naphthalene, anthracene, azulene, heptalene, acenaphthylene, phenalene, fluorene, phenanthrene, biphenyl, triphenylene, pyrene, chrysene, picene, perylene, pentaphene, pentacene, tetraphene, hexaphene, hexacene, rubicene, dinaphthalene, heptaphene, pyranthrene, and the like.

A monovalent aromatic heterocyclic ring group having 3 to 30 ring atoms which constitutes R may be a group derived from the ring (aromatic heterocyclic ring) of 3 to 30 ring atoms containing one or more aromatic rings and having one or more heteroatoms, for example, a nitrogen atom (N), an oxygen atom (O), a phosphorus atom (P), a sulfur atom (S), and carbon atoms (C) that are the remaining ring-forming atoms. Moreover, when the aromatic heterocyclic ring group contains two or more rings, the two or more rings may mutually be condensed. In addition, one or more hydrogen atoms present in these aromatic heterocyclic ring groups may be substituted with a substituent.

Here, the number of ring-forming atoms refers to the number of atoms constituting the ring itself in a compound having a structure in which atoms are bonded to a ring (e.g., monocyclic, condensed ring, ring set). Atoms not constituting the ring (for example, a hydrogen atom crossing the bond of atoms constituting the ring) or, when the ring is substituted by a substituent, the atoms included in the substituent are not included in the number of ring atoms. For example, a carbazolyl group (a substituent composed of carbazole) has 13 ring atoms.

The aromatic heterocyclic ring constituting the aromatic heterocyclic ring group is not particularly limited, but may be for example, a π-electron deficient aromatic heterocyclic ring, a π-electron excess aromatic heterocyclic ring, a π-electron deficient-π-electron excess mixed aromatic heterocyclic ring in which an π-electron deficient aromatic heterocyclic ring and an π-electron excess aromatic heterocyclic ring are mixed.

Specific examples of the π-electron deficient aromatic heterocyclic ring may include pyridine, pyrazine, pyridazine, pyrimidine, triazine, quinoline, isoquinoline, quinoxaline, quinazoline, naphthyridine, acridine, phenazine, benzoquinoline, benzoisoquinoline, phenanthridine, phenanthroline, benzoquinone, coumarin, anthraquinone, fluorenone, and the like.

Specific examples of the π-electron excess aromatic heterocyclic ring may include furan, thiophene, benzofuran, benzothiophene, dibenzofuran, dibenzothiophene, pyrrole, indole, carbazole, and the like.

Specific examples of the π-electron deficient-π-electron excess mixed aromatic heterocyclic ring may include imidazole, benzimidazole, pyrazole, indazole, oxazole, isoxazole, benzoxazole, benzoisoxazole, thiazole, Isothiazole, benzothiazole, benzoisothiazole, imidazoline, benzimidazolinone, imidazopyridine, imidazopyrimidine, imidazophenanthridine, benzimidazophenanthroline, azadibenzofuran, azacarbazole, azadibenzothiophene, diazadibenzofuran, diazacarbazole, diazadibenzothiophene, xanthone, thioxanthone, and the like.

The alkyl group having 1 to 30 carbon atoms which constitutes R is not particularly limited. For example, it is a linear or branched alkyl group having 1 to 30 carbon atoms.

For example, it may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, and the like.

For example, the carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group. Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, the number of carbon atoms in the alkyl group included in the polymer according to an embodiment may be small from the viewpoint of securing the solvent resistance of the hole transport layer.

Accordingly, in an embodiment, the alkyl group may be a linear or branched alkyl group having 1 to 18 carbon atoms. The alkyl group may be appropriately selected depending on the quantum dots used or the solvent for dispersing the quantum dots.

The alkoxy group having 1 to 30 carbon atoms which constitutes R is not particularly limited. For example, it may be a linear or branched alkoxy group having 1 to 30 carbon atoms. Specifically, it may be a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, heptadecyloxy group, an octadecyldecyloxy group, a 2-ethylhexyloxy group, a 3-ethylpentyloxy group, and the like.

The carbon number of the alkoxy group may be as follows.

For example, when the ligand of the quantum dot is a long-chain alkyl-containing compound such as oleic acid, oleylamine, or trioctylphosphine, the compound included in the hole transport layer may also include a compound having a long-chain alkoxy group.

Due to an interaction of the ligand of the quantum dot with the alkoxy group present in the hole transport layer, effects such as improving hole injection properties may be obtained.

In addition, when the solvent for dispersing the quantum dots is a long-chain hydrocarbon-based solvent, the number of carbon atoms of the alkoxy group included in the polymer according to an embodiment may be small from the viewpoint of securing the solvent resistance of the hole transport layer.

Accordingly, the alkoxy group may be a linear or branched alkoxy group having 1 to 18 carbon atoms.

These alkoxy groups may be appropriately selected depending on the quantum dots used or the solvent in which the quantum dots are dispersed.

The aryloxy group having 6 to 30 carbon atoms which constitutes R is not particularly limited.

For example, it may be a monocyclic or condensed polycyclic aryloxy group having 6 to 30 carbon atoms which may contain a heteroatom. For example, it may be a phenoxy group, a 1-naphthyloxy group, a 2-naphthyloxy group, a 2-azrenyloxy group, a 2-furanyloxy group, a 2-thienyloxy group, a 2-indolyloxy group, a 3-indolyloxy group, a 2-benzofuryloxy group, a 2-benzothienyloxy group, and the like.

The alkylamino group having 1 to 30 carbon atoms which constitutes R is not particularly limited. For example, it may be an alkylamino group having a linear or branched alkyl group having 1 to 30 carbon atoms. For example, it may be an N-alkylamino groups such as an N-methylamino group, an N-ethyl amino group, an N-propylamino group, an N-isopropyl amino group, an N-butylamino group, an N-isobutyl amino group, an N-sec-butylamino group, an N-tert-butylamino group, an N-pentyl amino group, or an N-hexyl amino group, or an N, N-dialkyl amino groups such as an N, N-dimethylamino group, an N-methyl-N-ethyl amino group, an N, N-diethyl amino group, an N, N-dipropylamino group, an N, N-diisopropyl amino group, an N, N-dibutyl amino group, an N, N-diisobutylamino group, an N, N-dipentylamino group, or an N, N-dihexylamino group.

On the other hand, other substituents that may further substitute an alkyl group having 1 to 30 carbon atoms, an alkoxy group having 1 to 30 carbon atoms, an aryloxy group having 6 to 30 carbon atoms, an alkylamino group having 1 to 30 carbon atoms, cyano group, a monovalent aromatic hydrocarbon ring group having 6 to 30 carbon atoms, or a unsubstituted monovalent aromatic heterocyclic ring having 3 to 30 ring atoms, and the like.

The descriptions of the monovalent organic group which constitutes R' and R" are the same as the descriptions for R, and thus the descriptions are omitted.

A divalent organic group which may constitute X or other than NR' and $C(R")_2$ is not particularly limited.

Here, in the compound represented by Chemical Formula (L5), m and n may each independently be an integer of 1 or more and 3 or less. In addition, m and n may each independently be an integer of 2 or more and 3 or less, for example, 3.

In addition, the compound represented by Chemical Formula (L5) may be a compound represented by Chemical Formula (L5-A).

(L5-A)

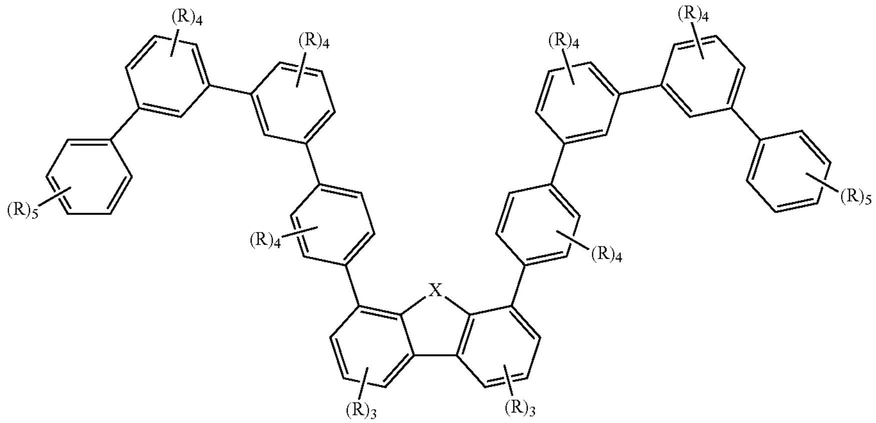

monovalent aromatic heterocyclic ring group having 3 to 30 ring atoms which may constitute R are not particularly limited.

Other substituents are, for example, the same as substituents which may constitute R. That is, it may be a hydrogen atom, a cyano group, a substituted or unsubstituted alkyl group having 1 to 30 carbon atoms, an alkoxy group having 1 to 30 carbon atoms, an aryloxy group having 6 to 30 carbon atoms, an alkylamino group having an alkyl group having 1 to 30 carbon atoms, a monovalent aromatic hydrocarbon ring group having 6 to 30 carbon atoms, a monovalent aromatic heterocyclic ring group having 3 to 30 ring atoms, and the like.

Since the descriptions of other substituents is the same as that of R, the descriptions are omitted.

On the other hand, additional other substituents that further substitute other substituents, and other substituents that further substitute the additional other substituents, and the like are the same as these other substituents.

In Chemical Formula (L5), R' and R" in NR' and $C(R")_2$, which may constitute X, are not particularly limited.

For example, R' and R" in NR' and $C(R")_2$ may each independently be a hydrogen atom, a cyano group, a substituted or unsubstituted alkyl group having 1 to 30 carbon atoms, a substituted or unsubstituted alkoxy group having 1 to 30 carbon atoms, a substituted or unsubstituted aryloxy group having 6 to 30 carbon atoms, a substituted or unsubstituted amino group having 1 to 30 carbon atoms, a substituted or unsubstituted monovalent aromatic hydrocarbon ring group having 6 to 30 carbon atoms, a substituted or In Chemical Formula (L5-A), R and X are the same as in Chemical Formula (L5).

In Chemical Formulas (L5) and (L5-A), R may each independently be a hydrogen atom, a cyano group, an unsubstituted alkyl group having 1 to 30 carbon atoms, an unsubstituted alkoxy group having 1 to 30 carbon atoms, or an unsubstituted aryloxy group having 6 to 30 carbon atoms, an alkylamino group having an unsubstituted alkyl group having 1 to 30 carbon atoms, an unsubstituted monovalent aromatic hydrocarbon ring group having 6 to 30 carbon atoms, or an unsubstituted monovalent aromatic heterocyclic ring group having 3 to 30 ring atoms.

In addition, each R may independently be a hydrogen atom, a cyano group, an unsubstituted alkyl group having 1 to 30 carbon atoms, an unsubstituted alkoxy group having 1 to 30 carbon atoms, an unsubstituted aryloxy group having 6 to 30 carbon atoms, or an alkylamino group having an unsubstituted alkyl group having 1 to 30 carbon atoms.

In addition, each R may be a hydrogen atom.

In Chemical Formulas (L5) and (L5-A), R' may be a hydrogen atom, a cyano group, an unsubstituted alkyl group having 1 to 30 carbon atoms, an unsubstituted alkoxy group having 1 to 30 carbon atoms, an unsubstituted aryloxy group having 6 to 30 carbon atoms, an unsubstituted amino group having 1 to 30 carbon atoms, an unsubstituted monovalent aromatic hydrocarbon ring group having 6 to 30 carbon atoms, or an unsubstituted monovalent aromatic heterocyclic ring group having 3 to 30 ring atoms.

In addition, each R' may independently be a hydrogen atom, a cyano group, an unsubstituted alkyl group having 1 to 30 carbon atoms, an unsubstituted alkoxy group having 1 to 30 carbon atoms, an unsubstituted C6-C30 or less aryloxy group, or an alkylamino group having an unsubstituted alkyl group having 1 to 30 carbon atoms.

In addition, each R' may be a hydrogen atom.

In Chemical Formulas (L5) and (L5-A), each occurrence of R" is independently a hydrogen atom, a cyano group, an unsubstituted alkyl group having 1 to 30 carbon atoms, an unsubstituted alkoxy group having 1 to 30 carbon atoms, an unsubstituted aryloxy group having 6 to 30 carbon atoms, an alkylamino group having an unsubstituted alkyl group having 1 to 30 carbon atoms, an unsubstituted monovalent aromatic hydrocarbon ring group having 6 to 30 carbon atoms, or an unsubstituted monovalent aromatic heterocyclic ring group having 3 to 30 ring atoms.

In addition, each R" may independently be a hydrogen atom, a cyano group, an unsubstituted alkyl group having 1 to 30 carbon atoms, an unsubstituted alkoxy group having 1 to 30 carbon atoms, an unsubstituted aryloxy group having 6 to 30 carbon atoms, or an unsubstituted amino group having 1 to 30 carbon atoms.

In addition, each R" may be a hydrogen atom.

The carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group.

Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, the number of carbon atoms of the alkyl group contained in the polymer according to an embodiment may be small from the viewpoint of securing the solvent resistance of the hole transport layer.

Accordingly, the alkyl group may include a linear or branched alkyl group having 1 to 18 carbon atoms.

These alkyl groups may be appropriately selected depending on the quantum dots used or the solvent for dispersing the quantum dots.

The carbon number of the alkoxy group may be as follows.

For example, when the ligand of the quantum dot is a long-chain alkyl-containing compound such as oleic acid, oleylamine, or trioctylphosphine, the compound included in the hole transport layer may also include a compound having a long-chain alkoxy group.

Due to an interaction of the ligand of the quantum dot with the alkoxy group present in the hole transport layer, effects such as improving hole injection properties may be obtained.

In addition, when the solvent for dispersing the quantum dots is a long-chain hydrocarbon-based solvent, the number of carbon atoms in the alkyl group contained in the polymer according to an embodiment may be small from the viewpoint of securing the solvent resistance of the hole transport layer.

Accordingly, the alkoxy group may be a linear or branched alkoxy group having 1 to 18 carbon atoms. These alkoxy groups may be appropriately selected depending on the quantum dots used or the solvent for dispersing the quantum dots.

In Chemical Formula Formulas (L5) and (L5-A), X may be O, S, NR' or $C(R")_2$.

In addition, X may be O or S, and may be, for example, S.

Hereinafter, the low molecular weight compound 5 is specifically illustrated.

However, the low molecular weight compound 5 is not limited to these specific examples.

1

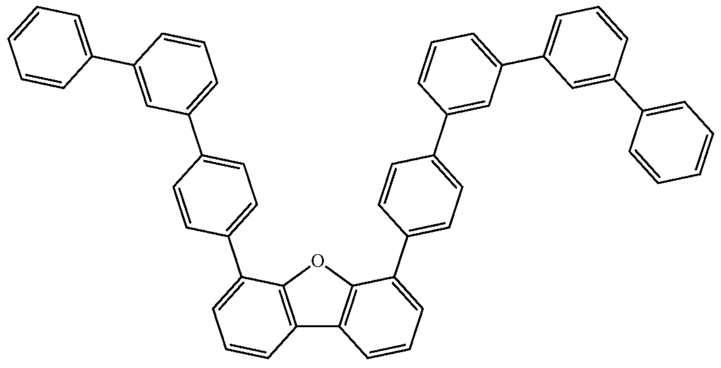

-continued
2
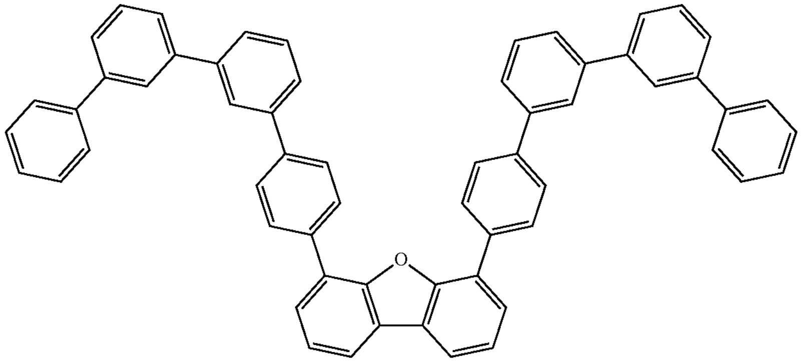
3
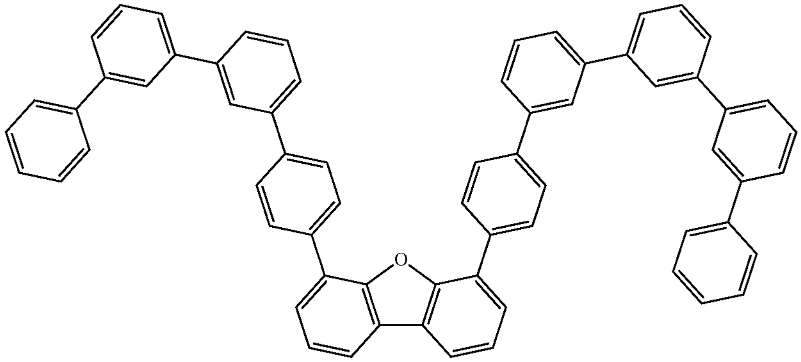
4
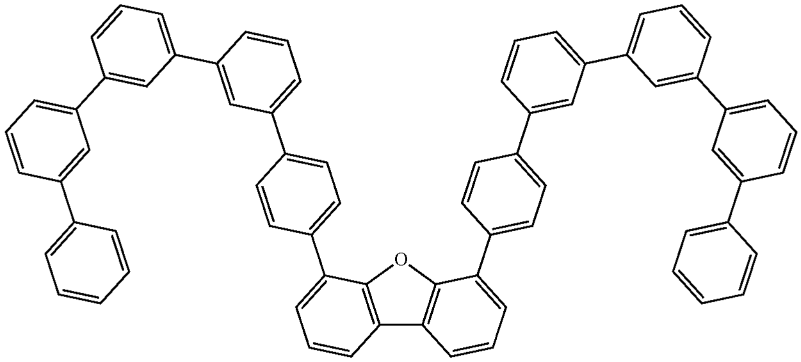
5
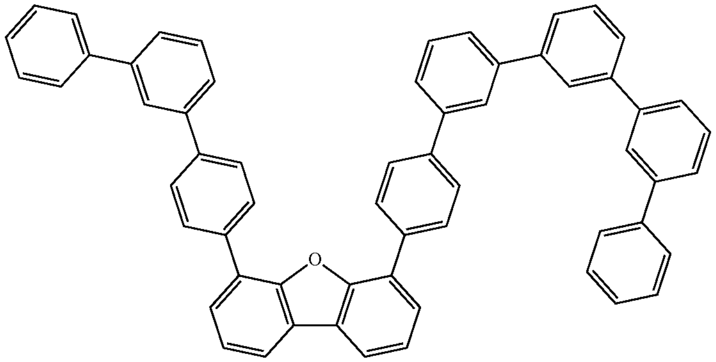

-continued
6
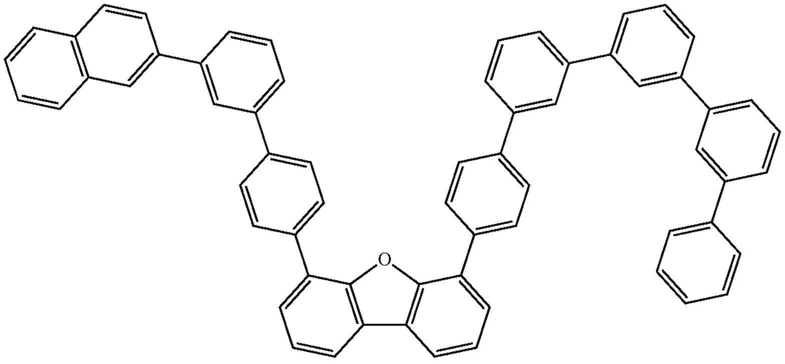
7
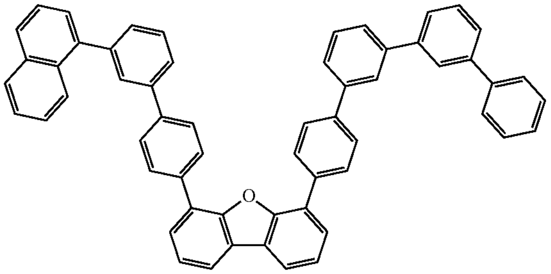
8
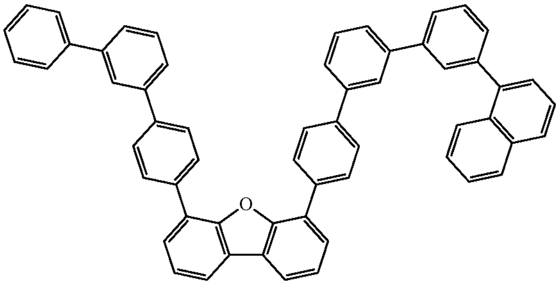
9
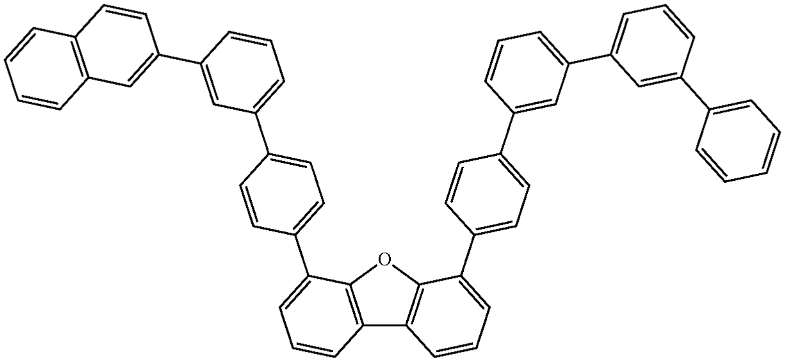
10
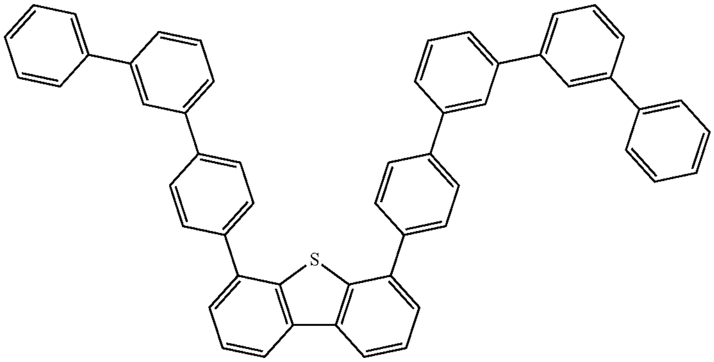

-continued
11
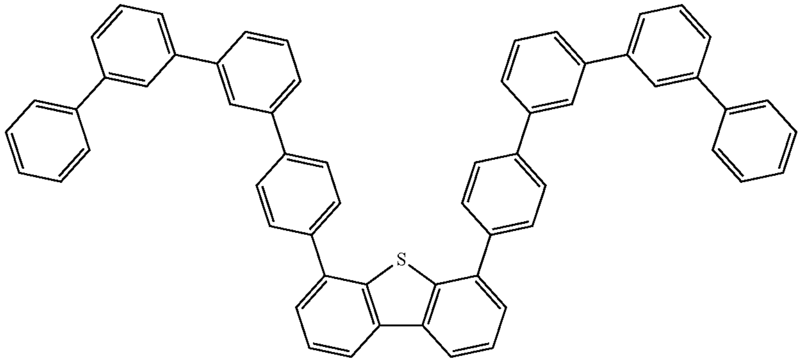
12
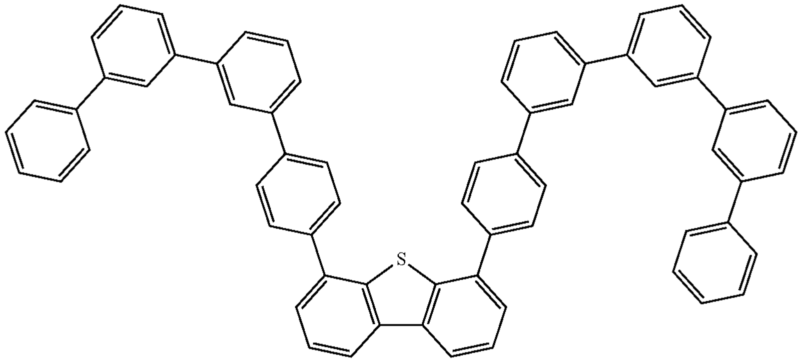
13
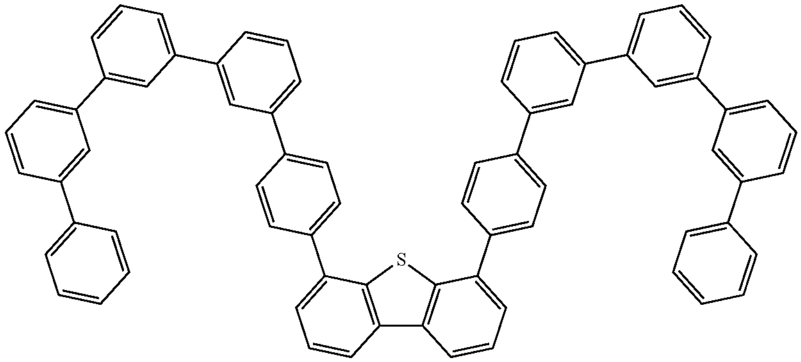
14
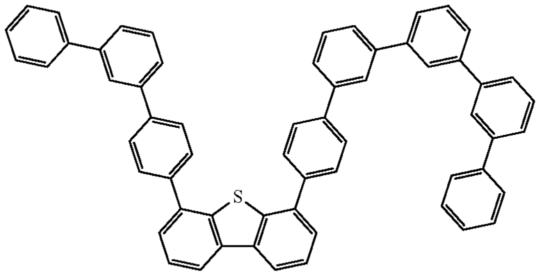
15
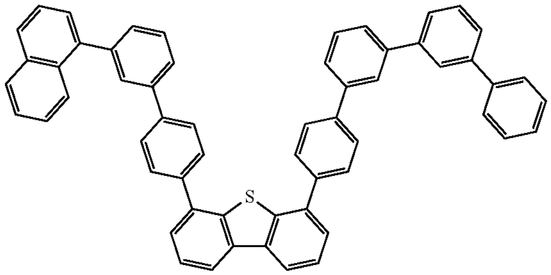

-continued
16
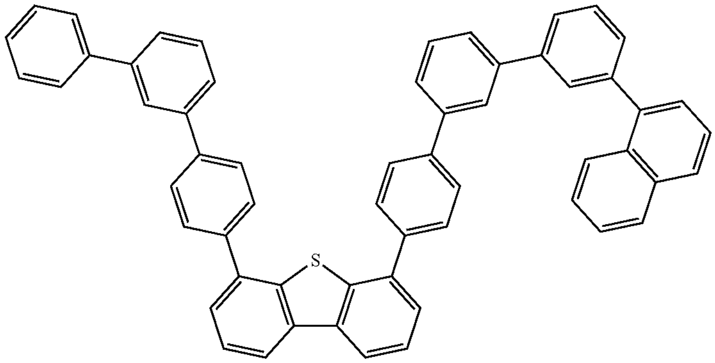
17
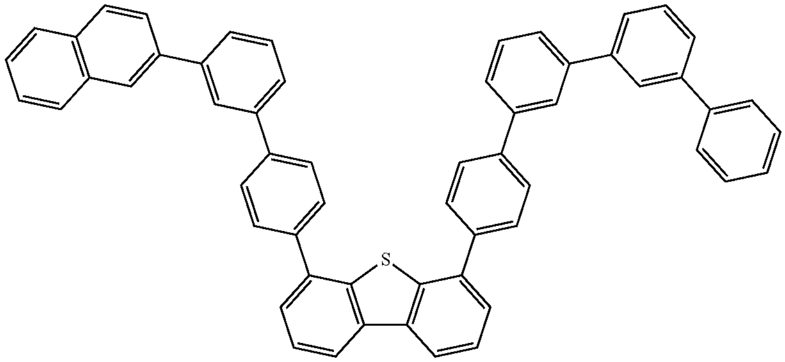
18
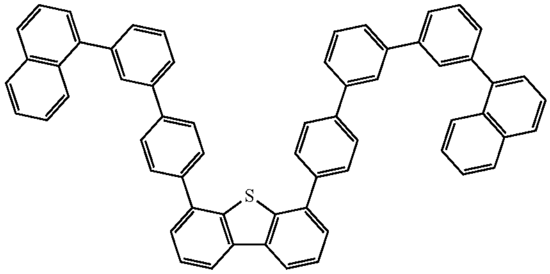
19
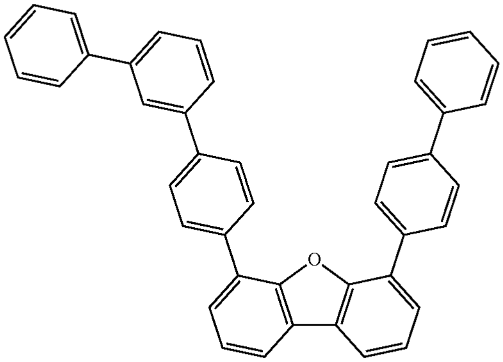
20
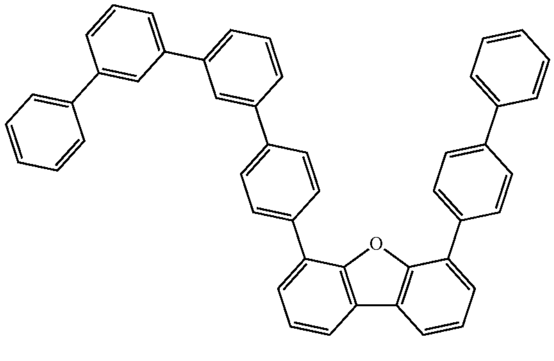
21
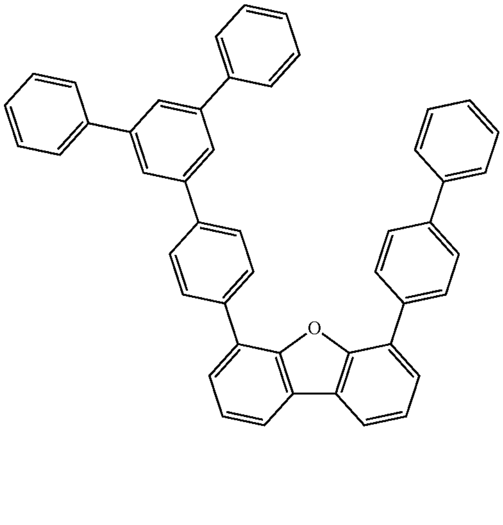

-continued
22
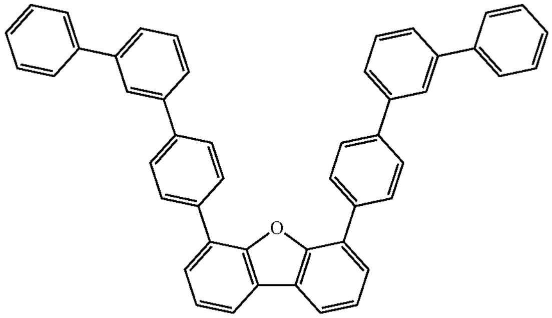
23
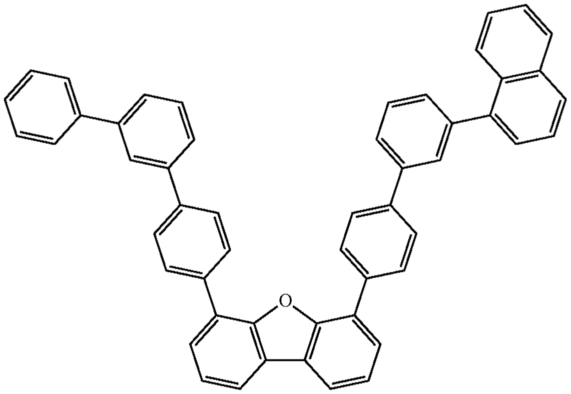
24
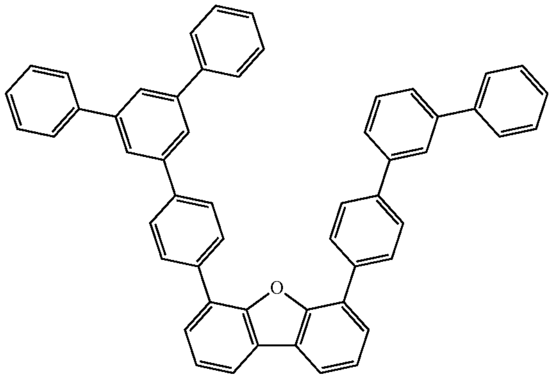
25
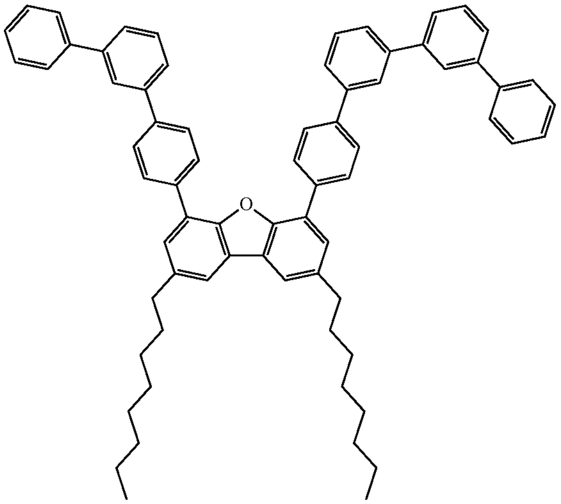
26
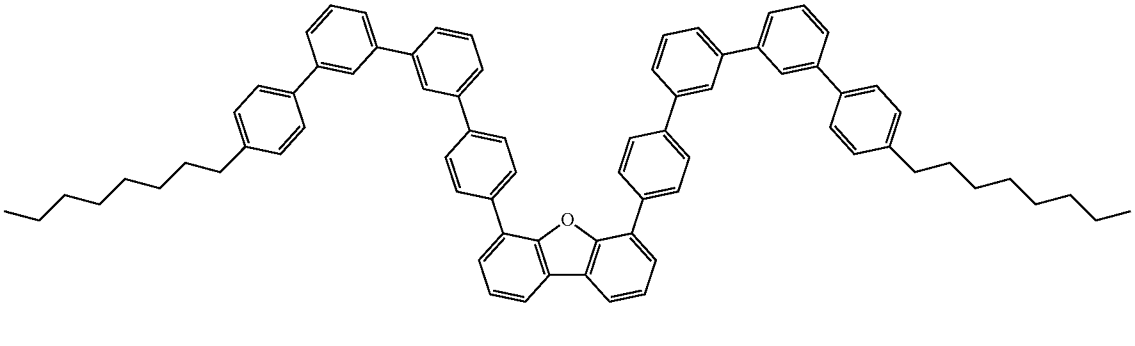

In addition, a method of preparing the low molecular weight compound 5 is not particularly limited, and the low molecular weight compound 5 may be prepared using various preparing methods including well-known synthesis methods.

(Low Molecular Weight Compound 6)

The low molecular weight compound 6 is a compound represented by Chemical Formula (L6).

When the low molecular weight material includes a widegap material, the widegap material may include at least one low molecular weight compound 6 represented by Chemical Formula (L6). The low molecular weight compound 6 may have hole transport properties.

(L6)

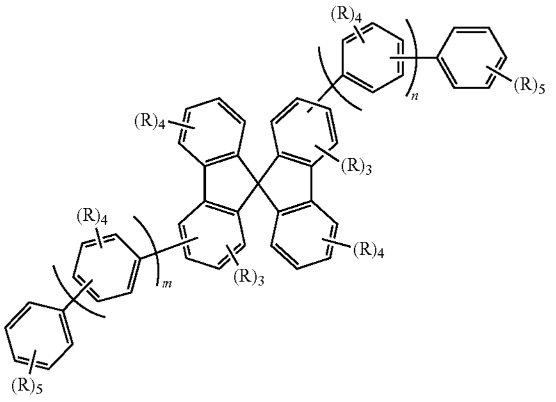

In Chemical Formula (L-6), m and n each independently represent an integer of 0 or more and 3 or less, and R is each independently a hydrogen atom or a monovalent organic group.

In Chemical Formula (L6), two or more Rs may be condensed or bonded to form a ring.

In Chemical Formula (L6), the monovalent organic group that constitutes R is not particularly limited.

For example, each occurrence of R may be a hydrogen atom, a cyano group, a substituted or unsubstituted alkyl group having 1 to 30 carbon atoms, a substituted or unsubstituted alkoxy group having 1 to 30 carbon atoms, a substituted or unsubstituted aryloxy group having 6 to 30 carbon atoms, an alkylamino group having a substituted or unsubstituted alkyl group having 1 to 30 carbon atoms, a substituted or unsubstituted monovalent aromatic hydrocarbon ring group having 6 to 30 carbon atoms, or a substituted or unsubstituted monovalent aromatic heterocyclic ring groups having 3 to 30 ring atoms.

The aromatic hydrocarbon ring group having 6 to 30 carbon atoms that may constitute R is a group derived from a hydrocarbon (aromatic hydrocarbon) ring having a carbon ring containing one or more aromatic rings having 6 to 30 carbon atoms. In addition, when the aromatic hydrocarbon cyclic group contains two or more rings, the two or more rings may mutually be condensed. In addition, one or more hydrogen atoms present in these aromatic hydrocarbon ring groups may be replaced with a substituent.

Although the aromatic hydrocarbon ring constituting the aromatic hydrocarbon ring group is not particularly limited, it may be, for example, benzene, indene, naphthalene, anthracene, azulene, heptalene, acenaphthylene, phenalene, fluorene, phenanthrene, biphenyl, triphenylene, pyrene, chrysene, picene, perylene, pentaphene, pentacene, tetraphene, hexapene, hexacene, rubicene, trinaphthalene, heptaphene, pyranthrene, and the like.

A monovalent aromatic heterocyclic ring group having 3 to 30 ring atoms which may constitute R may be a group derived from the ring (aromatic heterocyclic ring) of 3 to 30 ring atoms containing one or more aromatic rings and having one or more heteroatoms (e.g., a nitrogen atom (N), an oxygen atom (O), a phosphorus atom (P), a sulfur atom (S), and carbon atoms (C) that are the remaining ring-forming atoms.

In addition, when the aromatic heterocyclic ring group contains two or more rings, the two or more rings may mutually be condensed. In addition, one or more hydrogen atoms present as these aromatic heterocyclic ring groups may be replaced with a substituent.

Here, the number of ring atoms refers to the number of atoms constituting the ring itself in a compound having a structure in which atoms are bonded to a ring (e.g., monocyclic, condensed ring, ring set). Atoms not constituting the ring (for example, a hydrogen atom crossing the bond of atoms constituting the ring) or, when the ring is substituted by a substituent, the atoms included in the substituent are not included in the number of ring atoms. For example, a carbazolyl group (a substituent composed of carbazole) has 13 ring atoms.

The aromatic heterocyclic ring constituting the aromatic heterocyclic ring group is not particularly limited, but may be for example, a π-electron deficient aromatic heterocyclic ring, a π-electron excess aromatic heterocyclic ring, a π-electron deficient-π-electron excess mixed aromatic heterocyclic ring in which an π-electron deficient aromatic heterocyclic ring and an π-electron excess aromatic heterocyclic ring are mixed.

Specific examples of the π-electron deficient aromatic heterocyclic ring may include pyridine, pyrazine, pyridazine, pyrimidine, triazine, quinoline, isoquinoline, quinoxaline, quinazoline, naphthyridine, acridine, phenazine, benzoquinoline, benzoisoquinoline, phenanthridine, phenanthroline, benzoquinone, coumarin, anthraquinone, fluorenone, and the like.

Specific examples of the π-electron excess aromatic heterocyclic ring may include furan, thiophene, benzofuran, benzothiophene, dibenzofuran, dibenzothiophene, pyrrole, indole, carbazole, and the like.

Specific examples of the π-electron deficient-π-electron excess mixed aromatic heterocyclic ring may include imidazole, benzimidazole, pyrazole, indazole, oxazole, isoxazole, benzoxazole, benzoisoxazole, thiazole, Isothiazole, benzothiazole, benzoisothiazole, imidazoline, benzimidazolinone, imidazopyridine, imidazopyrimidine, imidazophenanthridine, benzimidazophenanthroline, azadibenzofuran, azacarbazole, azadibenzothiophene, diazadibenzofuran, diazacarbazole, diazadibenzothiophene, xanthone, thioxanthone, and the like.

In the group formed by bonding two or more of a monovalent aromatic hydrocarbon ring group having 6 to 30 carbon atoms or a monovalent aromatic heterocyclic ring group having 3 to 30 ring-forming atoms, which may constitute R, the monovalent aromatic hydrocarbon ring group having 6 to 30 carbon atoms and the monovalent aromatic heterocyclic ring group having 3 to 30 ring-forming atoms are the same as those described above, and thus descriptions thereof are omitted.

The alkyl group having 1 to 30 carbon atoms which may constitute R is not particularly limited.

For example, it may be a linear or branched alkyl group having 1 to 30 carbon atoms.

For example, it may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group and the like.

The carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkoxy group.

Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, the number of carbon atoms in the alkyl group contained in the polymer according to an embodiment may be small from the viewpoint of securing the solvent resistance of the hole transport layer.

Accordingly, the alkyl group may include a linear or branched alkyl group having 1 to 18 carbon atoms. These alkyl groups may be appropriately selected depending on the quantum dots used or the solvent for dispersing the quantum dots.

The alkoxy group having 1 to 30 carbon atoms which may constitute R is not particularly limited.

For example, R is a linear or branched alkoxy group having 1 to 30 carbon atoms.

For example, it may be a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group.

The carbon number of the alkoxy group may be as follows.

For example, when the ligand of the quantum dot is a long-chain alkyl-containing compound such as oleic acid, oleylamine, or trioctylphosphine, the compound included in the hole transport layer may also include a compound having a long-chain alkoxy group.

Due to an interaction of the ligand of the quantum dot with the alkoxy group present in the hole transport layer, effects such as improving hole injection properties may be obtained.

In addition, when the solvent for dispersing the quantum dots is a long-chain hydrocarbon-based solvent, the number of carbon atoms of the alkoxy group contained in the polymer according to an embodiment may be small from the viewpoint of securing the solvent resistance of the hole transport layer.

Accordingly, the alkoxy group may be a linear or branched alkoxy group having 1 to 18 carbon atoms.

These alkoxy groups may be appropriately selected depending on the quantum dots used or the solvent in which the quantum dots are dispersed.

The aryloxy group having 6 to 30 carbon atoms which may constitute R is not particularly limited. For example, it may be a monocyclic or condensed polycyclic aryloxy group having 6 to 30 carbon atoms which may contain a heteroatom. For example, it may be a phenoxy group, a 1-naphthyloxy group, a 2-naphthyloxy group, a 2-azrenyloxy group, a 2-furanyloxy group, a 2-thienyloxy group, a 2-indolyloxy group, a 3-indolyl oxy group, a 2-bendofuryl oxy group, a 2-benzothienyl oxy group, and the like.

The alkylamino group having an alkyl group having 1 to 30 carbon atoms which may constitute R is not particularly limited. For example, it may be an alkylamino group having a linear or branched alkyl group having 1 to 30 carbon atoms. For example, it may be an N-alkylamino groups such as an N-methylamino group, an N-ethyl amino group, an N-propylamino group, an N-isopropyl amino group, an N-butylamino group, an N-isobutyl amino group, an N-sec-butylamino group, an N-tert-butylamino group, an N-pentyl amino group, or an N-hexyl amino group, or an N, N-dialkyl amino groups such as an N, N-dimethylamino group, an N-methyl-N-ethyl amino group, an N, N-diethyl amino group, an N, N-dipropylamino group, an N, N-diisopropyl amino group, an N, N-dibutyl amino group, an N, N-diisobutylamino group, an N, N-dipentylamino group, or an N, N-dihexylamino group.

On the other hand, other substituents further substituting an alkyl group having 1 to 30 carbon atoms, an alkoxy group having 1 to 30 carbon atoms, an aryloxy group having 6 to 30 carbon atoms, an alkylamino group having 1 to 30 carbon atoms, cyano group, a monovalent aromatic hydrocarbon ring group having 6 to 30 carbon atoms, or a monovalent aromatic heterocyclic ring group having 3 to 30 ring atoms which constitute R are not particularly limited.

Other substituents are, for example, the same as substituents which may constitute R.

That is, R may be a hydrogen atom, a cyano group, a substituted or unsubstituted alkyl group having 1 to 30 carbon atoms, an alkoxy group having 1 to 30 carbon atoms, an aryloxy group having 6 to 30 carbon atoms, an amino group having 1 to 30 carbon atoms. a monovalent aromatic hydrocarbon ring group having 6 to 30 carbon atoms, or a monovalent aromatic heterocyclic ring group having 3 to 30 ring atoms.

Since the descriptions of other substituents is the same as that of R, the descriptions are omitted.

On the other hand, additional other substituents further substituting other substituents, and other substituents further substituting the additional other substituents, and the like are the same as these other substituents.

And, the compound represented by Chemical Formula (L6) is a compound represented by Chemical Formula (L6-A), Chemical Formula (L6-B), Chemical Formula (L6-C), or Chemical Formula (L6-D).

(L6-A)

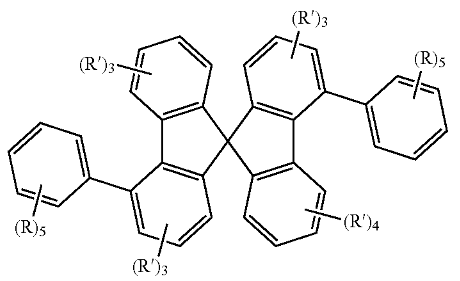

(L6-B)

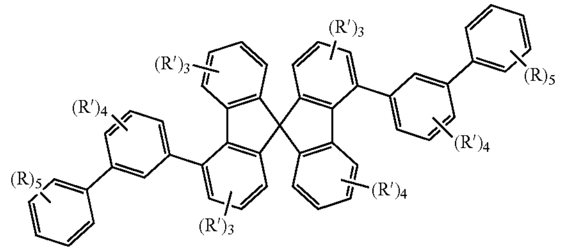

(L6-C)

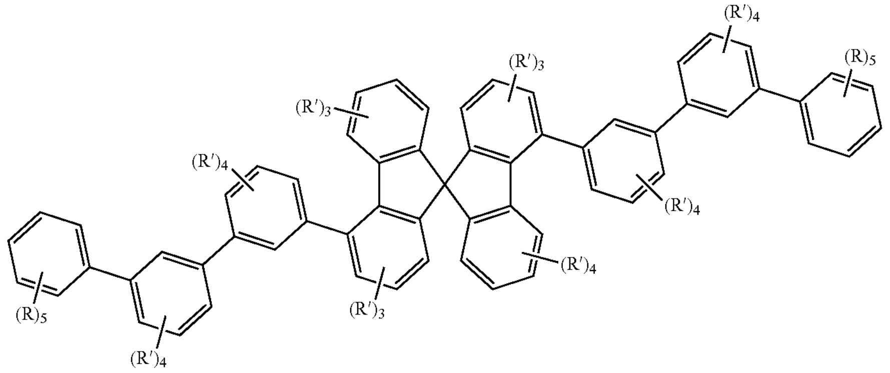

(L6-D)

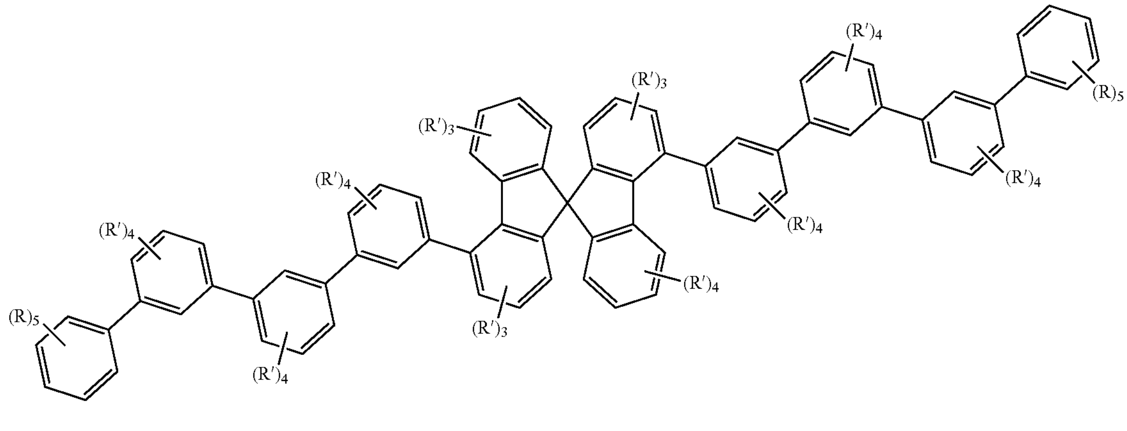

In Chemical Formulas (L6-A), (L6-B), (L6-C), and (L6-D),

R is the same as in Chemical Formula (L6),

R' is each independently a hydrogen atom, a cyano group, a substituted or unsubstituted alkyl group having 1 to 30 carbon atoms, a substituted or unsubstituted alkoxy group having 1 to 30 carbon atoms, a substituted or an unsubstituted aryloxy group having 6 to 30 carbon atoms, or an alkylamino group having a substituted or unsubstituted alkyl group having 1 to 30 carbon atoms.

In Chemical Formulas (L6), (L6-A), (L6-B), (L6-C), and (L6-D), R may each independently be a hydrogen atom, a cyano group, an unsubstituted alkyl group having 1 to 30 carbon atoms, an unsubstituted alkoxy group having 1 to 30 carbon atoms, an unsubstituted aryloxy group having 6 to 30 carbon atoms, an unsubstituted amino group having 1 to 30 carbon atoms, an unsubstituted monovalent aromatic hydrocarbon ring group having 6 to 30 carbon atoms, or an unsubstituted monovalent aromatic heterocyclic ring group having 3 to 30 ring atoms.

In addition, all of R may be a hydrogen atom.

In Chemical Formulas (L6-A), (L6-B), (L6-C) and (L6-D), each R' may independently be a cyano group, an unsubstituted alkyl group having 1 to 30 carbon atoms, an unsubstituted alkoxy group having 1 to 30 carbon atoms, an unsubstituted aryloxy group having 6 to 30 carbon atoms, or an alkylamino group having an unsubstituted alkyl group having 1 to 30 carbon atoms.

In addition, each R' may be a hydrogen atom.

The carbon number of the alkyl group may be as follows.

For example, when the ligand of the quantum dot is a long-chain alkyl-containing compound such as oleic acid, oleylamine, or trioctylphosphine, the compound included in the hole transport layer may also include a compound having a long-chain alkyl group.

Due to an interaction of the ligand of the quantum dot with the alkyl group present in the hole transport layer, effects such as improving hole injection properties may be obtained.

In addition, when the solvent for dispersing the quantum dots is a long-chain hydrocarbon-based solvent, the number of carbon atoms of the alkyl group contained in the polymer according to an embodiment may be small from the viewpoint of securing the solvent resistance of the hole transport layer.

Accordingly, the alkyl group may include a linear or branched alkyl group having 1 to 18 carbon atoms. These alkyl groups may be appropriately selected depending on the quantum dots used or the solvent for dispersing the quantum dots.

The carbon number of the alkoxy group may be as follows.

For example, when the ligand of the quantum dot is a long-chain alkyl-containing compound such as oleic acid, oleylamine, or trioctylphosphine, the compound included in the hole transport layer may also include a compound having a long-chain alkoxy group.

Due to an interaction of the ligand of the quantum dot with the alkoxy group present in the hole transport layer, effects such as improving hole injection properties may be obtained.

In addition, when the solvent for dispersing the quantum dots is a long-chain hydrocarbon-based solvent, the number of carbon atoms of the alkoxy group contained in the polymer according to an embodiment may be small from the viewpoint of securing the solvent resistance of the hole transport layer.

Therefore, the alkoxy group may be a linear or branched alkoxy group having 1 to 18 carbon atoms. These alkoxy groups may be appropriately selected depending on the quantum dots used or the solvent for dispersing the quantum dots.

Among the compounds represented by Chemical Formulas (L6-A), (L6-B), (L6-C), and (L6-D), for example, the compound represented by Chemical Formula (L6-C) may be included.

Hereinafter, the low molecular weight compound 6 is specifically illustrated. However, the low molecular weight compound 6 is not limited to these specific examples.

1

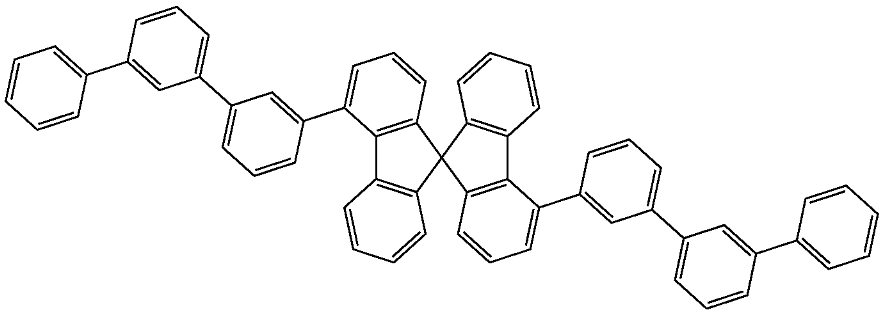

2

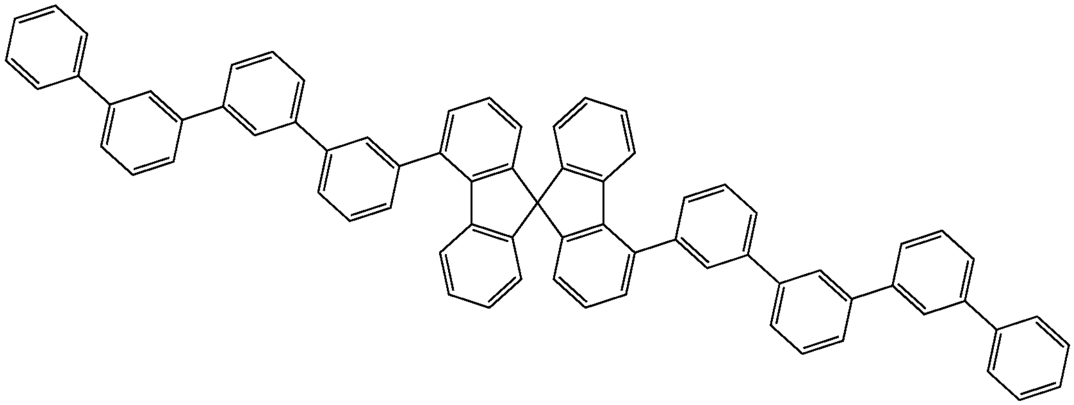

-continued
3
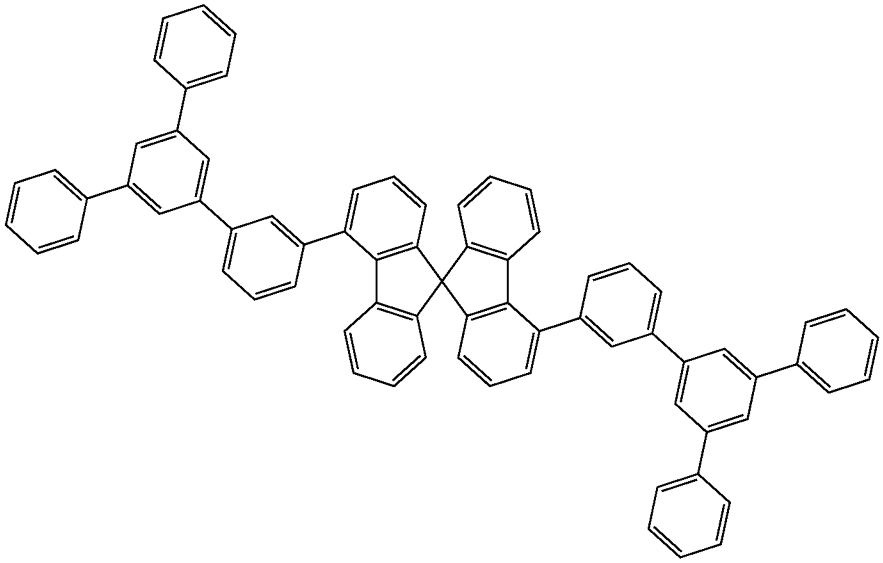
4
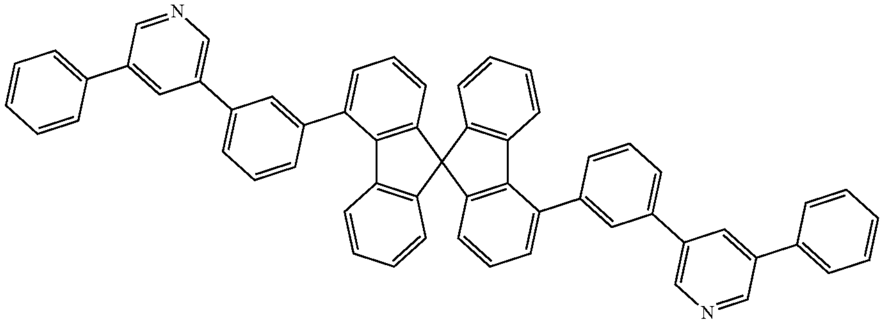
5
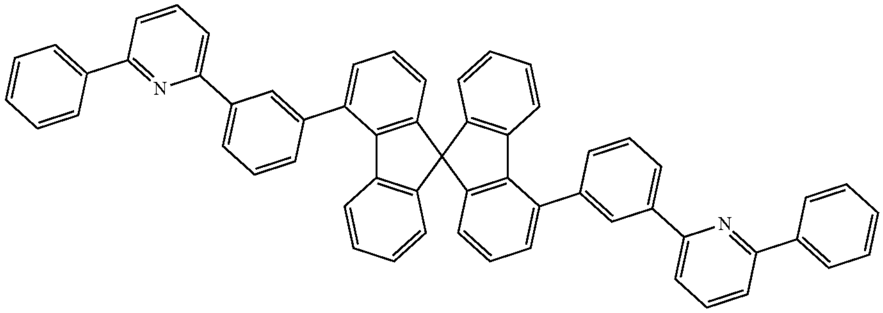
6
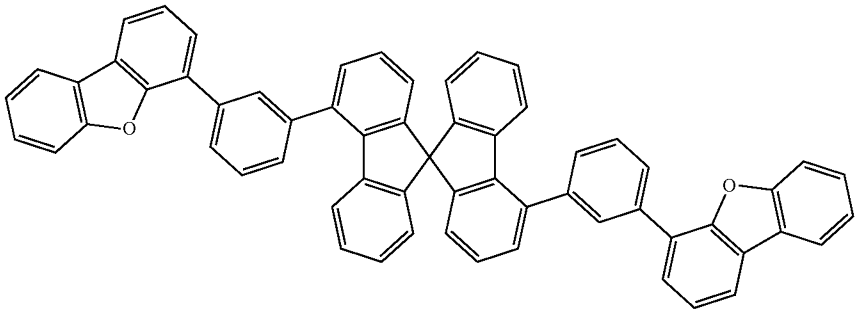

-continued
7
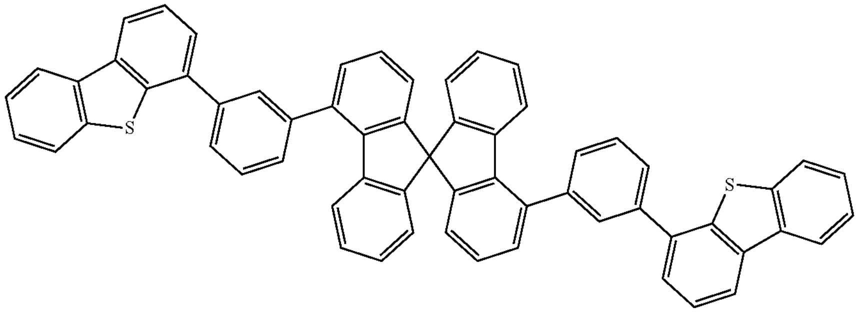
8
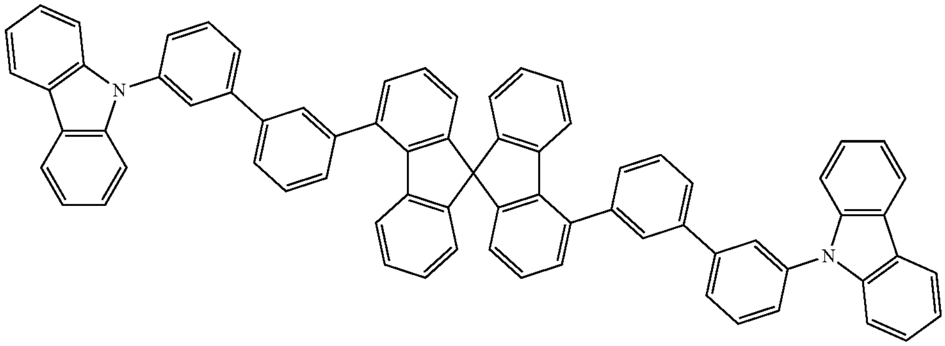
9
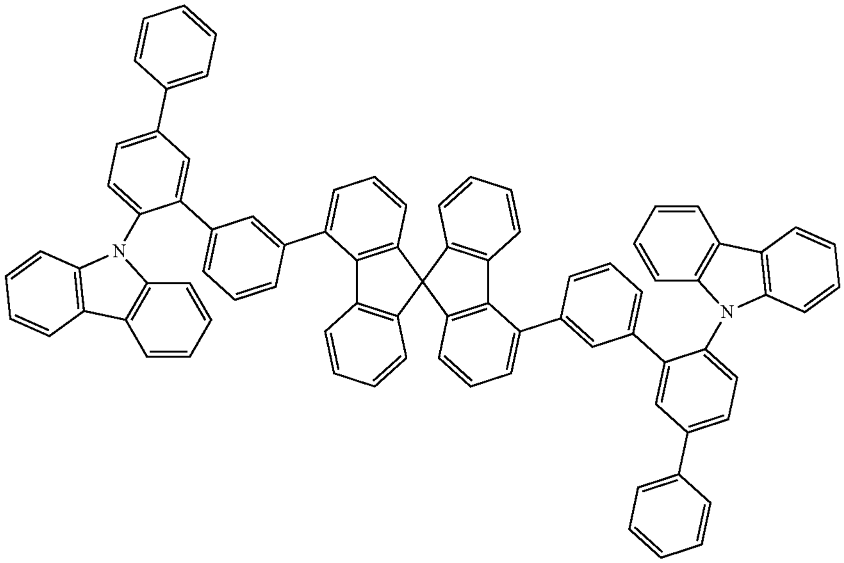
10
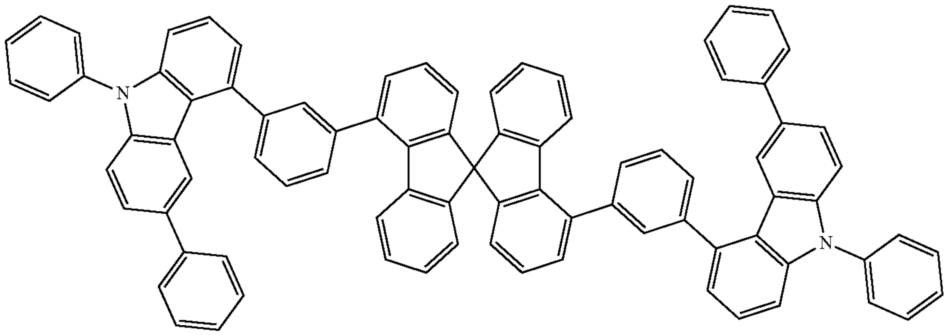

-continued
11
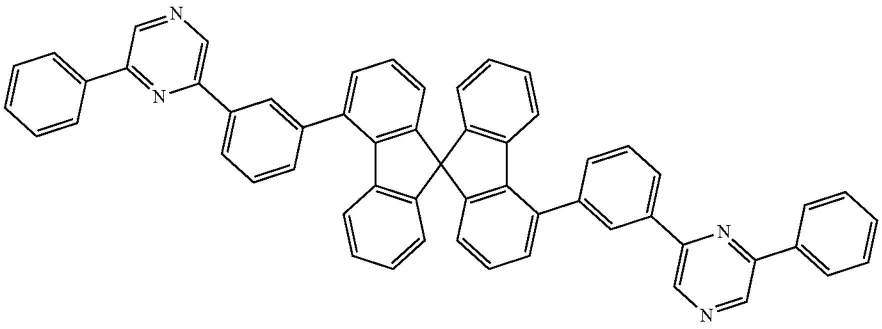
12
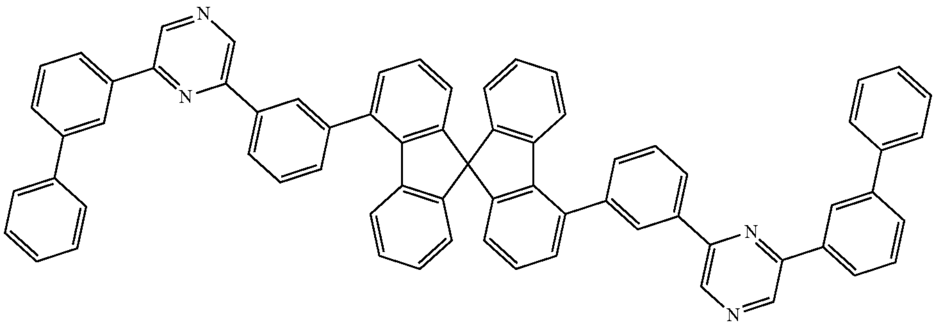
13
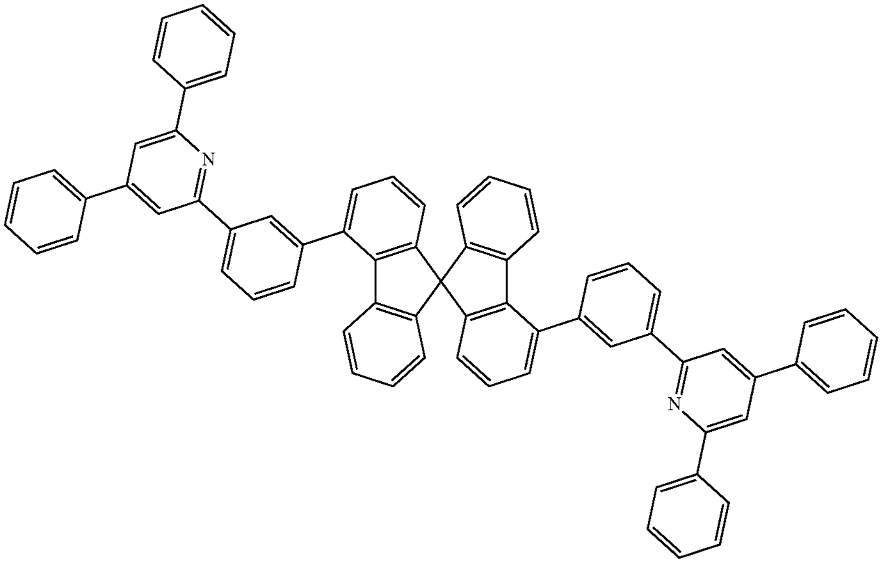

-continued
14
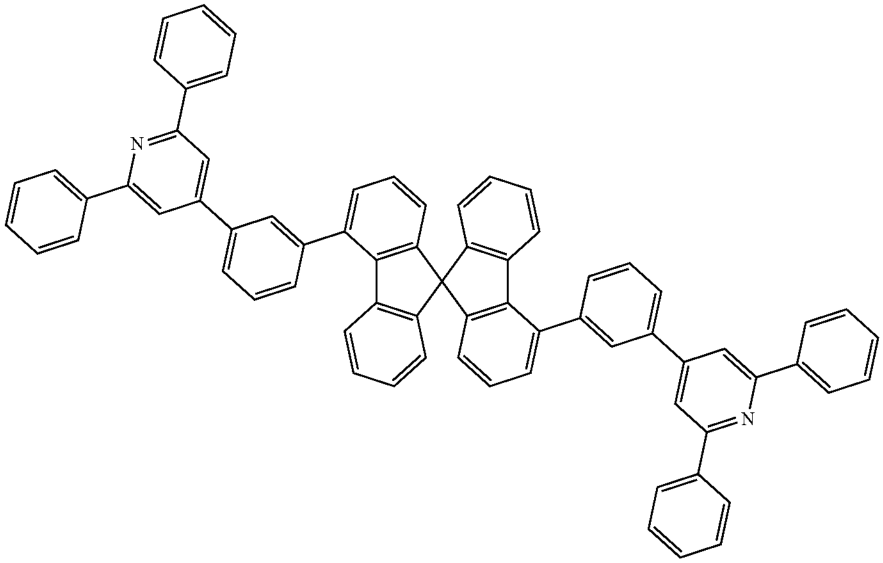
15
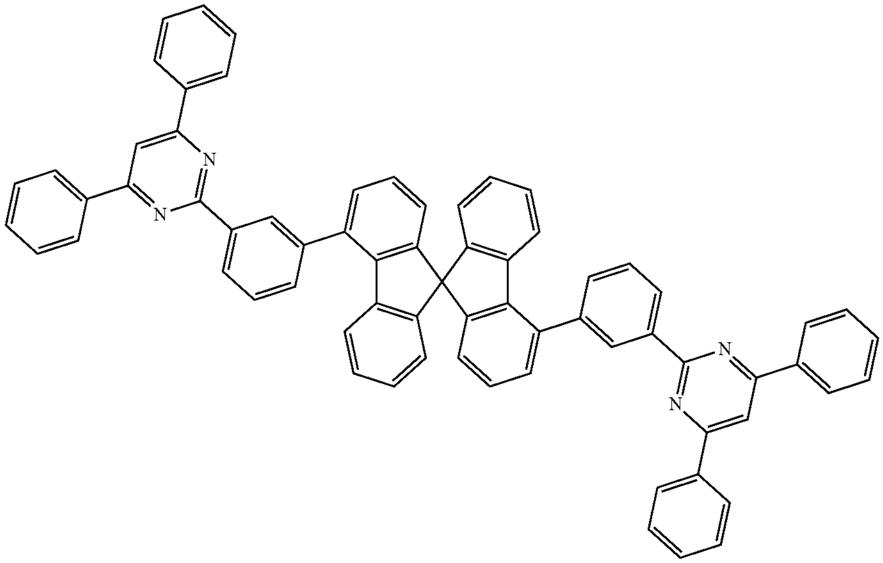

-continued

16

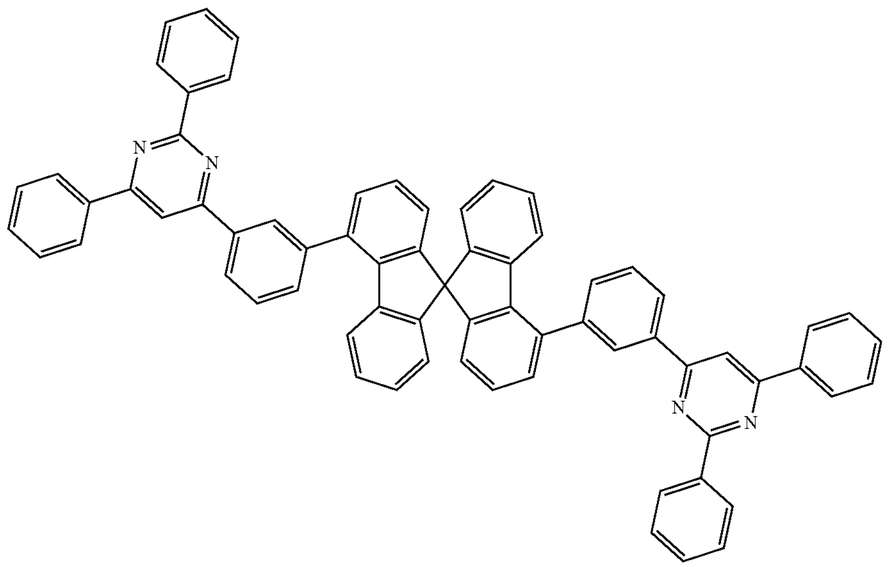

17

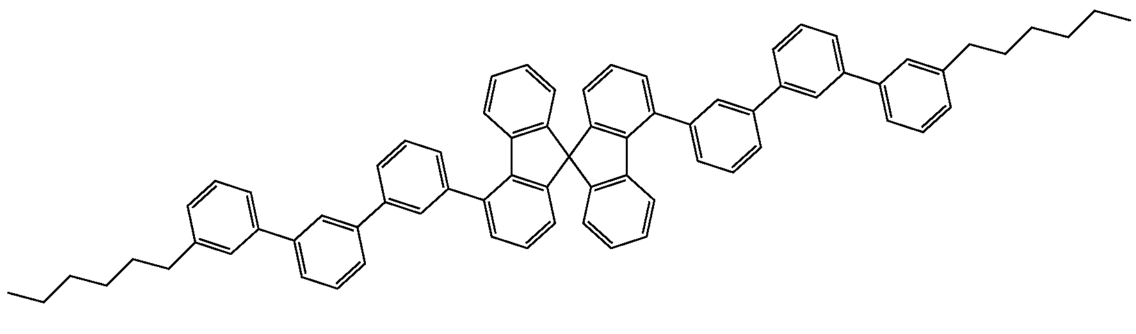

In addition, a method of preparing the low molecular weight compound 6 is not particularly limited, and the low molecular weight compound 5 may be prepared using various preparing methods including well-known synthesis methods.

In an embodiment, the low molecular weight material includes at least one low molecular weight compound selected from the low molecular weight compound 1, the low molecular weight compound 2, the low molecular weight compound 3, the low molecular weight compound 4, the low molecular weight compound 5, and the low molecular weight compound 6.

For example, the low molecular weight material may include at least one low molecular weight compound selected from Group (C).

Group (C)

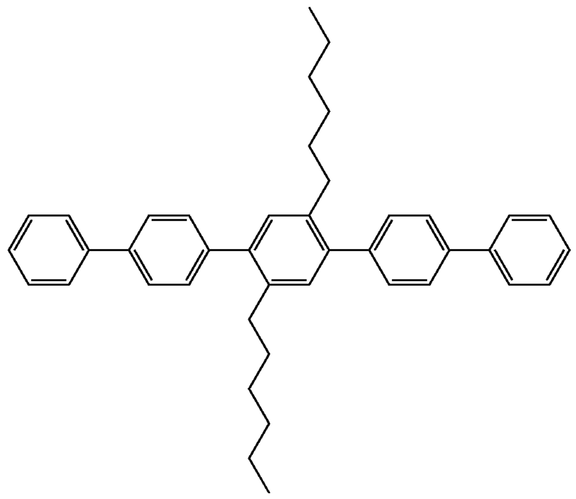 [SMILES: CCCCCCc1cc(-c2ccc(-c3ccccc3)cc2)c(CCCCCC)cc1-c1ccc(-c2ccccc2)cc1]

-continued

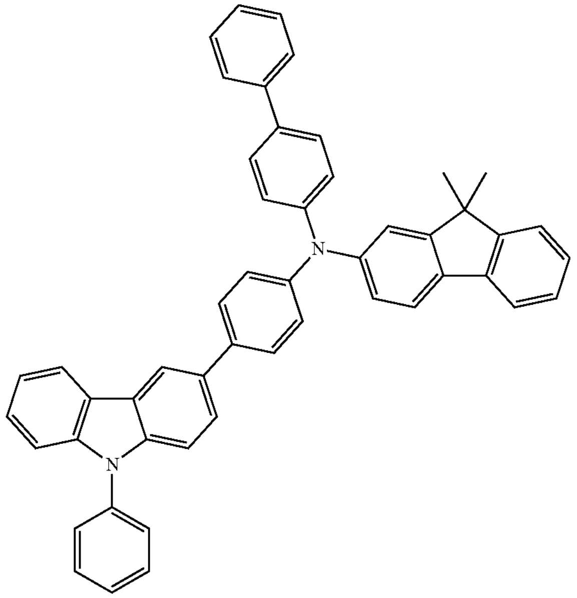

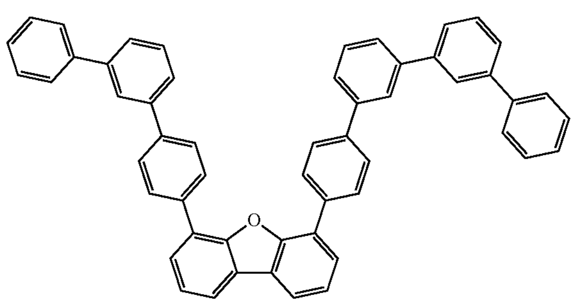

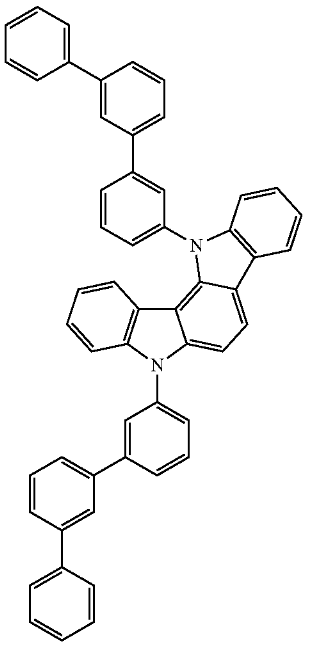

-continued

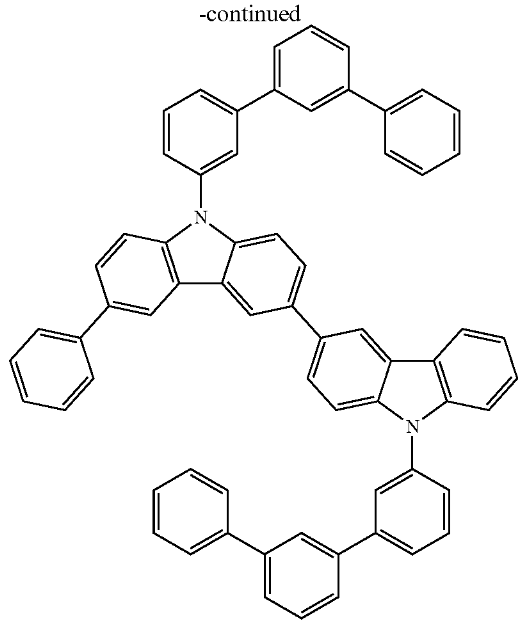

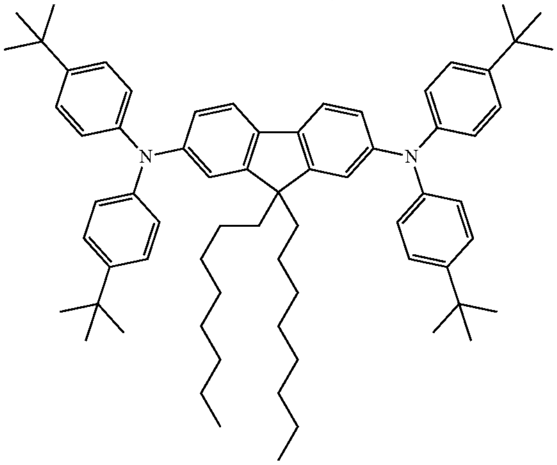

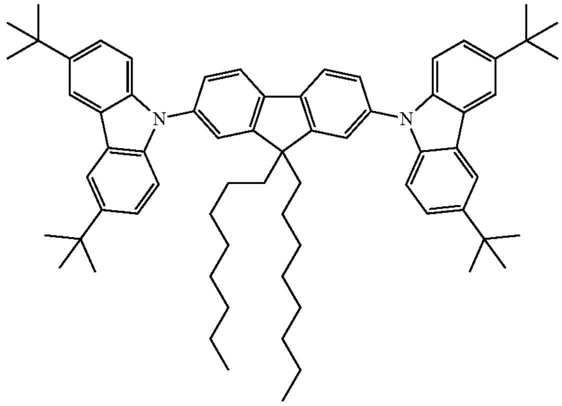 [SMILES: CCCCCCCCC1(CCCCCCCC)c2cc(-n3c4ccc(C(C)(C)C)cc4c4cc(C(C)(C)C)ccc43)ccc2-c2ccc(-n3c4ccc(C(C)(C)C)cc4c4cc(C(C)(C)C)ccc43)cc21]

For example, in the electroluminescent device according to an embodiment, the organic layer (e.g., hole transport layer) includes at least one polymer selected from the aforementioned Group (A) and at least one type of low molecular weight compound selected from the low molecular weight compound 1, the low molecular weight compound 2, the low molecular weight compound 3, the low molecular weight compound 4, the low molecular weight compound 5, and the low molecular weight compound 6.

For example, in the electroluminescent device according to an embodiment, the organic layer (e.g., hole transport layer) includes at least one polymer selected from the aforementioned Group (B) and at least one type of low molecular weight compound selected from the low molecular weight compound 1, the low molecular weight compound 2, the low molecular weight compound 3, the low molecular weight compound 4, the low molecular weight compound 5, and the low molecular weight compound 6.

For example, in the electroluminescent device according to an embodiment, the organic layer (e.g., hole transport layer) includes at least one polymer selected from the aforementioned Group (A) and at least one type of low molecular weight compound selected from Group (C).

For example, in the electroluminescent device according to an embodiment, the organic layer (e.g., hole transport layer) includes at least one polymer selected from the aforementioned Group (B) and at least one type of low molecular weight compound selected from Group (C).

When using a low molecular weight material, the content of the low molecular weight material in the composition according to an embodiment is not particularly limited. However, as the content of the low molecular weight material in the composition according to an embodiment, when the total of the polymer and the low molecular weight material is 100 mass %, the content of the low molecular weight material may be greater than about 0 mass % and less than or equal to about 50 mass, for example, greater than or equal to about 10 mass % and less than or equal to about 30 mass %, for example, greater than or equal to about 15 mass % and less than or equal to about 25 mass %. According to these methods, the device life-span of the EL device, in particular, the device life-span of the quantum dot electroluminescent device is further improved.

The content of the low molecular weight material in the electroluminescent device material according to an embodiment is also the same as the exemplary range of the low molecular weight material in the composition.

The content of the low molecular weight material in the organic layer (e.g., hole-transport layer) of the electroluminescent device according to an embodiment is also the same as the range of the exemplary content of the low molecular weight material in the composition according to an embodiment.

In an embodiment, the hole transport layer 140 may include a polymer according to an embodiment and a known hole transport material.

When any one other organic layer of the EL device 100 includes a polymer according to an embodiment, the hole transport layer 140 may be formed of a known hole transport material.

The known hole transport material may be, for example, 1,1-bis [(di-4-tolylamino) phenyl] cyclohexane (TAPC); carbazole derivatives such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

A hole transport material may be used alone or as a mixture of two or more.

The light emitting layer 150 is formed on the hole transport layer 140.

The light emitting layer 150 is a layer that emits light by fluorescence or phosphorescence, and may be formed using a vacuum deposition method, a spin coating method, an inkjet printing method, or the like.

The emission layer 150 may have a thickness of, for example, greater than or equal to about 10 nm and less than or equal to about 60 nm, for example, greater than or equal to about 20 nm and less than or equal to about 50 nm.

The light emitting material of the light emitting layer 150 is not particularly limited and a well-known light emitting material may be used.

The light emitting material included in the light emitting layer 150 may be, for example, a light emitting material capable of emitting light from triplet excitons (i.e., phosphorescent light emission). In this case, the driving life-span of the EL device 100 may also be improved.

A light emitting material may be used alone or as a mixture of two or more.

The light emitting layer 150 is not particularly limited and may have a known configuration.

For example, the light emitting layer includes quantum dots or an organometallic complex, for example, quantum dots.

That is, in an embodiment, the organic layer has a light emitting layer including quantum dots or an organometallic complex, for example, the organic layer has a light emitting layer including quantum dots.

Meanwhile, when the light emitting layer includes quantum dots, the EL device may be a quantum dot electroluminescent device (QLED), a quantum dot light emitting device, or a quantum dot light emitting device.

In addition, when the light emitting layer includes an organometallic complex, the EL device may be an organic electroluminescent device (OLED).

In a form in which the light emitting layer includes quantum dots (QLED), the light emitting layer has a plurality of quantum dots arranged in a single layer or a plurality of layers. Here, the quantum dots are semiconductor nanoparticles of a predetermined size having a quantum confinement effect. Although a diameter in particular of a semiconductor nanoparticle (quantum dot) is not limited, for example, it may be greater than or equal to about 1 nm and less than or equal to about 15 nm, for example, greater than or equal to about 1 nm and less than or equal to about 10 nm.

The semiconductor nanoparticles (quantum dots) arranged in the light emitting layer may be synthesized by a wet chemical process, an organometallic chemical vapor deposition process, a molecular beam epitaxy process, or other similar processes.

Among them, the wet chemical process is a method of growing particles by adding a precursor material to an organic solvent.

In the wet chemical process, when the crystal is grown, the organic solvent is naturally coordinated on the surface of the quantum dot crystal to act as a dispersant, thereby controlling the growth of the crystal. For this reason, the wet chemical processes are easier than vapor deposition methods such as metal organic chemical vapor deposition (MOCVD) or molecular beam epitaxy (MBE), and the growth of semiconductor nanoparticles may be controlled at low cost.

By controlling the size of semiconductor nanoparticles (quantum dots), an energy band gap may be adjusted, and light in various wavelength bands may be obtained from the light emitting layer (quantum dot light emitting layer). Therefore, by using a plurality of quantum dots of different sizes, a display that emits or outputs light of a plurality of wavelengths may be manufactured.

The size of the quantum dots may be selected to emit red, green, or blue light to constitute a color display. In addition, the size of the quantum dots may be combined to emit white light with various color light.

The semiconductor nanoparticles (quantum dots) may be semiconductor material selected from a Group II-VI semiconductor compound; a Group III-V semiconductor compound; a Group IV-VI semiconductor compound; a Group IV element or compound; and a combination thereof.

The Group II-VI semiconductor compound is not particularly limited, but includes, for example, a binary compound selected from CdSe, CdTe, ZnS, ZnSe, ZnTe, ZnO, HgS, HgSe, HgTe, and a mixture thereof; a ternary compound selected from CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof; or a quaternary compound selected from CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V semiconductor compound is not particularly limited, but includes, for example, a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; or a quaternary compound selected from GaAlNAs, GaAlNSb, GaAlPAs, GaAlPSb, GaInNP, GaInNAs, GalnNSb, GaInPAs, GalnPSb, InAlNP, InAlNAs, InAlNSb, InAlPAs, InAlPSb, and a mixture thereof.

The Group IV-VI semiconductor compound is not particularly limited, but includes, for example, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; or a quaternary compound selected from SnPbSSe, SnPbSeTe, SnPbSTe, and a mixture thereof.

The Group IV element or compound is not particularly limited, but includes, for example, a single element compound selected from Si, Ge, and a mixture thereof; or a binary compound selected from SiC, SiGe, and a mixture thereof.

The semiconductor nanoparticles (quantum dots) may have a homogeneous single structure or a double structure of a core-shell.

The core-shell may include different materials.

The material constituting each core and shell may be made of different semiconductor compounds.

However, an energy bandgap of the shell material is larger than an energy bandgap of the core material.

For example, the semiconductor nanoparticle (quantum dot) according to an embodiment may have a structure of ZnTeSe/ZnSe/ZnS, InP/ZnSe/ZnS, CdSe/ZnS, InP/ZnS, and the like.

For example, a process of producing a quantum dot having a core (CdSe)-shell (ZnS) structure is described below.

First, trioctylphosphine oxide (TOPO) is used as a surfactant.

A precursor material of the core (CdSe), such as $(CH_3)_2Cd$ (dimethylcadmium) or TOPSe (trioctylphosphine selenide), is injected into an organic solvent to form crystals. At this time, after maintaining a certain time at high temperature so that the crystals grow to a certain size, the precursor materials of the shell (ZnS) are injected, to form a shell on the surface of the core already produced. As a result, a quantum dot of CdSe/ZnS capped with TOPO may be produced.

The semiconductor nanoparticles (quantum dots) may be modified with an organic compound.

The quantum dots may be used alone or as a mixture of 2 or more quantum dots.

When the light emitting layer includes quantum dots, the light emitting layer may further include other materials in addition to the quantum dots.

Although the other materials are not particularly limited, the other materials may be, for example, an organic compound etc.

In addition, in the embodiment (OLED) in which the light emitting layer includes an organometallic complex, the light emitting layer 150 may include, for example, 6,9-diphenyl-9'-(5'-phenyl-[1,1':3',1"-terphenyl]-3-yl) 3,3'-bi[9H-carbazole], 3,9-biphenyl-5-(3-(4-phenyl-6-(5'-phenyl-[1,1':3',1"-terphenyl]-3-yl)-1,3,5,-triazin-2-yl)phenyl)-9H-carbazole, 9,9'-diphenyl-3,3'-bi[9H-carbazole], tris (8-quinolinato)aluminum (Alq3), 4,4'-bis(carbazol-9-yl)biphenyl (CBP), poly (n-vinyl carbazole) (PVK), 9,10-di(naphthalene)anthracene (ADN), 4,4',4"-tris(N-carbazolyl) triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis (9-carbazole)2,2'-dimethyl-bipheny (dmCBP), and the like, as a host material. The host material may be used alone or as a mixture of two or more host materials.

The light emitting layer 150 may include, for example, perylene and a derivative thereof, rubrene and a derivative thereof, coumarin and a derivative thereof, 4-dicyanomethylene-2-(dimethylaminostyryl)-6-methyl-4H-pyran (DCM) and a derivative thereof, an iridium (Ir) complex such as bis[2-(4,6-difluorophenyl)pyridinate]picolinate iridium(III) (Flrpic)), bis(1-phenylisoquinoline) (acetylacetonate) iridium(III) ($Ir(piq)_2(acac)$), tris(2-phenylpyridine)iridium (III) ($Ir(ppy)_3$), tris(2-(3-p-xylyl)phenyl)pyridine iridium (III), an osmium (Os) complex, a platinum complex, and the like, as a dopant material.

Among these, for example, the light emitting material may be a light emitting organometallic complex compound.

The dopant material may be used alone or as a mixture of 2 or more dopant materials.

A method for forming the light emitting layer is not particularly limited.

It may be formed by coating (by a solution coating method) coating liquid including the quantum dots or organometallic complex. At this time, a solvent constituting the coating liquid may be a solvent which does not dissolve the materials (hole transport material, for example, the polymer according to an embodiment) in the hole transport layer.

An electron transport layer 160 is formed on the light emitting layer 150. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nm and less than or equal to about 50 nm.

The electron transport layer 160 may be formed of a known electron transport material.

The known electron transport material may include, for example, (8-quinolinolate)lithium (lithium quinolate, Liq), tris(8-quinolinato)aluminum ($Alq_3$), and a compound having a nitrogen-containing aromatic ring.

Examples of the compound having the nitrogen-containing aromatic ring may include, for example, a compound including a pyridine ring such as 1,3,5-tri [(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene (TPBI).

The electron transport material may be used alone or as a mixture of two or more electron transport materials.

An electron injection layer 170 is formed on the electron transport layer 160.

The electron injection layer 170 is a layer having a function of facilitating injection of electrons from the second electrode 180.

The electron injection layer 170 is formed using a vacuum deposition method or the like.

The electron injection layer 170 may be formed to have a thickness of greater than or equal to about 0.1 nm and less than or equal to about 5 nm, and more specifically, greater than or equal to about 0.3 nm and less than or equal to about 2 nm.

As a material for forming the electron injection layer 170, any known material may be used.

For example, the electron injection layer 170 may be formed of a lithium compound such as (8-quinolinato) lithium (lithium quinolate, Liq) and lithium fluoride (LiF), sodium chloride (NaCl), cesium fluoride (CsF), lithium oxide ($Li_2O$), or barium oxide (BaO).

The electron injection material may be used alone or as a mixture of two or more electron injection materials.

A second electrode 180 is formed on the electron injection layer 170.

The second electrode 180 is formed using a vacuum deposition method or the like.

The second electrode 180 may be, for example, a cathode, and may be formed of a metal, an alloy, or a conductive compound having a small work function.

For example, the second electrode 180 may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like.

The second electrode 180 may be formed to have a thickness of greater than or equal to about 10 nm and less than or equal to about 200 nm, and more and specifically, greater than or equal to about 50 nm and less than or equal to about 150 nm.

Alternatively, the second electrode 180 may be formed as a transmissive electrode by a thin film of less than or equal to about 20 nm of a metal material or a transparent conductive layer such as indium tin oxide ($In_2O_3$—$SnO_2$), and indium zinc oxide ($In_2O_3$—ZnO).

The EL device 100 according to the present embodiment has been described above as an example of the electroluminescent device according to an embodiment.

The EL device 100 according to an embodiment includes an organic film (e.g., a hole transport layer or a hole injection layer) containing a polymer according to an embodiment, thereby increasing the device life-span of the EL device 100, for example, extending the device life-span of the quantum dot electroluminescent device.

In an embodiment, the polymer according to an embodiment may be included in the organic layer as the EL device material according to an embodiment, or may be included as the composition according to an embodiment.

The EL device 100 according to an embodiment may also be formed in other known stacked structures. For example, in the EL device 100, one or more of the hole injection layer 130, the hole transport layer 140, the electron transport layer 160, and the electron injection layer 170 may be omitted, or an additional layer may be further provided.

In addition, each layer of the EL device 100 may be formed as a single layer, or may be formed as a plurality of layers. For example, the EL device 100 may further include a hole blocking layer between the electron transport layer 160 and the light emitting layer 150 to prevent excitons or holes from diffusing into the electron transport layer 160.

Meanwhile, the hole blocking layer may be formed of, for example, an oxadiazole derivative, a triazole derivative, or a phenanthroline derivative. For example, the EL device 100 may further include an electron blocking layer between the hole transport layer 140 and the light emitting layer 150 to prevent excitons or electrons from diffusing into the hole transport layer 140.

In addition, the polymer according to an embodiment, the EL device material according to an embodiment, and the composition according to an embodiment may be applied to other electroluminescent devices in addition to the QLED or OLED.

Although the other electroluminescent devices are not particularly limited, the other electroluminescent devices may be, for example, an organic-inorganic perovskite light emitting device.

As another embodiment of the composition according to an embodiment, for example, the composition may include the polymer according to an embodiment and a low molecular weight material satisfying the above condition (a), and at the same time, satisfying the above condition (b), the above condition (c), or a combination thereof. The composition may be a composition for forming a hole transport layer.

The electroluminescent device according to an embodiment includes, for example, a pair of electrodes, and one or two or more organic layers between the pair of electrodes, and at least one of the organic layers includes a polymer according to an embodiment, and a low molecular weight material satisfying the above condition (a), and at the same time, satisfying the above condition (b), the above condition (c), or a combination thereof.

For example, the electroluminescent device may include a pair of electrodes and a hole transport layer between the pair of electrodes, wherein the hole transport layer includes the polymer according to an embodiment and a low molecular weight material satisfying the above condition (a), and at the same time, satisfying the above condition (b), the above condition (c), or a combination thereof.

These electroluminescent devices may further include a layer containing quantum dots.

Although the embodiments of the present invention have been described in detail, these are for purposes of explanation and examples, and are not limiting, and it is clear that the scope of the present invention should be construed by the appended claims.

The present invention includes the following embodiments and examples:

[1] A polymer having an overlap index of greater than or equal to about 0.00001 and less than or equal to about 1.8 represented by the following equation:

$$\text{overlap index} = \left(\sum_{k=1}^{n}\left(d_{HOMO}^{k} \times d_{LUMO}^{k}\right)\right) \times 100$$

In the equation, k is a serial number assigned to an atom in the chemical formula of a structural unit constituting the polymer, $d^k_{HOMO}$ denotes a distribution density of HOMO in the atom of serial number k, and $d^k_{LUMO}$ denotes a distribution density of LUMO in the atom of serial number k;

[2] The polymer according to [1], wherein the overlap index is greater than or equal to about 0.00001 and less than or equal to about 1.2 represented by the above equation;

[3] The polymer according to [1] or [2], including the structural unit represented by Chemical Formula (1);

[4] A polymer including the structural unit represented by Chemical Formula (1);

[5] The polymer according to [3] or [4], wherein in Chemical Formula (1), $Ar^3$ is a group selected from Group (I);

[6] The polymer according to any one of [3] to [5], wherein in Chemical Formula (1), at least one of $Ar^1$, $Ar^2$, and $Ar^4$ is each independently a group selected from Group (II);

[7] The polymer according to [6], wherein in Chemical Formula (1), $Ar^1$, $Ar^2$, and $Ar^4$ are each independently a group selected from Group (II);

[8] The polymer according to any one of [3] to [7], wherein the structural unit represented by Chemical Formula (1) is at least one structural unit selected from Group (A);

[9] The polymer according to any one of [3] to [7], wherein the structural unit represented by Chemical Formula (1) is at least one structural unit selected from Group (B);

[10] The polymer according to [9], wherein the structural unit represented by Chemical Formula (1) is at least one structural unit selected from Group (B');

[11] A composition including the polymer according to any one of [1] to [10]; [12] The composition according to [11], further including a low molecular weight material satisfying the above condition (a) and at the same time satisfying the above condition (b), the above condition (c), or a combination thereof;

[13] An electroluminescent device including a pair of electrodes and at least one organic film including the polymer according to any one of [1] to [10], between the pair of electrodes;

[14] The electroluminescent device including a pair of electrodes, and one or two or more organic layers between the pair of electrodes, wherein at least one of the organic layers includes the polymer of any one of [1] to [10] and the low molecular weight material satisfying the above condition (a) and at the same time satisfying the above condition (b), the above condition (c), or a combination thereof;

[15] The electroluminescent device including a pair of electrodes and at least one organic film including the composition according to [11] or [12], which is disposed between the pair of electrodes; and

[16] The electroluminescent device according to any one of [13] to [15], further including a layer including quantum dots.

EXAMPLES

The effects of the present disclosure will be described with reference to the following examples and comparative examples.

However, the technical scope of the present disclosure is not limited only to the following examples.

On the other hand, unless otherwise specified in the following examples, the operation was performed at room temperature (25° C.).

In addition, unless otherwise indicated, "%" and "part" mean "mass %" and "part by mass", respectively.

Synthesis of Polymer

Synthesis of Intermediate 1

Intermediate 1 was synthesized according to the following reaction scheme.

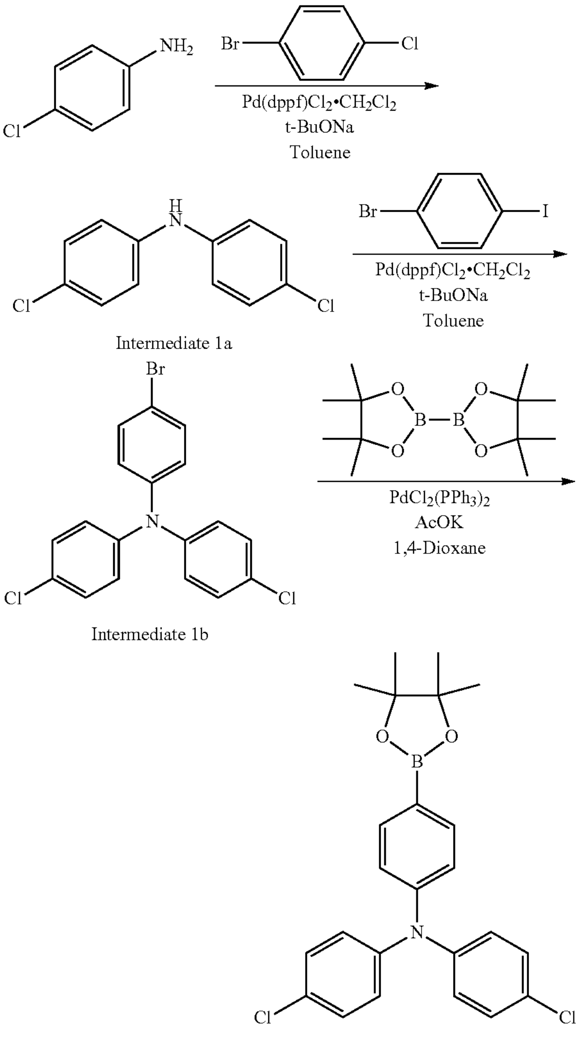

In a 3 L 4-necked flask, 4-chloro aniline (510 mmol, 65.0 g), 1-bromo-4-chlorobenzene (535 mmol, 102.4 g), sodium t-butoxide (t-BuONa) (764 mmol, 73.4 g), toluene (1,020 ml), and a [1,1'-bis(diphenyl phosphino)ferrocene]palladium (II) dichloride dichloromethane adduct ($PdCl_2$(dppf)-$CH_2Cl_2$) (15.3 mmol, 12.5 g) were combined and then, heated and stirred at 110° C. under a nitrogen atmosphere to initiate a reaction. Subsequently, while a progress of the reaction was checked, the reaction solution was heated and stirred at 110° C. for 6 hours.

After completion of the reaction, the resulting solution was cooled to room temperature and filtered through Celite.

The resulting solution was concentrated and purified by silica gel chromatography (hexane:toluene=7:3).

The obtained solution was concentrated and then, purified by recrystallization using toluene and hexane. A solid obtained therefrom was vacuum-dried (50° C., 16 hours), obtaining Intermediate 1a (amount: 100 g, yield: 83%).

In a 1 L 4-necked flask, Intermediate 1a (168 mmol, 40.0 g), p-bromoiodobenzene (252 mmol, 71.3 g), t-BuONa (336 mmol, 32.3 g), toluene (336 ml), and $PdCl_2$(dppf)-$CH_2Cl_2$ (0.50 mmol, 4.12 g) were combined and then, heated and stirred at 110° C. under a nitrogen atmosphere to initiate a reaction.

Subsequently, while a progress of the reaction was checked, the reaction solution was heated and stirred at 110° C. for 6 hours.

After completion of the reaction, the resulting solution was cooled to room temperature and filtered through Celite.

The resulting solution was concentrated and purified by silica gel chromatography (hexane:toluene=7:3).

The obtained solution was concentrated and then, twice recrystallized by using tetrahydrofuran (THF) and methanol. A solid obtained therefrom was vacuum-dried (50° C., 16 hours), obtaining Intermediate 1b (amount: 34 g, yield: 50%).

In a 2 L 3-necked flask, Intermediate 1b (178 mmol, 70.0 g), bis(pinacolato)diboron (267 mmol, 67.8 g), potassium acetate (356 mmol, 34.2 g), and 1,4-dioxane (650 ml) were combined and then, stirred, and bis(triphenylphosphine) palladium(II) dichloride ($PdCl_2(PPh_3)_2$)) (5.34 mmol, 4.36 g) was added thereto and then, refluxed for 20 hours under an argon atmosphere.

The obtained solution was cooled to room temperature and then, filtered with Celite to remove an insoluble matter. Subsequently, the obtained solution was concentrated and filtered with a silica gel pad to remove impurities. The obtained solution was concentrated and then, purified by recrystallization using toluene and hexane.

A solid obtained therefrom was vacuum-dried (50° C., 12 hours), obtaining Intermediate 1 (amount: 53.5 g, yield: 68%).

Synthesis of Intermediate 2

Intermediate 2 was synthesized according to the following reaction scheme.

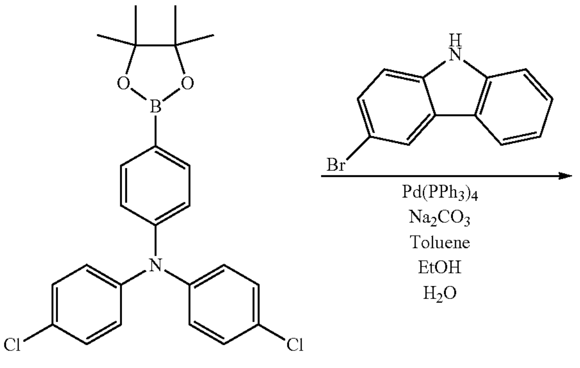

-continued

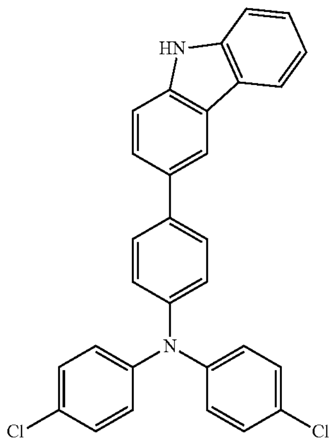

Intermediate 2

In a 500 mL 3-necked flask, Intermediate 1 (73.1 mmol, 9.0 g), 3-bromo-9H-carbazole (73.1 mmol, 16.1 g), and toluene (180 ml) were combined and then, dissolved.

An $Na_2CO_3$ aqueous solution (109.7 mmol, 5.82 g, in 90 mL of pure water) and ethanol (90 mL) were added thereto and dispersed therein and then, bubbled with nitrogen for 30 minutes.

Subsequently, tetrakis(triphenylphosphine)palladium (0) ($Pd(PPh_3)_4$) (3.66 mol, 2.11 g) was added thereto and then, refluxed for 5 hours under a nitrogen atmosphere.

When a reaction was completed, the obtained solution was cooled to room temperature, diluted with toluene, and then, washed with pure water three times. The obtained solution was dried with $MgSO_4$ and then, filtered with a silica gel pad. The obtained filtrate was treated under a reduced pressure to remove the solvents and then, twice purified by recrystallization using toluene and methanol. The obtained solid was vacuum-dried (50° C., 16 hours), obtaining Intermediate 2 (amount: 13.8 g, yield: 79%).

Synthesis of Intermediate 3

Intermediate 3 was synthesized according to the following reaction scheme.

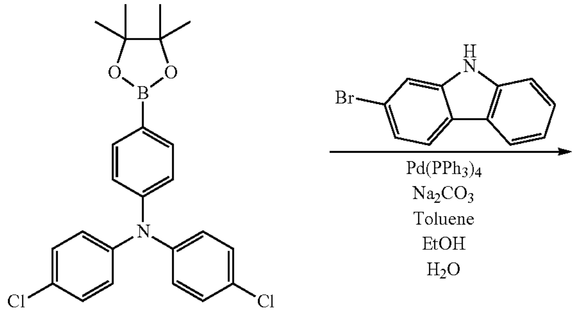

-continued

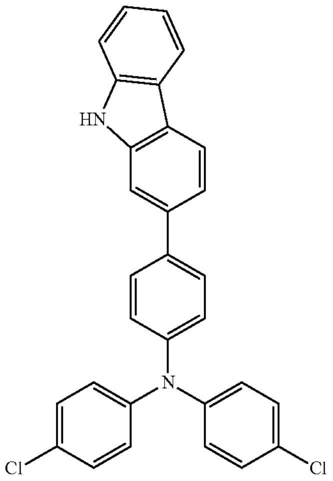

Intermediate 3

Intermediate 3 (amount: 14.5 g, yield: 89%) was synthesized in the same manner as Intermediate 2 except that 2-bromo-9H-carbazole was used instead of the 3-bromo-9H-carbazole in Intermediate 2.

Synthesis of Intermediate 4

Intermediate 4 was synthesized according to the following reaction scheme.

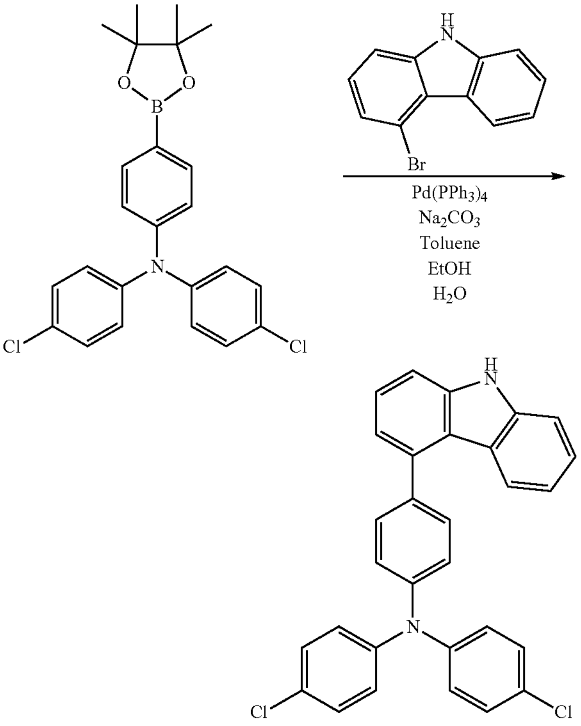

Intermediate 4

Intermediate 4 (amount: 32.1 g, yield: 64%) was synthesized in the same manner as Intermediate 2 except that 4-bromo-9H-carbazole was used instead of the 3-bromo-9H-carbazole in Intermediate 2.

Synthesis of Monomer M-1

Monomer M-1 was synthesized according to the following reaction scheme.

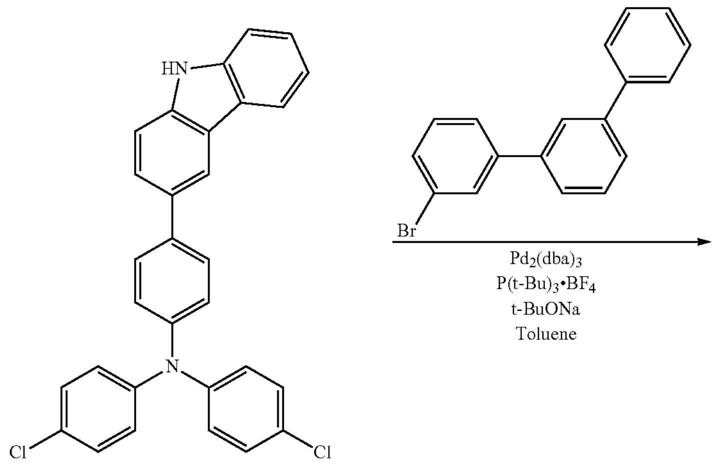

-continued

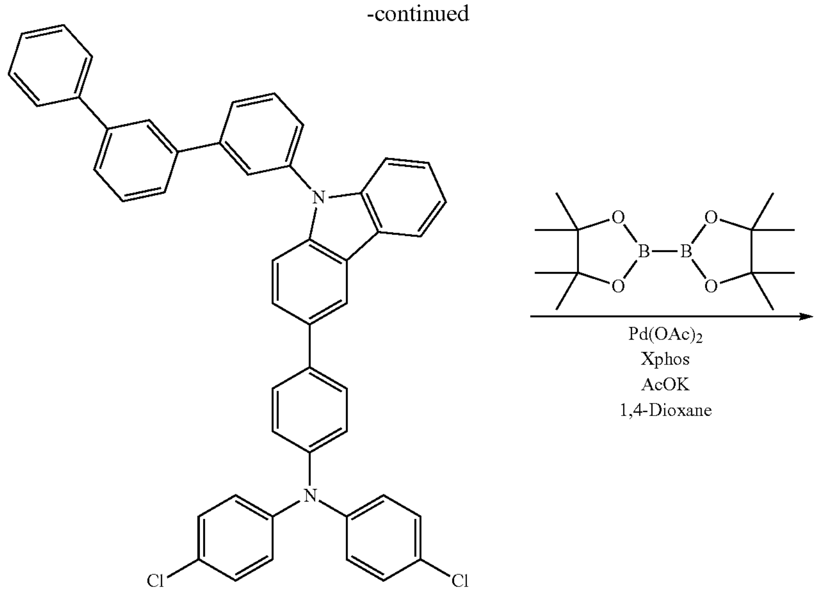

Precursor M-1a

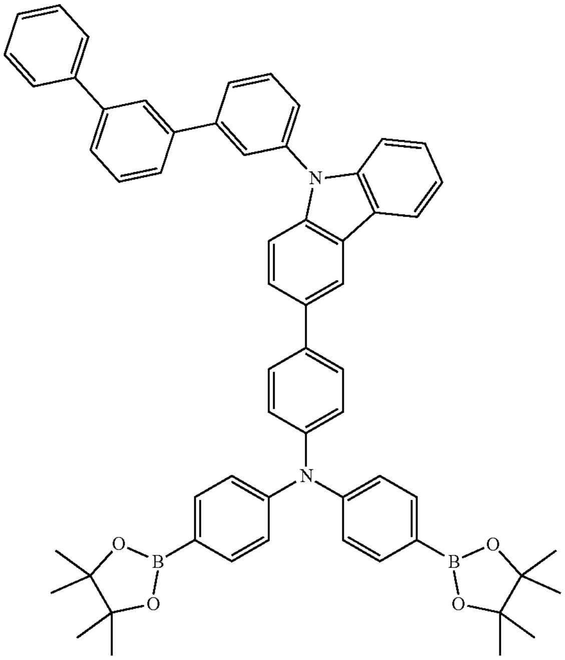

Monomer M-1

In a 300 mL 4-necked flask, Intermediate 2 (28.8 mmol, 13.8 g), 3-bromo-1,1':3',1"-terphenyl (31.7 mmol, 9.79 g), t-BuONa (43.2 mmol, 4.15 g), and toluene (160 ml) were combined and then, dispersed. Subsequently, trisdibenzylidene acetone dipalladium (0.58 mmol, 0.53 g), and tri-tert-butyl phosphine tetra fluoroborate (1.15 mmol, 0.33 g) were added thereto and then, stirred by heating under a nitrogen atmosphere at 110° C. for 4 hours.

When the reaction was competed, the obtained solution was cooled to room temperature and then, treated with Celite to remove insoluble matter. A filtrate therefrom was distilled under a reduced pressure to remove the solvents, and the residue was purified through column chromatography (silica gel, hexane/toluene), obtaining Precursor M-1a (amount: 11.0 g, yield: 54%).

In a 2 L 3-necked flask, Precursor M-1a (15.5 mmol, 11.0 g), bis(pinacolato)diboron) (62.2 mmol, 15.8 g), potassium acetate (93.3 mmol, 9.0 g), and 1,4-dioxane (155 ml) were combined and then, dispersed by stirring, and palladium acetate (1.55 mmol, 0.35 g) and 2-dicyclohexylphosphino- 2',4',6'-triisopropylbiphenyl (1.55 mmol, 0.74 g) were added thereto and then, refluxed for 5 hours under an argon atmosphere.

The obtained solution was cooled to room temperature and treated with Celite to remove insoluble matter. A filtrate therefrom was distilled under a reduced pressure to remove the solvents and filtered through a silica gel pad to remove impurities. The obtained solution was concentrated and purified by recrystallization using toluene and acetonitrile. A solid obtained therefrom was vacuum-dried (50° C., 12 hours), obtaining Monomer M-1 (amount: 5.3 g, yield: 38%).

Synthesis of Monomer M-2

According to the following reaction scheme, Monomer M-2 (amount: 5.1 g, yield: 57%) was synthesized in the same manner as Monomer M-1 except that 2-(3-bromophenyl)naphthalene replaced the 3-bromo-1,1':3',1"-terphenyl.

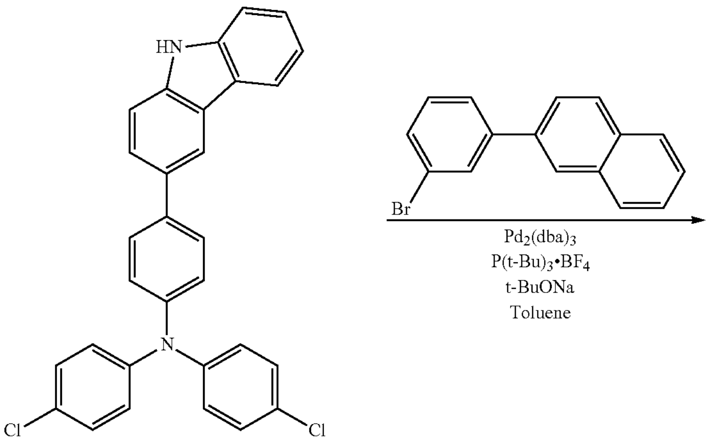

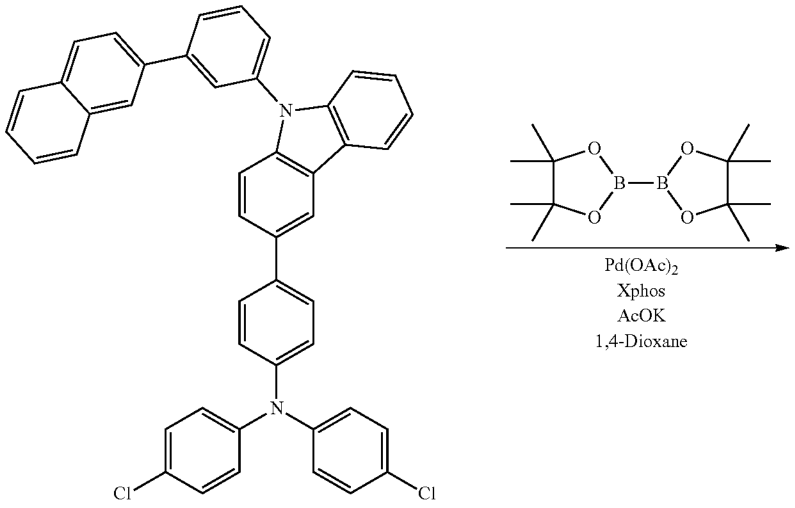

-continued

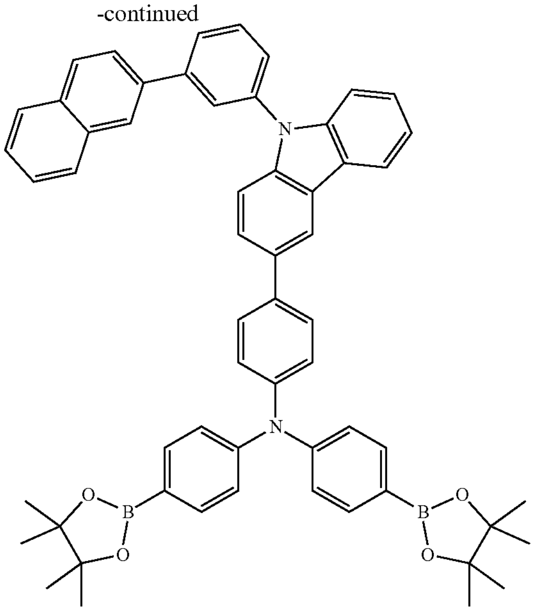

Monomer M-2

Synthesis of Monomer M-3

According to the following reaction scheme, Monomer M-3 (amount: 6.5 g, yield: 60%) was synthesized in the same manner as Monomer M-1 except that 2-bromodibenzofuran replaced the 3-bromo-1,1':3',1"-terphenyl.

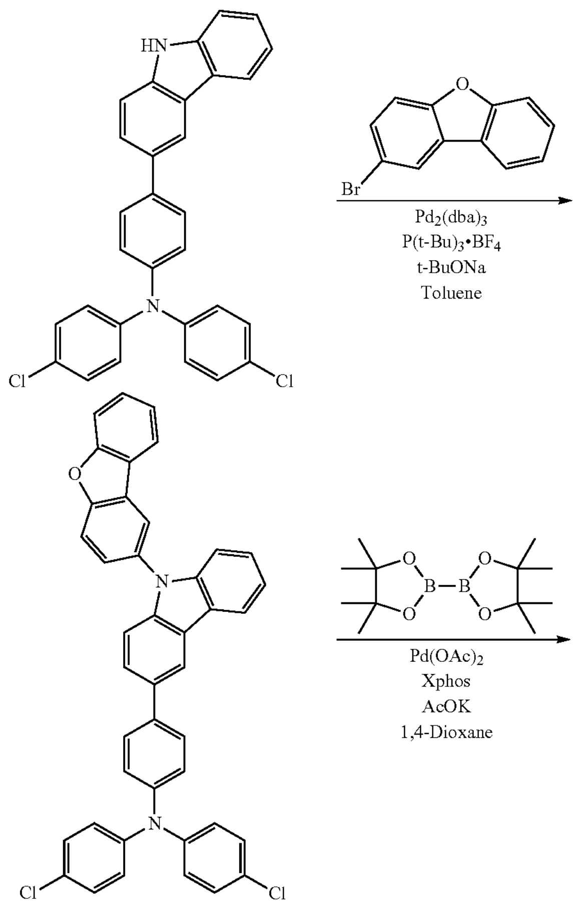

-continued

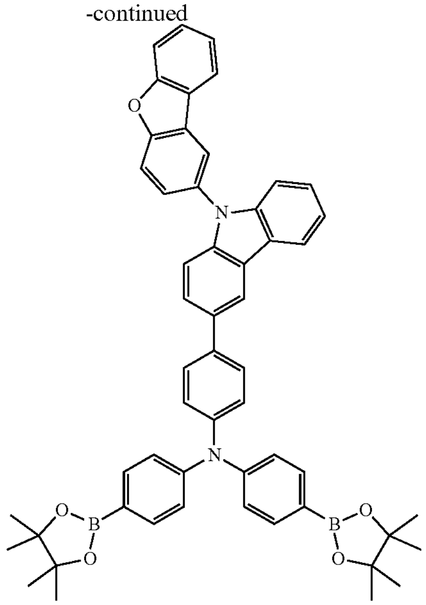

Monomer M-3

Synthesis of Monomer M-4

According to the following reaction scheme, Monomer M-4 (amount: 3.8 g, yield: 40%) was synthesized in the same manner as Monomer M-1 Intermediate 3 was used instead of Intermediate 2, and the 2-bromodibenzothiophene was used instead of 3-bromo-1_1'3',1"-terphenyl

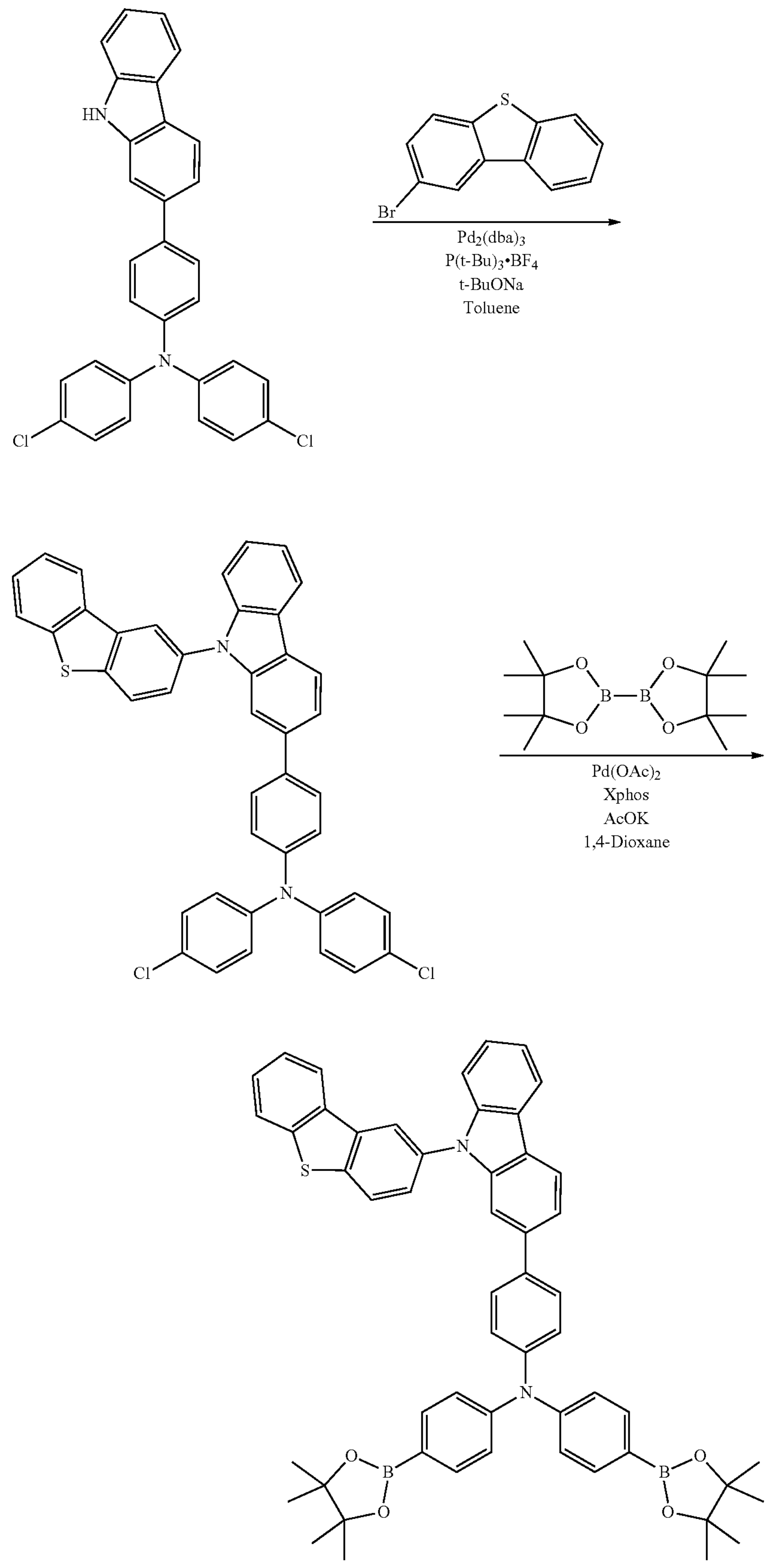
Monomer M-4

Synthesis of Monomer M-5

According to the following reaction scheme, Monomer M-5 (amount: 3.0 g, yield: 17%) was synthesized in the same manner as Monomer M-1 except that 3-bromo-9,9-dimethyl fluorene was used instead of 3-bromo-1,1':3',1"-terphenyl.

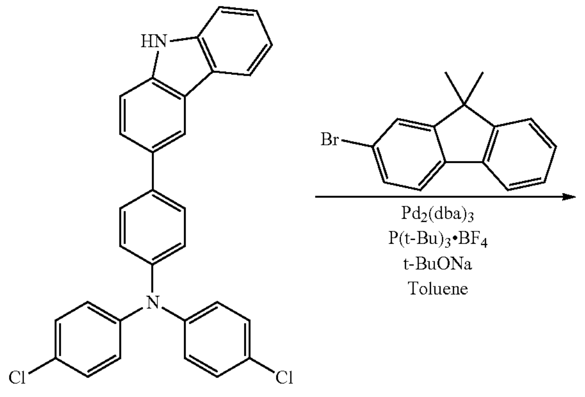

-continued

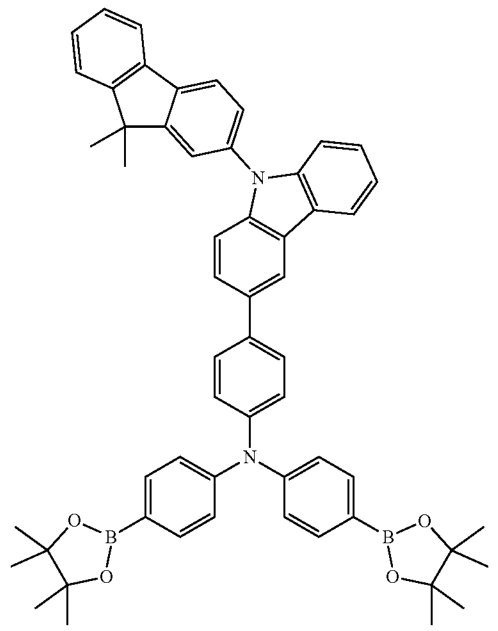

Monomer M-5

Synthesis of Monomer M-6

According to the following reaction scheme, Monomer M-6 (amount: 9.3 g, yield: 73%) was synthesized in the same manner as Monomer M-1 except that Intermediate 4 was used instead of Intermediate 2, and 3-bromo-9,9-dimethyl fluorene was used instead of 3-bromo-1,1':3',1"-terphenyl.

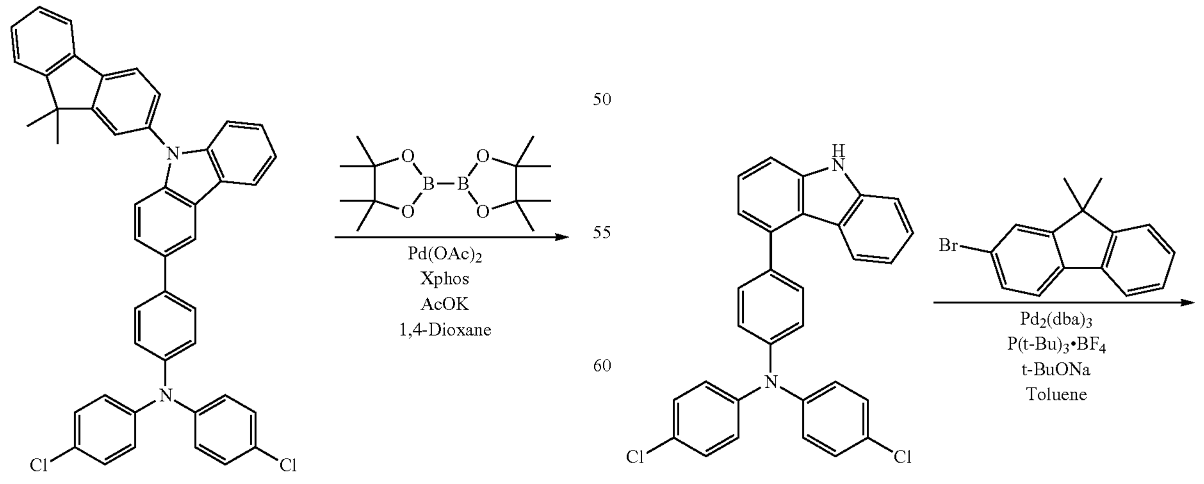

-continued

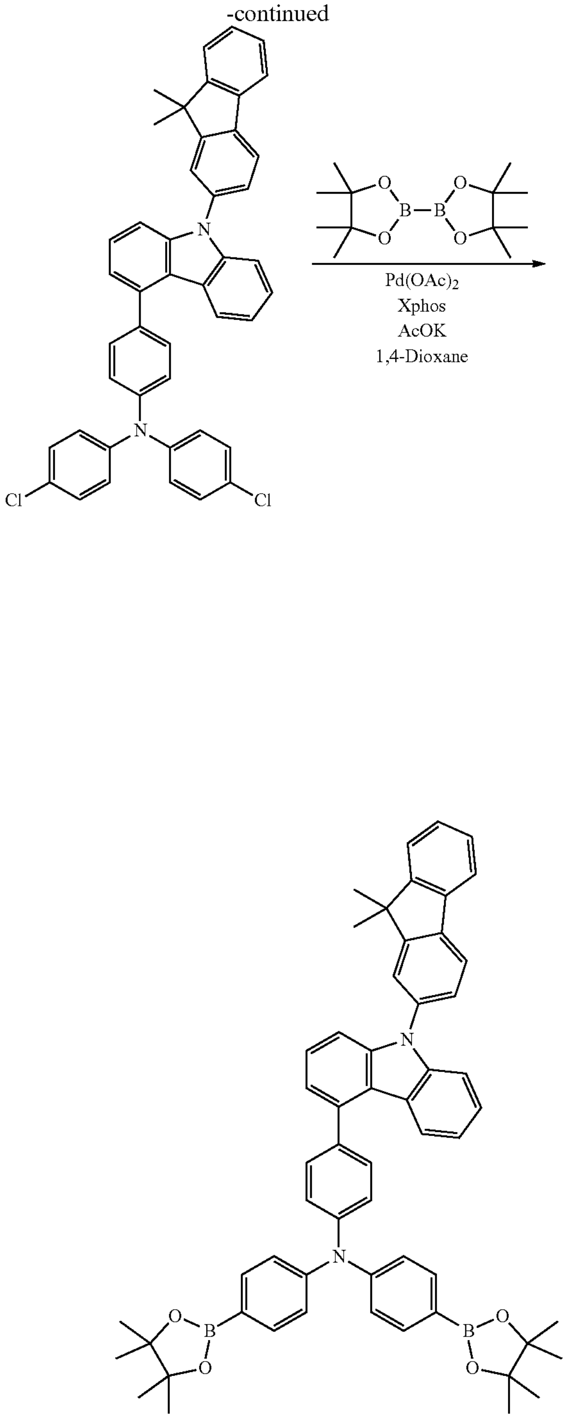

Monomer M-6

Example 1: Synthesis of Polymer A-1

Under an argon atmosphere, Monomer M-1 (1.978 g), 9.9-dioctyl-3,6-dibromo fluorene (1.212 g), palladium acetate (5.0 mg), tris(2-methoxy phenyl)phosphine (47.0 g), toluene (64 mL), and 20 mass % of a tetraethylammonium hydroxide aqueous solution (11.5 g) were mixed and stirred under reflux for 6 hours.

Subsequently, phenyl boronic acid (268.8 mg), bis(triphenylphosphine)palladium(II) dichloride (93.5 mg), and 20 mass % of a tetraethyl ammonium hydroxide aqueous solution (11.5 g) were added to the reaction solution and then, heated under reflux for 6 hours.

After removing an aqueous layer from the obtained solution, sodium N, N-diethyl dithiocarbamate trihydrate (7.51 g) and ion exchanged water (70 mL) were added thereto and then, stirred at 85° C. for 6 hours.

After the obtained solution was separated into an organic layer and an aqueous layer, the organic layer was washed with water, then 3 mass % of an acetic acid aqueous solution, and then water. The organic layer was added dropwise to methanol to precipitate a polymer, which was separated and dried, obtaining a solid. The solid was dissolved in toluene and then, passed through column chromatography charged with silica gel/alumina, and a solvent was removed therefrom by distillation under reduced pressure.

The obtained liquid was added dropwise to methanol, and a solid precipitated therein was collected and dried, obtaining Polymer A-1 (amount: 0.35 g).

Polymer A-1 were measured with respect to a weight average molecular weight (Mw) and polydispersity (Mw/Mn) by using SEC.

As a result, Polymer A-1 had a weight average molecular weight (Mw) and polydispersity (Mw/Mn) of 213,000 g/mol and 1.85, respectively.

Polymer A-1 is estimated to have the following repeating unit (structural unit) from the monomers used above.

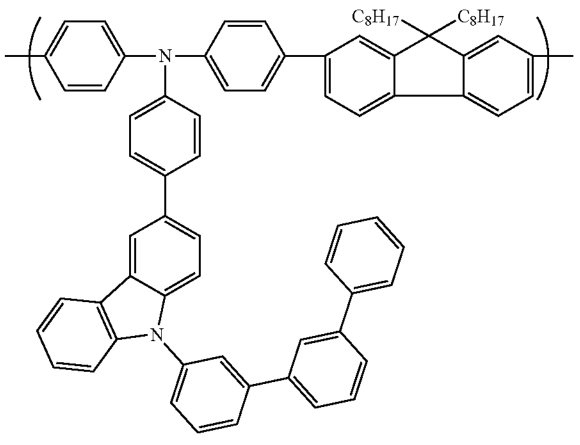

Example 2: Synthesis of Polymer A-2

Polymer A-2 (amount: 0.77 g) was synthesized in the same procedure as Polymer A-1 except that Monomer M-2 was used instead of Monomer M-1.

Polymer A-2 were measured with respect to weight average molecular weight (Mw) and polydispersity (Mw/Mn) by using SEC.

As a result, Polymer A-2 had a weight average molecular weight (Mw) and polydispersity (Mw/Mn) of 217,000 g/mol and 1.83, respectively.

Polymer A-2 is estimated to have the following repeating unit (structural unit) from the monomers used above.

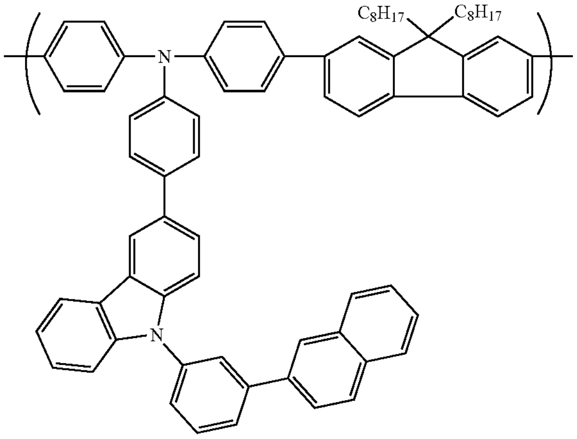

Example 3: Synthesis of Polymer A-3

Polymer A-3 (amount: 0.70 g) was synthesized in the same procedure as Polymer A-1 except that Monomer M-3 was used instead of Monomer M-1.

Polymer A-3 were measured with respect to weight average molecular weight (Mw) and polydispersity (Mw/Mn) by using SEC.

As a result, Polymer A-3 had a weight average molecular weight (Mw) and polydispersity (Mw/Mn) of 220,000 g/mol and 1.58, respectively.

Polymer A-3 is estimated to have the following repeating unit (structural unit) from the monomers used above.

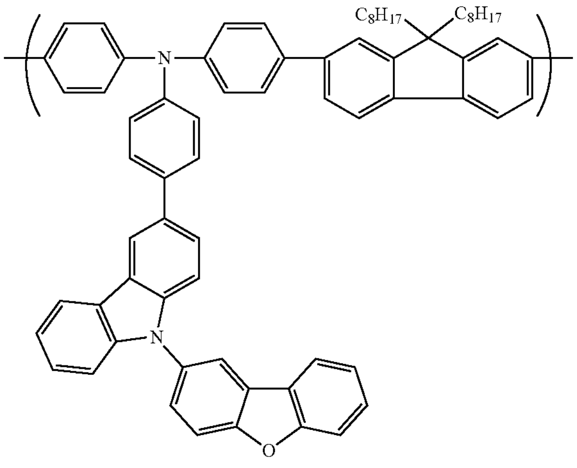

Example 4: Synthesis of Polymer A-4

Polymer A-4 (amount: 0.43 g) was synthesized in the same procedure as Polymer A-1 except that Monomer M-1 was changed into Monomer M-4.

Polymer A-4 was measured with respect to weight average molecular weight (Mw) and polydispersity (Mw/Mn) by using SEC.

As a result, Polymer A-4 had a weight average molecular weight (Mw) and polydispersity (Mw/Mn) of 140,000 g/mol and 2.90, respectively.

Polymer A-4 is estimated to have the following repeating unit (structural unit) from the monomers used above.

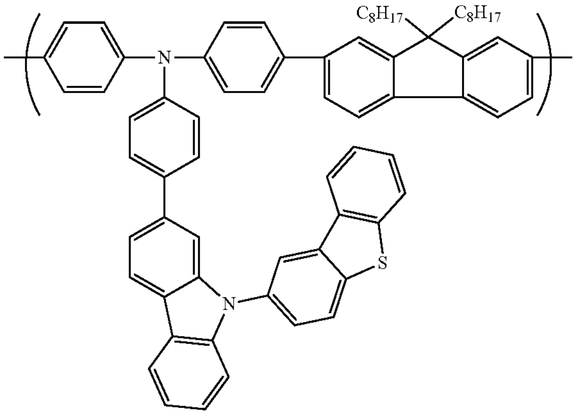

Example 5: Synthesis of Polymer A-5

Polymer A-5 (amount: 0.15 g) was synthesized in the same procedure as Polymer A-1 except that Monomer M-5 was used instead of Monomer M-1.

Polymer A-5 was measured with respect to weight average molecular weight (Mw) and polydispersity (Mw/Mn) by using SEC.

As a result, Polymer A-5 had a weight average molecular weight (Mw) and polydispersity (Mw/Mn) of 74,000 g/mol and 1.58, respectively.

Polymer A-5 is estimated to have the following repeating unit (structural unit) from the monomers used above.

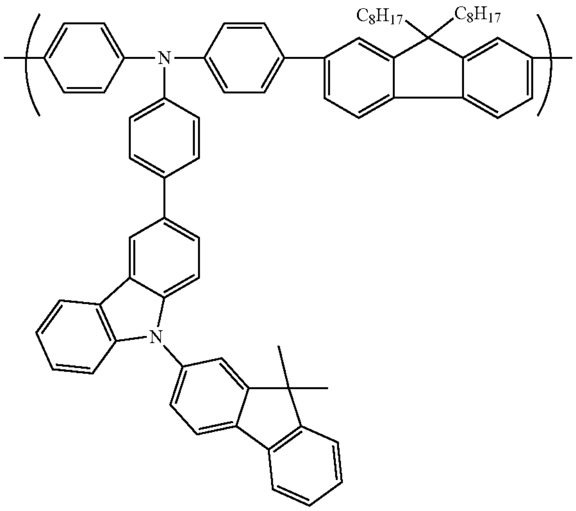

Example 6: Synthesis of Polymer A-6

Polymer A-6 (amount: 0.92 g) was synthesized in the same procedure as Polymer A-1 except that Monomer M-6 was used instead of Monomer M-1.

Polymer A-6 was measured with respect to weight average molecular weight (Mw) and polydispersity (Mw/Mn) by using SEC.

As a result, Polymer A-6 had a weight average molecular weight (Mw) and polydispersity (Mw/Mn) of 114,000 g/mol and 2.56, respectively.

Polymer A-6 is estimated to have the following repeating unit (structural unit) from the monomers used above.

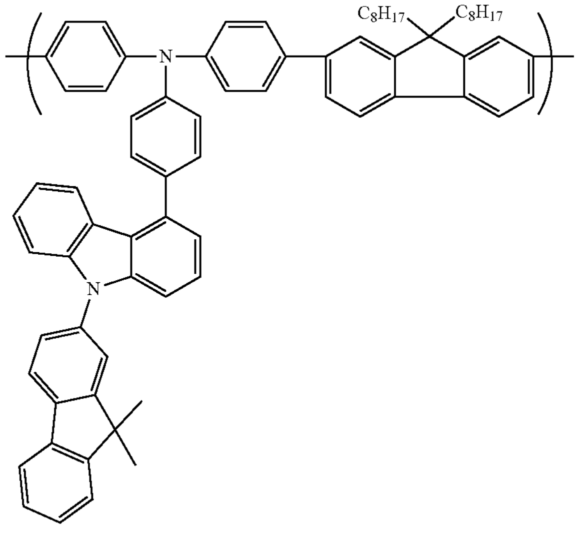

In Polymers A-1 to A-6, the group represented by "$C_8H_{17}$—" indicates an n-octyl group.

Example 7: Polymer A-7

Polymer A-7 is described later.

Example 8-21: Polymer A-8 to Polymer A-21

Synthesis of Intermediate 5

Intermediate 5 was synthesized according to the following reaction scheme.

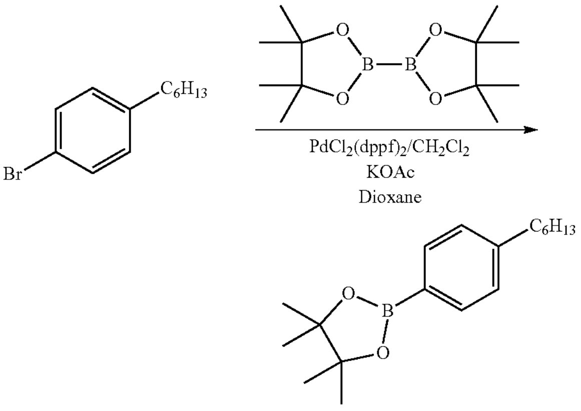

Intermediate 5

In a 1 L 4-necked flask, 1-bromo-4-hexyl benzene (207.3 mmol, 50.0 g), bis(pinacolato)diboron (248.8 mmol, 63.2 g), potassium acetate (310.1 mmol, 29.9 g), and 1,4-dioxane (691 ml) were combined and then, dispersed. Subsequently, [1,1'-bis(diphenylphosphino)ferrocene]dichloro palladium (II) and a dichloro methane adduct (20.7 mmol, 16.9 g) were added thereto and then, heated and stirred under a nitrogen atmosphere at 90° C. for 4 hours.

After completion of the reaction, the obtained solution was cooled to room temperature, and the insoluble matter was separated using Celite. A filtrate therefrom was distilled under a reduced pressure to remove the solvents, and the residue was purified through column chromatography (silica gel, hexane/toluene), obtaining Intermediate 5 (amount: 48.0 g, yield: 80%).

In 1-bromo-4-hexyl benzene and Intermediate 5, the group represented by "$C_6H_{13}$—" indicates an n-hexyl group.

Synthesis of Monomer M-7

Monomer M-7 was synthesized according to the following reaction scheme.

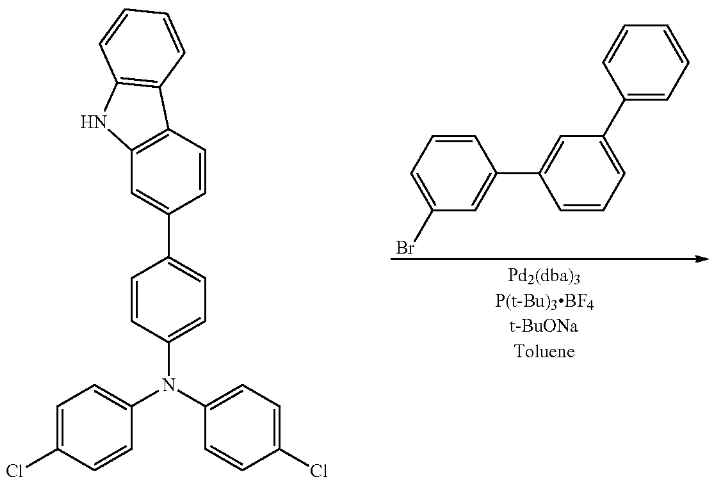

-continued

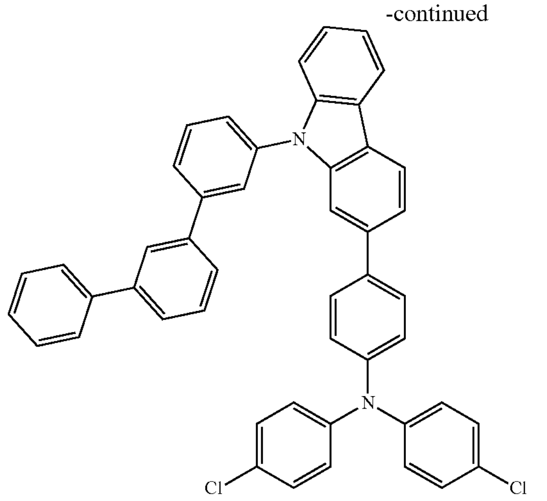

Precursor M-7a

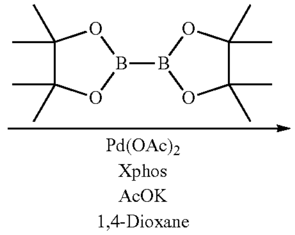

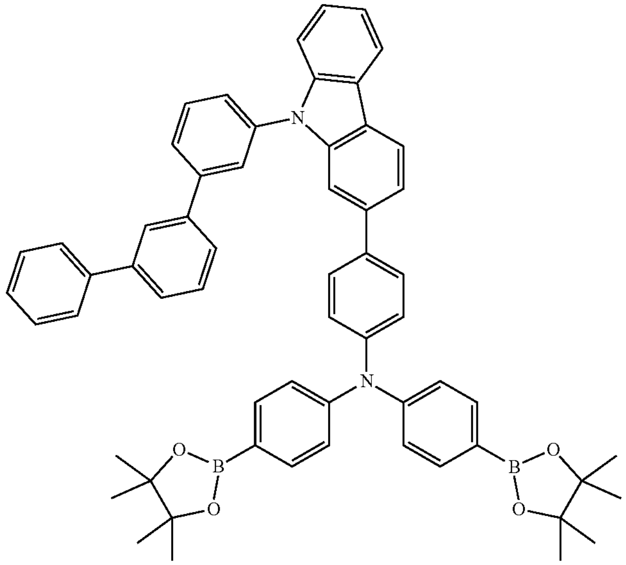

Monomer M-7

Monomer M-7 was synthesized in the same procedure as Monomer M-1 except that Intermediate 2 was used instead of Intermediate 1.

A yield and an amount of Precursor M-7a, and a yield and an amount of Monomer M-7 were respectively Precursor M-7a (amount: 7.0 g, yield: 73%), Monomer M-7 (amount: 6.0 g, yield: 68%).

Synthesis of Monomer M-8

Monomer M-8 was synthesized according to the following reaction scheme.

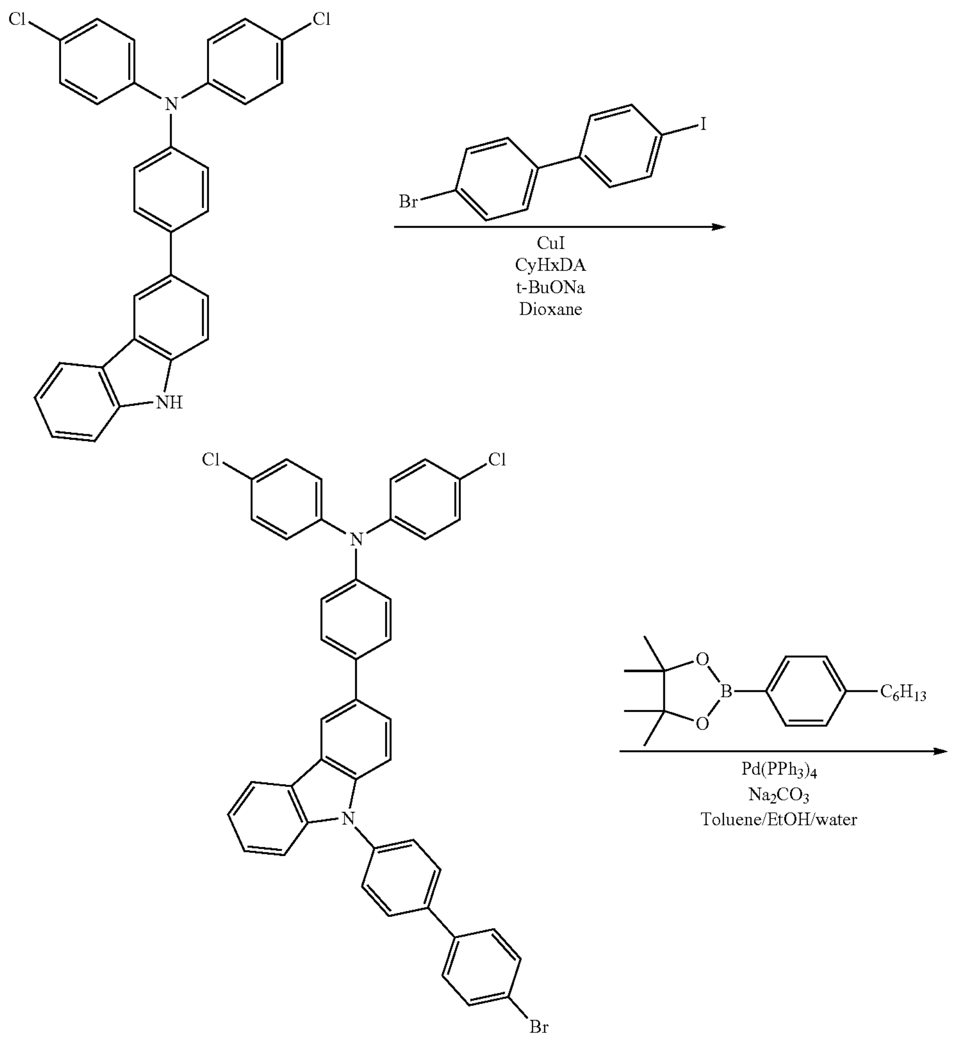
Precursor M-8a
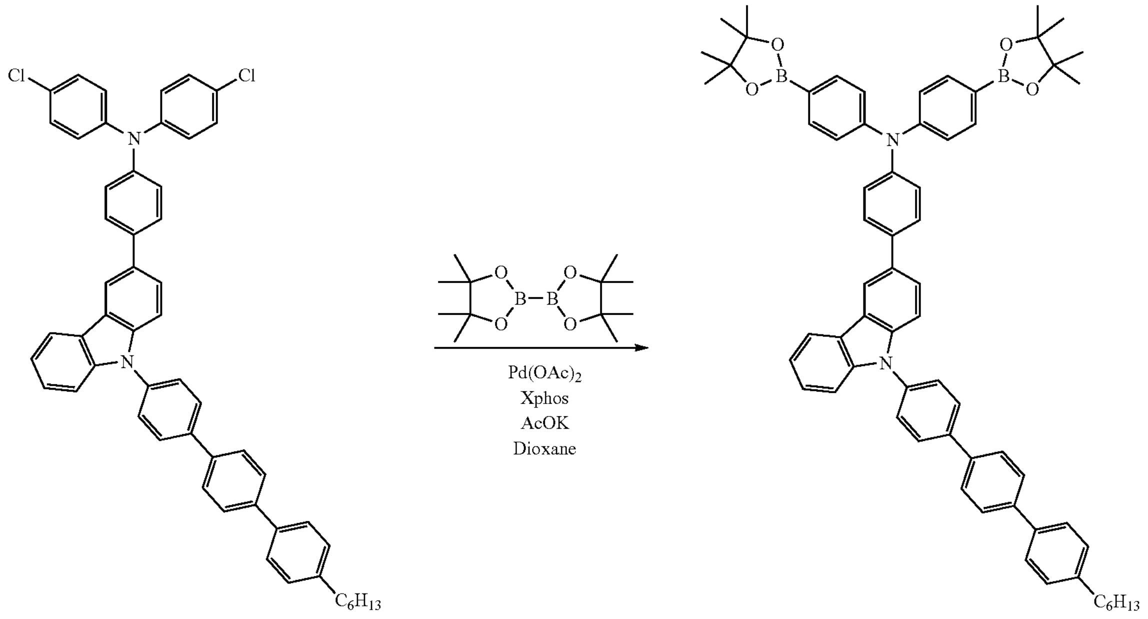
Precursor M-8b
Monomer M-8

In Precursor M-8b and Monomer M-8, the group represented by "$C_6H_{13}$—" indicates an n-hexyl group.

In a 200 mL 4-necked flask, Intermediate 2 (31.3 mmol, 15.0 g), 4-bromo-4'-iodo-1,1'-biphenyl (31.3 mmol, 11.2 g), t-BuONa (46.9 mmol, 4.51 g), and 1,4-dioxane (31 mL) were combined and then, dispersed. Subsequently, copper iodide (1.56 mmol, 0.30 g) and trans-cyclohexane diamine (6.26 mmol, 0.75 g) were added thereto and then, heated and stirred at 90° C. under a nitrogen atmosphere for 20 hours.

After completion of the reaction, the obtained solution was cooled to room temperature, and the insoluble matter was separated therefrom using Celite.

A filtrate therefrom was distilled under a reduced pressure to remove the solvent, and the residue was purified through column chromatography (silica gel, hexane/toluene). The obtained solid was purified by recrystallization using tetrahydrofuran and methanol, obtaining Precursor M-8a (amount: 19.3 g, yield: 87%).

In a 500 mL 3-necked flask, Precursor M-8a (27.2 mmol, 19.3 g), Intermediate 5 (27.2 mmol, 7.83 g), sodium carbonate (40.8 mmol, 4.32 g), toluene (136 mL), ethanol (68 mL), and distilled water (68 mL) were combined and then, stirred and dispersed. Subsequently, tetrakis(triphenylphosphine)palladium (0.81 mmol, 0.94 g) was added thereto and then, refluxed for 14 hours under an argon atmosphere.

The obtained solution was cooled to room temperature, and a precipitate was separated therefrom and washed in methanol.

The precipitate was purified by recrystallization using tetrahydrofuran and methanol.

The obtained solid was vacuum-dried (50° C., 12 hours), obtaining Precursor M-8b (amount: 17.4 g, yield: 80%).

In a 500 mL 3-necked flask, Precursor M-8b (22.0 mmol, 17.4 g), bis(pinacolato)diboron (87.9 mmol, 22.3 g), potassium acetate (131.9 mmol, 12.7 g), and 1,4-dioxane (220 mL) were combined and then, dispersed by stirring. Subsequently, palladium acetate (2.20 mmol, 0.50 g) and 2-dicyclohexylphosphino-2',4',6'-triisopropylbiphenyl (2.20 mmol, 1.05 g) were added thereto and then, refluxed for 3 hours under an argon atmosphere.

The obtained solution was cooled to room temperature and filtered with Celite to separate insoluble matter. A filtrate therefrom was distilled under a reduced pressure to remove the solvent and then, filtered with a silica gel pad to remove impurities. The obtained solution was concentrated and then, purified by recrystallization using toluene and acetonitrile.

The obtained solid was vacuum-dried (50° C., 12 hours), obtaining Monomer M-8 (amount: 9.6 g, yield: 44%).

Synthesis of Monomer M-9

Monomer M-9 was synthesized according to the following reaction scheme.

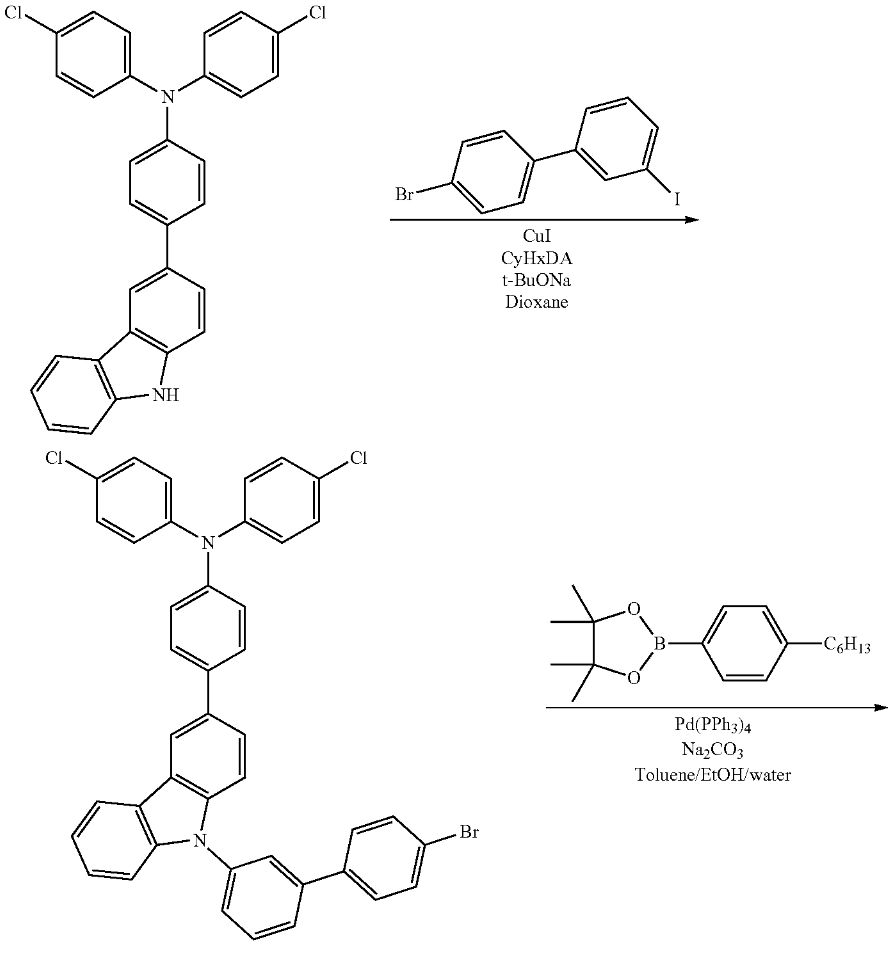

Precursor M-9a

-continued

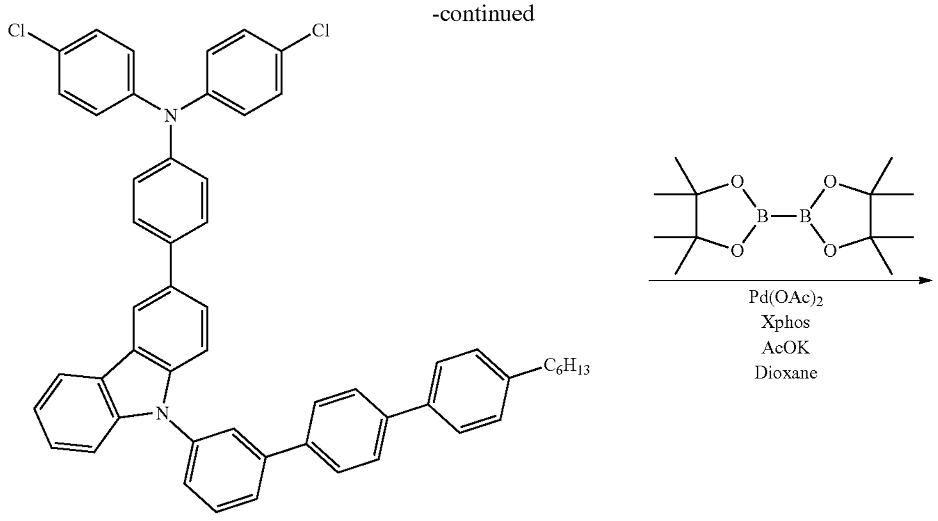

Precursor M-9b

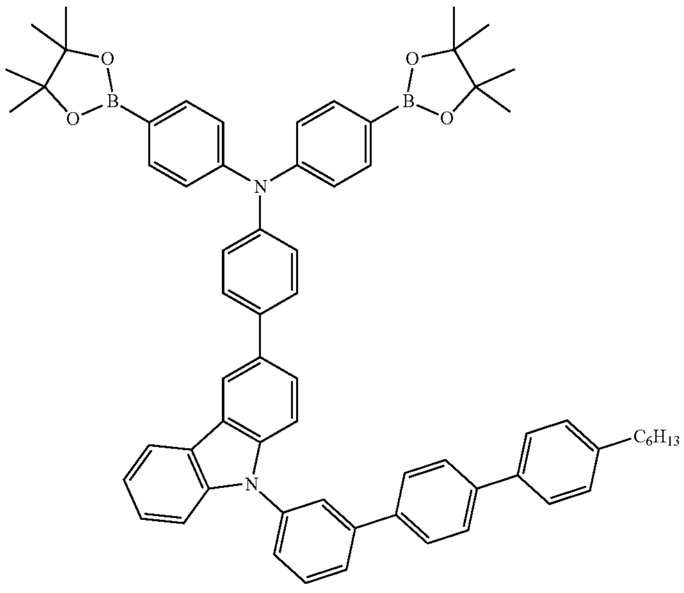

Monomer M-9

In Precursor M-9b and Monomer M-9, the group represented by "$C_6H_{13}$—" indicates an n-hexyl group.

Monomer M-9 was synthesized in the same procedure as Monomer M-8 except that the 4-bromo-3'-iodo-1,1'-biphenyl was used instead of 4-bromo-4'-iodo-1,1'-biphenyl as in Monomer M-8.

A yield and an amount of Precursor M-9a, a yield and an amount of Precursor M-9b, and a yield and an amount of Monomer M-9 were respectively Precursor M-9a (amount: 14.5 g, yield: 65%), Precursor M-9b (amount: 4.4 g, yield: 44%), and Monomer M-9 (amount: 3.4 g, yield: 62%).

Synthesis of Monomer M-10

Monomer M-10 was synthesized according to the following reaction scheme.

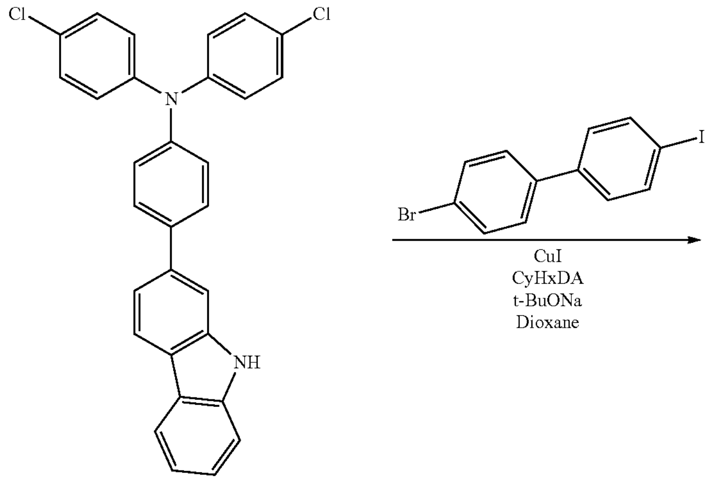
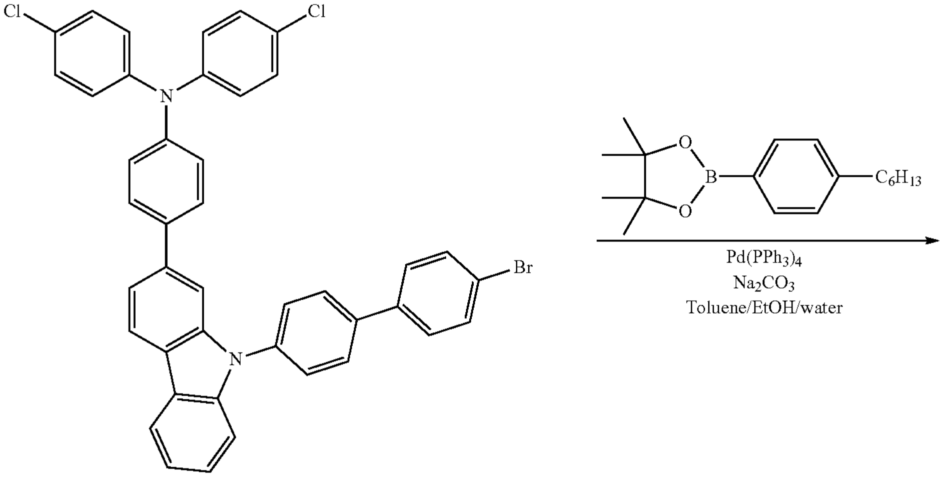
Precursor M-10a
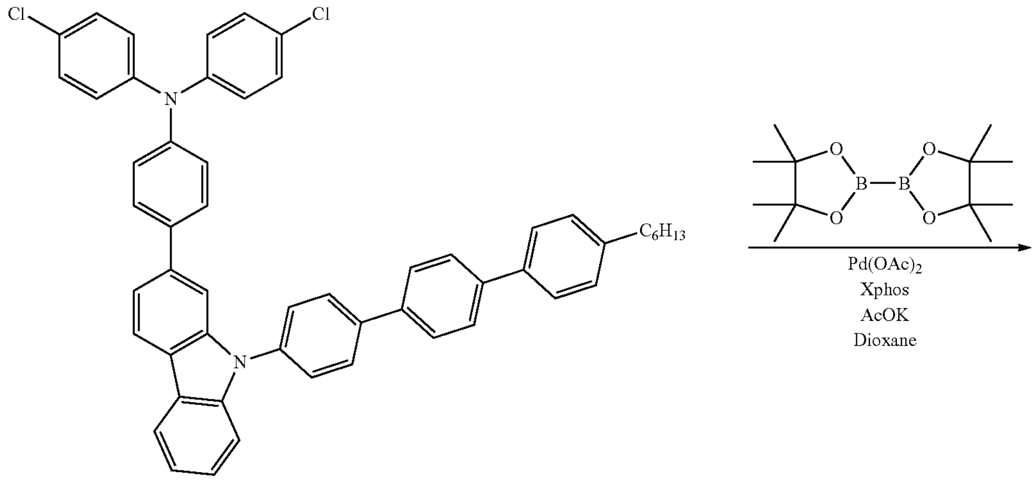
Precursor M-10b

-continued

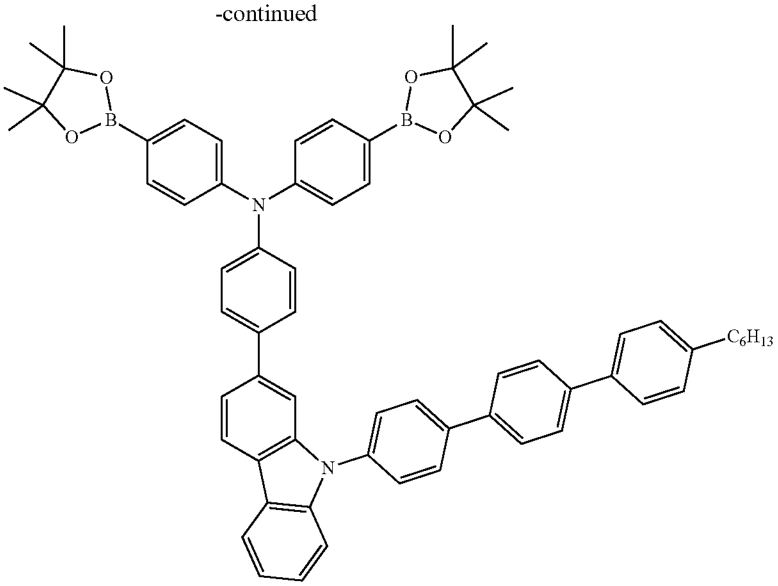

Monomer M-10

In Precursor M-10b and Monomer M-10, the group represented by "$C_6H_{13}$—" indicates an n-hexyl group.

Monomer M-10 was synthesized in the same procedure as Monomer M-8 except that Intermediate 2 was changed into Intermediate 3 in Monomer M-8.

A yield and an amount of Precursor M-10a, a yield and an amount of a yield and an amount of Precursor M-10b, and a yield and an amount of Monomer M-10 were respectively Precursor M-10a (amount: 12.9 g, yield: 58%), Precursor M-10b (amount: 10.8 g, yield: 75%), and Monomer M-10 (amount: 7.8 g, yield: 57%).

Synthesis of Monomer M-11

Monomer M-11 was synthesized according to the following reaction scheme.

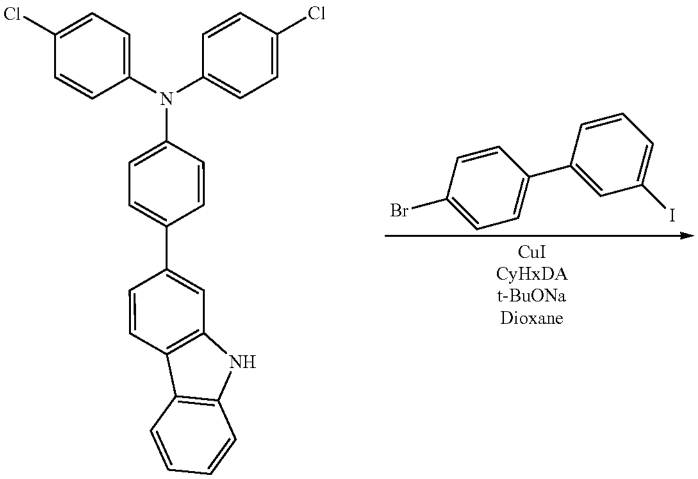

-continued
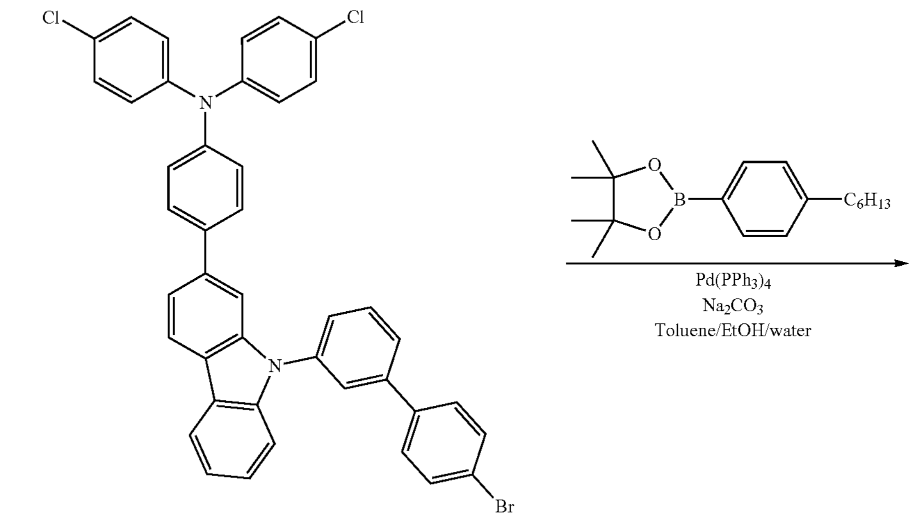
Precursor M-11a
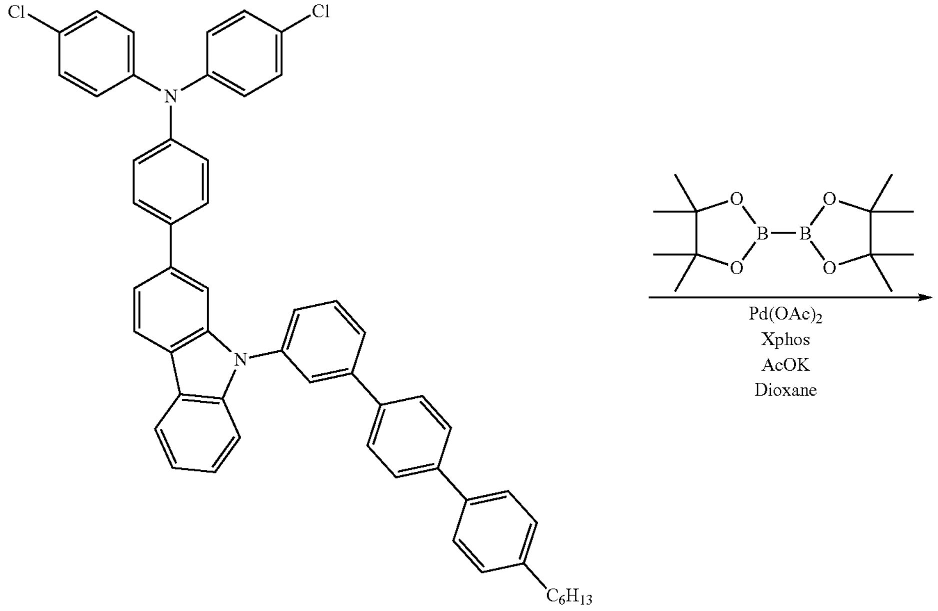
Precursor M-11b

-continued

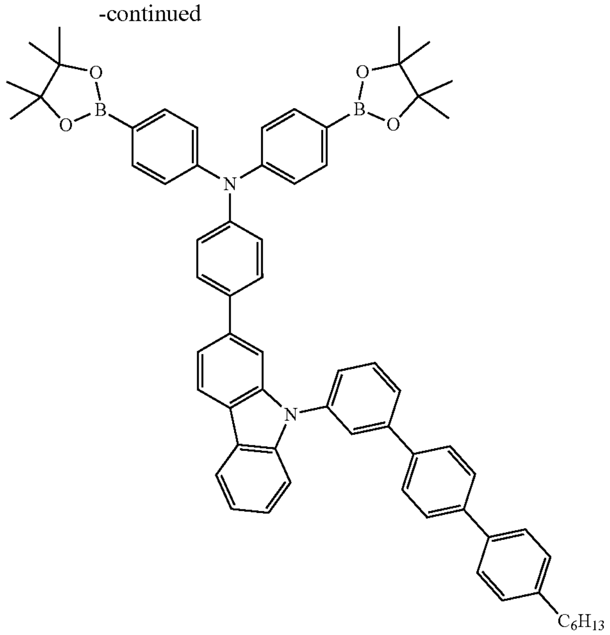

Precursor M-11

In Precursor M-11b and Monomer M-11, the group represented by "$C_6H_{13}$—" indicates an n-hexyl group.

Monomer M-11 was synthesized in the same procedure as Monomer M-8 except that Intermediate 3 was used instead of Intermediate 2, and 4-bromo-3'-iodo-1,1'-biphenyl was used instead of the 4-bromo-4'-iodo-1,1'-biphenyl as in Monomer M-8.

A yield and an amount of Precursor M-11a, a yield and an amount of a yield and an amount of Precursor M-11 b, and a yield and an amount of Monomer M-11 were respectively Precursor M-11a (amount: 14.5 g, yield: 65%), Precursor M-11b (amount: 14.4 g, yield: 89%), and Monomer M-11 (amount: 9.1 g, yield: 53%).

(Monomer M-12)

Monomer M-12 was synthesized according to the following reaction scheme.

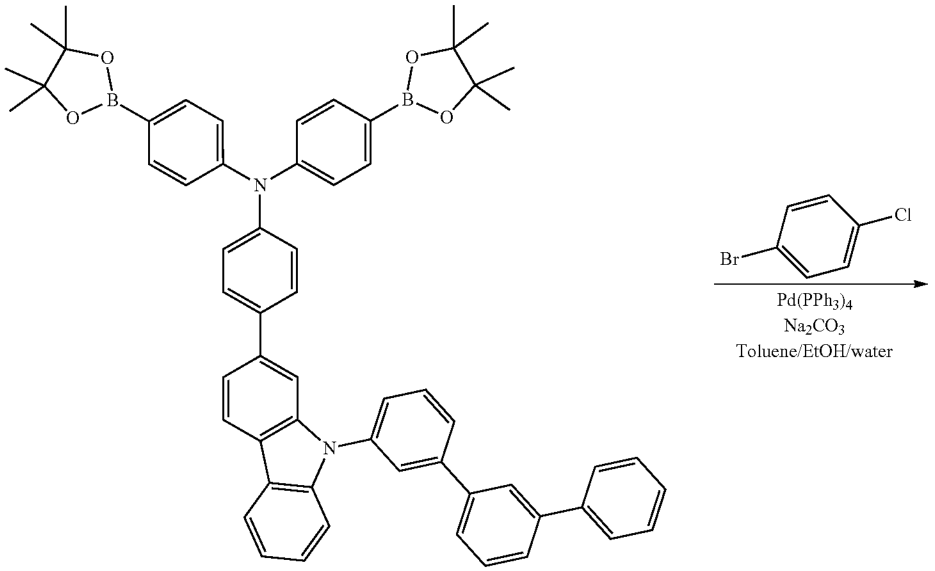

-continued

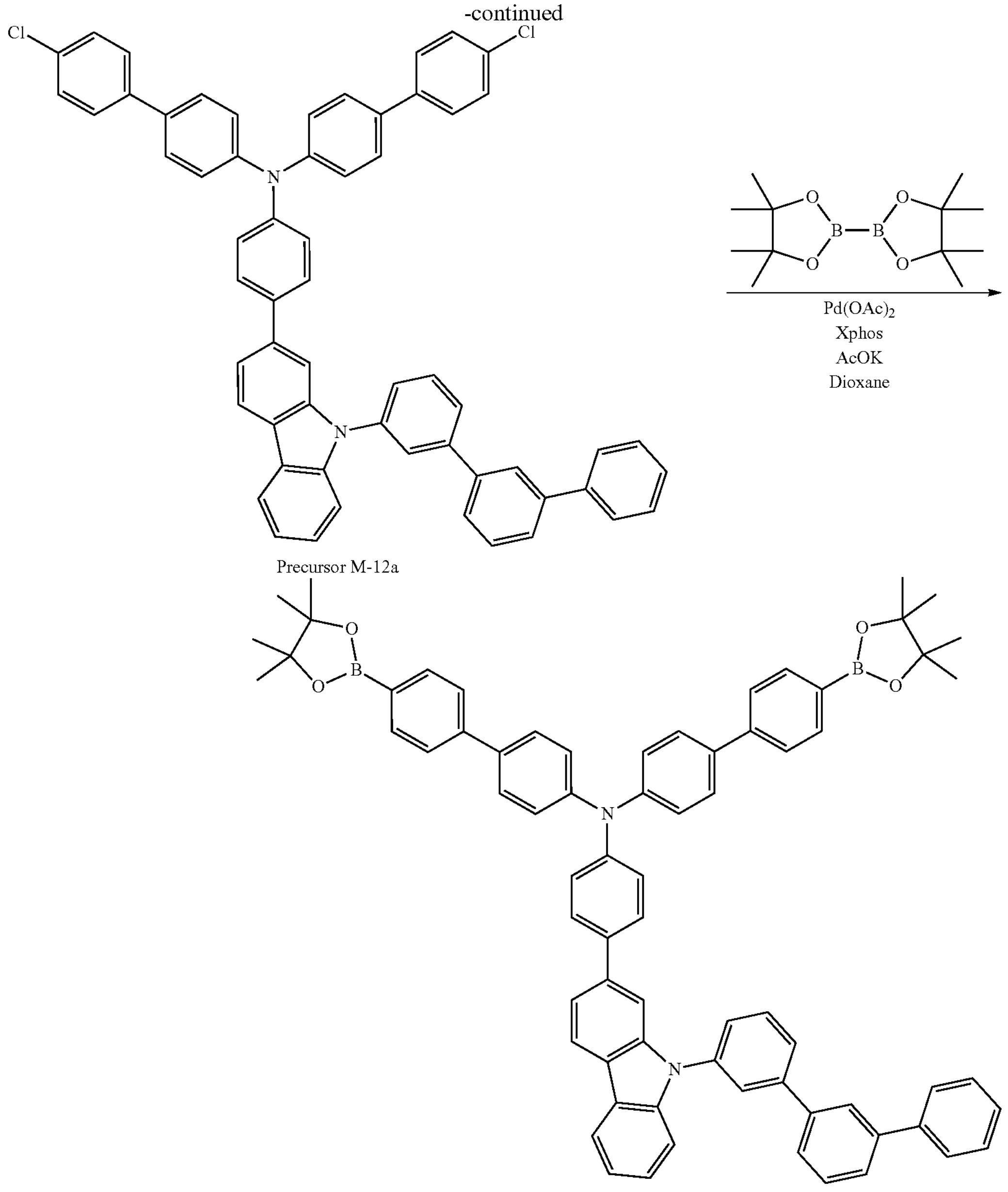

Precursor M-12a

Monomer M-12

In a 500 mL 3-necked flask, Precursor M-7 (11.2 mmol, 10.0 g), 1-bromo-4-chlorobenzene (28.1 mmol, 5.37 g), sodium carbonate (16.8 mmol, 1.79 g), toluene (56 mL), ethanol (28 mL), and distilled water (28 mL) were combined and then, dispersed by stirring. Subsequently, tetrakis(triphenylphosphine)palladium (0.34 mmol, 0.389 g) was added thereto and then, refluxed for 7 hours under an argon atmosphere.

The obtained solution was cooled to room temperature, and a precipitate was separated therefrom and washed with methanol.

The precipitate was purified by recrystallization using tetrahydrofuran and methanol.

The obtained solid was vacuum-dried (50° C., 12 hours), obtaining Precursor M-12a (amount: 7.8 g, yield: 81%).

Monomer M-12 (amount: 5.6 g, yield: 59%) was synthesized in the same manner as in Monomer M-1 except that Precursor M-12a was used instead of Precursor M-1a as in Monomer M-1.

Each monomer obtained above was examined with respect to a structure by using a nuclear magnetic resonance spectroscopy (1H-NMR).

Example 8: Synthesis of Polymer A-8

Synthesis of Polymer A-8

Polymer A-8 (amount: 1.1 g) was synthesized in the same procedure as in Polymer A-1 except that 9.9-didodecyl-3,6-dibromo fluorene was used instead of the 9.9-dioctyl-3,6-dibromo fluorene in Polymer A-1.

Polymer A-8 was measured with respect to weight average molecular weight (Mw) and polydispersity (Mw/Mn) by using SEC.

As a result, Polymer A-8 had a weight average molecular weight (Mw) and polydispersity (Mw/Mn) of 89,000 g/mol and 2.2, respectively.

Polymer A-8 obtained in this way is estimated to have the following repeating unit (structural unit) from the monomers used above.

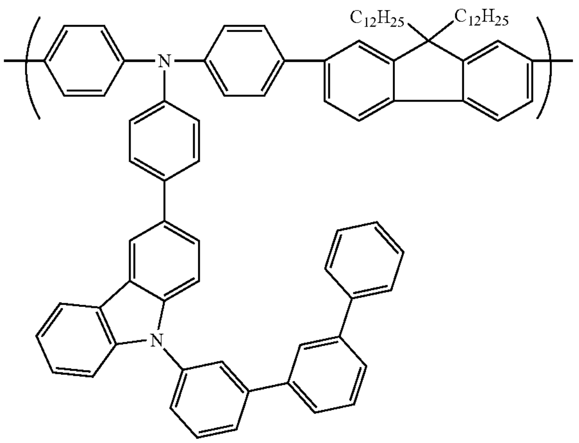

In Polymer A-8, the group represented by "$C_{12}H_{25}$—" indicates an n-dodecyl group.

Example 9: Synthesis of Polymer A-9

Synthesis of Polymer A-9

Polymer A-9 (amount: 1.1 g) was synthesized in the same procedure as Polymer A-1 except that Monomer M-1 was changed into Monomer M-9 in Polymer A-1.

Polymer A-9 was measured with respect to a weight average molecular weight (Mw) and polydispersity (Mw/Mn) by using SEC.

As a result, Polymer A-9 had a weight average molecular weight (Mw) and polydispersity (Mw/Mn) of 196,000 g/mol and 2.7, respectively.

Polymer A-9 obtained in this way is estimated to have the following repeating unit (structural unit) from the monomers used above.

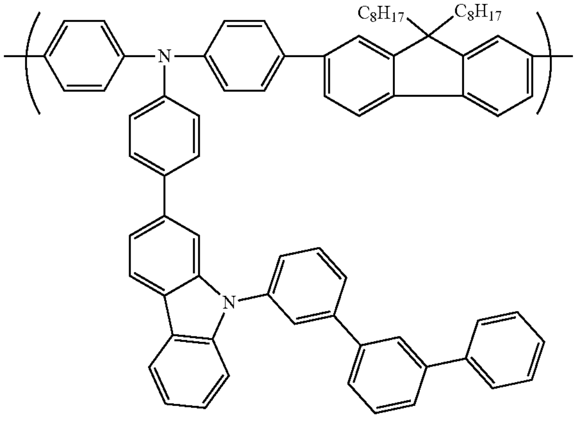

In Polymer A-9, the group represented by "$C_8H_{17}$—" represents an n-octyl group.

Example 10: Synthesis of Polymer A-10

Polymer A-10 (amount: 0.90 g) was synthesized in the same procedure as Polymer A-9 except that 9.9-didecyl-3,6-dibromo fluorene was used instead of the 9.9-dioctyl-3,6-dibromo fluorene in Polymer A-9.

Polymer A-10 was measured with respect to weight average molecular weight (Mw) and polydispersity (Mw/Mn) by using SEC. As a result, Polymer A-10 had a weight average molecular weight (Mw) and polydispersity (Mw/Mn) of 115,000 g/mol and 1.48, respectively.

Polymer A-10 obtained in this way is estimated to have the following repeating unit (structural unit) from the monomers used above.

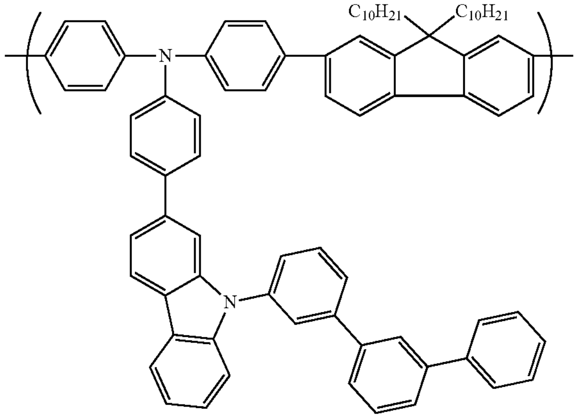

In Polymer A-10, the group represented by "$C_{10}H_{21}$—" indicates an n-decyl group.

Example 11: Synthesis of Polymer A-11

Polymer A-11 (amount: 2.0 g) was synthesized in the same procedure as Polymer A-9 except that 9,9-didodecyl-3,6-dibromo fluorene was used instead of the 9,9-dioctyl-3,6-dibromo fluorene in Polymer A-9.

Polymer A-11 was measured with respect to weight average molecular weight (Mw) and polydispersity (Mw/Mn) by using SEC. As a result, Polymer A-11 had a weight average molecular weight (Mw) and polydispersity (Mw/Mn) of 227,000 g/mol and 1.7, respectively.

Polymer A-11 is estimated to have the following repeating unit (structural unit) from the monomers used above.

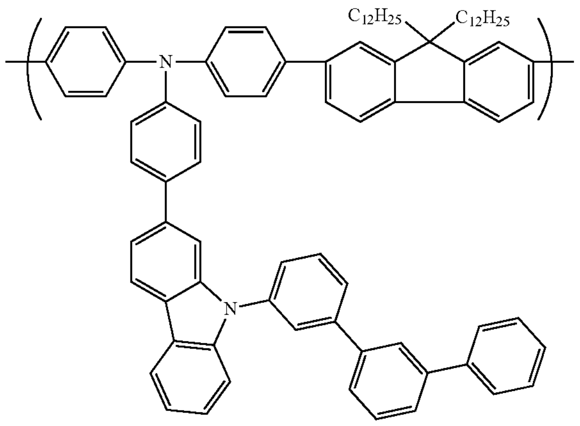

In Polymer A-11, the group represented by "$C_{12}H_{25}$—" indicates an n-dodecyl group.

Example 12: Synthesis of Polymer A-12

Polymer A-12 (amount: 1.17 g) was synthesized in the same procedure as Polymer A-1 except that Monomer M-4 was used instead of Monomer M1, and the 9,9-didecyl-3,6-dibromo fluorene was used instead of 9,9-dioctyl-3,6-dibromo fluorene in Polymer A-1.

Polymer A-12 was measured with respect to weight average molecular weight (Mw) and polydispersity (Mw/Mn) by using SEC. As a result, Polymer A-12 had a weight average molecular weight (Mw) and polydispersity (Mw/Mn) of 63,000 g/mol and 2.3, respectively.

Polymer A-12 obtained in this way is estimated to have the following repeating unit (structural unit) from the monomers used above.

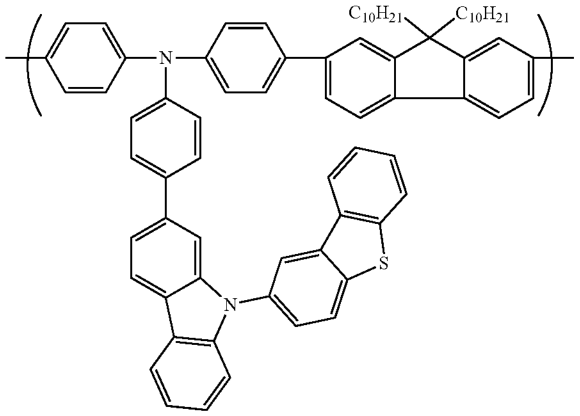

In Polymer A-12, the group represented by "$C_{10}H_{21}$—" indicates an n-decyl group.

Example 13: Synthesis of Polymer A-13

Polymer A-13 (amount: 0.8 g) was synthesized in the same procedure as Polymer A-1 except that Monomer M-8 was used instead of Monomer M-1.

Polymer A-13 was measured with respect to weight average molecular weight (Mw) and polydispersity (Mw/Mn) by using SEC. As a result, Polymer A-13 had a weight average molecular weight (Mw) and polydispersity (Mw/Mn) of 145,000 g/mol and 2.3, respectively.

Polymer A-13 obtained in this way is estimated to have the following repeating unit (structural unit) from the monomers used above.

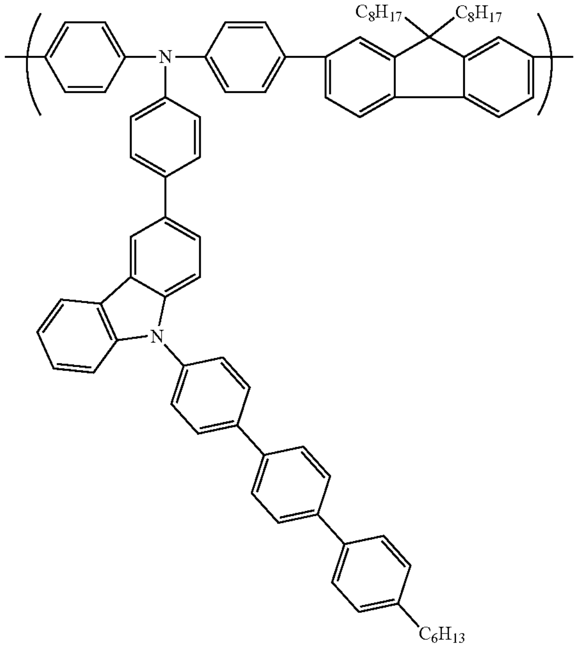

In Polymer A-13, the group represented by "$C_8H_{17}$—" indicates an n-octyl group and the group represented by "$C_6H_{13}$—" indicates an n-hexyl group.

Example 14: Synthesis of Polymer A-14

Polymer A-14 (amount: 0.9 g) was synthesized in the same procedure as Polymer A-1 except that Monomer M-9 was used instead of Monomer M-1 as in Polymer A-1.

Polymer A-14 was measured with respect to weight average molecular weight (Mw) and polydispersity (Mw/Mn) by using SEC. As a result, Polymer A-14 had a weight average molecular weight (Mw) and polydispersity (Mw/Mn) of 303,000 g/mol and 2.0, respectively.

Polymer A-14 obtained in this way is estimated to have the following repeating unit (structural unit) from the monomers.

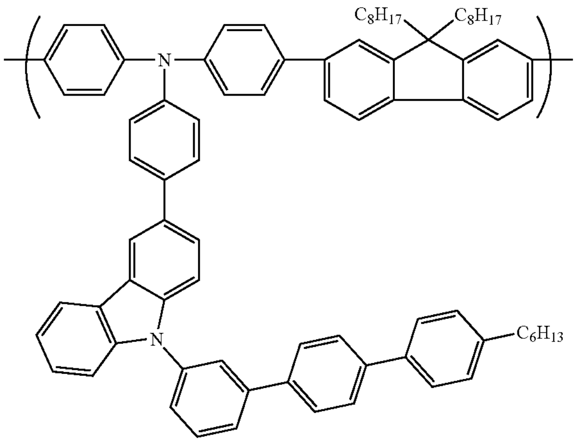

In Polymer A-14, the group represented by "$C_8H_{17}$—" indicates an n-octyl group and the group represented by "$C_6H_{13}$—" indicates an n-hexyl group.

Example 15: Synthesis of Polymer A-15

Polymer A-15 (amount: 1.0 g) was synthesized in the same procedure as Polymer A-14 except that 9,9-didodecyl-3,6-dibromo fluorene was used instead of 9.9-dioctyl-3,6-dibromo fluorene as in Polymer A-14.

Polymer A-15 was measured with respect to weight average molecular weight (Mw) and polydispersity (Mw/Mn) by using SEC. As a result, Polymer A-15 had a weight average molecular weight (Mw) and polydispersity (Mw/Mn) of 123,000 g/mol and 1.8, respectively.

Polymer A-15 obtained in this way is estimated to have the following repeating unit (structural unit) from the monomers.

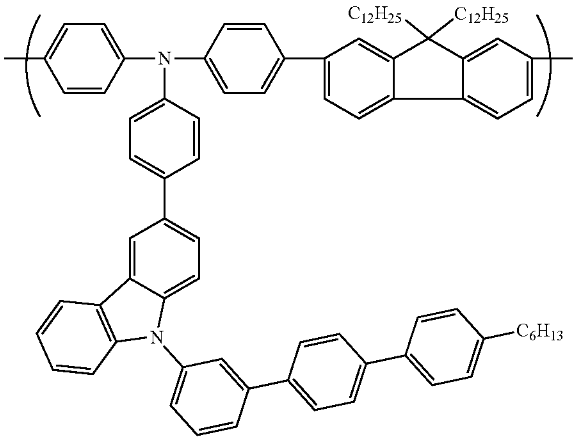

In Polymer A-15, the group represented by "$C_{12}H_{25}$—" indicates an n-dodecyl group, and the group represented by "$C_6H_{13}$—" indicates an n-hexyl group.

Example 16: Synthesis of Polymer A-16

Polymer A-16 (amount: 0.7 g) was synthesized in the same procedure as Polymer A-1 except that M-10 was used instead of Monomer M-1, and 9.9-didecyl-3,6-dibromo fluorene was used instead of the 9,9-dioctyl-3,6-dibromo fluorene as in Polymer A-1.

Polymer A-16 was measured with respect to weight average molecular weight (Mw) and polydispersity (Mw/Mn) by using SEC. As a result, Polymer A-16 had a weight average molecular weight (Mw) and polydispersity (Mw/Mn) of 114,000 g/mol and 1.6, respectively.

Polymer A-16 obtained in this way is estimated to have the following repeating unit (structural unit) from the monomers.

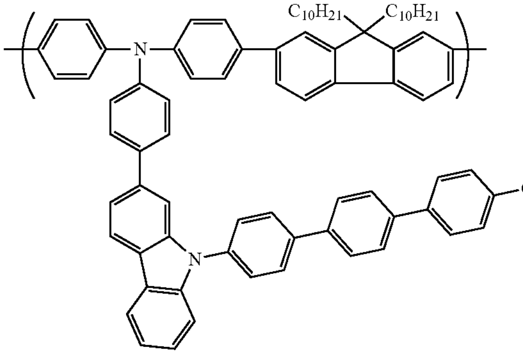

In Polymer A-16, the group represented by "$C_{10}H_{21}$—" indicates an n-decyl group, and the group represented by "$C_6H_{13}$—" indicates an n-hexyl group.

Example 17: Synthesis of Polymer A-17

Polymer A-17 (amount: 0.7 g) was synthesized in the same procedure as Polymer A-16 except that the 9,9-didodecyl-3,6-dibromo fluorene was used instead of 9,9-didecyl-3,6-dibromo fluorene as in Polymer A-16.

Polymer A-17 was measured with respect to weight average molecular weight (Mw) and polydispersity (Mw/Mn) by using SEC. As a result, Polymer A-17 had a weight average molecular weight (Mw) and polydispersity (Mw/Mn) of 140,000 g/mol and 1.6, respectively.

Polymer A-17 obtained in this way is estimated to have the following repeating unit (structural unit) from the monomers.

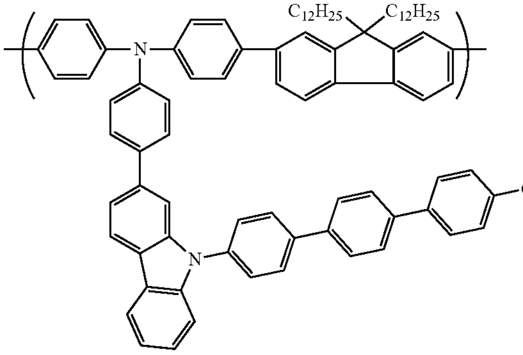

In Polymer A-17, the group represented by "$C_{12}H_{25}$—" indicates an n-dodecyl group, and the group represented by "$C_6H_{13}$—" indicates an n-hexyl group.

Example 18: Synthesis of Polymer A-18

Polymer A-18 (amount: 1.0 g) was synthesized in the same procedure as Polymer A-1 Monomer M-11 was used instead od Monomer M-1 as in Polymer A-1.

Polymer A-18 was measured with respect to weight average molecular weight (Mw) and polydispersity (Mw/Mn) by using SEC. As a result, Polymer A-18 had a weight average molecular weight (Mw) and polydispersity (Mw/Mn) of 100,000 g/mol and 2.0, respectively.

Polymer A-18 obtained in this way is estimated to have the following repeating unit (structural unit) from the monomers.

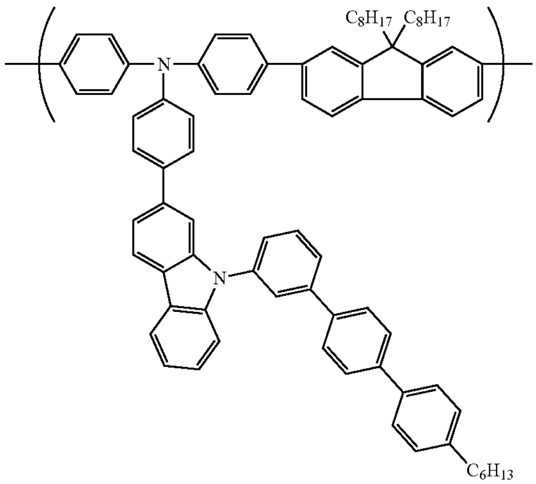

In Polymer A-18, the group represented by "$C_8H_{17}$—" indicates an n-octyl group and the group represented by "$C_6H_{13}$—" indicates an n-hexyl group.

Example 19: Synthesis of Polymer A-19

Polymer A-19 (amount: 1.3 g) was synthesized in the same procedure as Polymer A-1 except that Monomer M-12 was used instead of Monomer M-1 as in Polymer A-1.

Polymer A-19 was measured with respect to weight average molecular weight (Mw) and polydispersity (Mw/Mn) by using SEC. As a result, Polymer A-19 had a weight average molecular weight (Mw) and polydispersity (Mw/Mn) of 12,000 g/mol and 1.7, respectively.

Polymer A-19 obtained in this way is estimated to have the following repeating unit (structural unit) from the monomers.

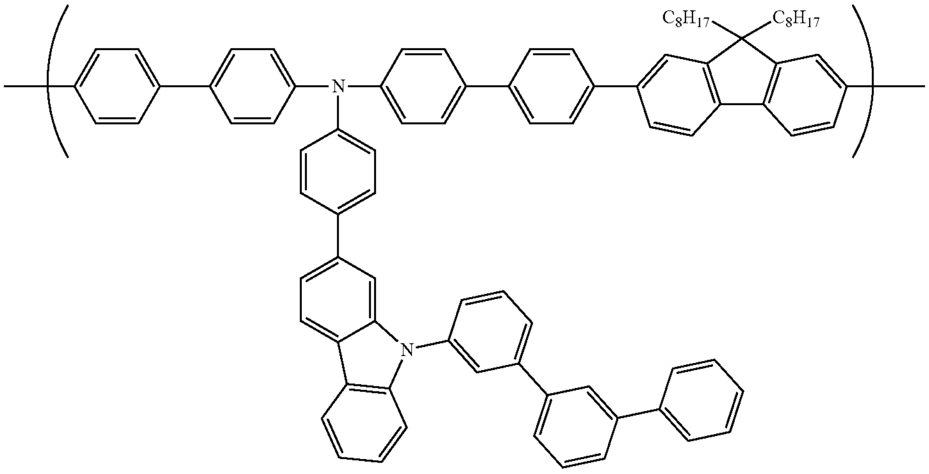

In Polymer A-19, the group represented by "$C_8H_{17}$—" indicates an n-octyl group.

Example 20: Synthesis of Polymer A-20

Polymer A-20 (amount: 1.1 g) was synthesized in the same procedure as Polymer A-19 except that 9,9-didodecyl-3,6-dibromo fluorene was used instead of 9,9-dioctyl-3,6-dibromo fluorene as in Polymer A-19.

Polymer A-20 was measured with respect to weight average molecular weight (Mw) and polydispersity (Mw/Mn) by using SEC. As a result, Polymer A-20 had a weight average molecular weight (Mw) and polydispersity (Mw/Mn) of 196,000 g/mol and 2.7, respectively.

Polymer A-20 obtained in this way is estimated to have the following repeating unit (structural unit) from the monomers

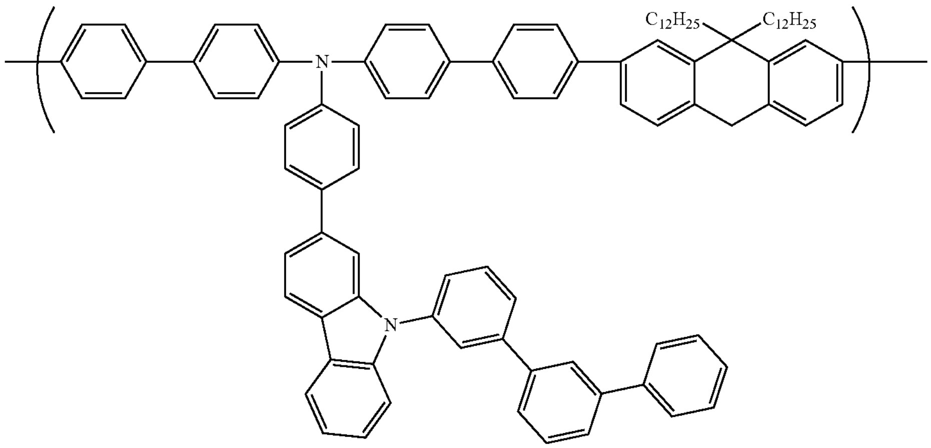

In Polymer A-20, the group represented by "$C_{12}H_{25}$—" indicates an n-dodecyl group.

Example 21: Synthesis of Polymer A-21

Polymer A-21 (amount: 1.1 g) was synthesized in the same procedure as Polymer A-19 except that 1,4-dibromo-2,5-dihexylbenzene was used instead of 9.9-dioctyl-3,6-dibromo fluorene.

Polymer A-21 was measured with respect to weight average molecular weight (Mw) and polydispersity (Mw/Mn) by using SEC. As a result, Polymer A-21 had a weight average molecular weight (Mw) and polydispersity (Mw/Mn) of 196,000 g/mol and 2.7, respectively.

Polymer A-21 obtained in this way is estimated to have the following repeating unit (structural unit) from the monomers.

In Polymer A-21, the group represented by "$C_6H_{13}$—" indicates an n-hexyl group.

<Evaluation of Each Polymer>

[Simulation Evaluation]

The polymers of Example 1 to 6 (Polymers A-1 to A-6), the polymer of Example 7 (Polymer A-7), the polymers of Example 8 to 21 (Polymers A-8 to A-21), and poly[(9,9-dioctyl fluorenyl-2,7-diyl)-co-(4,4'-(N-(4-sec-butyl phenyl) diphenyl amine)](TFB) including the following structural unit were calculated with respect to an overlap index in the following method.

On the other hand, the polymer of Example 7 (Polymer A-7) may be synthesized by changing the raw materials in the synthesis of Polymer A-1 according to Example 1.

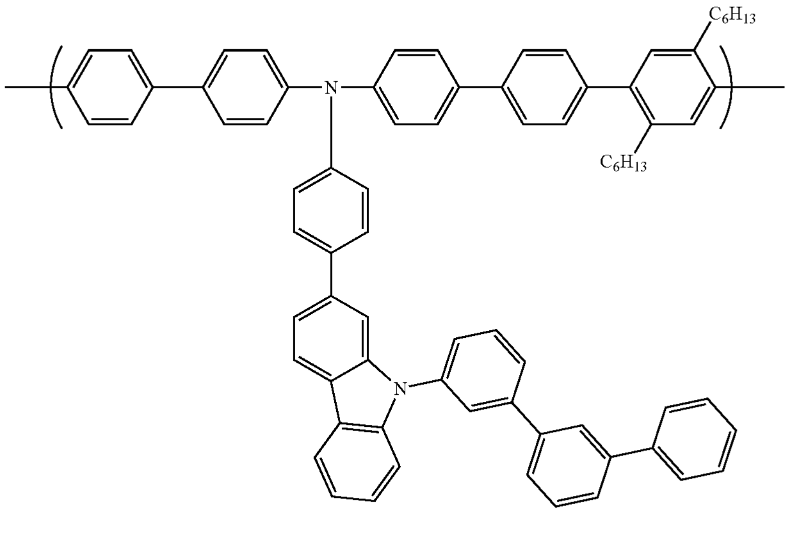

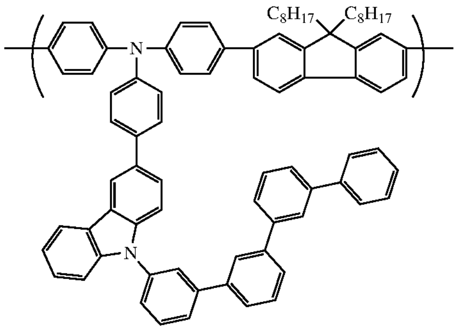

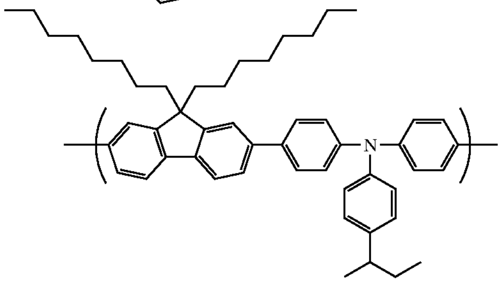

TFB

In Polymer A-7, the group represented by "$C_8H_{17}$—" represents an n-octyl group.

The structural units of the polymers were calculated with respect to HOMO, LUMO, and distribution density thereof by using density functional theory (DFT), Gaussian 16 (Gaussian Inc.) as a calculation software, functional B3LYP, and a basis function 6-31G (d, p).

The distribution density of HOMO and the distribution density of LUMO on each atom of the structural units of the polymers from the above calculation were used to calculate an overlap index as an overlap of HOMO and LUMO according to the following equation.

$$\text{overlap index} = \left(\sum_{k=1}^{n}\left(d^k_{HOMO} \times d^k_{LUMO}\right)\right) \times 100$$

Herein, in the equation, k is a serial number assigned to an atom in the chemical formula of a structural unit constituting the polymer, $d^k_{HOMO}$ denotes a distribution density of HOMO in the atom of serial number k, and $d^k_{LUMO}$ denotes a distribution density of LUMO in the atom of serial number k, and the $d^k_{HOMO}$ and $d^k_{LUMO}$ are values calculated as functional B3LYP and basis function 6-31 G (d, p) using quantum chemical calculation software by density functional theory (DFT), respectively.

Calculation of the overlap index is performed for the ground state of the structural unit of the polymer, and the highest orbital in which electrons were distributed was called HOMO, and the lowest orbital in which electrons were not distributed was called LUMO.

On the other hand, when the polymers included only one type of structural unit, the overlap index was calculated by the structural unit, when the polymers included two or more structural units, the overlap index of the polymer was obtained by respectively calculating an overlap index of each structural unit, multiplying each overlap index with a content ratio of each structural unit (a ratio of the number of each structural unit to the total number of all the structural units constituting the polymer), and then, all adding them.

In more detail, the overlap index may be calculated in the following order.

First, a serial number is assigned to each atom included in the structural unit of a polymer.

Subsequently, each atom to which the serial number was assigned was measured with respect to distribution density of HOMO and distribution density of LUMO on each atom of the structural units constituting the polymer.

Figure 2:
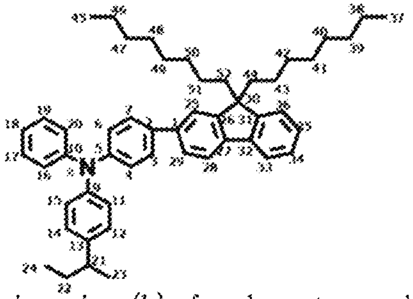
FIG. 2 is explanatory drawing explaining a calculation method of the overlap index of TFB which is a comparative example compound, and an overlap of the distribution densities of HOMO and LUMO.
Figure 2:
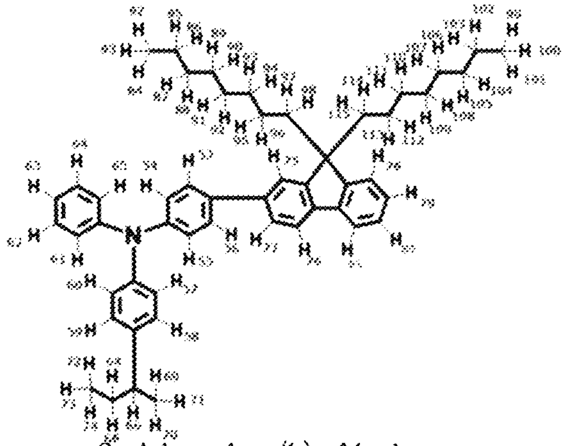
Figure 2:
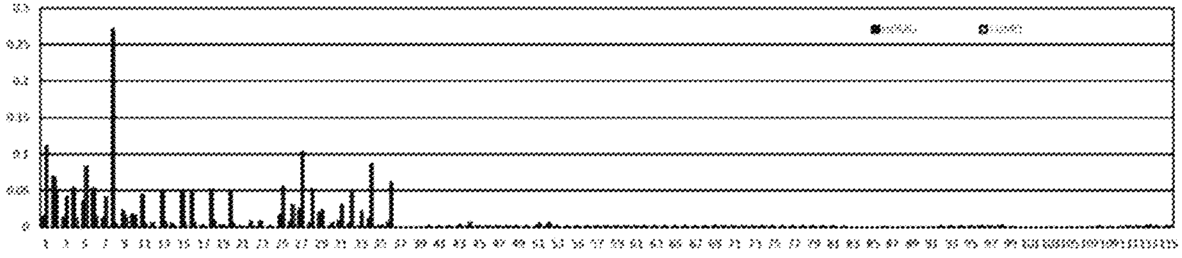
Figure 3:
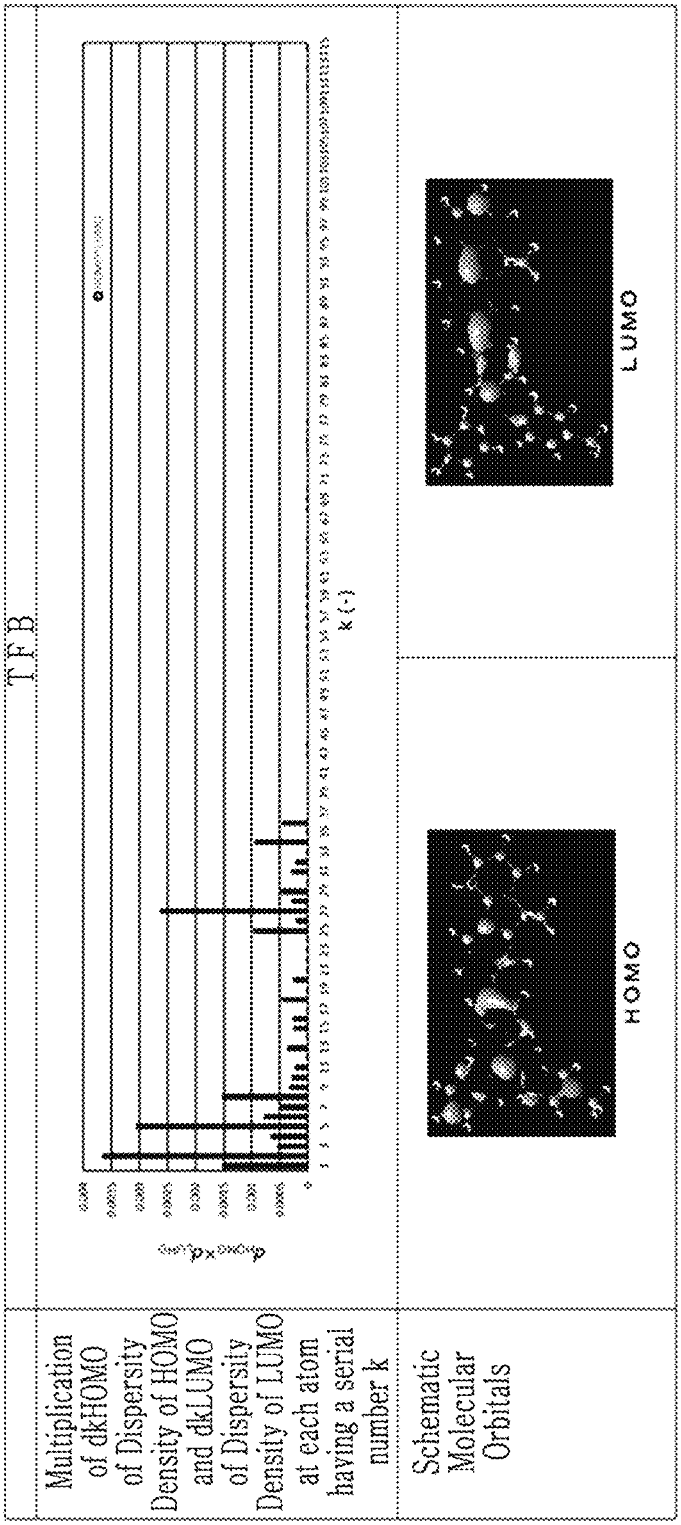
FIG. 3 is explanatory drawing explaining a calculation method of the overlap index of TFB which is a comparative example compound, and an overlap of the distribution densities of HOMO and LUMO.
Figure 4:
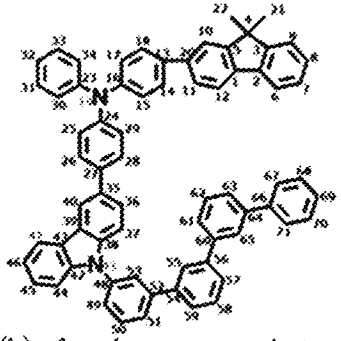
FIG. 4 is explanatory drawing explaining a calculation method of the overlap index of Polymer A-7 according to an embodiment, and an overlap of the distribution densities of HOMO and LUMO.
Figure 4:
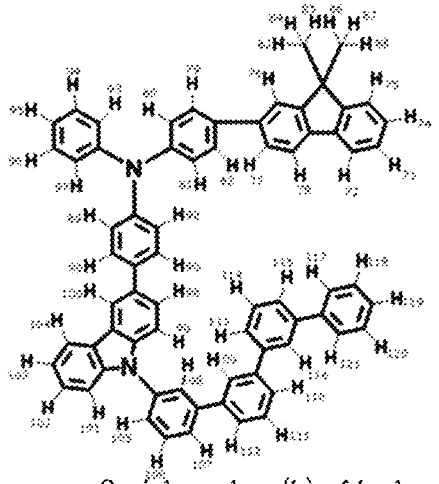
Figure 4:
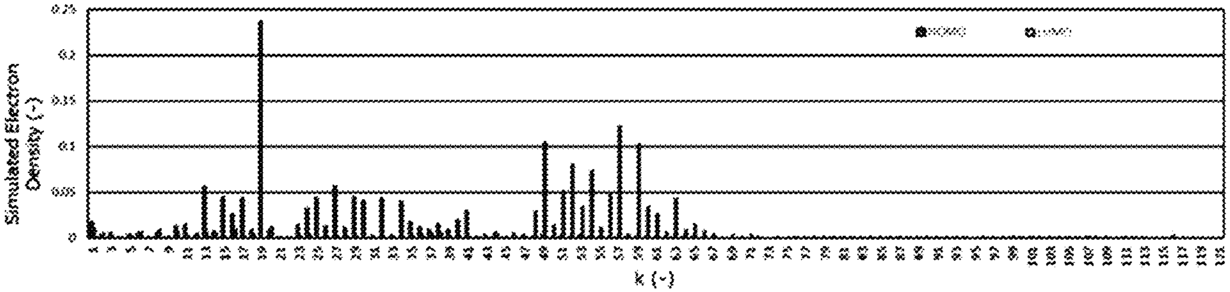
Figure 5:
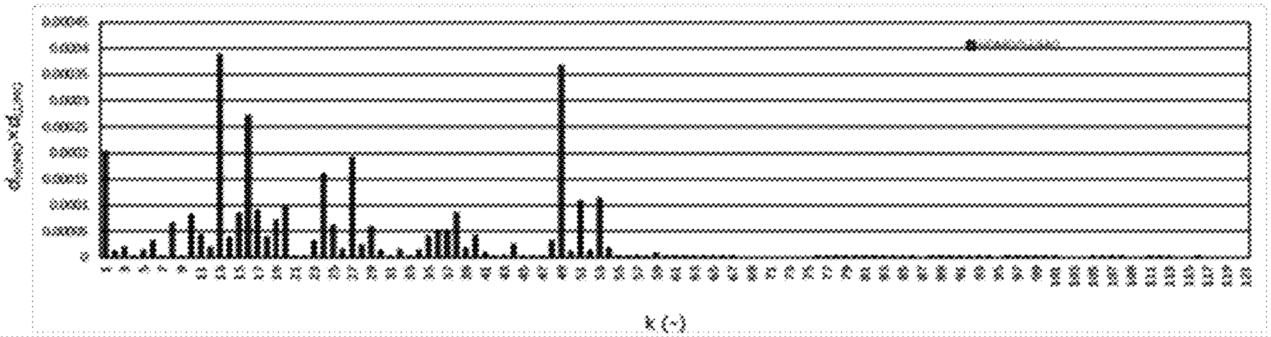
FIG. 5 is explanatory drawing explaining a calculation method of the overlap index of Polymer A-7 according to an embodiment, and an overlap of the distribution densities of HOMO and LUMO.
Figure 5:
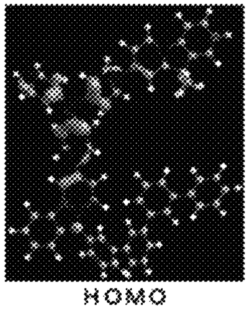
Figure 5:
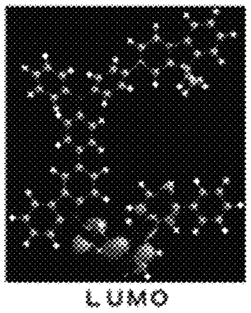
Figure 6:
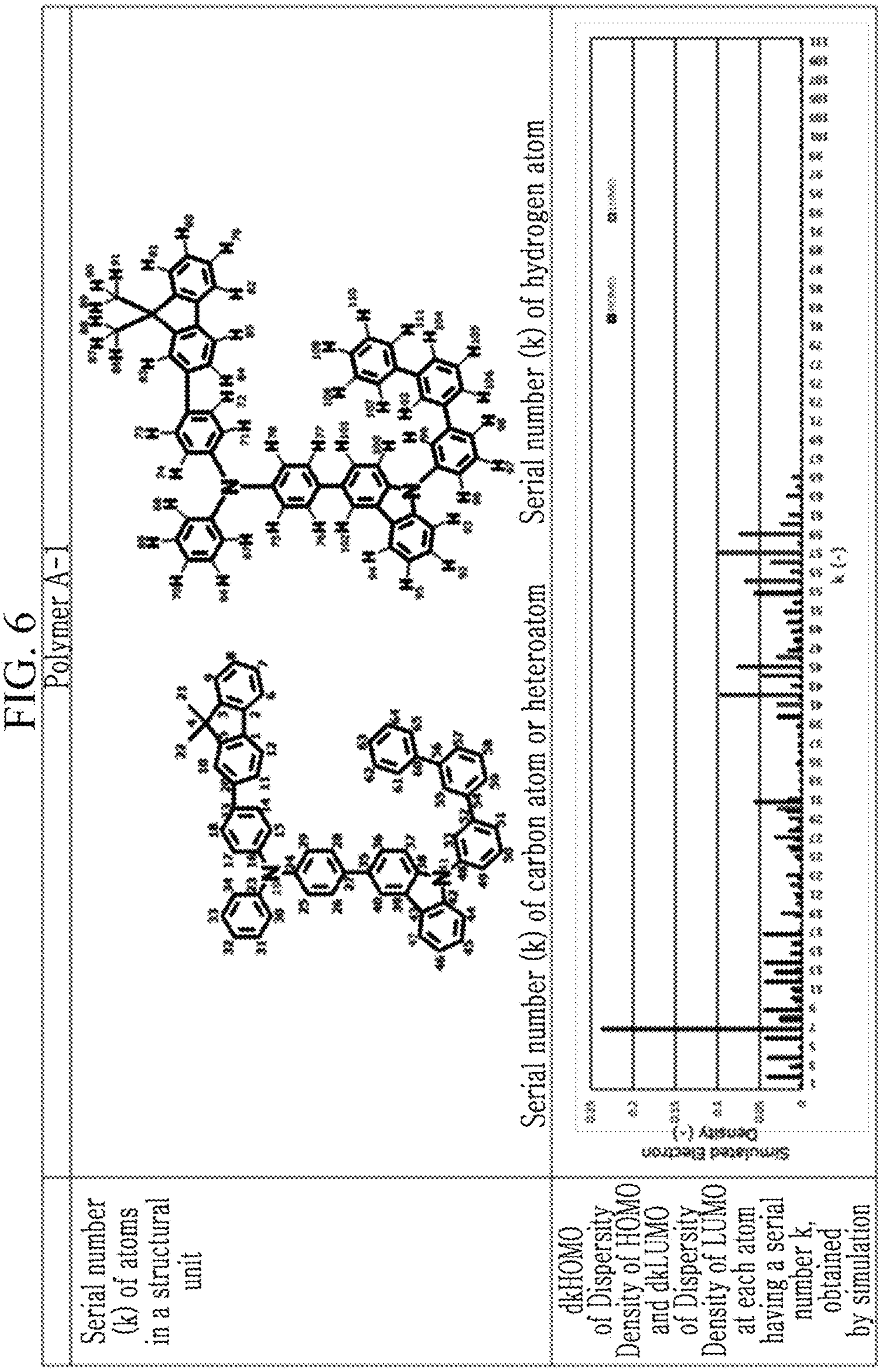
FIG. 6 is explanatory drawing explaining a calculation method of the overlap index of Polymer A-1 according to an embodiment, and an overlap of the distribution densities of HOMO and LUMO.
Figure 7:
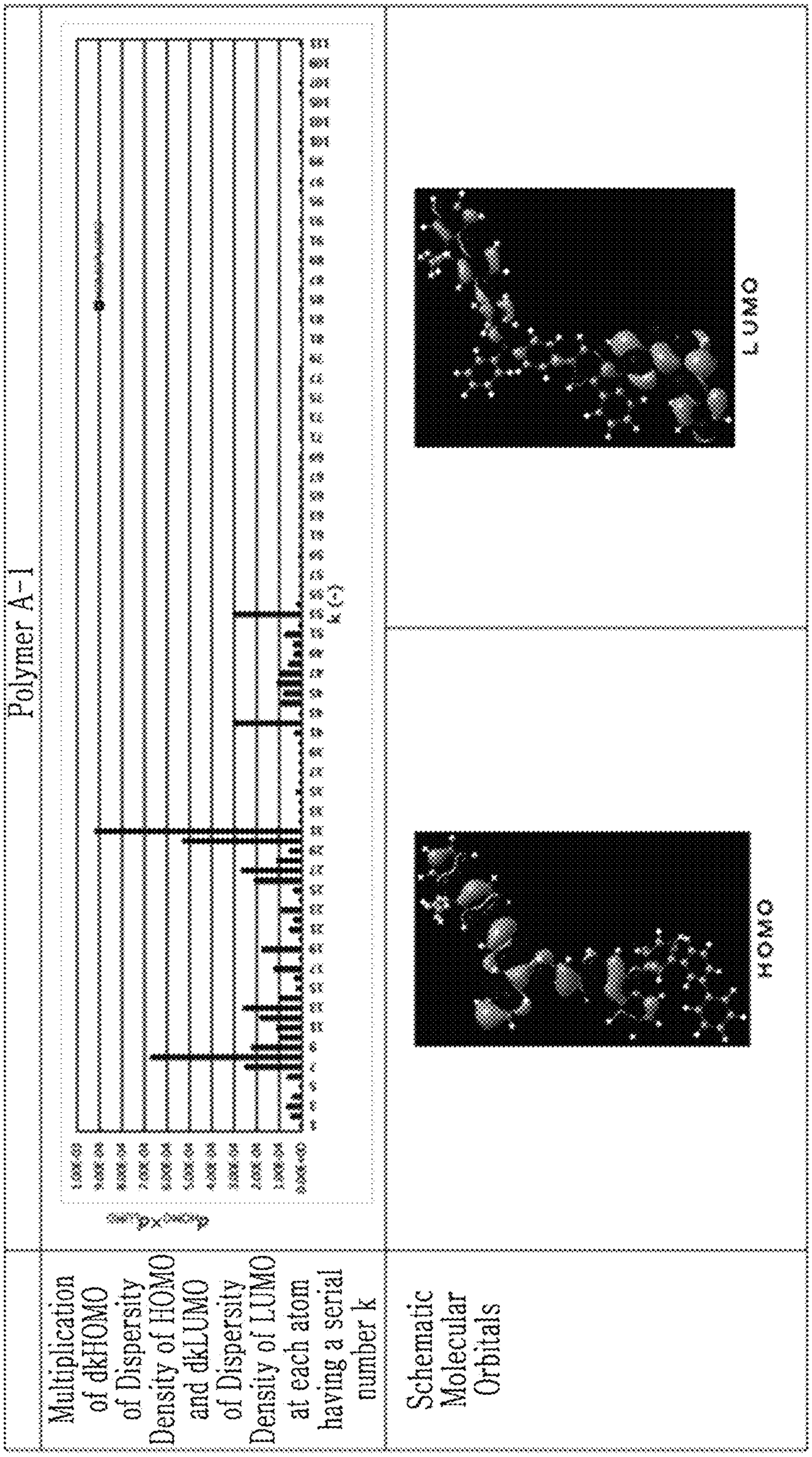
FIG. 7 is explanatory drawing explaining a calculation method of the overlap index of Polymer A-1 according to an embodiment, and an overlap of the distribution densities of HOMO and LUMO.
Figure 8:
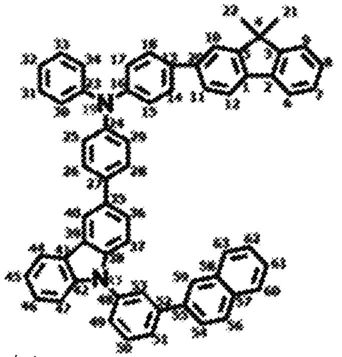
FIG. 8 is explanatory drawing explaining a calculation method of the overlap index of Polymer A-2 according to an embodiment, and an overlap of the distribution densities of HOMO and LUMO.
Figure 8:
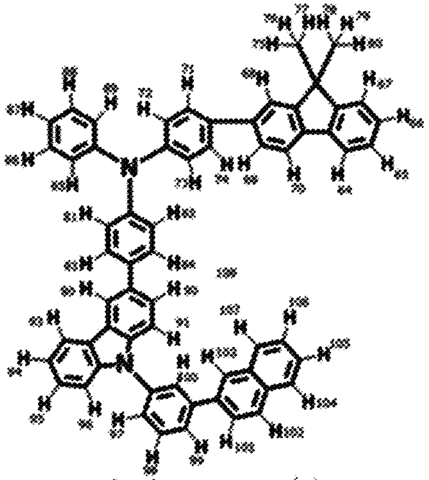
Figure 8:
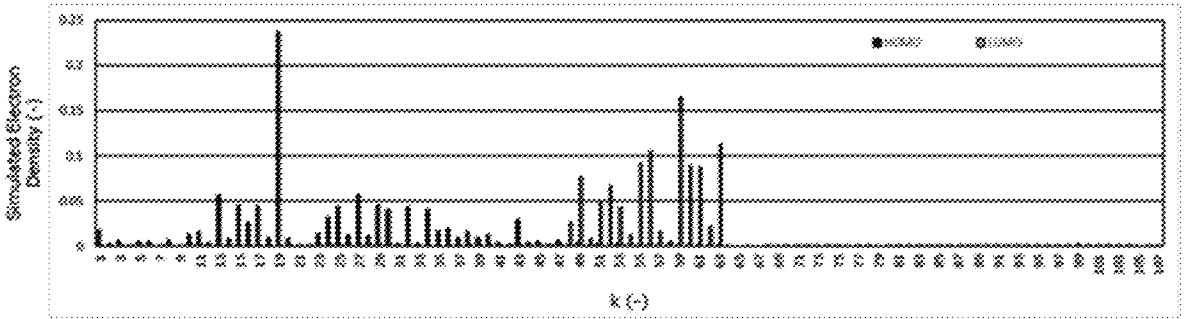
Figure 9:
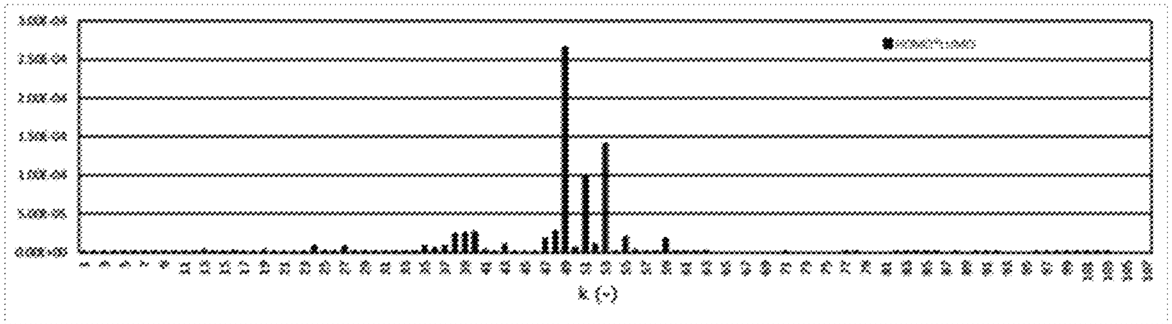
FIG. 9 is explanatory drawing explaining a calculation method of the overlap index of Polymer A-2 according to an embodiment, and an overlap of the distribution densities of HOMO and LUMO.
Figure 9:
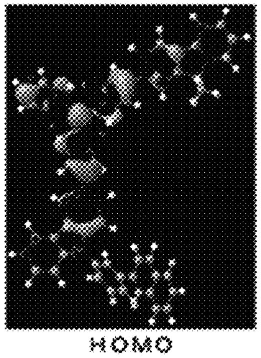
Figure 9:
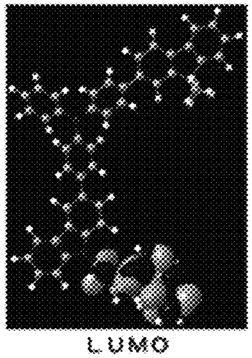
Figure 10:
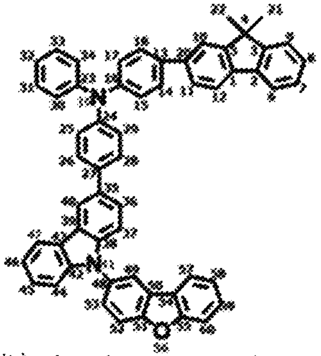
FIG. 10 is explanatory drawing explaining a calculation method of the overlap index of Polymer A-3 according to an embodiment, and an overlap of the distribution densities of HOMO and LUMO.
Figure 10:
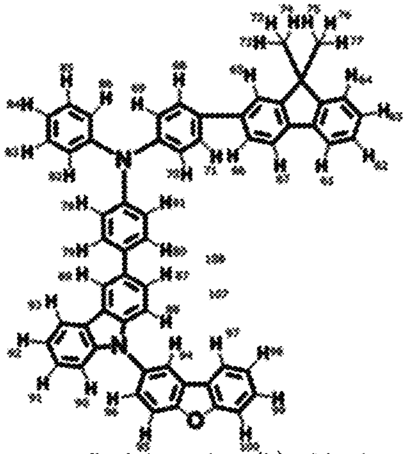
Figure 10:
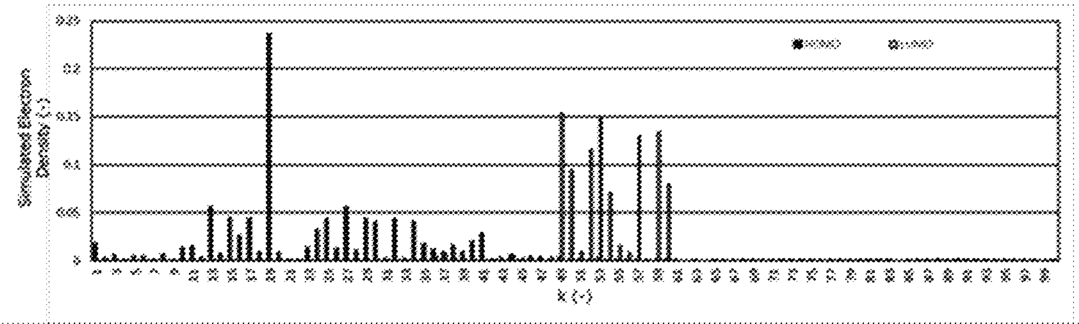
Figure 11:
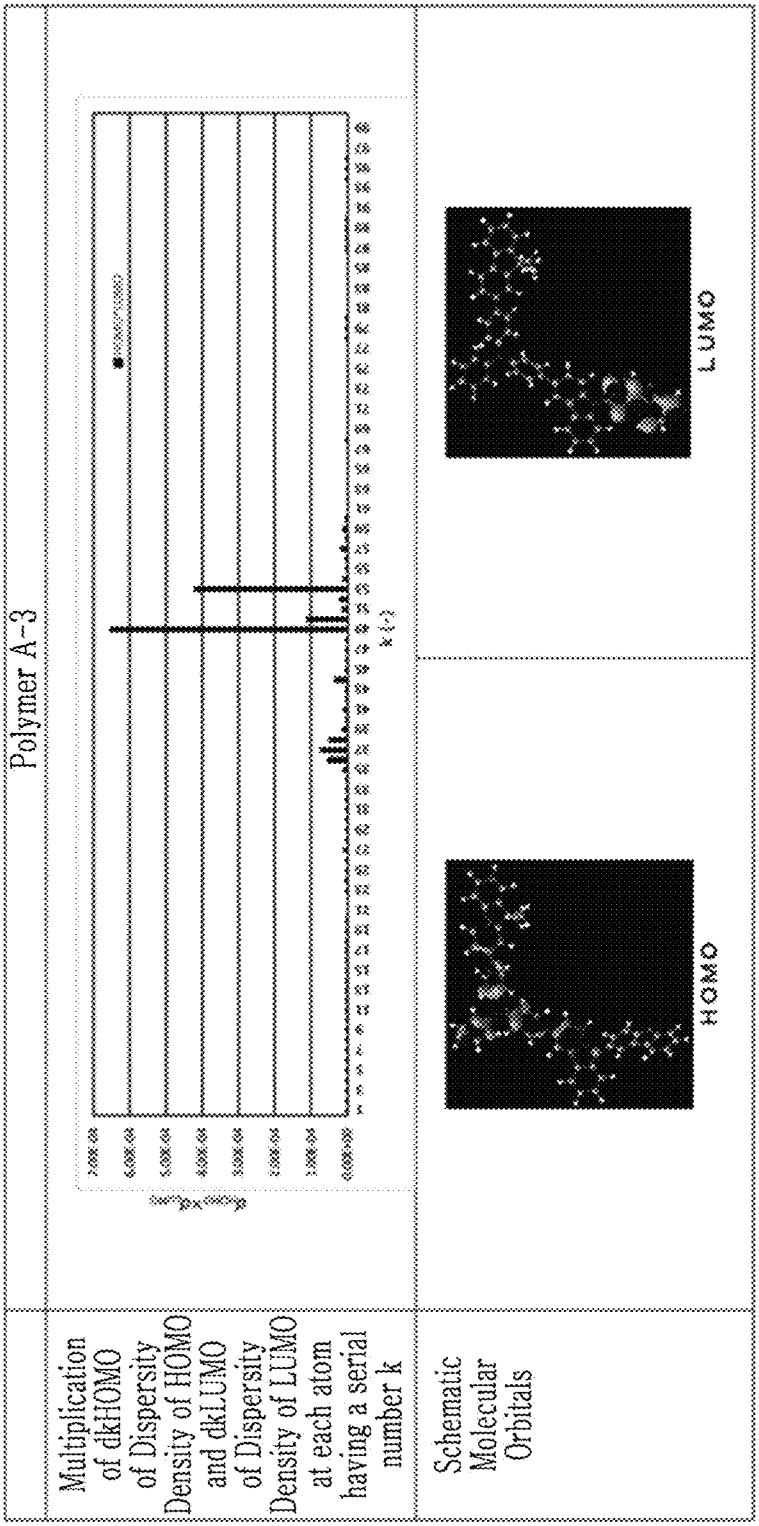
FIG. 11 is explanatory drawing explaining a calculation method of the overlap index of Polymer A-3 according to an embodiment, and an overlap of the distribution densities of HOMO and LUMO.

For example, regarding the poly[(9,9-dioctyl fluorenyl-2,7-diyl)-co-(4,4'-(N-(4-sec-butylphenyl)) diphenylamine)] (TFB) according to the comparative example, a graph showing HOMO distribution density $d^k_{HOMO}$ and LUMO distribution density $d^k_{LUMO}$ on the atoms of each serial number k through a simulation, a graph showing a product obtained by multiplying the HOMO distribution density $d^k_{HOMO}$ with the LUMO distribution density $d^k_{LUMO}$, and a molecular orbital obtained by a simulation are shown in FIGS. 2 and 3. In addition, Polymer A-7 according to Example 7 of the present invention was simulated to obtain a graph showing HOMO distribution density $d^k_{HOMO}$ and LUMO distribution density $d^k_{LUMO}$ on atoms of each serial number k, a graph showing a product obtained by multiplying the HOMO distribution density $d^k_{HOMO}$ and the LUMO distribution density $d^k_{LUMO}$, and a molecular orbital obtained by the simulation are shown in FIGS. 4 and 5.

The results of the HOMO distribution density of and the LUMO distribution density on each atom of structural units constituting the polymer were used to calculate an overlap index according to the aforementioned equation. Referring to the results, as shown in FIGS. 2 to 5, Polymer A-7 of Example 7, compared with TFB of the comparative example, exhibited a small overlap of a region corresponding to HOMO with a region corresponding to LUMO in the structural unit and also, as shown in Table 1, a small overlap index.

In addition, as another example, Polymers A-1 to A-6 according to Examples 1 to 6 and Polymer A-8 to A-21 according to Examples 8 to 21, compared with TFB according to the comparative example, also exhibited a small overlap of a region corresponding to HOMO with a region corresponding to a LUMO in a structural unit and in addition, as shown in Table 1, a small overlap index.

Among these, regarding Polymers A-1 to A-3 according to Examples 1 to 3, the graph showing HOMO distribution density $d^k_{HOMO}$ and LUMO distribution density $d^k_{LUMO}$ on atoms of each serial number k through the simulation, the graph showing a product obtained by multiplying the HOMO distribution density $d^k_{HOMO}$ and the LUMO distribution density $d^k_{LUMO}$ on atoms of each serial number k, and the molecular orbital obtained through the simulation are shown in FIGS. 6 to 11.

The overlap indexes are shown in Table 1.

TABLE 1

| | Polymer | Simulation evaluation overlap index |
|---|---|---|
| Example 1 | A-1 | 0.5932 |
| Example 2 | A-2 | 0.0766 |
| Example 3 | A-3 | 0.1536 |
| Example 4 | A-4 | 0.0536 |
| Example 5 | A-5 | 0.4892 |
| Example 6 | A-6 | 1.100 |
| Example 7 | A-7 | 0.3138 |

TABLE 1-continued

| | Polymer | Simulation evaluation overlap index |
|---|---|---|
| Example 8 | A-8 | 0.5932 |
| Example 9 | A-9 | 1.793 |
| Example 10 | A-10 | 1.793 |
| Example 11 | A-11 | 1.793 |
| Example 12 | A-12 | 0.05363 |
| Example 13 | A-13 | 0.1465 |
| Example 14 | A-14 | 0.1031 |
| Example 15 | A-15 | 0.1031 |
| Example 16 | A-16 | 0.07792 |
| Example 17 | A-17 | 0.07792 |
| Example 18 | A-18 | 0.02444 |
| Example 19 | A-19 | 1.119 |
| Example 20 | A-20 | 1.119 |
| Example 21 | A-21 | 1.771 |
| Comparative Example 1 | TFB | 2.091 |

Referring to Table 1, the polymers of the examples exhibited an overlap index of greater than or equal to 0.00001 and less than or equal to 1.8, and TFB of the comparative example exhibited an overlap index out of the range.

Referring to FIGS. 2 to 11, the polymers of the examples having an overlap index within the range of the present invention exhibited a small overlap of HOMO and LUMO, compared with TFB of the comparative example exhibiting an overlap index out of the range of the present invention.

[Evaluation of Characteristics]

Polymers A-1 to A-6 of Examples 1 to 6, Polymers A-8 to A-21 of Examples 8 to 21, and poly[(9,9-dioctyl fluorenyl-2,7-diyl)-co-(4,4'-(N-(4-sec-butylphenyl)) diphenylamine)] (TFB) including the structural unit (Luminescence Technology Corp.) were measured with respect to HOMO level (eV), LUMO level (eV), a glass transition temperature ($T_g$) (° C.), and solvent resistance in the following method.

On the other hand, TFB were measured with respect to weight average molecular weight (Mw) and polydispersity (Mw/Mn) by using SEC. As a result, TFB had a weight average molecular weight and Mw/Mn of respectively, 359,000 g/mol and 3.4.

The results are shown in Tables 2 and 3.

(Measurement of HOMO Level)

The polymers were respectively dissolved at a concentration of 1 mass % in xylene, preparing coating solutions. The coating solutions were spin-coated on an UV-cleaned and ITO-attached glass substrate at a rotation speed of 2000 rpm to form a film and then, dried on a hot plate at 150° C. for 30 minutes, obtaining samples.

The samples were measured with respect to HOMO level in the air by using a photoelectron spectrometer (AC-3, Riken Instrument Co., Ltd.).

Herein, the measurement results were used to calculate a rising tangent intersection, which was used as the HOMO level (eV). On the other hand, the HOMO level is, in general, a negative value.

(Measurement of LUMO Level)

The polymers were dissolved at a concentration of 3.2 mass % in toluene. The coating solutions were respectively spin-coated on an UV-cleaned and ITO-attached glass substrate at a rotation speed of 1600 rpm to form a film and then, dried on a hot plate at 250° C. for 60 minutes, obtaining samples (film thickness: about 70 nm). The samples were cooled to 77 K (−196° C.) and measured with respect to a photoluminescence (PL) spectrum. A peak of the shortest wavelength of the PL spectrum was used to calculate a LUMO level (eV).

(Glass Transition Temperature ($T_g$))

The samples (polymers) were heated up to 300° C. at a temperature increase rate of 10° C./min by using a differential scanning calorimeter (DSC) (DSC6000, Seiko Instruments Inc.) and held for 10 minutes, cooled to 25° C. at a temperature decrease rate of 10° C./min and held for 10 minutes, and then, heated up to 300° C. at a temperature increase rate of 10° C./min. When the measurement was completed, the samples were cooled to room temperature (25° C.) at 10° C./min.

(Solvent Resistance)

Solvent resistances of the polymers were estimated in the following method.

In other words, the polymers were respectively dissolved in xylene as a solvent at a concentration of 1 mass %, preparing each polymer solution.

Subsequently, the polymer coating solution was spin-coated on a silicon substrate and then, dried at 140° C. for 30 minutes, forming a film with a dry film thickness of 25 nm. Subsequently, the film (film before dipping in a solvent) was measured with respect to an absorption spectrum by using an ultraviolet visible spectrophotometer (UV-1800, Shimadzu Corp.). The film was measured with respect to a peak wavelength on the longest wavelength of the absorption spectrum, which was used as a reference wavelength.

Subsequently, the film (film before dipping in a solvent) on the silicon substrate was dipped in types and temperatures of a solvent shown in Table 3 below for 20 minutes, taken from the solvent, and dried at 140° C. for 30 minutes.

The dried film (film after dipping in a solvent) was measured with respect to an absorption spectrum by using the same visible spectrophotometer as the above.

The absorption spectrum was used to calculate a ratio of intensity at a reference wavelength after dipping in a solvent to intensity at a reference wavelength before dipping in a solvent ("intensity at a reference wavelength of absorption spectrum after dipping in solvent"/"intensity at a reference wavelength of absorption spectrum before dipping in solvent"×100(%)), which was defined as solvent resistance (%).

The solvent resistance was evaluated according to the following references:

A: solvent resistance of greater than or equal to 90%,

B: solvent resistance of greater than or equal to 75% and less than 90%, and

C: solvent resistance of less than 75%.

In the solvent resistance evaluation, A and B are desirable, and A is more desirable.

According to these evaluations, even if another layer was formed in a wet method on a layer including a polymer, the layer including a polymer was more suppressed from mixing with the other layer.

TABLE 2

| | | Evaluation of characteristics | | |
|---|---|---|---|---|
| | Polymer | HOMO (eV) | LUMO (eV) | $T_g$ (° C.) |
| Example 1 | A-1 | −5.50 | −2.65 | 124 |
| Example 2 | A-2 | −5.50 | −2.65 | 141 |
| Example 3 | A-3 | −5.52 | −2.68 | 151 |
| Example 4 | A-4 | −5.61 | −2.76 | 191 |
| Example 5 | A-5 | −5.48 | −2.64 | 181 |

TABLE 2-continued

| | | Evaluation of characteristics | | |
|---|---|---|---|---|
| | Polymer | HOMO (eV) | LUMO (eV) | $T_g$ (° C.) |
| Example 6 | A-6 | −5.56 | −2.69 | 187 |
| Example 8 | A-8 | −5.51 | −2.68 | 106 |
| Example 9 | A-9 | −5.49 | −2.66 | 156 |
| Example 10 | A-10 | −5.57 | −2.74 | 133 |
| Example 11 | A-11 | −5.57 | −2.73 | 115 |
| Example 12 | A-12 | −5.60 | −2.76 | 156 |
| Example 13 | A-13 | −5.50 | −2.68 | 121 |
| Example 14 | A-14 | −5.49 | −2.66 | 154 |
| Example 15 | A-15 | −5.49 | −2.65 | 120 |
| Example 16 | A-16 | −5.59 | −2.75 | 153 |
| Example 17 | A-17 | −5.59 | −2.75 | 135 |
| Example 18 | A-18 | −5.50 | −2.68 | 101 |
| Example 19 | A-19 | −5.64 | −2.78 | 173 |
| Example 20 | A-20 | −5.65 | −2.75 | 138 |
| Example 21 | A-21 | −5.65 | −2.73 | 125 |
| Comparative Example | TFB | −5.54 | −2.60 | 153 |

TABLE 3

| | | Solvent resistance value (%) Cyclohexylbenzene/decane = 60/40 (volume ratio) | |
|---|---|---|---|
| | Polymer | 140° C. | 190° C. |
| Example 1 | A-1 | A | A |
| Example 2 | A-2 | C | B |
| Example 3 | A-3 | B | B |
| Example 4 | A-4 | B | A |
| Example 5 | A-5 | C | B |
| Example 6 | A-6 | C | B |
| Example 8 | A-8 | B | B |
| Example 9 | A-9 | A | A |
| Example 10 | A-10 | A | A |
| Example 11 | A-11 | A | A |
| Example 12 | A-12 | B | A |
| Example 13 | A-13 | B | A |
| Example 14 | A-14 | A | A |
| Example 15 | A-15 | B | B |
| Example 16 | A-16 | A | A |
| Example 17 | A-17 | A | A |
| Example 18 | A-18 | A | A |
| Example 19 | A-19 | B | A |
| Example 20 | A-20 | A | A |
| Example 21 | A-21 | A | A |
| Comparative Example | TFB | C | C |

<Manufacture and Evaluation 1 of Quantum Dot Electroluminescent Device>

[Manufacture of Quantum Dot Electroluminescent device Using Blue Quantum Dots

Example 101: Quantum Dot Electroluminescent Device 1B

As for a first electrode (positive electrode), an ITO-attached glass substrate in which the indium tin oxide (ITO) was patterned to have a film thickness of 150 nm was used. This ITO-attached glass substrate was sequentially washed with a neutral detergent, deionized water, water, and isopropyl alcohol and then, treated with UV-ozone. Subsequently, on this ITO-attached glass substrate, poly(3,4-ethylenedioxythiophene)/poly(4-styrenesulfonate) (PEDOT/PSS) (Sigma-Aldrich Co., Ltd.) was spin-coated to have a dry film thickness of 30 nm and then, dried. As a result, a hole injection layer with a thickness (dry film thickness) of 30 nm was formed on the ITO-attached glass substrate.

On this hole injection layer, 1.0 mass % of a toluene solution of Polymer A-3 of Example 3 (hole transport material) was spin-coated to have a dry film thickness of 30 nm and heat-treated at 230° C. for 60 minutes, forming a hole transport layer. As a result, a hole transport layer with a thickness (dry film thickness) of 30 nm was formed on the hole injection layer.

Blue quantum dots with the following structure (ZnTeSe/ZnSe/ZnS (core/shell/shell; average diameter=about 10 nm) were dispersed to be 1.0 mass % in cyclohexane, preparing quantum dot dispersion:

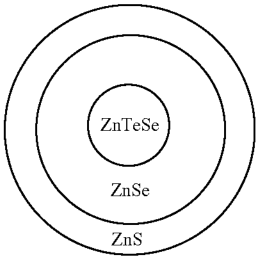

On the other hand, the hole transport layer was hardly soluble in cyclohexane.

This quantum dot dispersion was spin-coated to have a dry film thickness of 30 nm on the hole transport layer and then, dried. As a result, a quantum dot light emitting layer with a thickness (dry film thickness) of 30 nm was formed on the hole transport layer (HTL). On the other hand, light generated by irradiating the quantum dot dispersion with ultraviolet (UV) light had a central wavelength of 462 nm and a full width at half maximum (FWHM) of 30 nm.

This quantum dot light emitting layer was completely dried. On this quantum dot light emitting layer, lithium quinolate (Liq) and 1,3,5-tris(N-phenyl benzimidazole-2-yl) benzene (TPBI) (Sigma-Aldrich Co., Ltd.) as an electron transport material were codeposited by using a vacuum deposition apparatus. As a result, an electron transport layer (ETL) with a thickness of 36 nm was formed on the quantum dot light emitting layer.

The vacuum deposition device was used to deposit (8-quinolinolate)lithium (or lithium quinolate) (Liq) on the electron transport layer (ETL). As a result, the electron injection layer (EIL) with a thickness of 0.5 nm was formed on the electron transport layer (ETL).

The vacuum deposition device was used to deposit aluminum (Al) on the electron injection layer (EIL). As a result, a second electrode with a thickness of 100 nm (cathode) was formed on the electron injection layer (EIL).

Accordingly, Quantum dot electroluminescent device 1B was obtained.

Example 102: Quantum Dot Electroluminescent Device 2B

Quantum dot electroluminescent device 2B was manufactured in the same manner as Quantum dot electroluminescent device 1B of Example 101 except that Polymer A-2 of Example 2 was used instead of Polymer A-3 of Example 3. On the other hand, the hole transport layer was hardly soluble in cyclohexane.

Example 103: Quantum Dot Electroluminescent Device 3B

Quantum dot electroluminescent device 3B was manufactured in the same manner as Quantum dot electroluminescent device 1B of Example 101 except that Polymer A-1 of Example 1 was used instead of Polymer A-3 of Example 3. On the other hand, the hole transport layer was hardly soluble in cyclohexane.

Comparative Example 2: Quantum Dot Electroluminescent Device 4B

Quantum dot electroluminescent device 4B was manufactured in the same manner as Quantum dot electroluminescent device 1B of Example 101 except that poly[(9,9-dioctyl fluorenyl-2,7-diyl)-co-(4,4'-(N-(4-sec-butylphenyl)) diphenylamine)](TFB) (Luminescence Technology Corp.) was used instead of Polymer A-3 of Example 3. On the other hand, the hole transport layer was hardly soluble in cyclohexane.

Example 104: Quantum Dot Electroluminescent Device 5B

Quantum dot electroluminescent device 5B was manufactured in the same manner as Quantum dot electroluminescent device 1B of Example 101 except that Polymer A-8 of Example 8 was used instead of Polymer A-3 of Example 3.

On the other hand, the hole transport layer was hardly soluble in cyclohexane.

Example 105: Quantum Dot Electroluminescent Device 6B

Quantum dot electroluminescent device 6B was manufactured in the same manner as Quantum dot electroluminescent device 1B of Example 101 except that Polymer A-10 of Example 10 was used instead of Polymer A-3 of Example 3.

On the other hand, the hole transport layer was sparingly soluble in cyclohexane.

Example 106: Quantum Dot Electroluminescent Device 7B

Quantum dot electroluminescent device 7B was manufactured in the same manner as Quantum dot electroluminescent device 1B of Example 101 except that Polymer A-11 of Example 11 was used instead of Polymer A-3 of Example 3.

On the other hand, the hole transport layer was sparingly soluble in cyclohexane.

Example 107: Quantum Dot Electroluminescent Device 8B

Quantum dot electroluminescent device 8B was manufactured in the same manner as Quantum dot electroluminescent device 1B of Example 101 except that Polymer A-12 of Example 12 was used instead of Polymer A-3 of Example 3.

On the other hand, the hole transport layer was sparingly soluble in cyclohexane.

Example 108: Quantum Dot Electroluminescent Device 9B

Quantum dot electroluminescent device 9B was manufactured in the same manner as Quantum dot electroluminescent device 1B of Example 101 except that Polymer A-14 of Example 14 was used instead of Polymer A-3 of Example 3.

On the other hand, the hole transport layer was hardly soluble in cyclohexane.

Example 109: Quantum Dot Electroluminescent Device 10B

Quantum dot electroluminescent device 10B was manufactured in the same manner as Quantum dot electroluminescent device 1B of Example 101 except that Polymer A-15 of Example 15 was used instead of Polymer A-3 of Example 3.

On the other hand, the hole transport layer was sparingly soluble in cyclohexane.

Example 110: Quantum Dot Electroluminescent Device 11B

Quantum dot electroluminescent device 11B was manufactured in the same manner as Quantum dot electroluminescent device 1B of Example 101 except that Polymer A-16 of Example 16 was used instead of Polymer A-3 of Example 3.

On the other hand, the hole transport layer was sparingly soluble in cyclohexane.

Example 111: Quantum Dot Electroluminescent Device 12B

Quantum dot electroluminescent device 12B was manufactured in the same manner as Quantum dot electroluminescent device 1B of Example 101 except that Polymer A-17 of Example 17 was used instead of Polymer A-3 of Example 3.

On the other hand, the hole transport layer was sparingly soluble in cyclohexane.

Example 201: Quantum Dot Electroluminescent Device 13B

Quantum dot electroluminescent device 13B was manufactured in the same manner as Quantum dot electroluminescent device 1B of Example 101 except that the hole transport layer was formed by using a toluene solution including 0.8 mass % of Polymer A-1 (hole transport material) of Example 1 and 0.2 mass % of Compound AD-1 instead of the toluene solution including 1.0 mass % of Polymer A-3 (hole transport material) of Example 3.

On the other hand, the hole transport layer was sparingly soluble in cyclohexane.

Example 202: Quantum Dot Electroluminescent Device 14B

Quantum dot electroluminescent device 14B was manufactured in the same manner as Quantum dot electroluminescent device 13B of Example 201 except that Polymer A-10 of Example 10 was used instead of Polymer A-1 of Example 1.

On the other hand, the hole transport layer was sparingly soluble in cyclohexane.

Example 203: Quantum Dot Electroluminescent Device 15B

Quantum dot electroluminescent device 15B was manufactured in the same manner as Quantum dot electroluminescentnescent device 14B of Example 202 except that Compound AD-2 was used instead of Compound AD-1.

On the other hand, the hole transport layer was sparingly soluble in cyclohexane.

Example 204: Quantum Dot Electroluminescent Device 16B

Quantum dot electroluminescent device 16B was manufactured in the same manner as Quantum dot electroluminescent device 14B of Example 202 except that Compound AD-3 was used instead of Compound AD-1.

On the other hand, the hole transport layer was sparingly soluble in cyclohexane.

Example 205: Quantum Dot Electroluminescent Device 17B

Quantum dot electroluminescent device 17B was manufactured in the same manner as Quantum dot electroluminescent device 14B of Example 202 except that Compound AD-4 was used instead of Compound AD-1.

On the other hand, the hole transport layer was sparingly soluble in cyclohexane.

Example 206: Quantum Dot Electroluminescent Device 18B

Quantum dot electroluminescent device 18B was manufactured in the same manner as Quantum dot electroluminescent device 14B of Example 202 except that Compound AD-5 was used instead of Compound AD-1.

On the other hand, the hole transport layer was sparingly soluble in cyclohexane.

Example 207: Quantum Dot Electroluminescent Device 19B

Quantum dot electroluminescent device 19B was manufactured in the same manner as Quantum dot electroluminescent device 14B of Example 202 except that Compound AD-6 was used instead of Compound AD-1.

On the other hand, the hole transport layer was sparingly soluble in cyclohexane.

Example 208: Quantum Dot Electroluminescent Device 20B

Quantum dot electroluminescent device 20B was manufactured in the same manner as Quantum dot electroluminescent device 14B of Example 202 except that Compound AD-7 was used instead of Compound AD-1.

On the other hand, the hole transport layer was sparingly soluble in cyclohexane.

AD-1

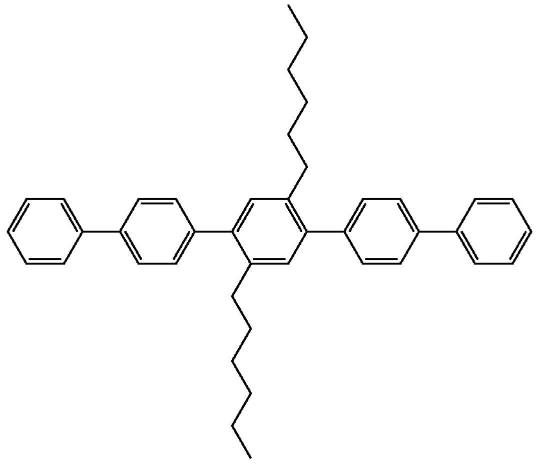

AD-2

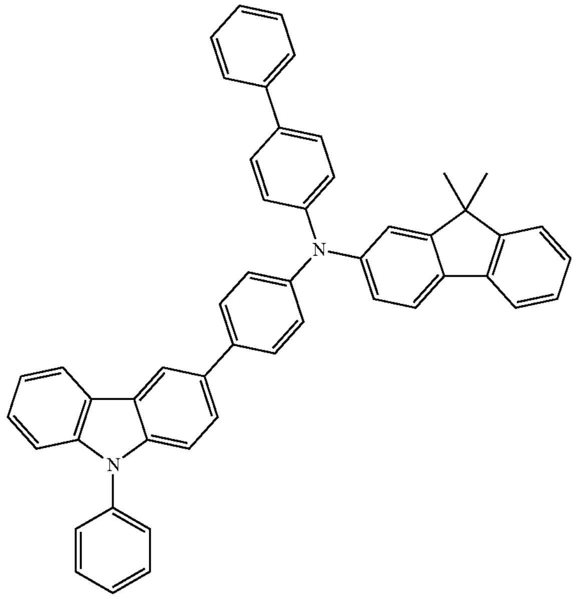

AD-3

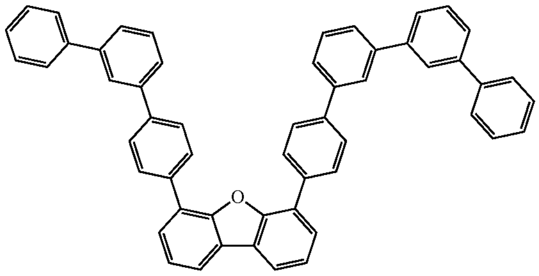

-continued

AD-4

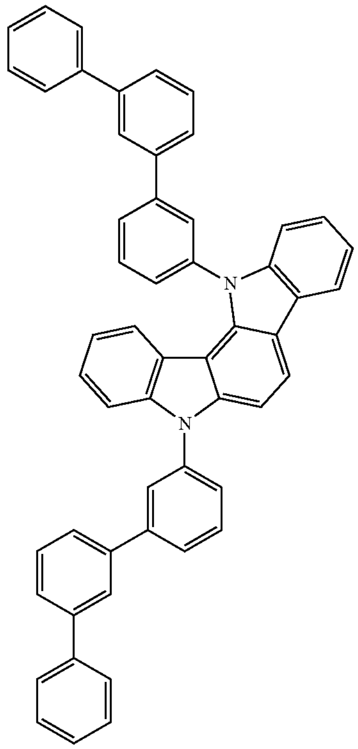

AD-5

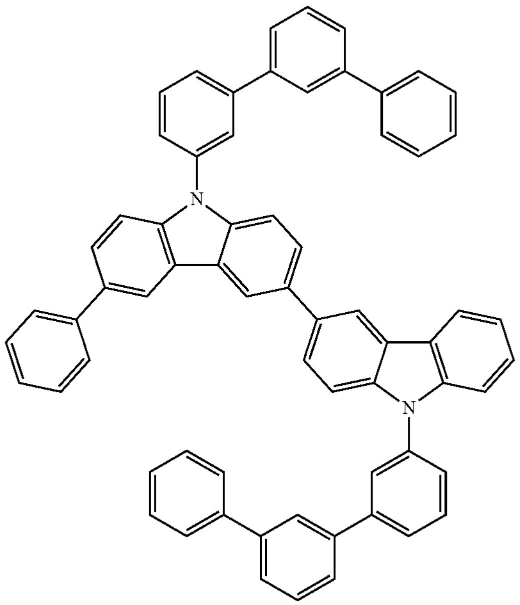

-continued

AD-6

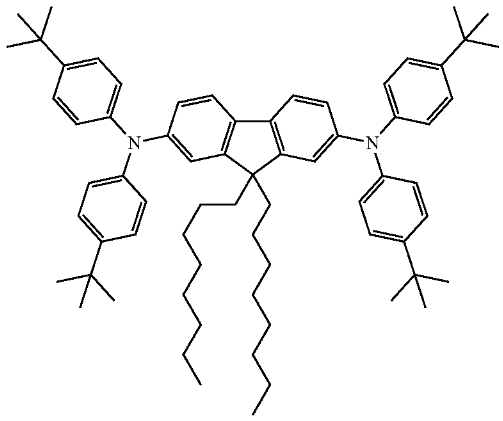

AD-7

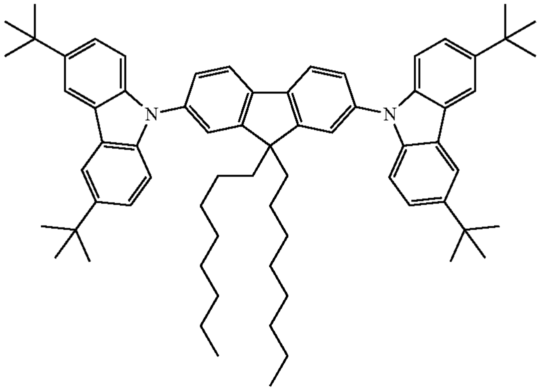

(HOMO and LUMO of Compound AD-1 to Compound AD-7)

The HOMO and LUMO of Compounds AD-1 to AD-7 were measured in the same manner as in the evaluation method of the HOMO and LUMO of the polymers of the above examples.

The HOMO and LUMO of Compounds AD-1 to AD-7 are shown below.

Compound AD-1: HOMO=−6.56 eV, LUMO=−2.73 eV,
Compound AD-2: HOMO=−6.24 eV, LUMO=−2.80 eV,
Compound AD-3: HOMO=−5.98 eV, LUMO=−2.65 eV,
Compound AD-4: HOMO=−5.80 eV, LUMO=−2.48 eV,
Compound AD-5: HOMO=−5.67 eV, LUMO=−2.24 eV,
Compound AD-6: HOMO=−5.57 eV, LUMO=−2.50 eV,
Compound AD-7: HOMO=−5.38 eV, LUMO=−2.34 eV.

[Evaluation 1 of Quantum Dot Electroluminescent Device]

Quantum dot electroluminescent devices 1B to 3B of Examples 101 to 103, Quantum dot electroluminescent device 4B of Comparative Example 2, Quantum dot electroluminescent device 5B to 12B of Examples 104 to 111, and Quantum dot electroluminescent device 13B to 20B of Examples 201 to 208 were evaluated with respect to device life-span in the following method. These devices exhibited light emission at a maximum emission wavelength of about 480 nm, which was blue light emission. The results are shown in Tables 4 and 5.

(Device Life-Span)

A DC constant voltage power supply (a source meter, Keyence Co., Ltd.) was used to apply a predetermined voltage to each quantum dot electroluminescent device to make the quantum dot electroluminescent device emit light.

While the quantum dot electroluminescent device was measured with respect to light emission by using a luminance measuring apparatus (SR-3, Topcom Co., Ltd.), a current was slowly increased and then, constantly maintained at a point where luminance reached 650 nit (cd/$m^2$). "LT50 (hr)" was obtained by measuring time when luminance measured by the luminance measuring apparatus slowly decreased and reached 50% of the initial luminance.

TABLE 4

| | QD-LED device | Hole transport material of hole transport layer | Relative value (%) when LT50 (hr) of Comparative Example 2 is 100% |
|---|---|---|---|
| Example 101 | 1B | Polymer A-3 | 235 |
| Example 102 | 2B | Polymer A-2 | 201 |
| Example 103 | 3B | Polymer A-1 | 224 |
| Example 104 | 5B | Polymer A-8 | 145 |
| Example 105 | 6B | Polymer A-10 | 123 |
| Example 106 | 7B | Polymer A-11 | 146 |
| Example 107 | 8B | Polymer A-12 | 102 |
| Example 108 | 9B | Polymer A-14 | 119 |
| Example 109 | 10B | Polymer A-15 | 239 |
| Example 110 | 11B | Polymer A-16 | 151 |
| Example 101 | 12B | Polymer A-17 | 255 |
| Comparative Example | 4B | TFB | 100 |

TABLE 5

| | QD-LED device | Hole transport material of hole transport layer | Low molecular weight material of hole transport layer | Relative value (%) when LT50 (hr) of Comparative Example 2 is 100% |
|---|---|---|---|---|
| Example 201 | 13B | Polymer A-1 | Polymer AD-1 | 397 |
| Example 202 | 14B | Polymer A-10 | Polymer AD-1 | 330 |
| Example 203 | 15B | Polymer A-10 | Polymer AD-2 | 227 |
| Example 204 | 16B | Polymer A-10 | Polymer AD-3 | 400 |
| Example 205 | 17B | Polymer A-10 | Polymer AD-4 | 361 |
| Example 206 | 18B | Polymer A-10 | Polymer AD-5 | 361 |
| Example 207 | 19B | Polymer A-10 | Polymer AD-6 | 278 |
| Example 208 | 20B | Polymer A-10 | Polymer AD-7 | 297 |
| Comparative Example 2 | 4B | TFB | None | 100 |

Referring to the results of Tables 4 and 5, Quantum dot electroluminescent device 1B to 3B and 5B to 20B of the examples exhibited significantly long device life-span, compared with Quantum dot electroluminescent device 4B of the comparative example not using a polymer according to the present invention.

<Manufacture and Evaluation 2 of Quantum Dot Electroluminescent Device>

[Manufacture of Quantum Dot Electroluminescent device Using Red Quantum Dots]

Example 112: Electroluminescent Device 3R

Quantum dot electroluminescent device 3R was manufactured in the same manner as Quantum dot electroluminescent device 3B of Example 103 except that the blue quantum dot of Example 103 was changed into a red quantum dot with the following structure (InP/ZnSe/ZnS (core/shell/shell); average diameter=about 10 nm):

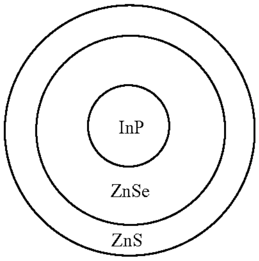

On the other hand, light emitted by irradiating the quantum dot dispersion with ultraviolet (UV) light had a central wavelength of 627 nm and a full width at half maximum (FWHM) of 35 nm.

Comparative Example 3: Electroluminescent Device 4R

Quantum dot electroluminescent device 4R was manufactured in the same manner as Quantum dot electroluminescent device 4B of Comparative Example 2 except that the blue quantum dot used in Comparative Example 2 was changed into the red quantum dot used to manufacture Quantum dot electroluminescent device 3R of Example 112.

[Manufacture of Quantum Dot Electroluminescent device Using Green Quantum Dots]

Example 113: Electroluminescent Device 3G

Quantum dot electroluminescent device 3G was manufactured in the same manner as Quantum dot electroluminescent device 3B of Example 103 except that the blue quantum dot used in Example 103 was changed into a green quantum dot with the following structure (InP/ZnSe/ZnS (core/shell/shell); average diameter=about 15 nm).

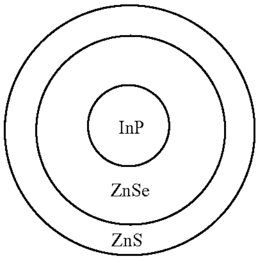

On the other hand, light emitted by irradiating the quantum dot disperse with ultraviolet (UV) light had a central wavelength of 550 nm and a full width at half maximum (FWHM) of 45 nm.

Comparative Example 4: Electroluminescent Device 4G

Quantum dot electroluminescent device 4G was manufactured in the same manner as Quantum dot electroluminescent device 4B of Comparative Example 2 except that the blue quantum dot used in Comparative Example 2 was changed into a green quantum dot used to manufacture Quantum dot electroluminescent device 3G of Example 113.

[Evaluation 2 of Quantum Dot Electroluminescent device]

Quantum dot electroluminescent devices 3R, 3G, and 3B of Examples 112, 113, and 103 and Quantum dot electroluminescent device 4R, 4G, and 4B of Comparative Examples 3, 4, and 2 were evaluated with respect to device life-span in the following method.

Regarding light emission of these devices, Quantum dot electroluminescent devices 3R and 4R turned out to have a maximum light emitting wavelength of about 640 nm which was red emission.

In addition, Quantum dot electroluminescent devices 3G and 4G had a maximum emission wavelength of about 550 nm, which was green light emission.

Quantum dot electroluminescent devices 3B and 4B exhibited a maximum emission wavelength of about 480 nm, which was blue light emission.

The results are shown in Tables 6 to 8.

(Device Life-Span)

A DC constant voltage power supply (source meter, Kiens Co., Ltd.) was used to apply a predetermined voltage to each quantum dot electroluminescent device to make the quantum dot electroluminescent device emit light. While the quantum dot electroluminescent device was measured with respect to light emission by using a luminance measuring apparatus (SR-3, Topcom, Inc.), a current was slowly increased and thus constantly maintained a point where luminance became 9000 nit (cd/$m^2$) in red, 5400 nit (cd/$m^2$) in green, and 650 nit (cd/$m^2$) in blue and then, allowed to stand.

"LT90 (hr)" was obtained by measuring time when the luminance measured by using a luminance measuring apparatus was slowly deteriorated and reached 90% of the initial luminance.

TABLE 6

| | QD-LED device | Hole transport material of hole transport layer | Light emitting color | Relative value (%) when LT90 of Comparative Example 3 is 100% |
|---|---|---|---|---|
| Example 112 | 3R | Polymer A-1 | red | 1695 |
| Comparative Example 3 | 4R | TFB | red | 100 |

TABLE 7

| | QD-LED device | Hole transport material of hole transport layer | Light emitting color | Relative value (%) when LT90 of Comparative Example 4 is 100% |
|---|---|---|---|---|
| Example 113 | 3G | Polymer A-1 | green | 397 |
| Comparative Example 4 | 4G | TFB | green | 100 |

TABLE 8

| | QD-LED device | Hole transport material of hole transport layer | Light emitting color | Relative value (%) when LT90 of Comparative Example 4 is 100% |
|---|---|---|---|---|
| Example 102 | 3B | Polymer A-1 | blue | 112 |
| Comparative Example 2 | 4B | TFB | blue | 100 |

Referring to the results of Tables 6 to 8, the quantum dot electroluminescent device 3R of the example exhibited significantly long device life-span, compared with the quantum dot electroluminescent device 4R of the comparative example not using a polymer according to the present invention.

Quantum dot electroluminescent device 3G of the example exhibited significantly long device life-span, compared with Quantum dot electroluminescent device 4G of the comparative example not using a polymer according to the present invention.

Quantum dot electroluminescent device 3B of the example exhibited significantly long device life-span, compared with Quantum dot electroluminescent device 4B of the comparative example not using a polymer according to the present invention.

Referring to the results, the quantum dot electroluminescent devices using a polymer according to the present invention exhibited significantly long device life-span for any luminous color of RGB, compared with the quantum dot electroluminescent device not using a polymer according to the present invention.

While the present disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100 . . . electroluminescent device (EL device),
110 . . . substrate,
120 . . . first electrode,
130 . . . hole injection layer,
140 . . . hole transport layer,
150 . . . light emitting layer,
160 . . . electron transport layer,
170 . . . electron injection layer,
180 . . . second electrode

What is claimed is:

1. A polymer comprising a structural unit represented by Chemical Formula (1):

(1)

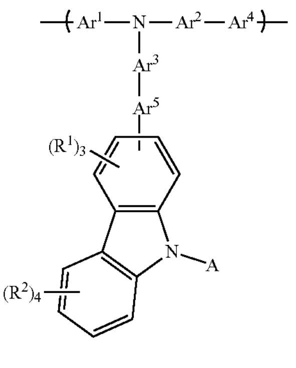

wherein, in Chemical Formula (1), $Ar^1$ and $Ar^2$ are each independently a substituted or unsubstituted divalent aromatic hydrocarbon group having 6 to 60 carbon atoms, $Ar^3$ is selected from Group (I):

Group (I)

I-1

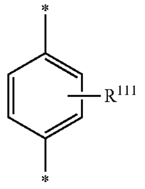

I-2

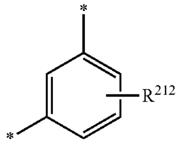

I-3

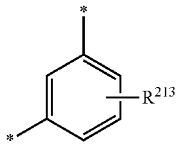

I-4

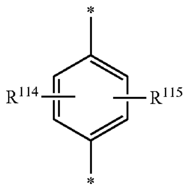

I-5

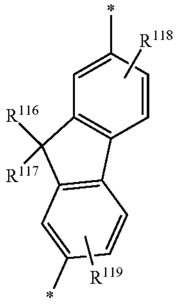

I-6

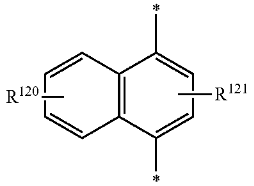

I-7

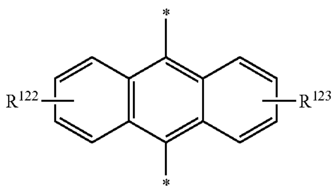

wherein, in Group (I), $R^{111}$ to $R^{123}$ are each independently a hydrogen atom or a linear or branched hydrocarbon group having 1 to 16 carbon atoms, and

* indicates a bonding position with an adjacent atom, $Ar^4$ is a substituted or unsubstituted divalent aromatic hydrocarbon group having 6 to 60 carbon atoms or a substituted or unsubstituted divalent aromatic heterocyclic ring group having 3 to 60 ring atoms, $Ar^5$ is a single bond or a substituted or unsubstituted divalent aromatic heterocyclic ring group having 3 to 60 ring atoms, each $R^1$ is independently a hydrogen atom, an alkyl group, a hydroxyalkyl group, an alkylthiol group, an alkoxy group, an alkoxyalkyl group, an alkylthioalkyl group, an alkenyl group, an alkynyl group, an alkylthio group, an alkoxycarbonyl group, an alkylthiocarbonyl group, a hydroxyl group, a carboxyl group, a thiocarboxyl group, a dithiocarboxyl group, a thiol group, or a cyano group, each $R^2$ is independently a hydrogen atom, an alkyl group, a hydroxyalkyl group, an alkylthiol group, an alkoxy group, an alkoxyalkyl group, an alkylthioalkyl group, an alkenyl group, an alkynyl group, an alkylthio group, an alkoxycarbonyl group, an alkylthiocarbonyl group, a hydroxyl group, a carboxyl group, a thiocarboxyl group, a dithiocarboxyl group, a thiol group, a cyano group, and A is a structure represented by Chemical Formula (2) or Chemical Formula (3):

(2)

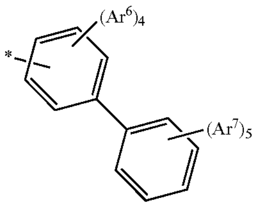

(3)

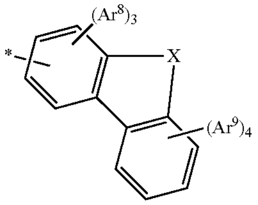

wherein, in Chemical Formula (2), each $Ar^6$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^7$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, two or more $Ar^7$s optionally form a condensed ring with the benzene ring to which two or more $Ar^7$ are bonded, and

* indicates a bonding position with an adjacent atom;

wherein, in Chemical Formula (3), each $Ar^8$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, each $Ar^9$ is independently a hydrogen atom, an alkyl group, a hydroxyalkyl group, an alkoxy group, an alkoxyalkyl group, an alkenyl group, an alkynyl group, an alkylthio group, an alkoxycarbonyl group, an alkylthiol group, an alkylthiocarbonyl group, a thiocarboxyl group, a dithiocarboxyl group, an alkylthioalkyl group, a hydroxyl group, a carboxyl group, a thiol group, a cyano group, a substituted or unsubstituted monovalent aromatic hydrocarbon group having 6 to 60 carbon atoms, a substituted or unsubstituted monovalent aromatic heterocyclic ring group having 3 to 60 ring atoms, or a substituted or unsubstituted monovalent ring set group including a structure in which one or more aromatic hydrocarbon rings having 6 to 60 carbon atoms and one or more aromatic heterocyclic rings having 3 to 60 ring atoms are bonded through a single bond, X is S, O, or C substituted with two substituted or unsubstituted linear or branched hydrocarbon groups having 1 to 16 carbon atoms, two or more $Ar^9$s optionally form a condensed ring with the benzene ring to which two or more $Ar^9$s are bonded, and

* indicates a bonding position with an adjacent atom.

2. The polymer of claim 1, wherein at least one of $Ar^1$, $Ar^2$, and $Ar^4$ in Chemical Formula (1) is each independently a group selected from Group (II):

Group (II)

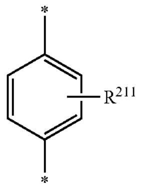

II-1

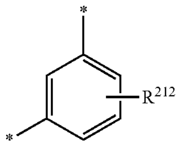

II-2

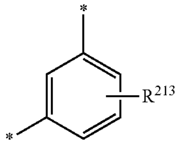

II-3

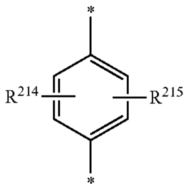

II-4

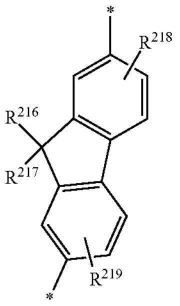

II-5

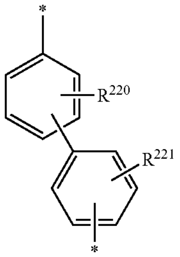

II-6

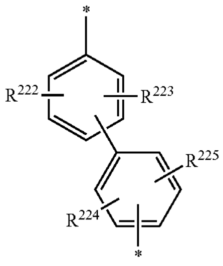

II-7 wherein $R^{211}$ to $R^{225}$ are each independently a hydrogen atom, or linear or branched hydrocarbon group having 1 to 16 carbon atoms, and

* indicates a bonding position with an adjacent atom.

3. The polymer of claim 2, wherein in Chemical Formula (1), $Ar^1$, $Ar^2$, and $Ar^4$ are each independently a group selected from Group (II).

4. A polymer comprising at least one structural unit selected from Group (A);

Group (A)

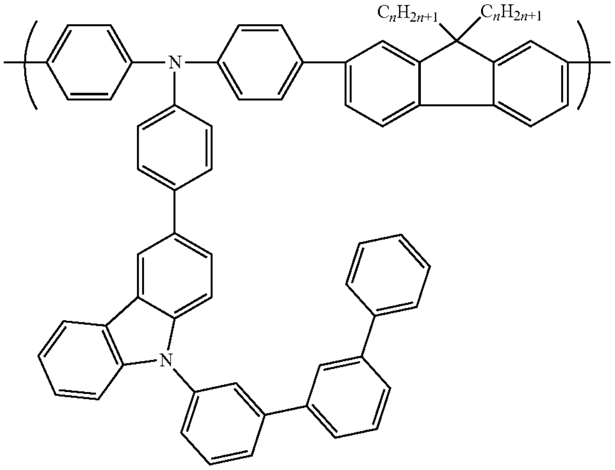

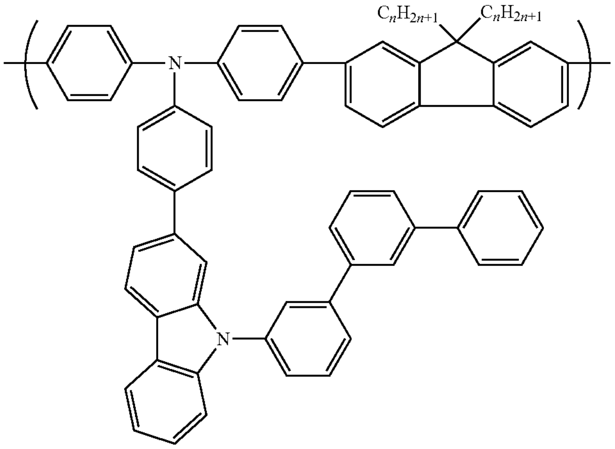

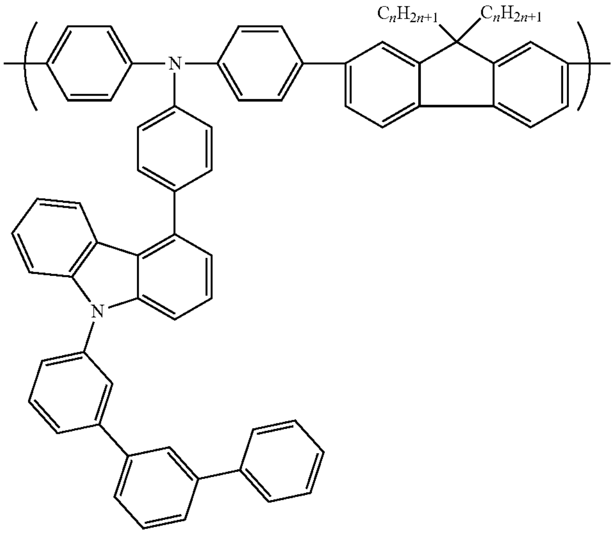

-continued
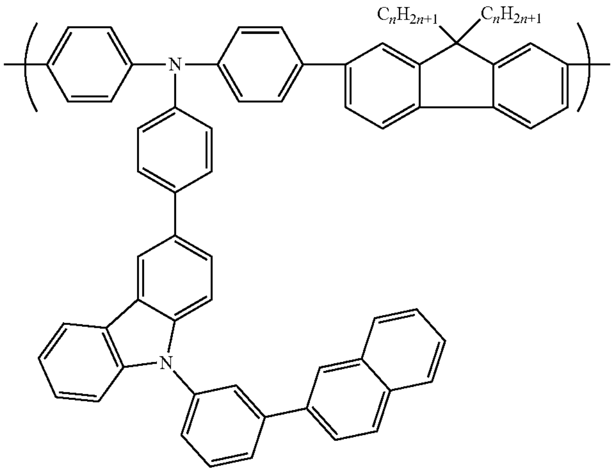
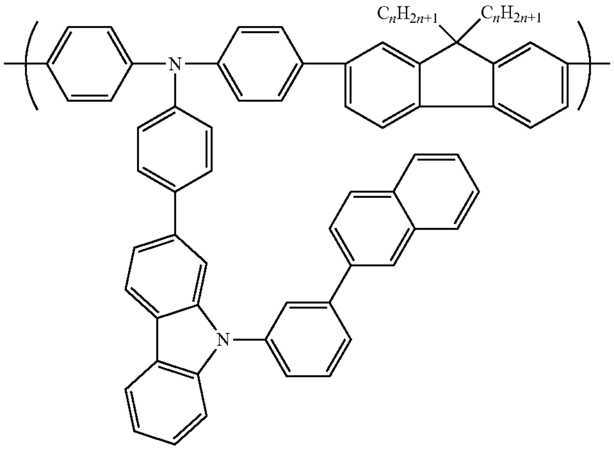
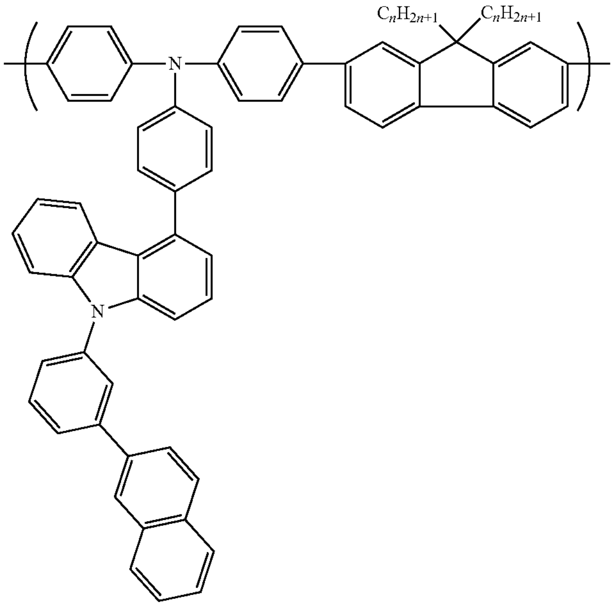

-continued
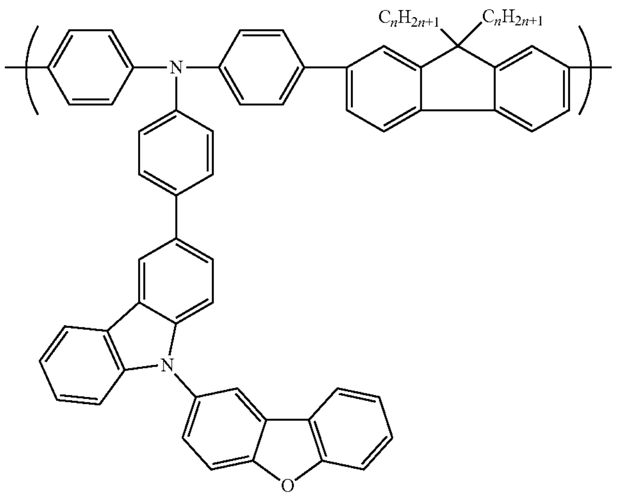
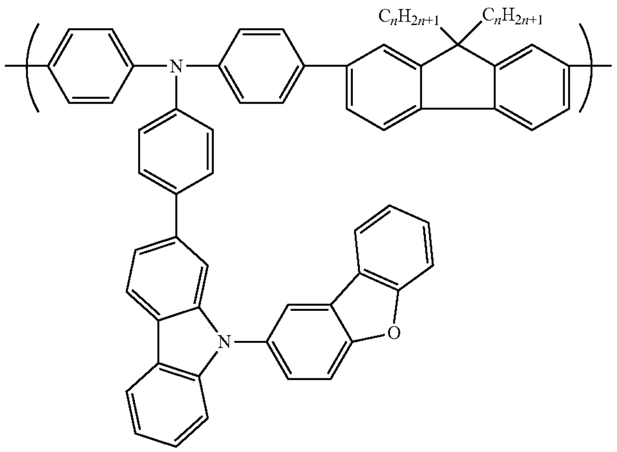
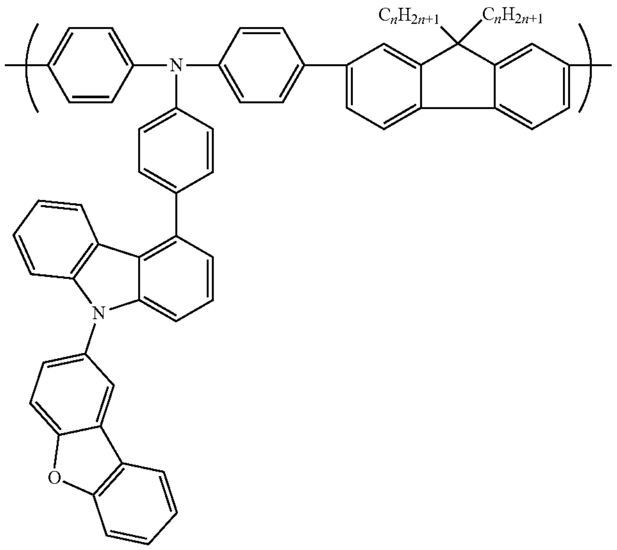

-continued
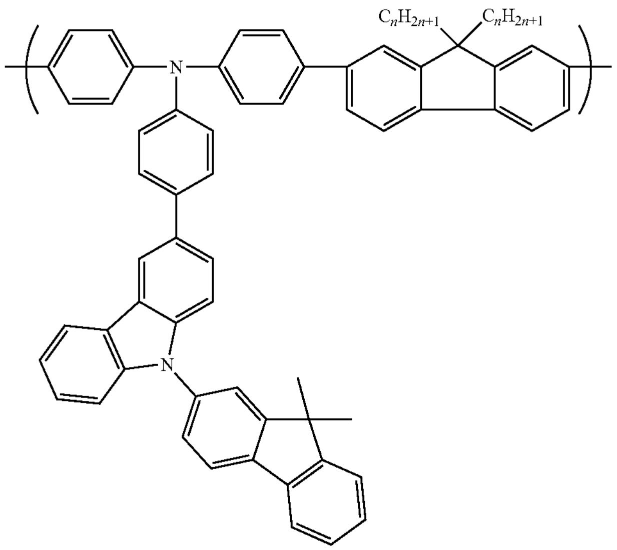
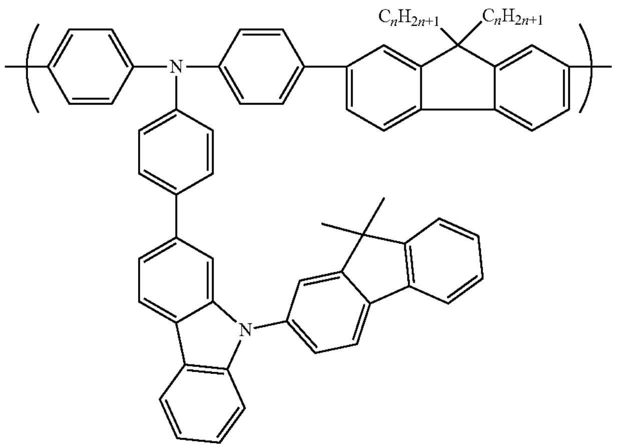
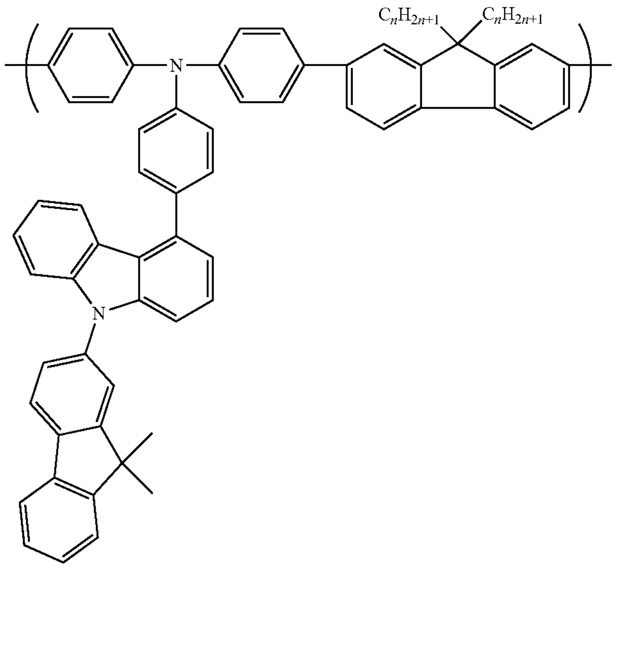

-continued
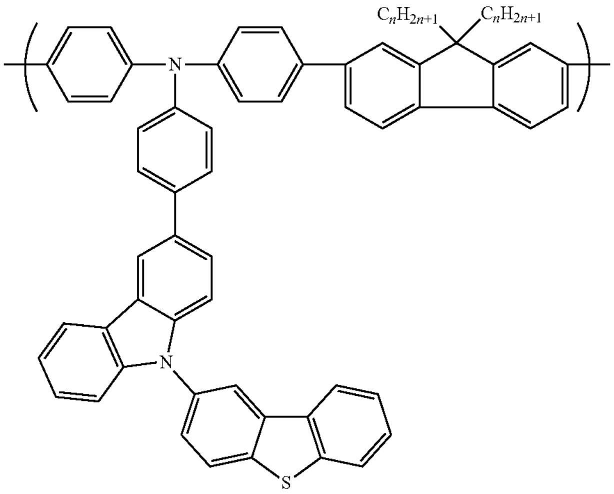
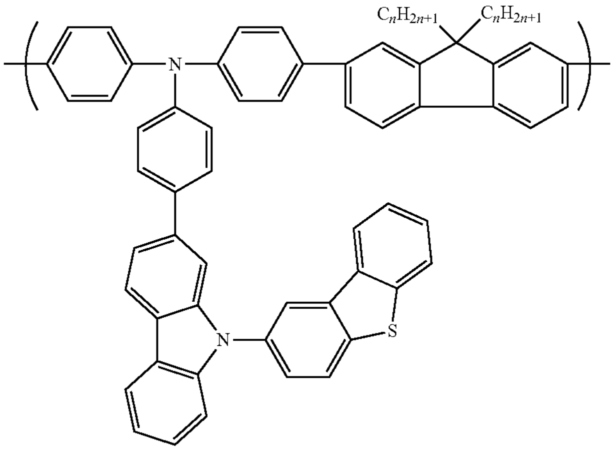
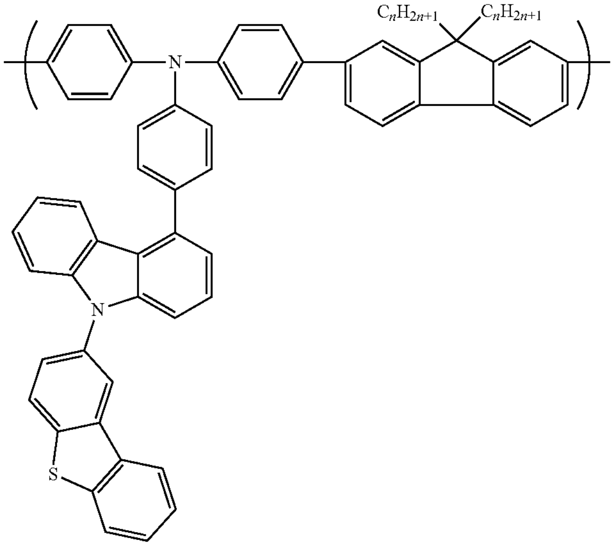

-continued
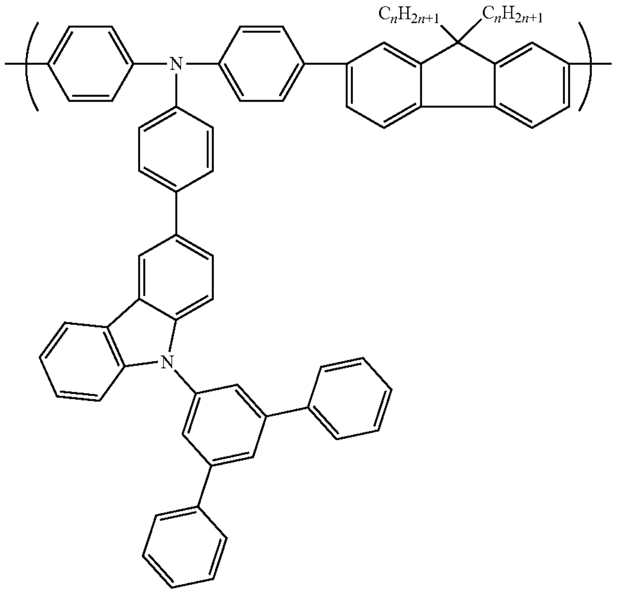
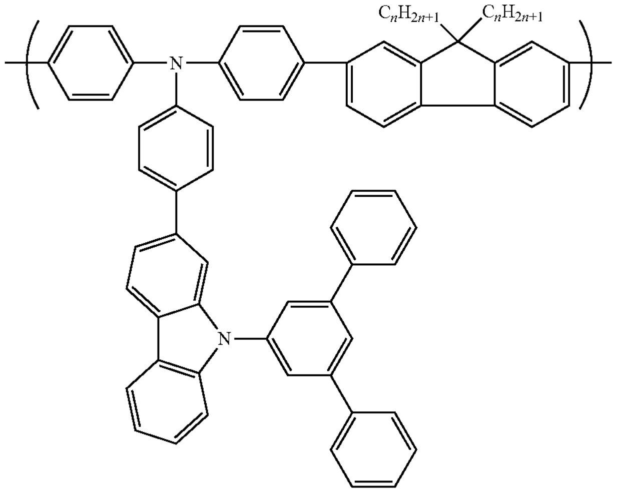
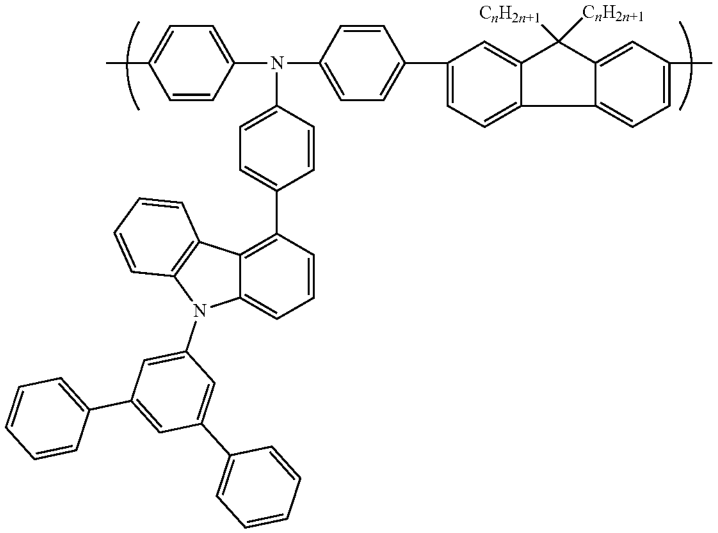

-continued
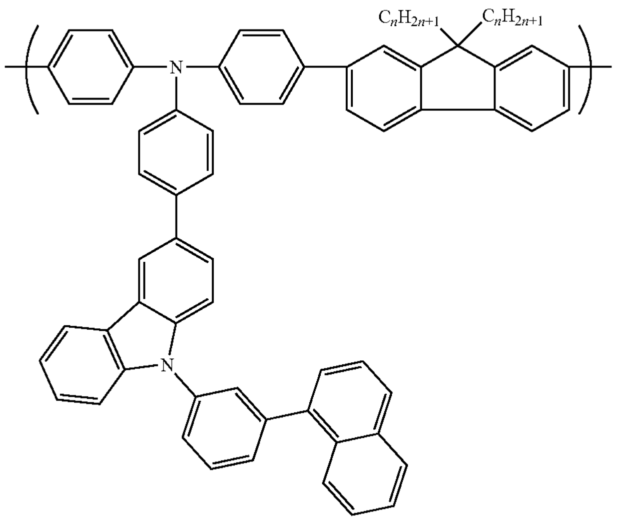
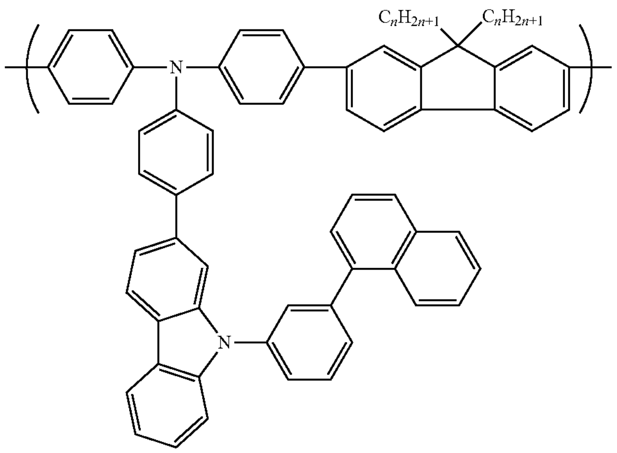
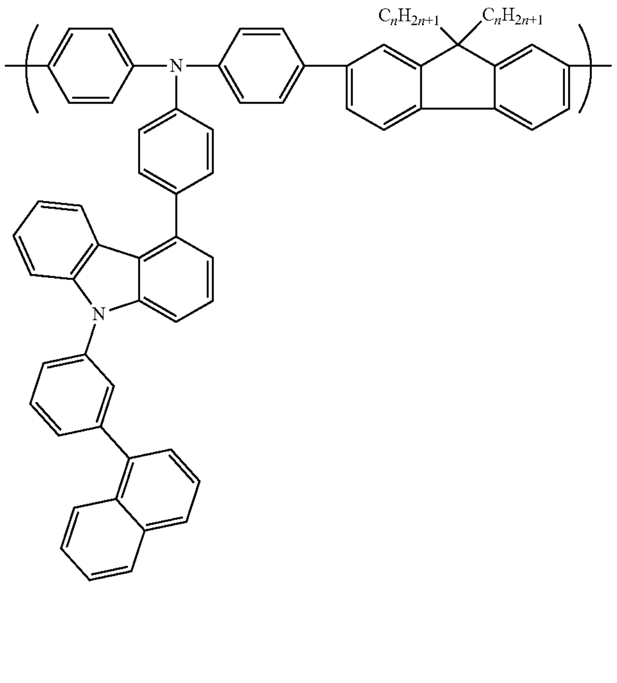

-continued
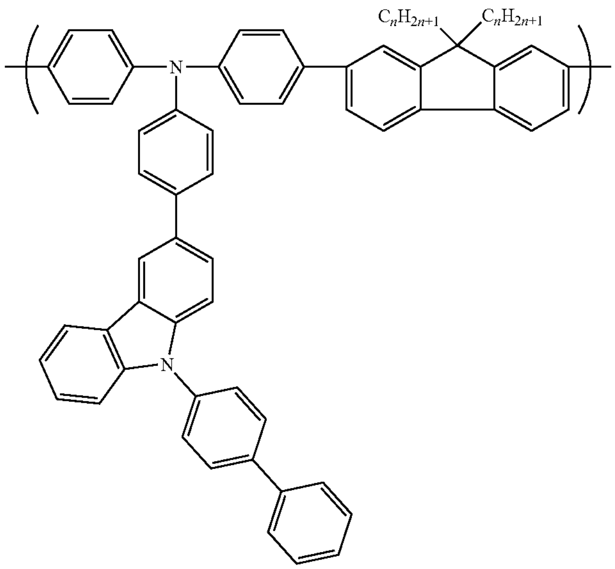
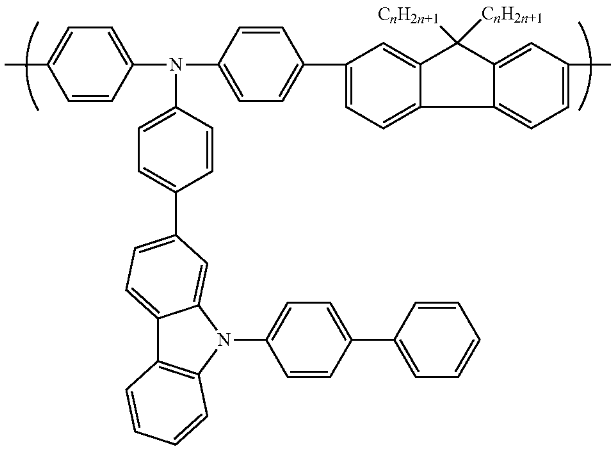
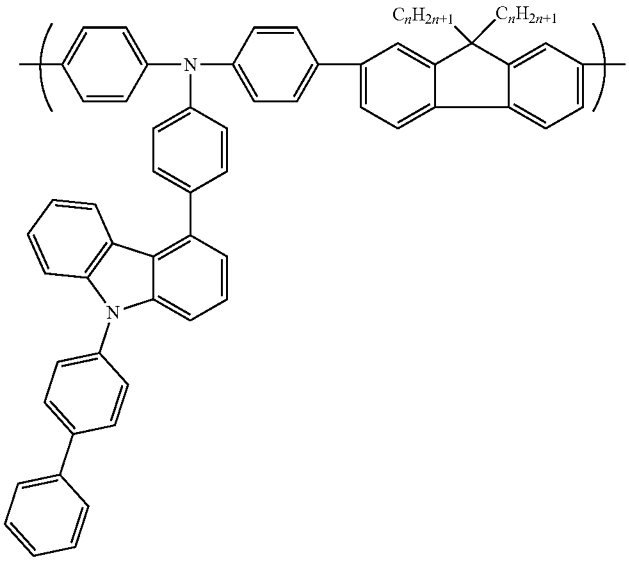

-continued
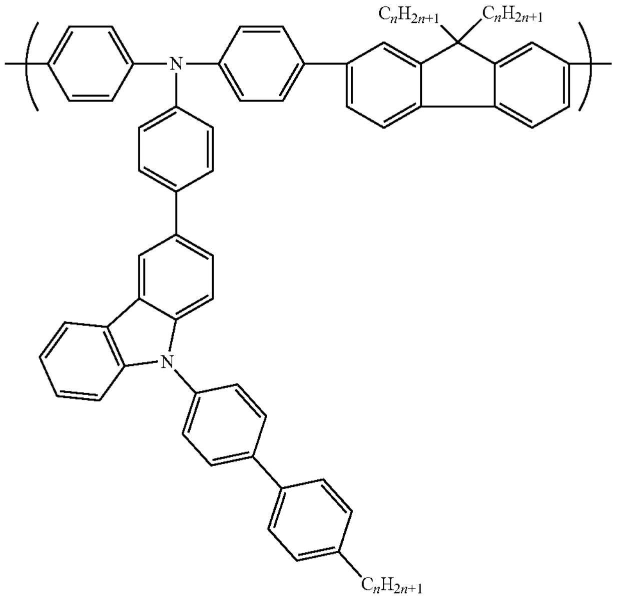
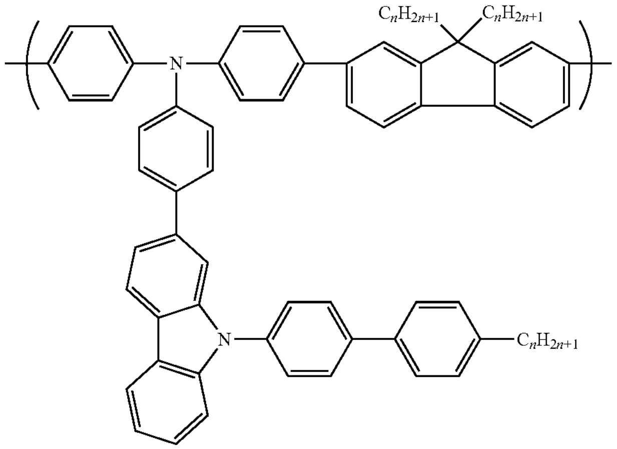
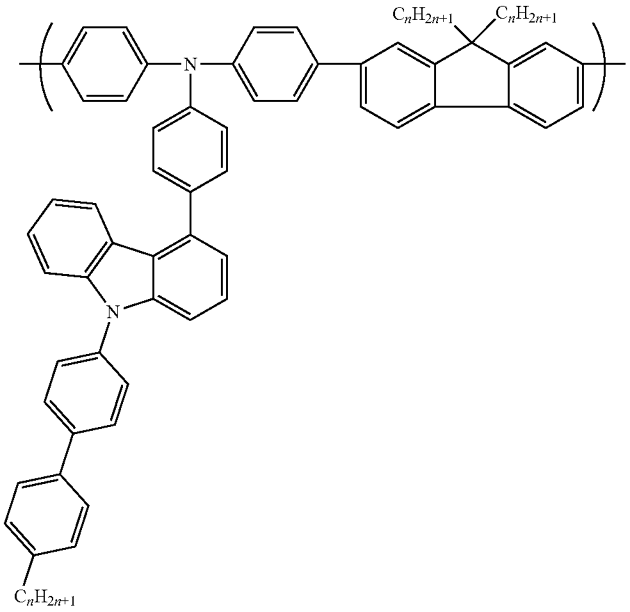

-continued
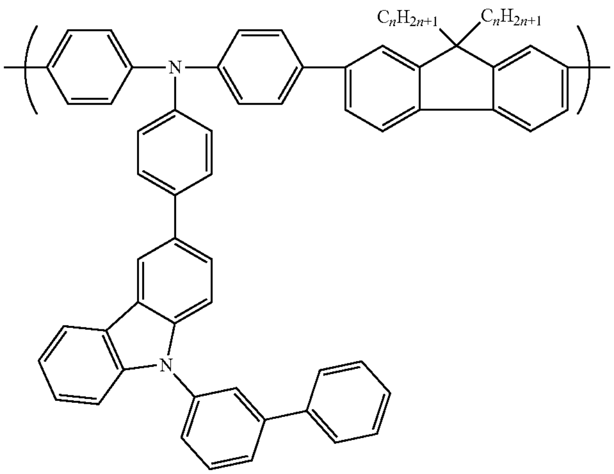
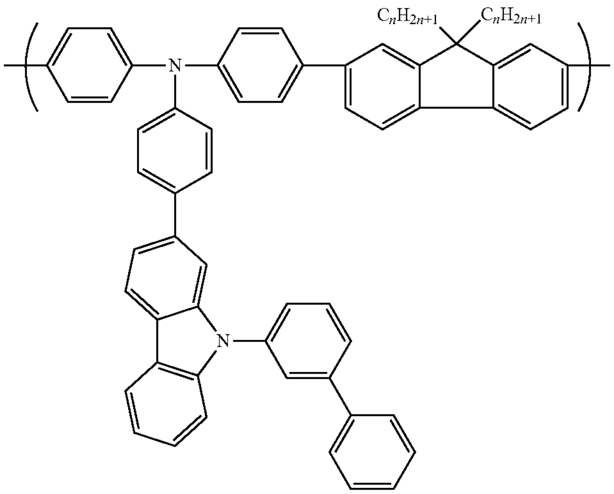
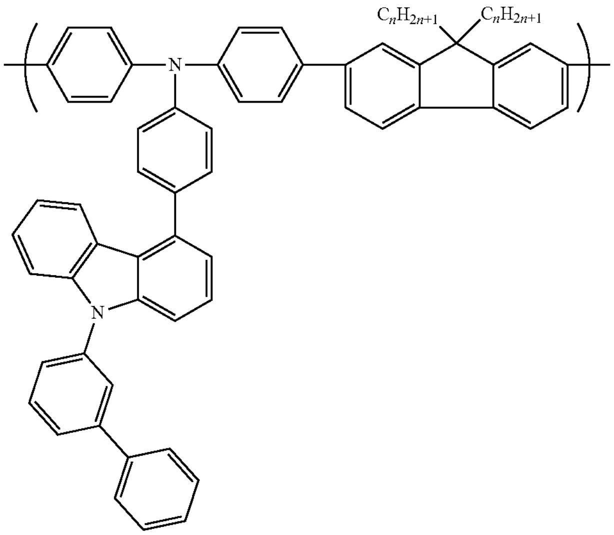

-continued
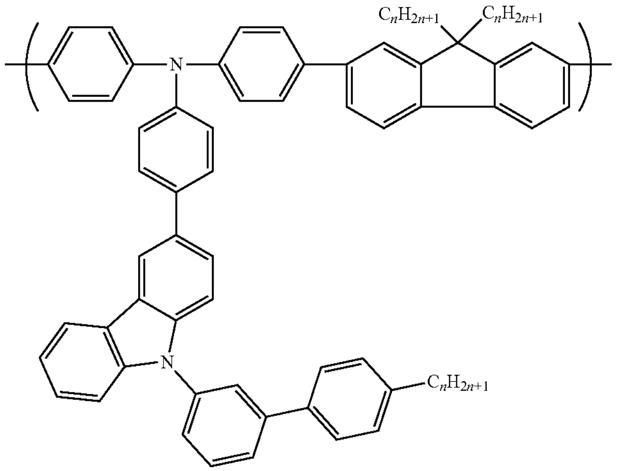
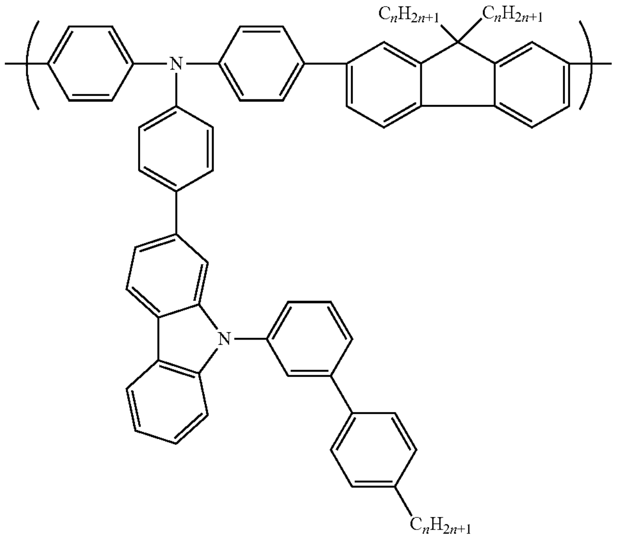
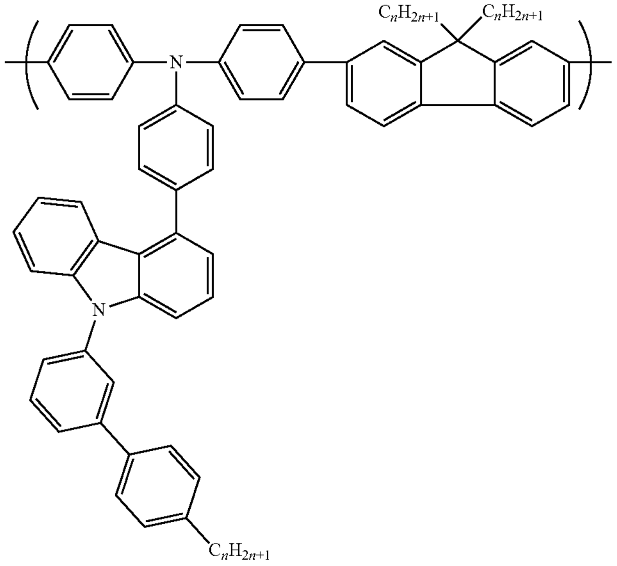

-continued
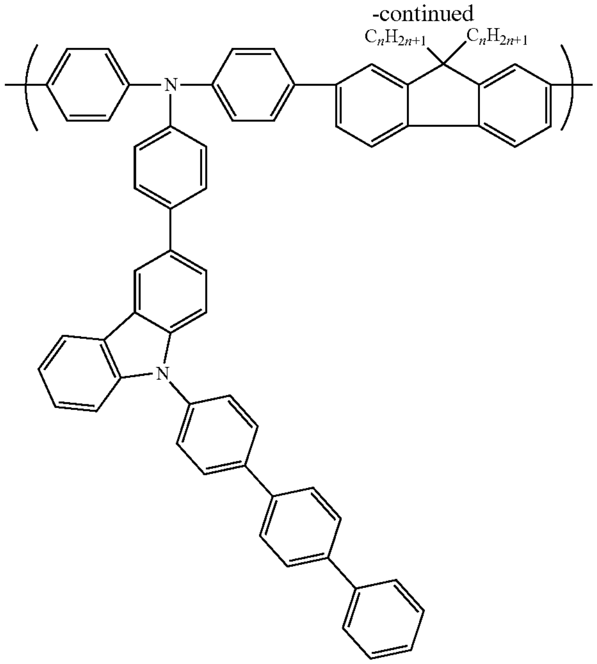
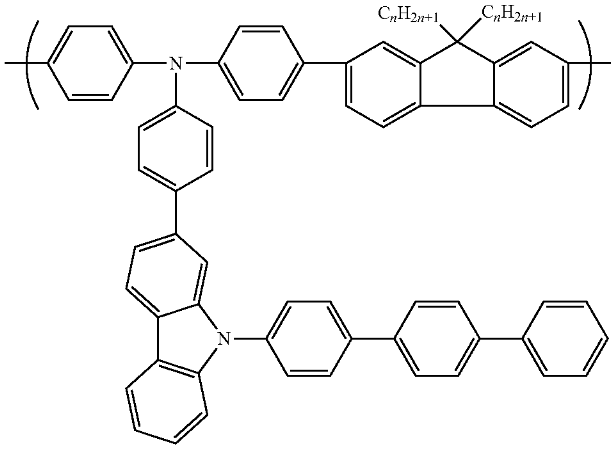
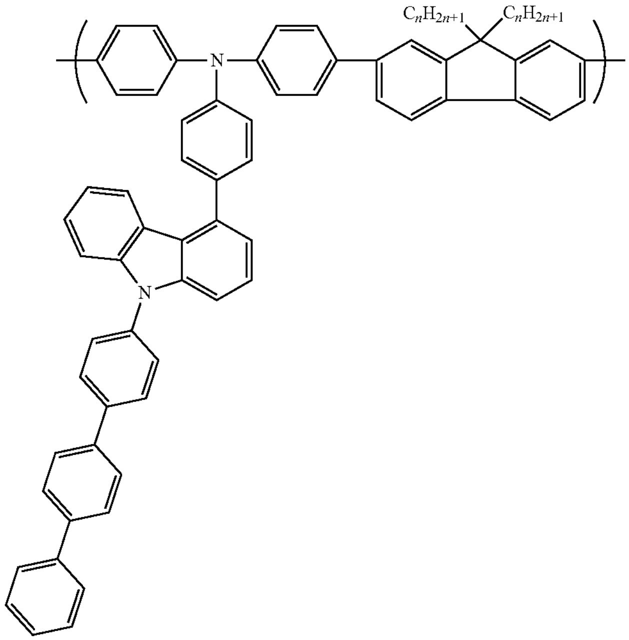

-continued
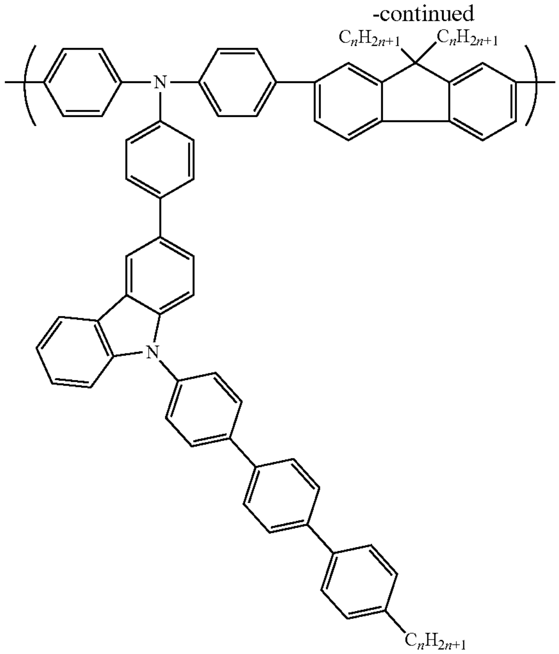
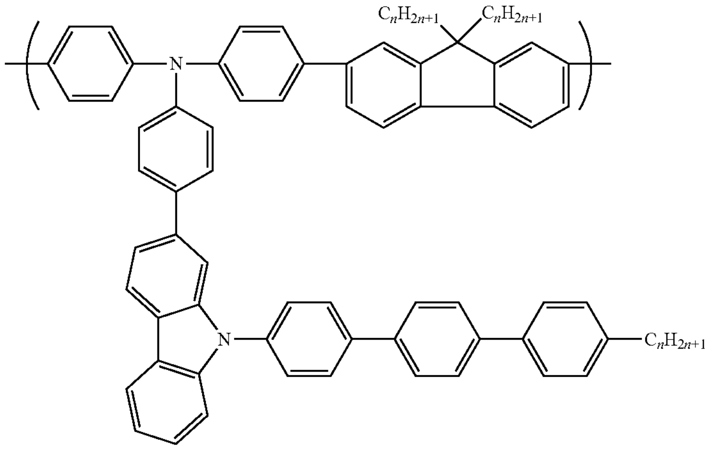
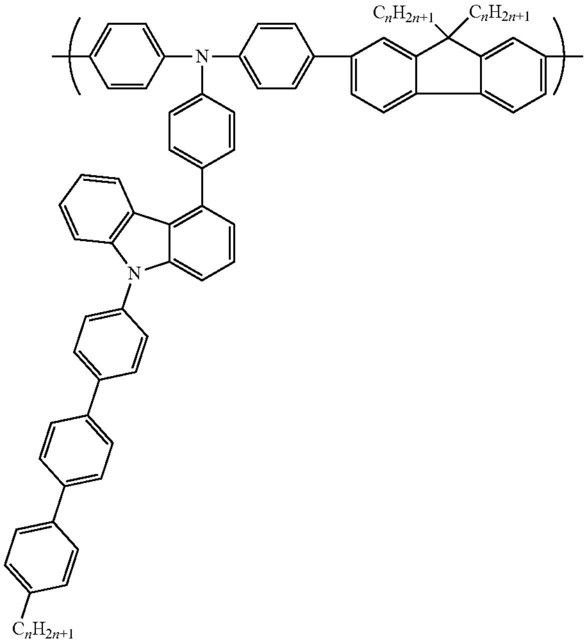

-continued
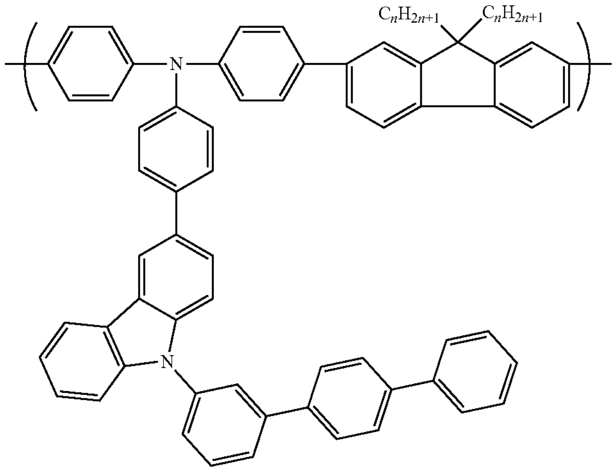
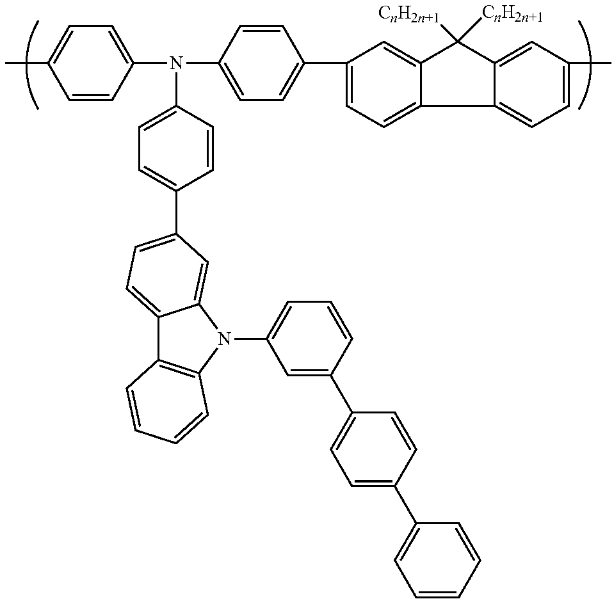
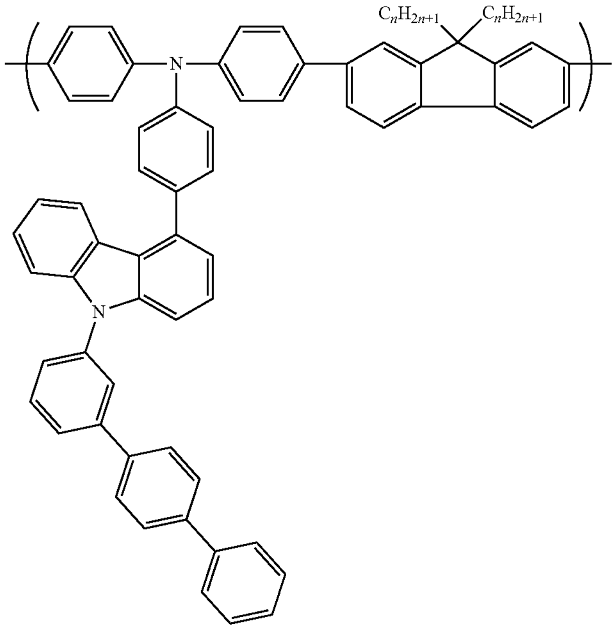

-continued
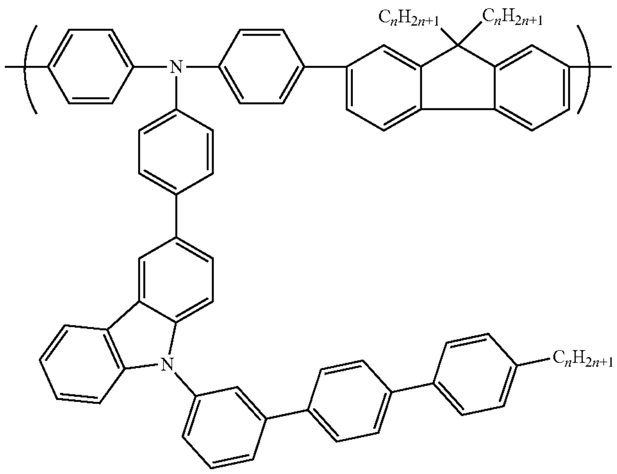
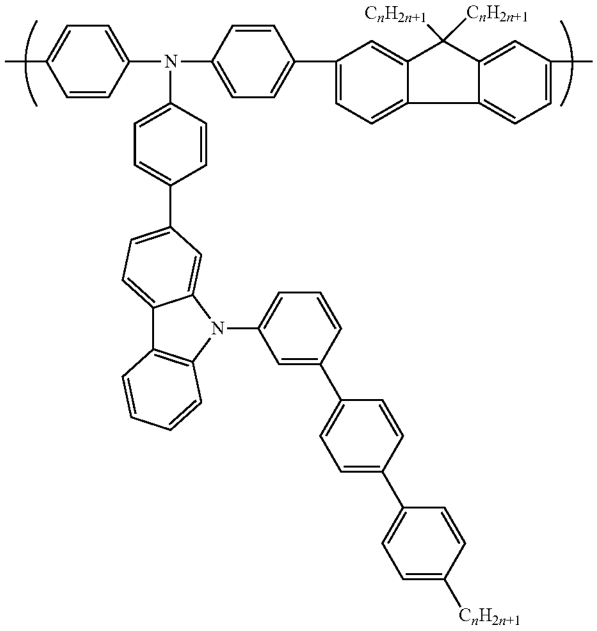

-continued
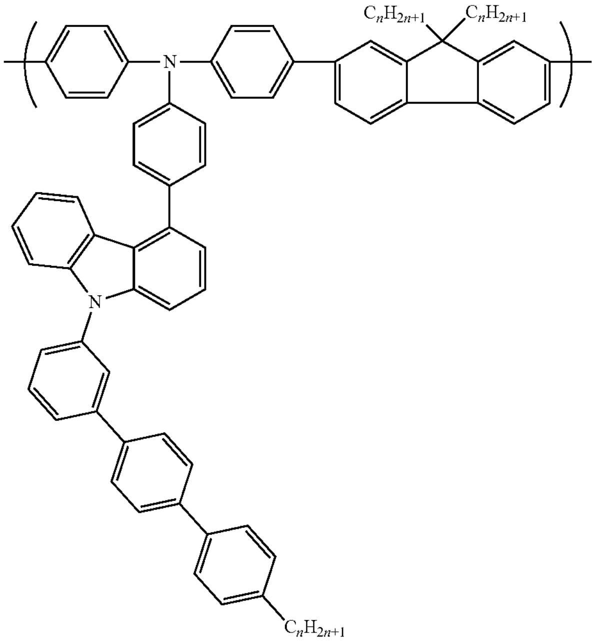
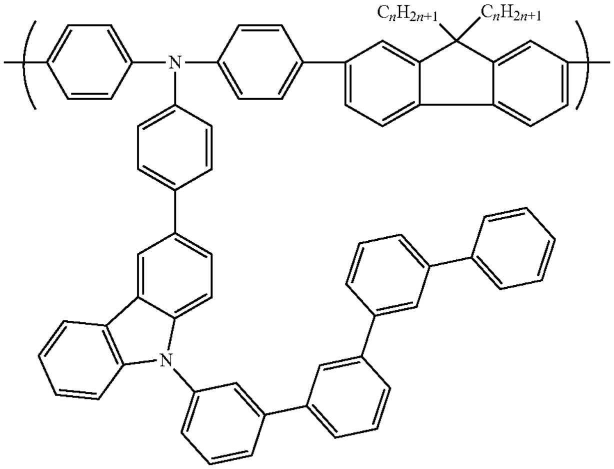

-continued
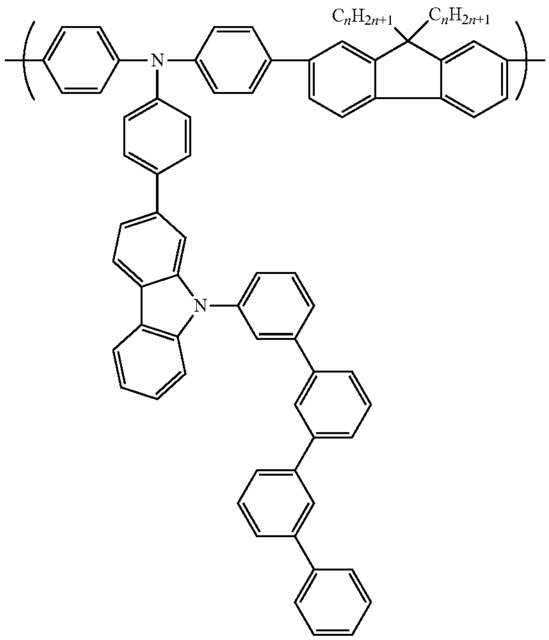
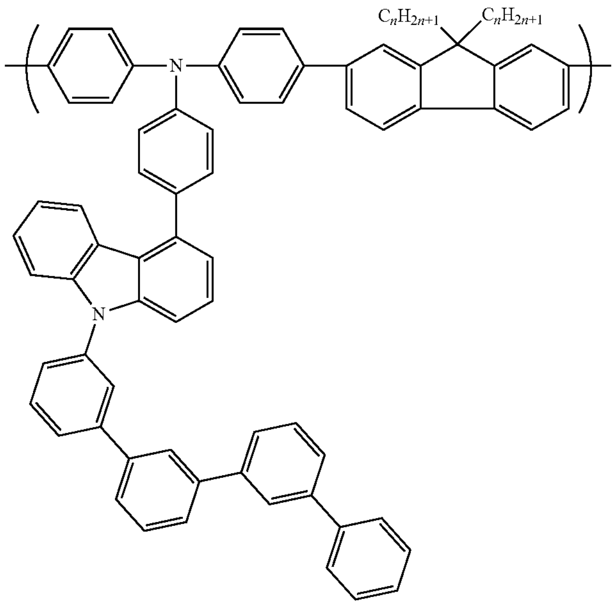

-continued
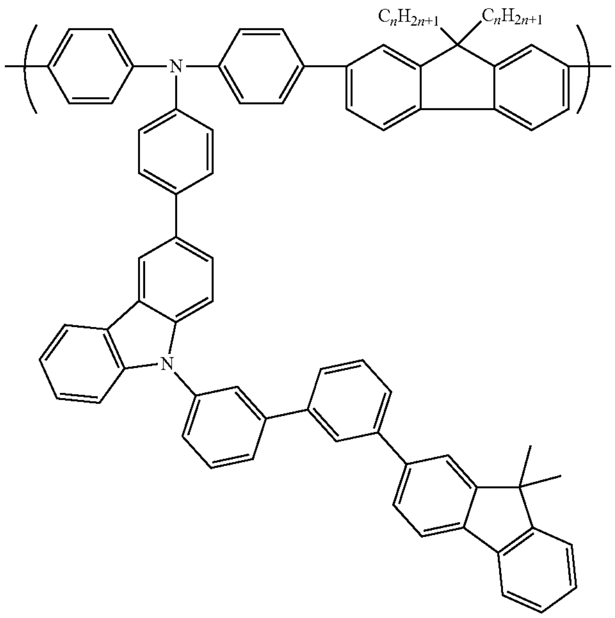
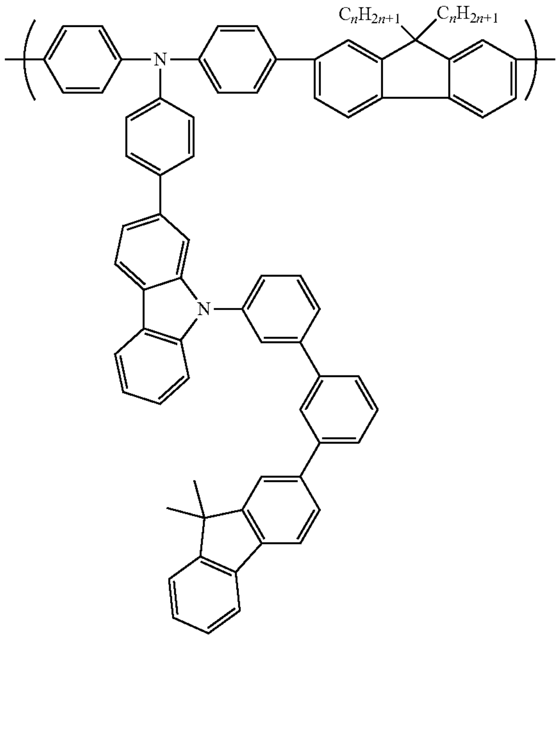

-continued
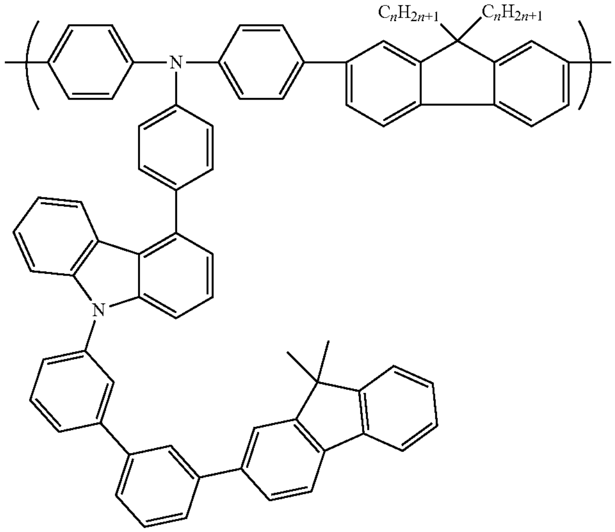
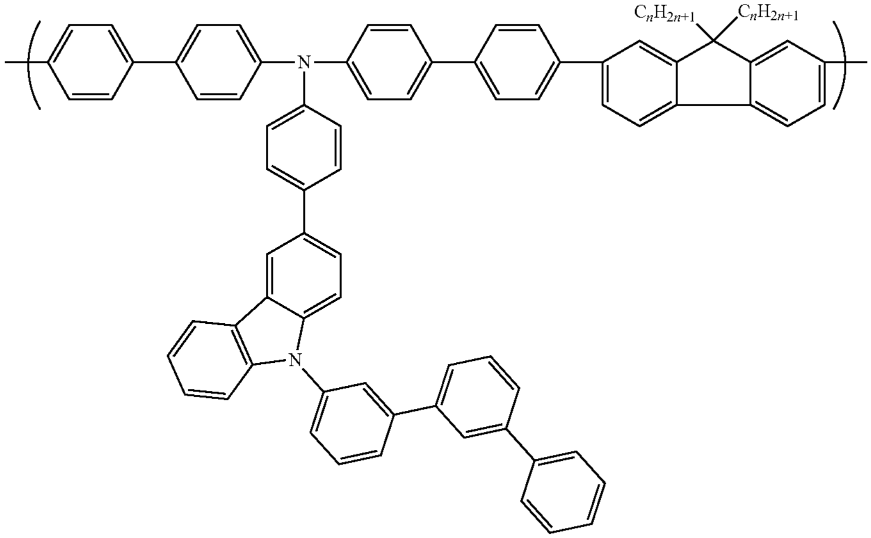
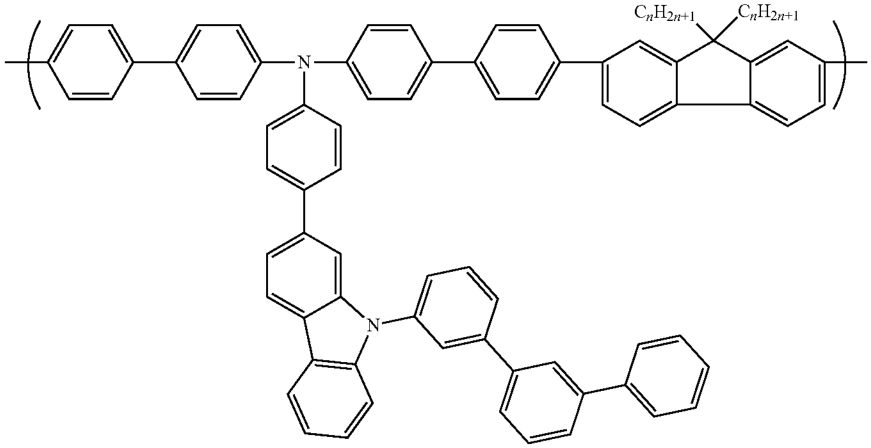

-continued
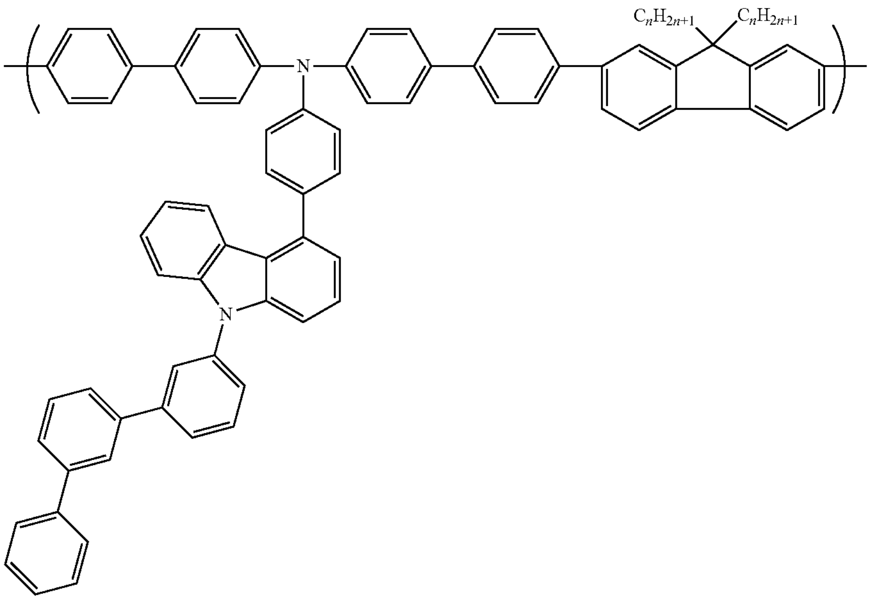
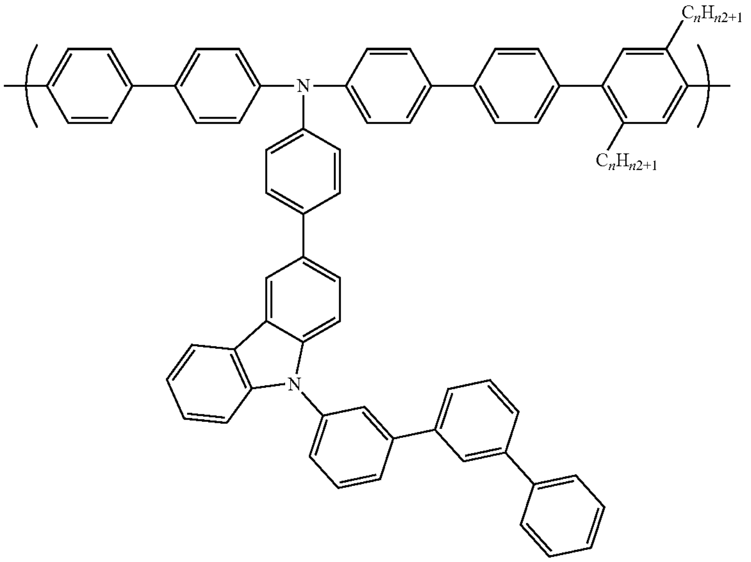
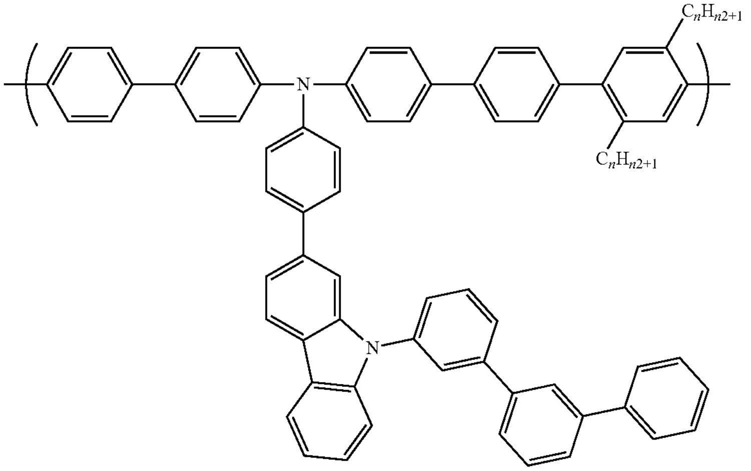

-continued

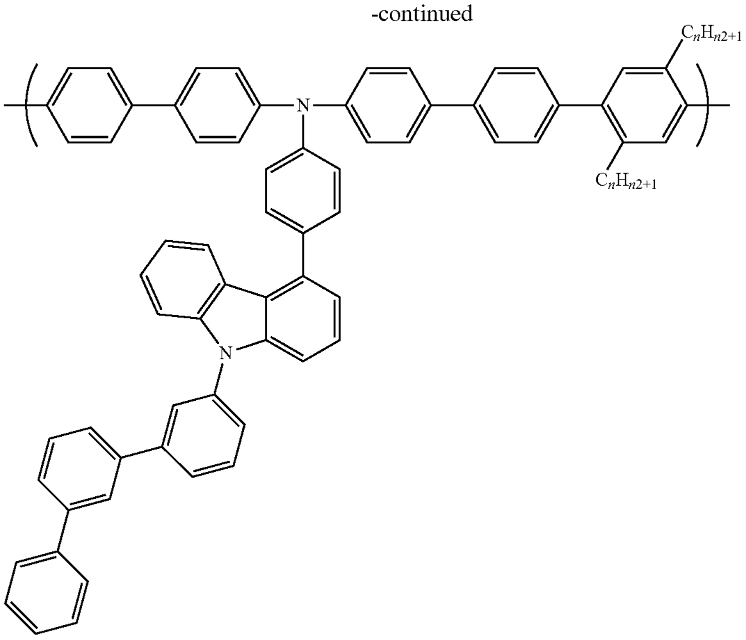

wherein, in the chemical formulas of Group (A), n represents an integer, when the compounds represented by the chemical formulas have two or more groups represented by "$C_nH_{2n+1}$—", n in each "$C_nH_{2n+1}$—" is the same as or different from each other, and each group represented by "$C_nH_{2n+1}$—" is the same as or different from each other.

5. The polymer of claim 4, wherein the structural unit is at least one structural unit selected from Group (B):

[Group B]

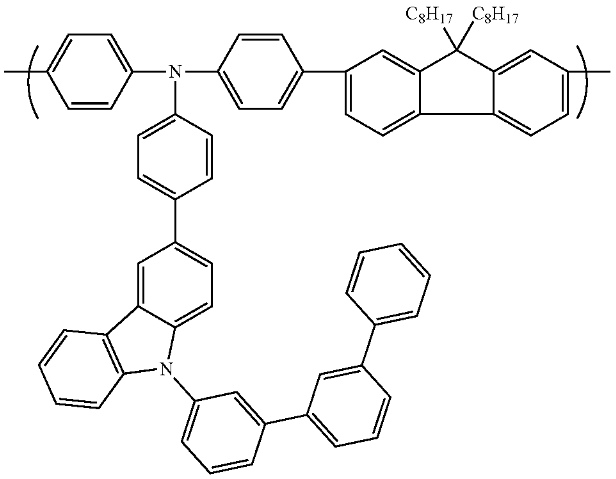

-continued
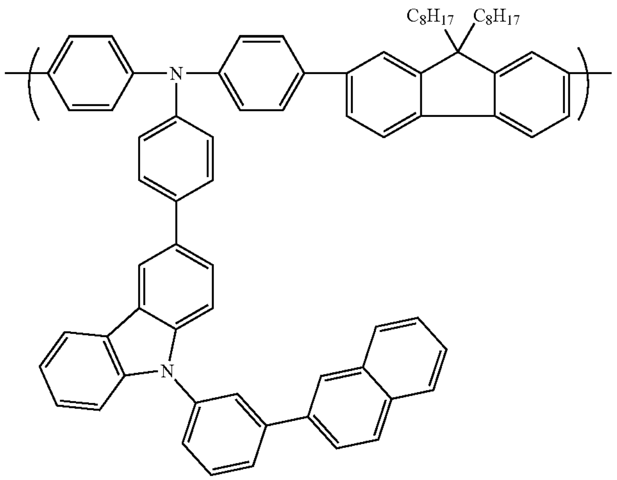
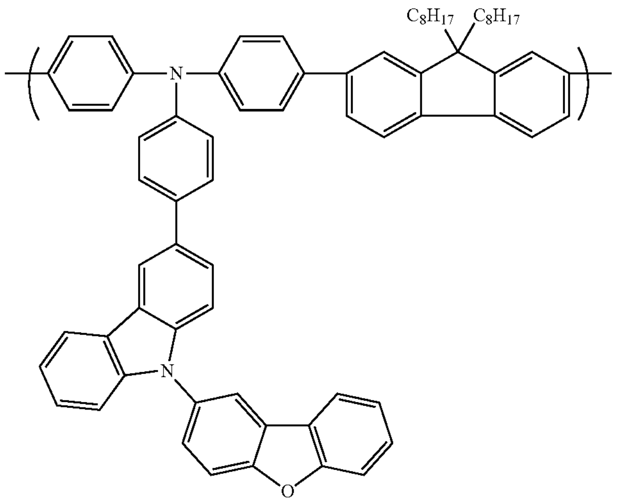
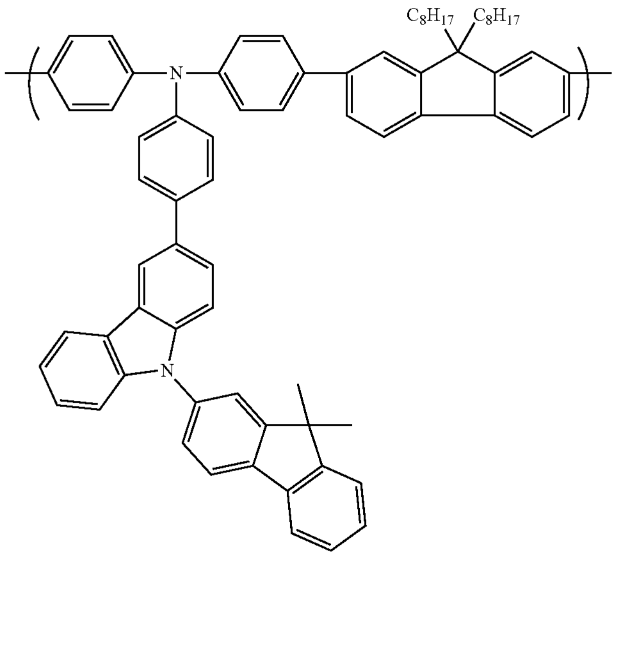

-continued
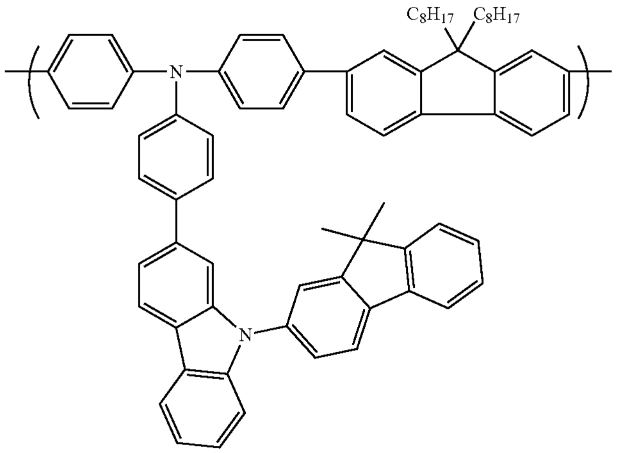
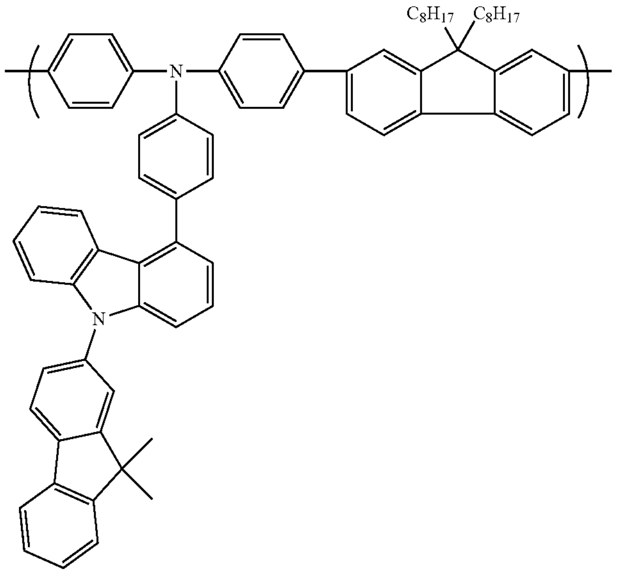
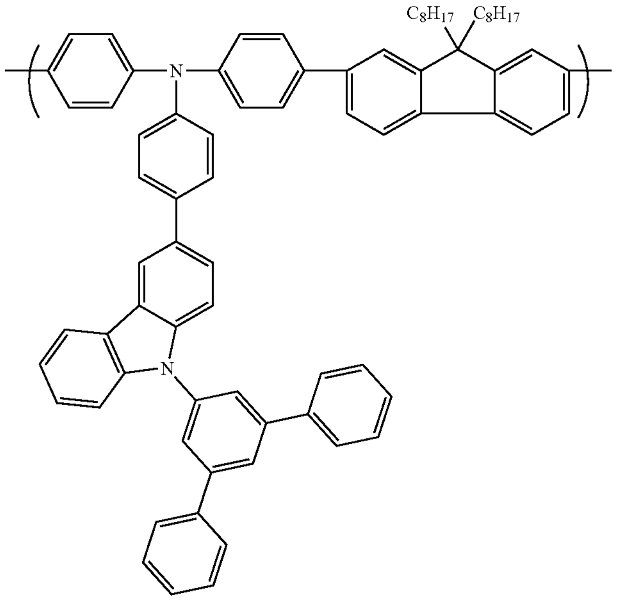

-continued
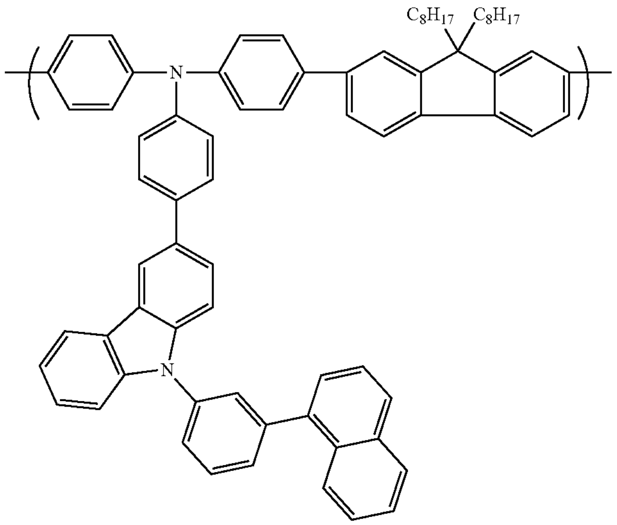
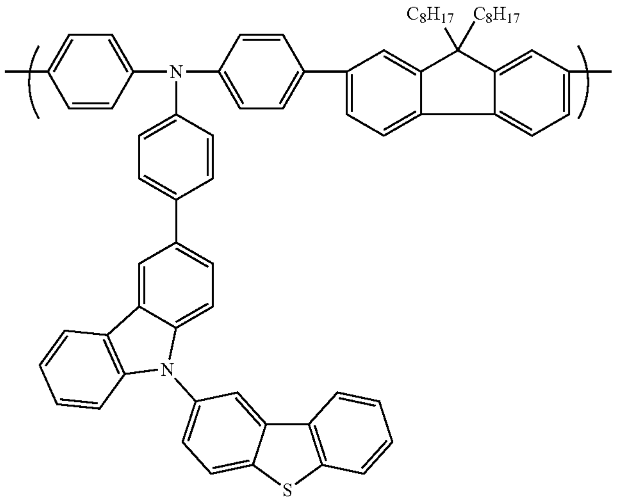
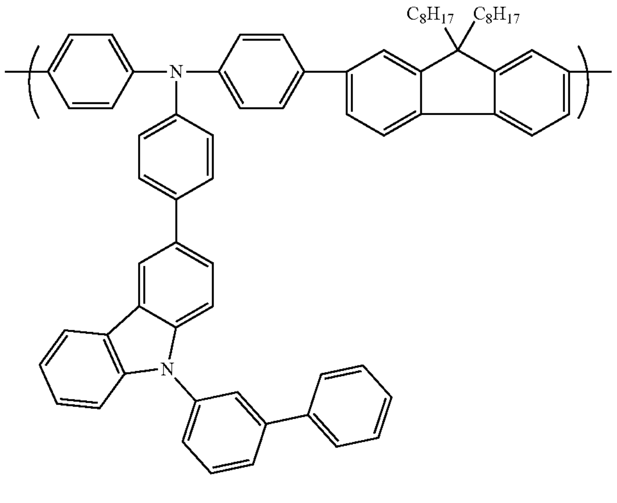

-continued
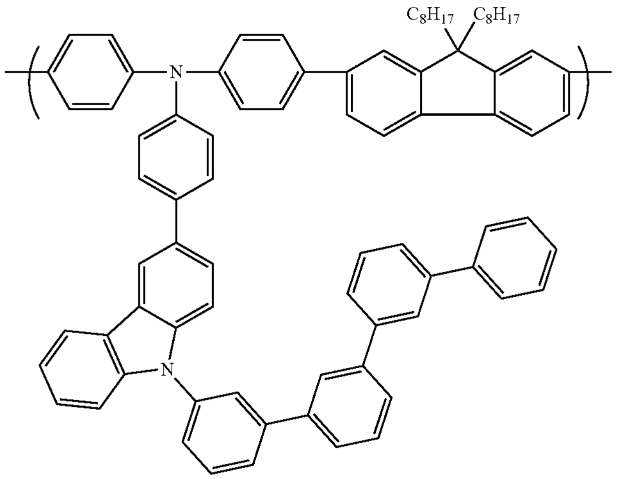
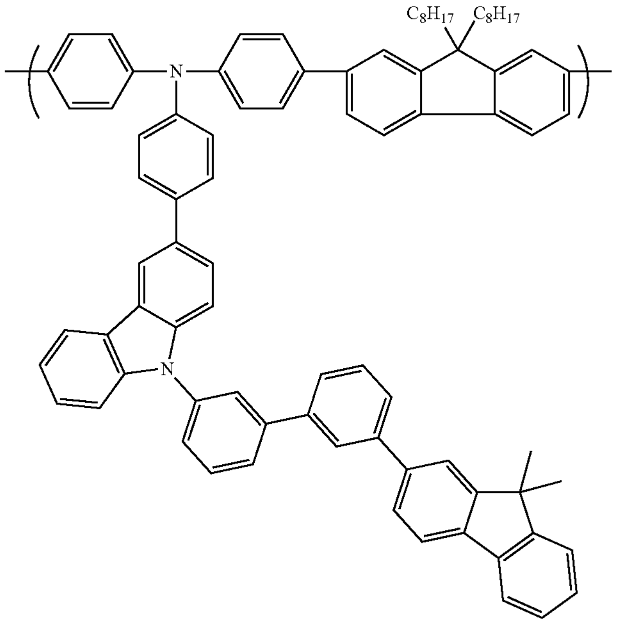
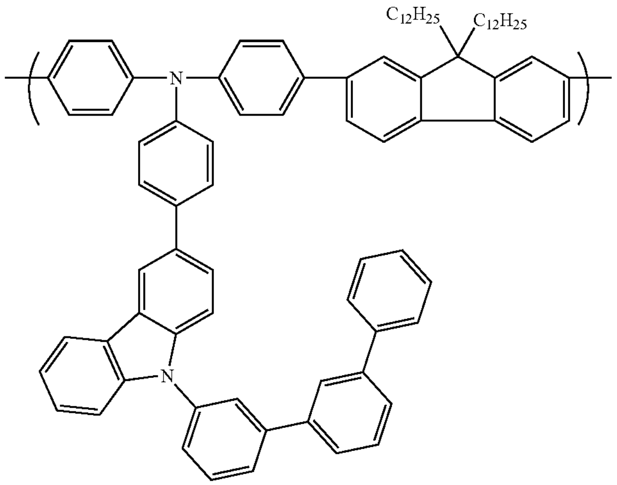

-continued
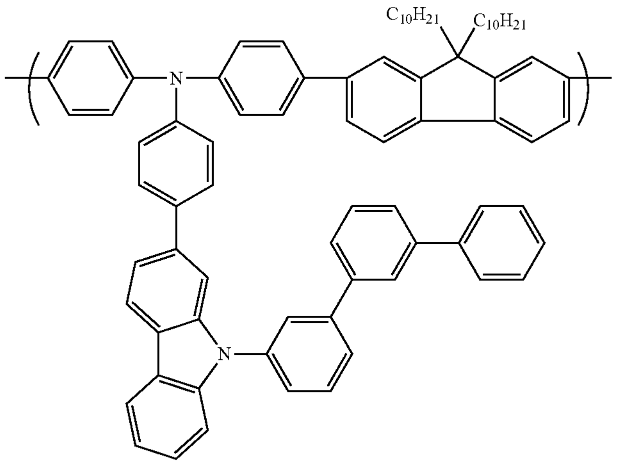
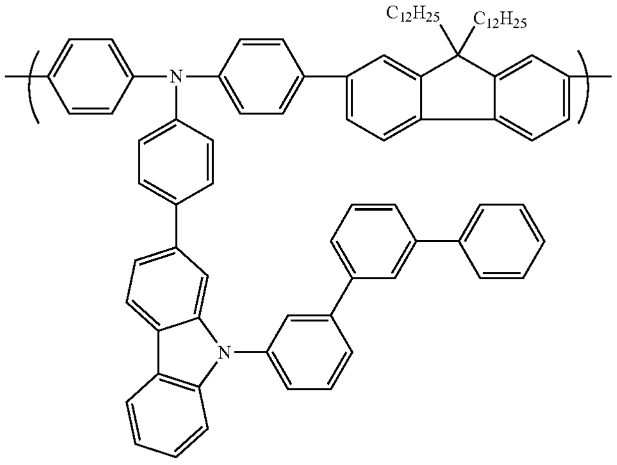
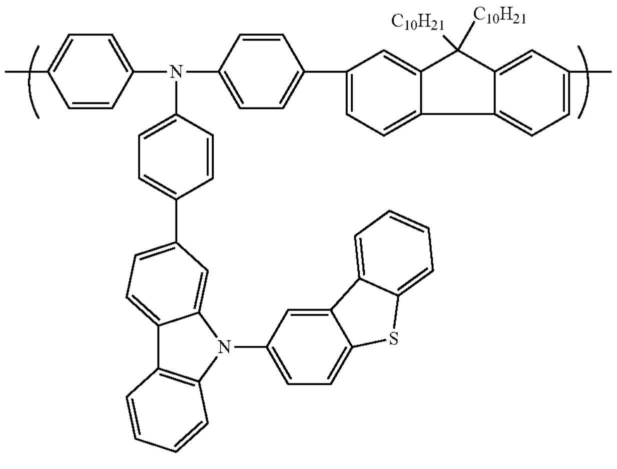

-continued
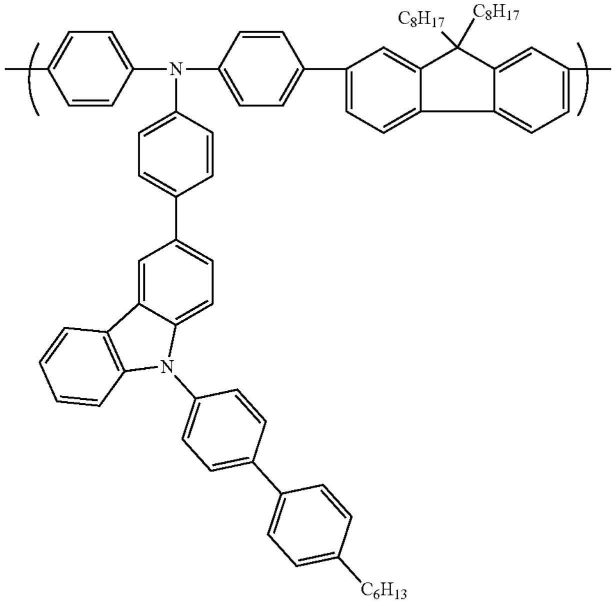
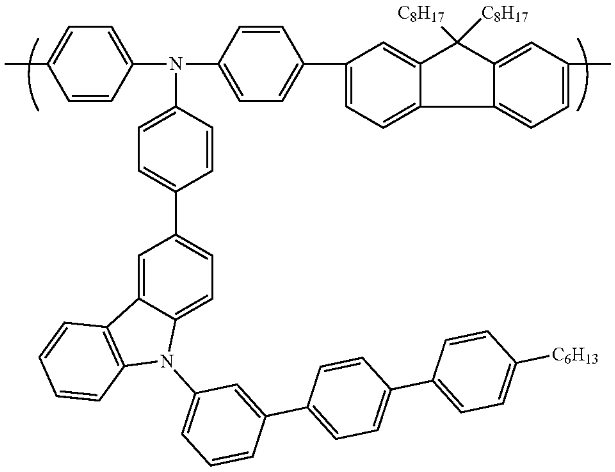
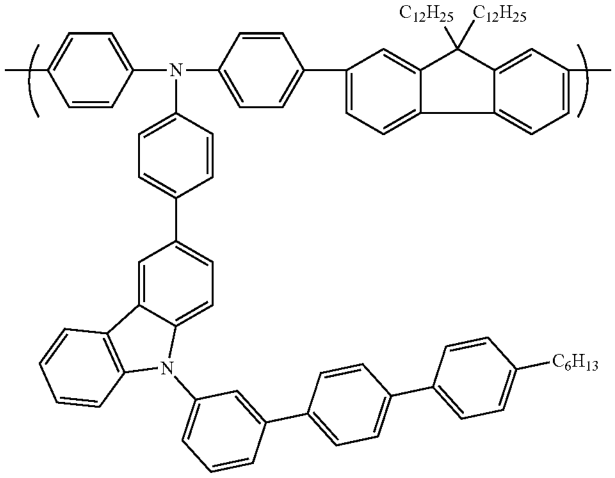

-continued
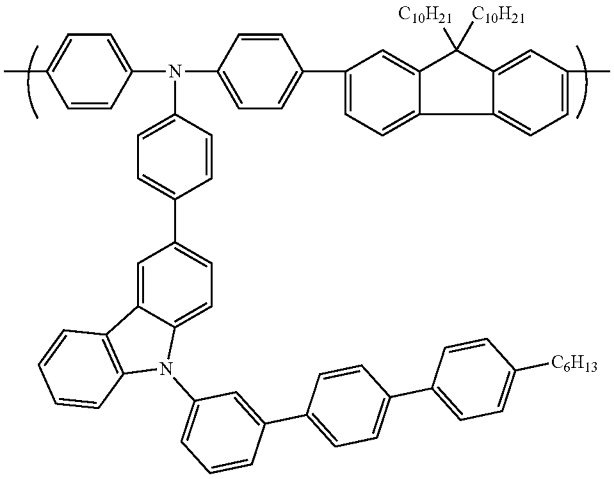
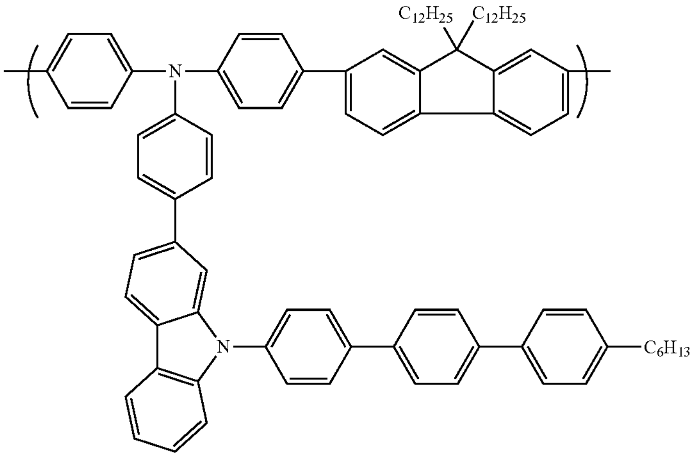
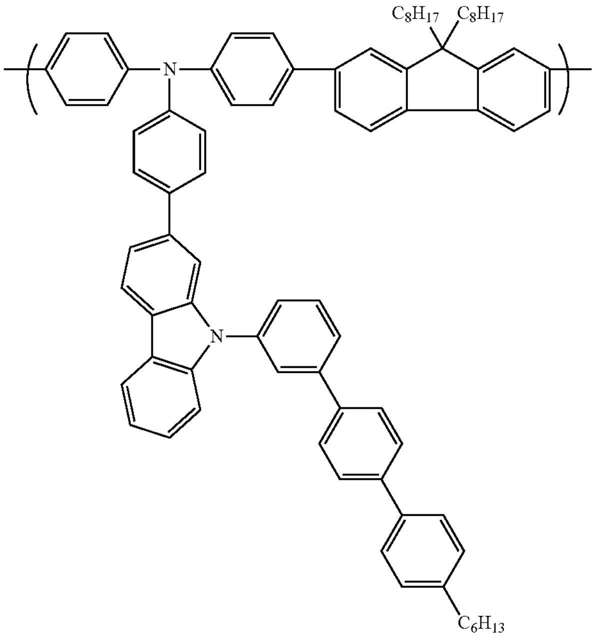

-continued

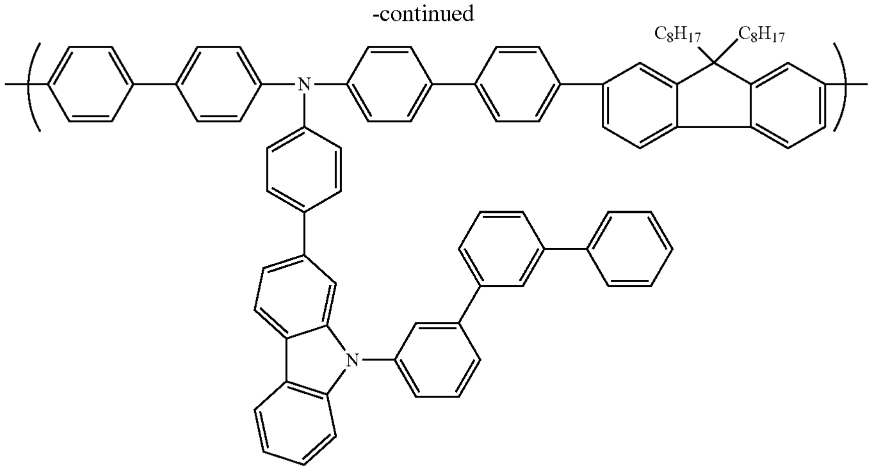

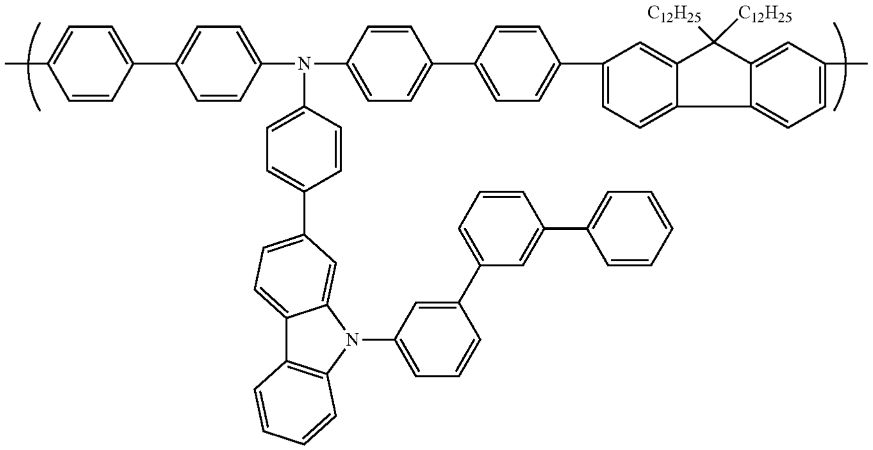

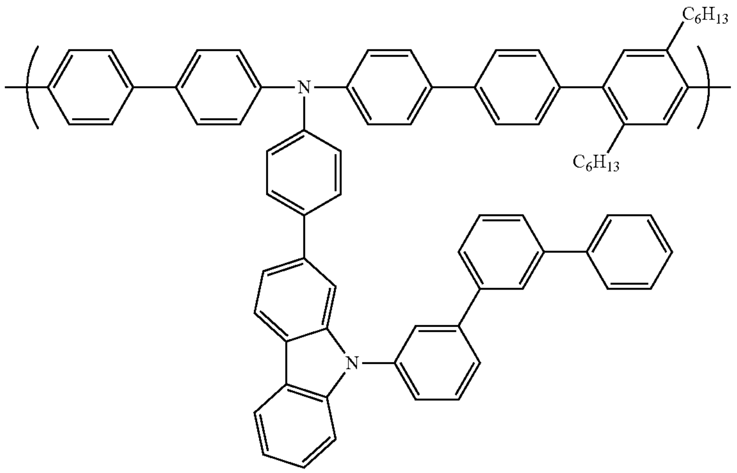

wherein, in the above chemical formulas, the group represented by "$C_{12}H_{25}$-" represents an n-dodecyl group, the group represented by "$C_{10}H_{21}$—" represents an n-decyl group, the group represented by "$C_8H_{17}$—" represents an n-octyl group, and the group represented by "$C_6H_{13}$—" represents an n-hexyl group.

6. The polymer of claim 4, wherein the structural unit is at least one structural unit selected from Group (B'):

-continued
Group (B′)
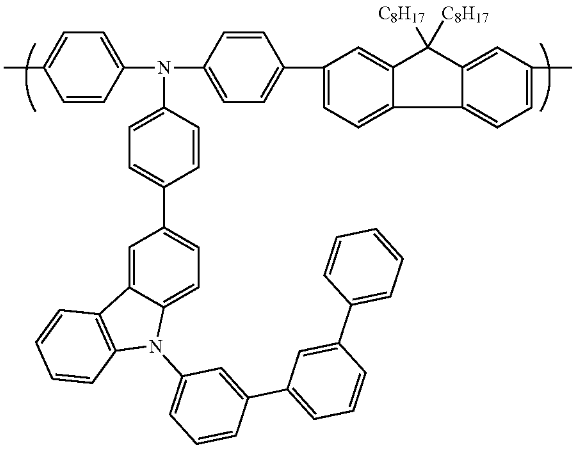
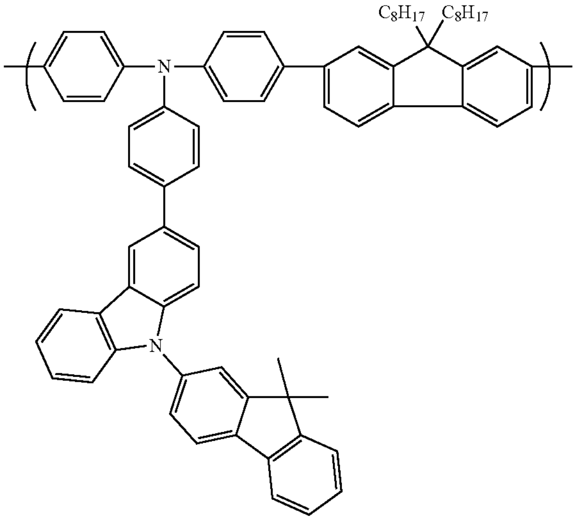
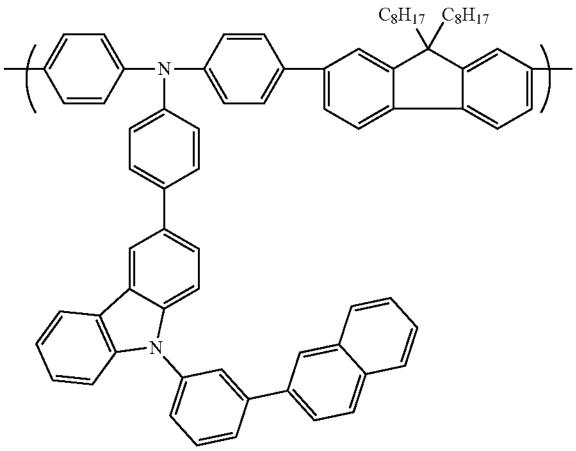
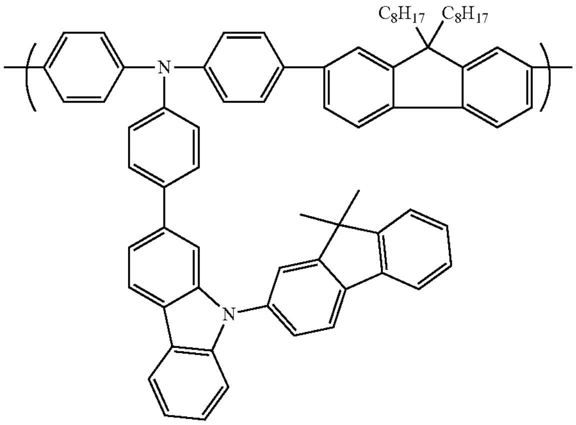
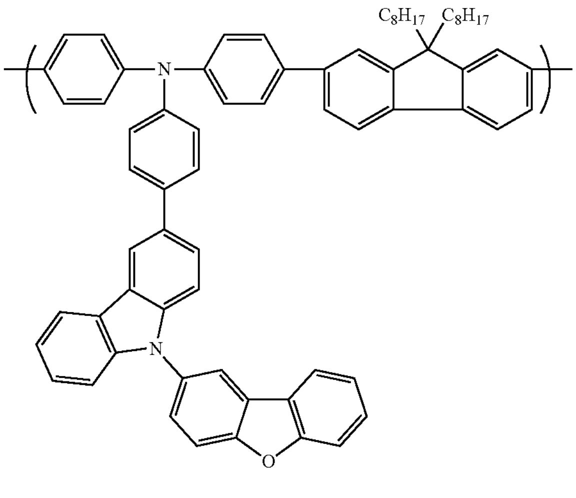
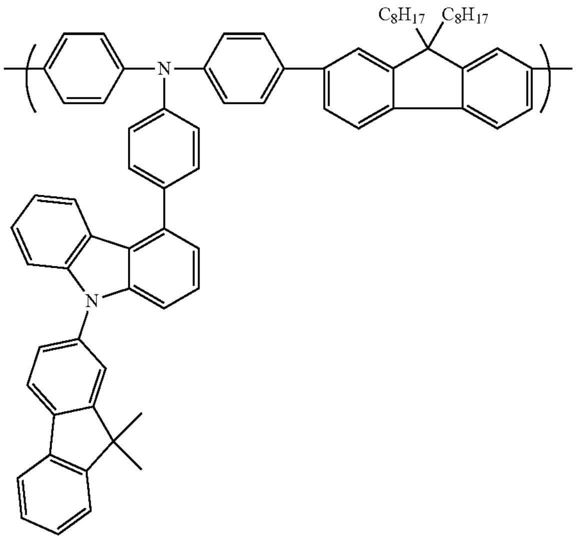

-continued

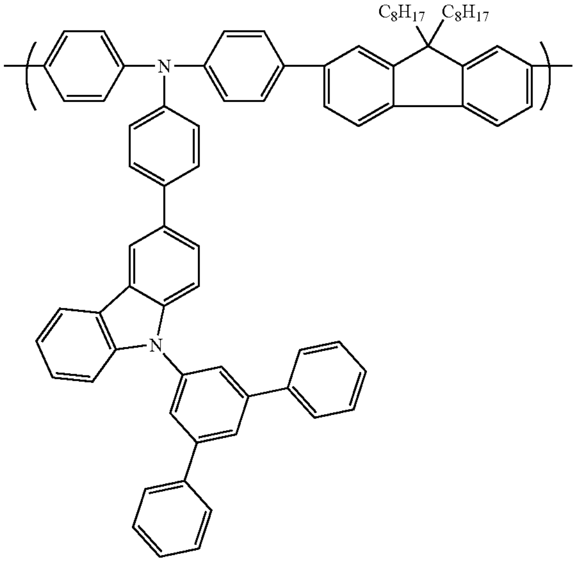

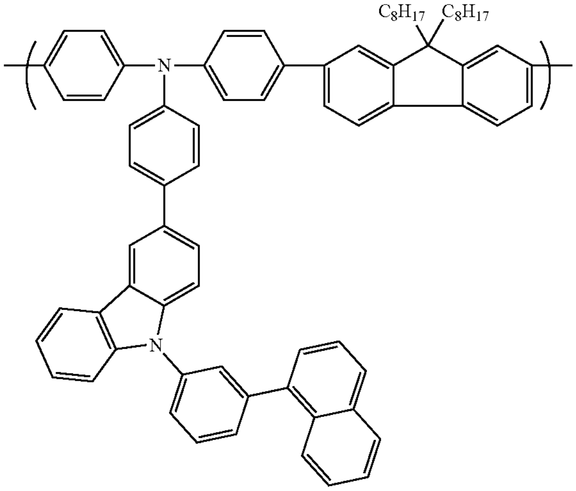

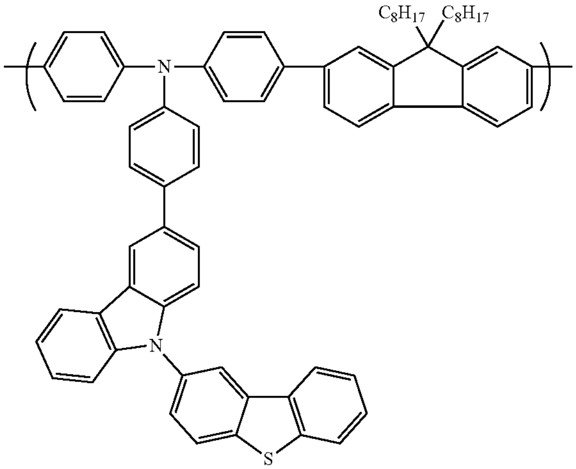

-continued

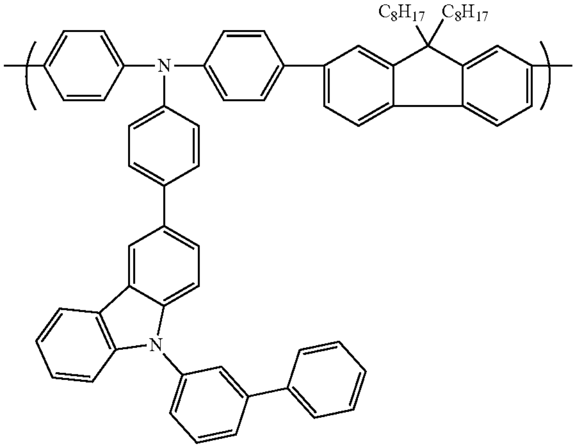

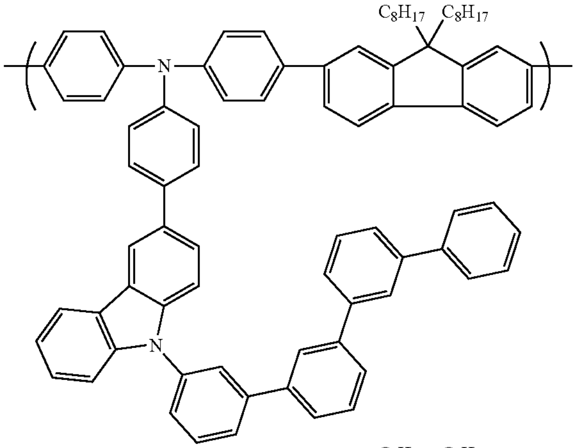

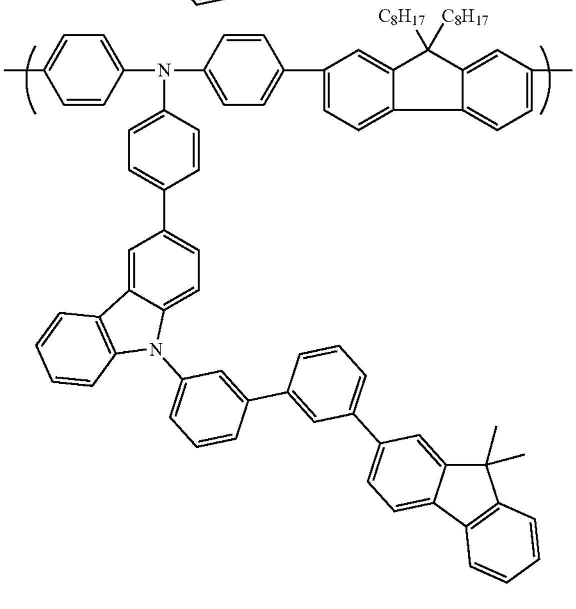

wherein, in the above chemical formulas, the group represented by "$C_8H_{17}$—" represents an n-octyl group.

7. A composition comprising the polymer of claim 1.

8. The composition of claim 7, wherein the composition further comprises a low molecular weight material satisfying the following condition (a) and at the same time satisfying the following condition (b), the following condition (c), or a combination thereof:

(a) a band gap of the low molecular weight material is larger than the polymer, (b) a LUMO of the low molecular weight material is shallower than the LUMO of the polymer, and (c) a HOMO of the low molecular weight material is deeper than the HOMO of the polymer.

9. An electroluminescent device comprising a pair of electrodes, and at least one organic film comprising the polymer of claim 1.

10. An electroluminescent device comprising a pair of electrodes, and one or two or more organic layers comprising, wherein at least one the organic layer comprises the polymer of claim 1, and a low molecular weight material satisfying the following condition (a) and satisfying the following condition (b), the following condition (c), or a combination thereof:

(a) a band gap of the low molecular weight material is larger than the polymer, (b) a LUMO of the low molecular weight material is shallower than the polymer, and (c) a HOMO of the low molecular weight material is deeper than the polymer.

11. An electroluminescent device comprising a pair of electrodes, and at least one organic film comprising the composition of claim 7.

12. The electroluminescent device of claim 9, wherein the electroluminescent device further comprises a layer comprising quantum dots.

13. The electroluminescent device of claim 10, wherein the electroluminescent device further comprises a layer comprising quantum dots.

14. The electroluminescent device of claim 11, wherein the electroluminescent device further comprises a layer comprising quantum dots.

15. The polymer of claim 1, wherein the polymer has an overlap index of greater than or equal to about 0.00001 and less than or equal to about 1.8 represented by the following equation:

$$\text{overlap index} = \left(\sum_{k=1}^{n}\left(d^k_{HOMO} \times d^k_{LUMO}\right)\right) \times 100$$

wherein, in the equation, k is a serial number assigned to an atom in the chemical formula of a structural unit constituting the polymer, $d^k_{HOMO}$ denotes a distribution density of the HOMO in the atom of serial number k, and $d^k_{LUMO}$ denotes a distribution density of the LUMO in the atom of serial number k.

16. The polymer of claim 15, wherein the overlap index of greater than or equal to about 0.00001 and less than or equal to about 1.2.

* * * * *